US011637135B2

(12) United States Patent
Tayanaka et al.

(10) Patent No.: US 11,637,135 B2
(45) Date of Patent: Apr. 25, 2023

(54) SOLID-STATE IMAGE SENSING DEVICE AND ELECTRONIC DEVICE

(71) Applicant: SONY GROUP CORPORATION, Tokyo (JP)

(72) Inventors: Hiroshi Tayanaka, Kanagawa (JP); Kentaro Akiyama, Kanagawa (JP); Yorito Sakano, Kanagawa (JP); Takashi Oinoue, Tokyo (JP); Yoshiya Hagimoto, Kanagawa (JP); Yusuke Matsumura, Kanagawa (JP); Naoyuki Sato, Kanagawa (JP); Yuki Miyanami, Kanagawa (JP); Yoichi Ueda, Kanagawa (JP); Ryosuke Matsumoto, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 0 days.

(21) Appl. No.: 17/542,186

(22) Filed: Dec. 3, 2021

(65) Prior Publication Data

US 2022/0093655 A1 Mar. 24, 2022

Related U.S. Application Data

(63) Continuation of application No. 16/683,379, filed on Nov. 14, 2019, now Pat. No. 11,217,612, which is a (Continued)

(30) Foreign Application Priority Data

Feb. 27, 2015 (JP) ................................ 2015-039223

(51) Int. Cl.
*H01L 27/146* (2006.01)
*H01L 27/14* (2006.01)
(Continued)

(52) U.S. Cl.
CPC ........ *H01L 27/146* (2013.01); *H01L 27/0248* (2013.01); *H01L 27/14* (2013.01);
(Continued)

(58) Field of Classification Search
CPC ... H01L 27/0248; H01L 27/14; H01L 27/146; H01L 27/14614; H01L 27/14621;
(Continued)

(56) References Cited

U.S. PATENT DOCUMENTS 4,884,121 A 11/1989 Ishii
5,461,419 A 10/1995 Yamada
(Continued)

FOREIGN PATENT DOCUMENTS

CN 101800233 A 8/2010
CN 101826537 A 9/2010
(Continued)

OTHER PUBLICATIONS

Office Action for CN Patent Application No. 201680011099.2, dated Jul. 23, 2020, 07 pages of Office Action and 10 pages of English Translation.

(Continued)

*Primary Examiner* — Antoinette T Spinks
(74) *Attorney, Agent, or Firm* — Chip Law Group

(57) ABSTRACT

The present technology relates to a solid-state image sensing device and an electronic device for reducing noises. The solid-state image sensing device includes: a photoelectric conversion unit; a charge holding unit for holding charges transferred from the photoelectric conversion unit; a first transfer transistor for transferring charges from the photoelectric conversion unit to the charge holding unit; and a light blocking part including a first light blocking part and a second light blocking part, in which the first light blocking part is arranged between a second surface opposite to a first
(Continued)

surface as a light receiving surface of the photoelectric conversion unit and the charge holding unit, and covers the second surface, and is formed with a first opening, and the second light blocking part surrounds the side surface of the photoelectric conversion unit. The present technology is applicable to solid-state image sensing devices of backside irradiation type, for example.

17 Claims, 143 Drawing Sheets

Related U.S. Application Data continuation of application No. 15/551,129, filed as application No. PCT/JP2016/054067 on Feb. 12, 2016, now Pat. No. 10,515,988.

(51) Int. Cl.
*H04N 5/355* (2011.01)
*H04N 5/3745* (2011.01)
*H01L 27/02* (2006.01)
*H04N 5/374* (2011.01)
*H04N 5/217* (2011.01)
*H04N 5/235* (2006.01)
*H04N 5/367* (2011.01)
*H04N 5/378* (2011.01)

(52) U.S. Cl.
CPC .... *H01L 27/1464* (2013.01); *H01L 27/14614* (2013.01); *H01L 27/14621* (2013.01); *H01L 27/14623* (2013.01); *H01L 27/14647* (2013.01); *H04N 5/2173* (2013.01); *H04N 5/2355* (2013.01); *H04N 5/3559* (2013.01); *H04N 5/35554* (2013.01); *H04N 5/35581* (2013.01); *H04N 5/367* (2013.01); *H04N 5/374* (2013.01); *H04N 5/378* (2013.01); *H04N 5/3745* (2013.01)

(58) Field of Classification Search
CPC ........... H01L 27/14623; H01L 27/1464; H01L 27/14647; H04N 5/2173; H04N 5/2355; H04N 5/35554; H04N 5/35581; H04N 5/3559; H04N 5/367; H04N 5/374; H04N 5/3745; H04N 5/378
See application file for complete search history.

(56) References Cited

U.S. PATENT DOCUMENTS

| | | | | |
|---|---|---|---|---|
| 2002/0006693 | A1 | 1/2002 | Matsuda | |
| 2008/0308855 | A1 | 12/2008 | El-Kareh et al. | |
| 2010/0201834 | A1 | 8/2010 | Maruyama et al. | |
| 2011/0032403 | A1 | 2/2011 | Mabuchi | |
| 2011/0101481 | A1 | 5/2011 | Nozaki | |
| 2013/0200479 | A1 | 8/2013 | Sakano et al. | |
| 2013/0327924 | A1 | 12/2013 | Machida | |
| 2014/0002700 | A1 | 1/2014 | Oishi | |
| 2014/0131779 | A1 | 5/2014 | Takeda | |
| 2015/0002718 | A1 | 1/2015 | Nomura | |
| 2015/0035028 | A1 | 2/2015 | Fan et al. | |
| 2015/0054110 | A1 | 2/2015 | Kashihara | |
| 2015/0084144 | A1 | 3/2015 | Suzuki et al. | |
| 2017/0287960 | A1 * | 10/2017 | Masuda | G02B 1/113 |
| 2021/0257401 | A1 | 8/2021 | Moriwaki et al. | |

FOREIGN PATENT DOCUMENTS

| | | | | | |
|---|---|---|---|---|---|
| CN | 101998066 | A | | 3/2011 | |
| CN | 103000644 | A | | 3/2013 | |
| CN | 103475829 | A | | 12/2013 | |
| CN | 103515402 | A | | 1/2014 | |
| CN | 103517003 | A | | 1/2014 | |
| CN | 103811507 | A | | 5/2014 | |
| EP | 2216818 | A2 | | 8/2010 | |
| EP | 2285098 | A2 | | 2/2011 | |
| JP | 2011-003860 | A | | 1/2011 | |
| JP | 2011003860 | A | * | 1/2011 | H01L 27/14612 |
| JP | 2011-040926 | A | | 2/2011 | |
| JP | 2011040926 | A | * | 2/2011 | H04N 5/335 |
| JP | 2012-248679 | A | | 12/2012 | |
| JP | 2013-098446 | A | | 5/2013 | |
| JP | 2013098446 | A | * | 5/2013 | H01L 27/14623 |
| JP | 2013-145917 | A | | 7/2013 | |
| JP | 2013-254805 | A | | 12/2013 | |
| JP | 2014-096490 | A | | 5/2014 | |
| JP | 2015-041677 | A | | 3/2015 | |
| KR | 10-2010-0091891 | A | | 8/2010 | |
| KR | 10-2011-0016401 | A | | 2/2011 | |
| TW | 201104852 | A | | 2/2011 | |
| TW | 201123871 | A | | 7/2011 | |
| TW | 201515202 | A | | 4/2015 | |
| WO | 2013/065569 | A1 | | 5/2013 | |
| WO | 2015/020821 | A2 | | 2/2015 | |

OTHER PUBLICATIONS

Office Action for JP Patent Application No. 2017-502061 dated Nov. 17, 2020, 02 pages of Office Action and 02 pages of English Translation.
Final Office Action for U.S. Appl. No. 15/551,129, dated May 14, 2019, 13 pages.
Non-Final Office Action for U.S. Appl. No. 15/551,129, dated Sep. 27, 2018, 12 pages.
Notice of Allowance for U.S. Appl. No. 15/551,129, dated Aug. 8, 2019, 10 pages.
International Search Report and Written Opinion of PCT Application No. PCT/JP2016/054067, dated Apr. 26, 2016, 13 pages of English Translation and 09 pages of ISRWO.
International Preliminary Report on Patentability of PCT Application No. PCT/JP2016/054067, dated Sep. 8, 2017, 13 pages of English Translation and 06 pages of IPRP.
Notice of Allowance for U.S. Appl. No. 16/683,379, dated Sep. 2, 2021, 10 pages.
Advisory Action for U.S. Appl. No. 16/683,379, dated Jun. 25, 2021, 2 pages.
Non-Final Office Action for U.S. Appl. No. 16/683,379, dated Sep. 30, 2020, 13 pages.
Final Office Action for U.S. Appl. No. 16/683,379, dated Apr. 15, 2021, 17 page.
Office Action for CN Patent Application No. 202110694615.9, dated Jan. 30, 2022, 09 pages of English Translation and 05 pages of Office Action.

* cited by examiner

| TRANSMISSIVITY/MATERIAL | W | Ti | Ta | Al |
|---|---|---|---|---|
| <~50dB | 80nm~ | 70nm~ | 70nm~ | 40nm~ |
| <~100dB | 180nm~ | 140nm~ | 150nm~ | 70nm~ |

SOLID-STATE IMAGE SENSING DEVICE AND ELECTRONIC DEVICE

CROSS-REFERENCE TO RELATED APPLICATIONS

The present application is a continuation application of U.S. patent application Ser. No. 16/683,379, filed Nov. 14, 2019, which is continuation application of U.S. patent application Ser. No. 15/551,129, filed on Aug. 15, 2017, now U.S. Pat. No. 10,515,988, which is a national stage entry of PCT/JP2016/054067, filed Feb. 12, 2016, which claims priority from prior Japanese Priority Patent Application JP 2015-039223 filed in the Japan Patent Office on Feb. 27, 2015, the entire contents of which are hereby incorporated by reference.

TECHNICAL FIELD

The present technology relates to a solid-state image sensing device and an electronic device, and particularly to a solid-state image sensing device and an electronic device capable of reducing noises.

BACKGROUND ART

There has been conventionally proposed a backside irradiation-type solid-state image sensing device in a global shutter system in which a floating diffusion region in which charges accumulated in a photodiode are transferred is substantially covered by a horizontal light blocking part and a vertical light blocking part is formed between adjacent pixels (see Patent Document 1, for example).

CITATION LIST

Patent Document

Patent Document 1: Japanese Patent Application Laid-Open No. 2013-98446

SUMMARY OF THE INVENTION

Problems to be Solved by the Invention

However, the technique described in Patent Document 1 is not enough in light blocking on an opposite surface to a light receiving surface of the photodiode. Thus, there is a problem that charges generated by a light not absorbed in but transmitted through the photodiode invade in a floating diffusion region and a noise can occur.

The present technology is disclosed in terms of such a situation, and is directed for reducing noises.

Solutions to Problems

A solid-state image sensing device according to a first aspect of the present technology includes: a photoelectric conversion unit; a charge holding unit for holding charges transferred from the photoelectric conversion unit; a first transfer transistor for transferring charges from the photoelectric conversion unit to the charge holding unit; and a light blocking part including a first light blocking part and a second light blocking part, in which the first light blocking part is arranged between a second surface opposite to a first surface as a light receiving surface of the photoelectric conversion unit and the charge holding unit, and covers the second surface, and is formed with a first opening, and the second light blocking part surrounds the side surface of the photoelectric conversion unit.

A cross section of the first light blocking part can be tapered from a connection part with the second light blocking part toward the first opening.

A third light blocking part for covering at least an opposite surface of the charge holding unit to a surface opposing the first light blocking part can be further provided at a position away from the first light blocking part from a device forming surface where the first transfer transistor is formed.

A gate electrode of the first transfer transistor can be provided with a first electrode part parallel with the first light blocking part and a second electrode part vertical to the first light blocking part and extending from the first light blocking part closer to the charge holding unit toward the photoelectric conversion unit via the first opening.

There can be further provided a fourth light blocking part connected to the first light blocking part and at least partially arranged at a position closer to the charge holding unit than to the first light blocking part and different from the second light blocking part in parallel with the second surface.

The photoelectric conversion unit can be formed on a first semiconductor substrate, the charge holding unit can be formed on a second semiconductor substrate, the first transfer transistor can be formed over the first semiconductor substrate and the second semiconductor substrate, and a joining interface between the first semiconductor substrate and the second semiconductor substrate can be formed in a channel of the first transfer transistor.

The joining interface can be formed closer to a drain end of the transfer transistor than to a source end thereof.

The second light blocking part can be formed from the second surface of the photoelectric conversion unit, and there can be further provided a fifth light blocking part formed from the first surface of the photoelectric conversion unit and connected to the second light blocking part.

The photoelectric conversion unit, the charge holding unit and the first transfer transistor can be made of monocrystal silicon.

The photoelectric conversion unit can be provided with a protruded part on the second surface extending from the first light blocking part toward the charge holding unit via the first opening.

The protruded part can be spread in parallel with the second surface closer to the charge holding unit side than to the first light blocking part.

A charge discharging unit for discharging charges accumulated in the photoelectric conversion unit is further provided, and the charge discharging unit can be arranged at a position where a light with a predetermined incident angle is incident in a case where the light passes through the first opening.

The charge discharging unit can be arranged between mutually-adjacent first and second pixels, and can be shared by the first pixel and the second pixel.

The first openings can be arranged near the charge discharging unit in the first pixel and the second pixel, respectively, a second opening with substantially the same size as the first opening can be formed in the first pixel at a position corresponding to the first opening in the second pixel, and a third opening with substantially the same size as the first opening can be formed in the second pixel at a position corresponding to the first opening in the first pixel.

A sacrifice film for forming the first light blocking part can be made of SiGe, and an alignment mark made of the not-removed sacrifice film can be further provided.

A cross section of the first light blocking part can be rounded at the first opening.

A charge voltage conversion unit, and a second transfer transistor for transferring charges held in the charge holding unit to the charge voltage conversion unit can be further provided, and the first light blocking part can be arranged between the second surface of the photoelectric conversion unit, and the charge holding unit and the charge voltage conversion unit.

An electronic device according to a second aspect of the present technology includes a solid-state image sensing device, the device including: a photoelectric conversion unit; a charge holding unit for holding charges transferred from the photoelectric conversion unit; a first transfer transistor for transferring charges from the photoelectric conversion unit to the charge holding unit; and a light blocking part including a first light blocking part and a second light blocking part, in which the first light blocking part is arranged between a second surface opposite to a first surface as a light receiving surface of the photoelectric conversion unit and the charge holding unit, covers the second surface, and is formed with a first opening, and the second light blocking part surrounds the side surface of the photoelectric conversion unit.

A solid-state image sensing device according to a third aspect of the present technology includes: a photoelectric conversion unit; a charge holding unit for holding charges transferred from the photoelectric conversion unit; a transfer transistor for transferring charges from the photoelectric conversion unit to the charge holding unit; and a light blocking part including a first light blocking part formed with an opening, and a second light blocking part, in which the first light blocking part is arranged in parallel with a light receiving surface of the photoelectric conversion unit and between the photoelectric conversion unit and the charge holding unit, and covers the photoelectric conversion unit except the opening, and the second light blocking part surrounds the side surface of the photoelectric conversion unit.

According to the first to third aspects of the present technology, a light passing through the photoelectric conversion unit is blocked by the first light blocking part, and a light from an adjacent pixel is blocked by the second light blocking part.

Effects of the Invention

According to the first to third aspects of the present technology, it is possible to reduce noises.

Additionally, the effects described herein are not necessarily limited, and any of the effects described in the present disclosure may be obtained.

BRIEF DESCRIPTION OF DRAWINGS

FIG. 120 is a diagram for explaining the second method for manufacturing the solid-state image sensing device according to the eleventh embodiment.

FIG. 121 is a diagram for considering a minimum value of a horizontal light blocking part.

FIG. 122 is a diagram for explaining a third method for manufacturing the solid-state image sensing device according to the eleventh embodiment.

FIG. 123 is a diagram for explaining the third method for manufacturing the solid-state image sensing device according to the eleventh embodiment.

FIG. 124 is a diagram for explaining the third method for manufacturing the solid-state image sensing device according to the eleventh embodiment.

FIG. 125 is a diagram for explaining the third method for manufacturing the solid-state image sensing device according to the eleventh embodiment.

FIG. 126 is a diagram for explaining the third method for manufacturing the solid-state image sensing device according to the eleventh embodiment.

FIG. 127 is a diagram for explaining the third method for manufacturing the solid-state image sensing device according to the eleventh embodiment.

FIG. 128 is a diagram for explaining the third method for manufacturing the solid-state image sensing device according to the eleventh embodiment.

FIG. 129 is a diagram for explaining the differences in the configuration of the solid-state image sensing device depending on the manufacture methods.

FIG. 130 is a cross-section view schematically illustrating an exemplary configuration of a solid-state image sensing device according to a twelfth embodiment of the present technology.

FIG. 131 is a diagram for explaining a method for manufacturing the solid-state image sensing device according to the twelfth embodiment.

Figure 132:
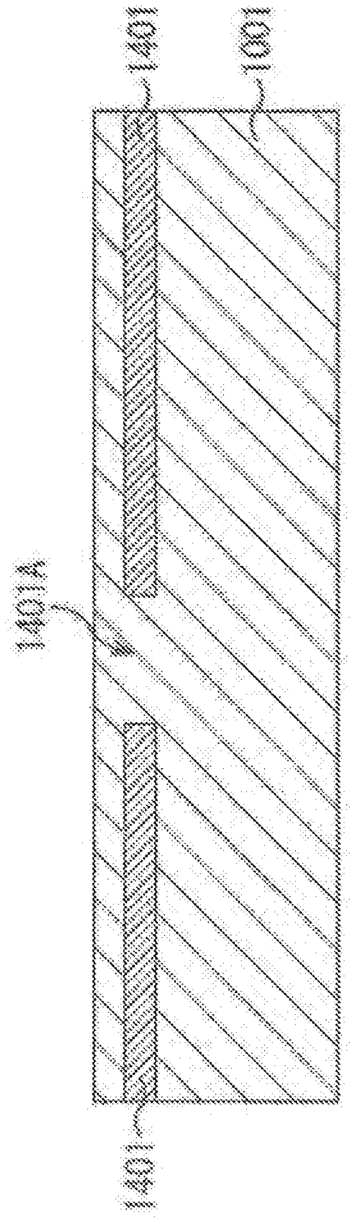

FIG. 132 is a diagram for explaining the method for manufacturing the solid-state image sensing device according to the twelfth embodiment.

Figure 133:
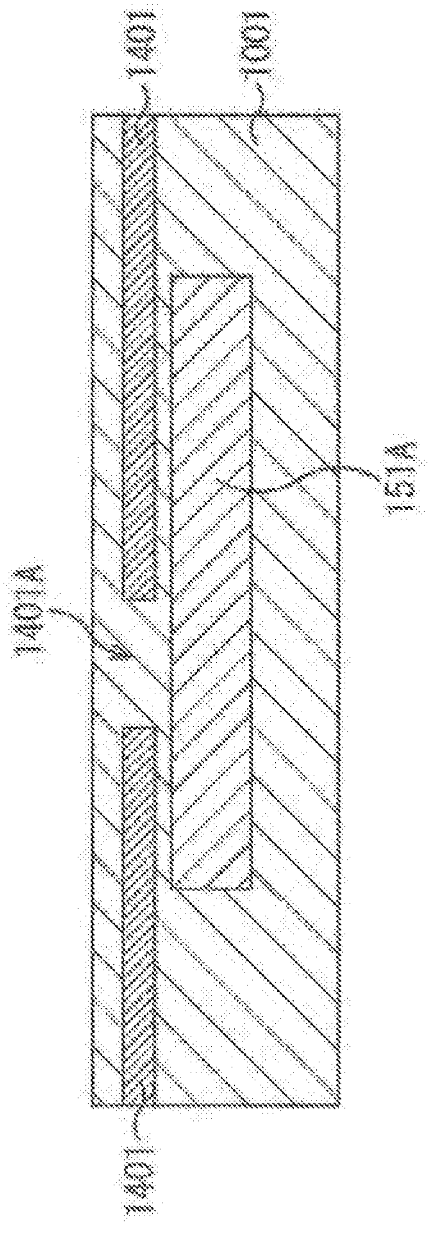

FIG. 133 is a diagram for explaining the method for manufacturing the solid-state image sensing device according to the twelfth embodiment.

Figure 134:
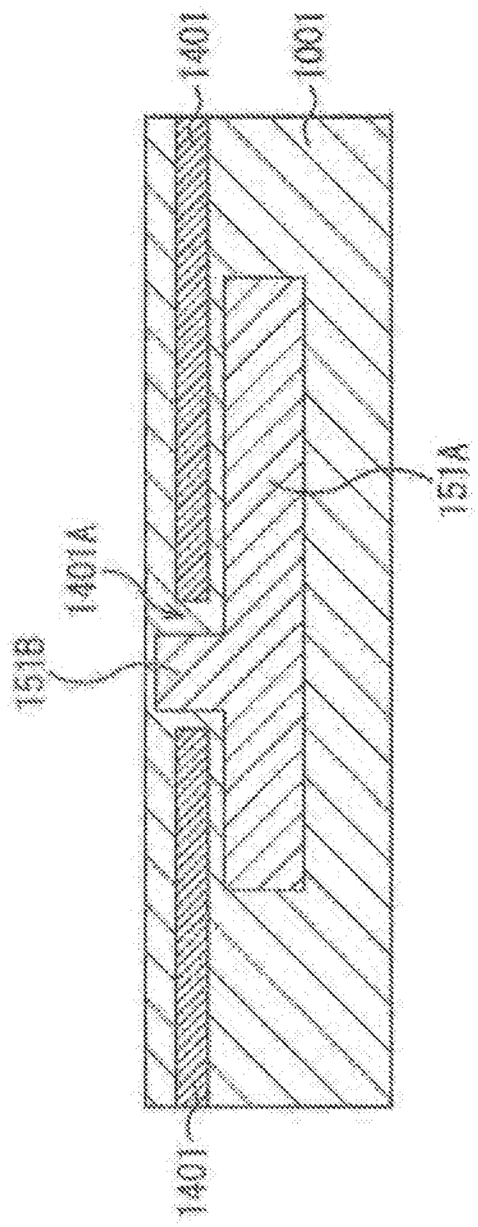

FIG. 134 is a diagram for explaining the method for manufacturing the solid-state image sensing device according to the twelfth embodiment.

Figure 135:
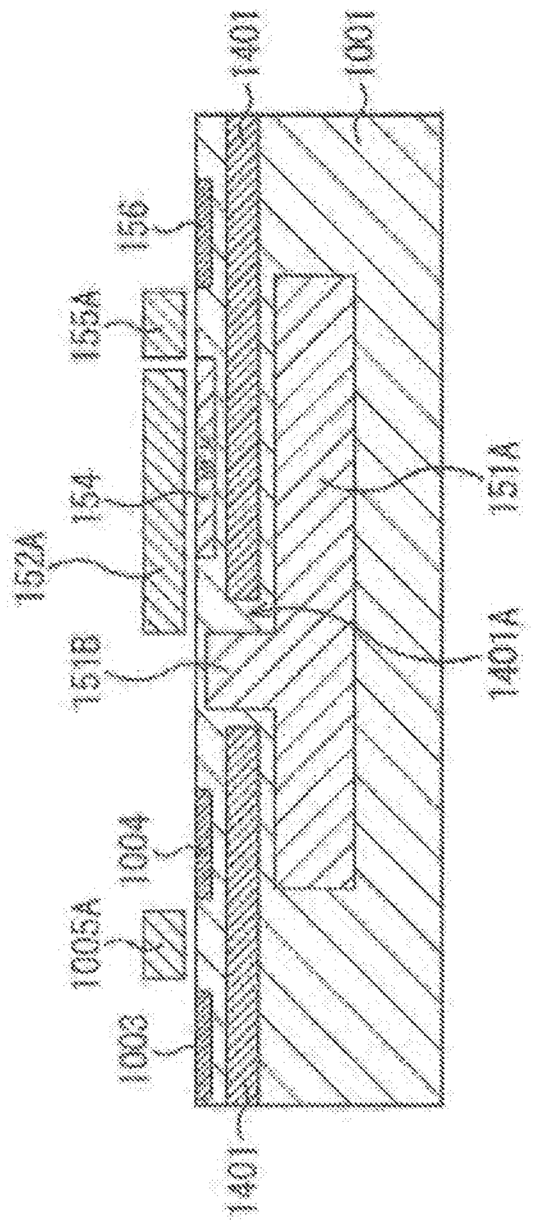

FIG. 135 is a diagram for explaining the method for manufacturing the solid-state image sensing device according to the twelfth embodiment.

Figure 136:
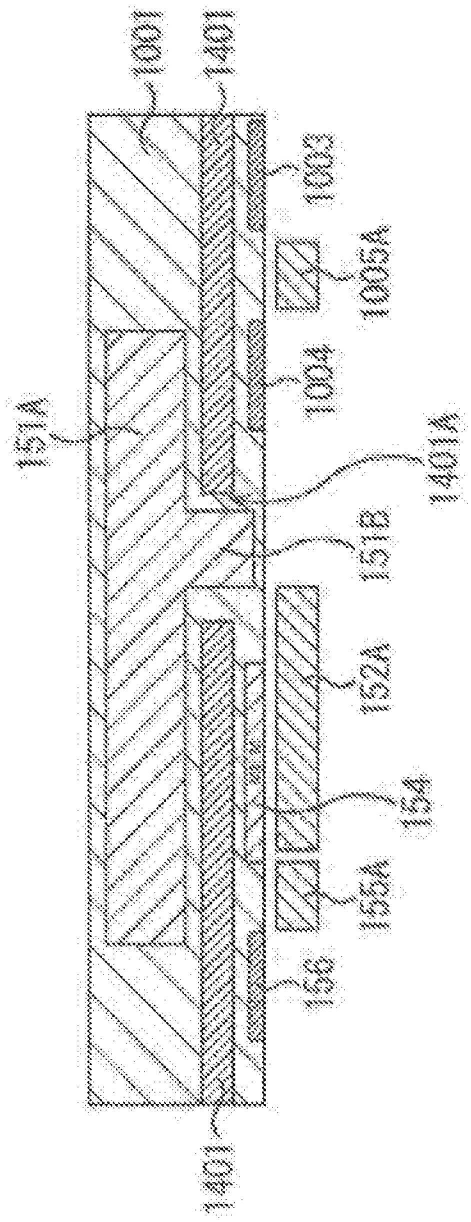

FIG. 136 is a diagram for explaining the method for manufacturing the solid-state image sensing device according to the twelfth embodiment.

Figure 137:
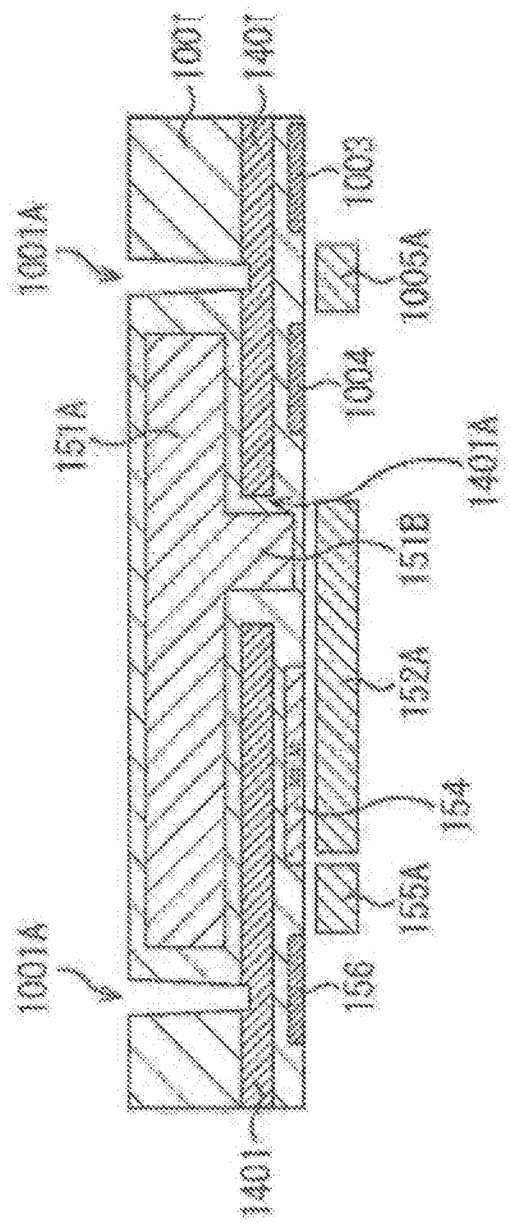

FIG. 137 is a diagram for explaining the method for manufacturing the solid-state image sensing device according to the twelfth embodiment.

Figure 138:
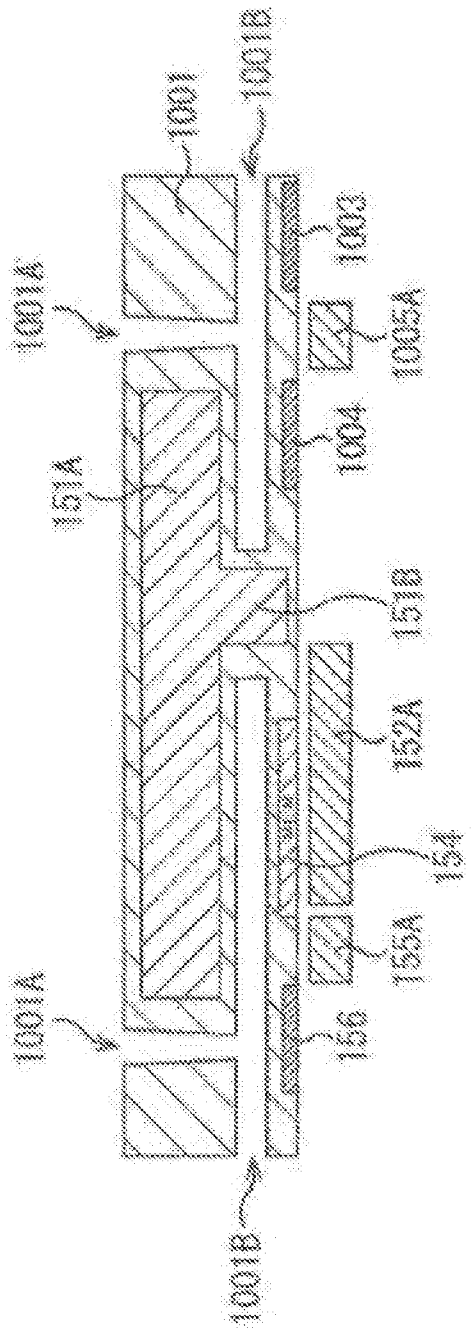

FIG. 138 is a diagram for explaining the method for manufacturing the solid-state image sensing device according to the twelfth embodiment.

Figure 139:
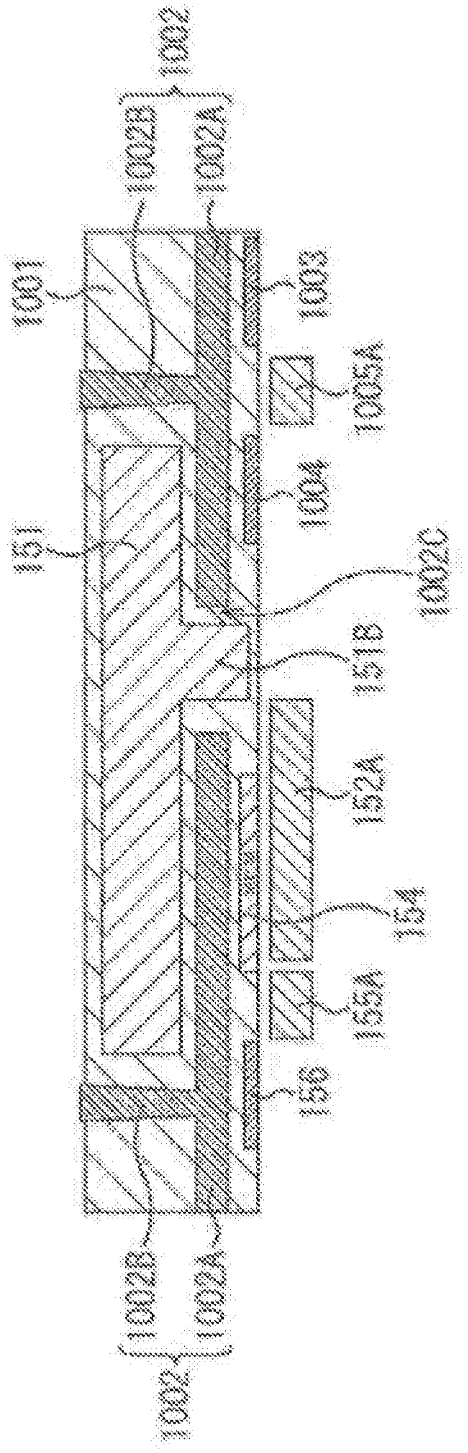

FIG. 139 is a diagram for explaining the method for manufacturing the solid-state image sensing device according to the twelfth embodiment.

Figure 140:
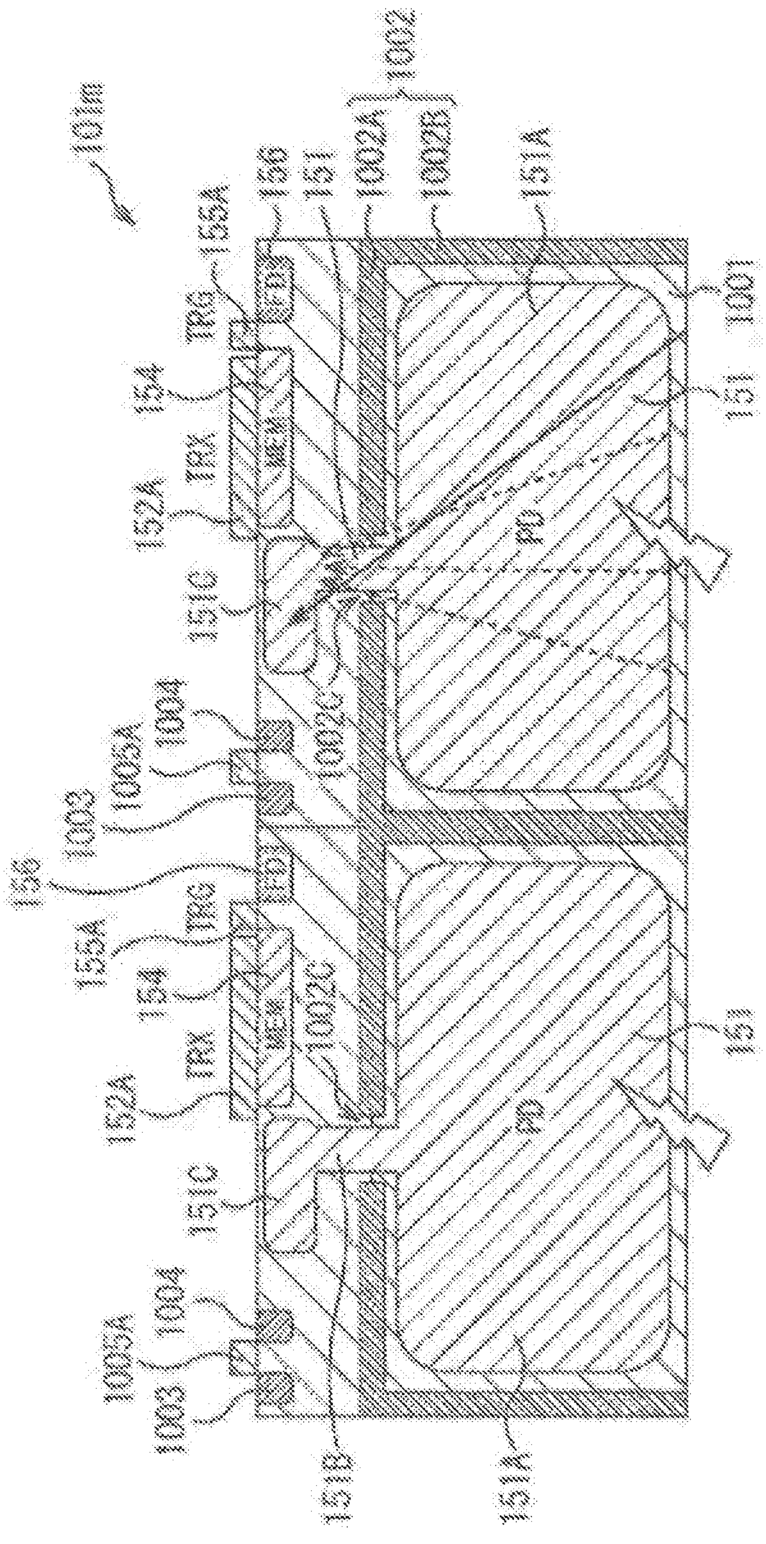

FIG. 140 is a cross-section view schematically illustrating an exemplary configuration of a solid-state image sensing device according to a thirteenth embodiment of the present technology.

Figure 141:
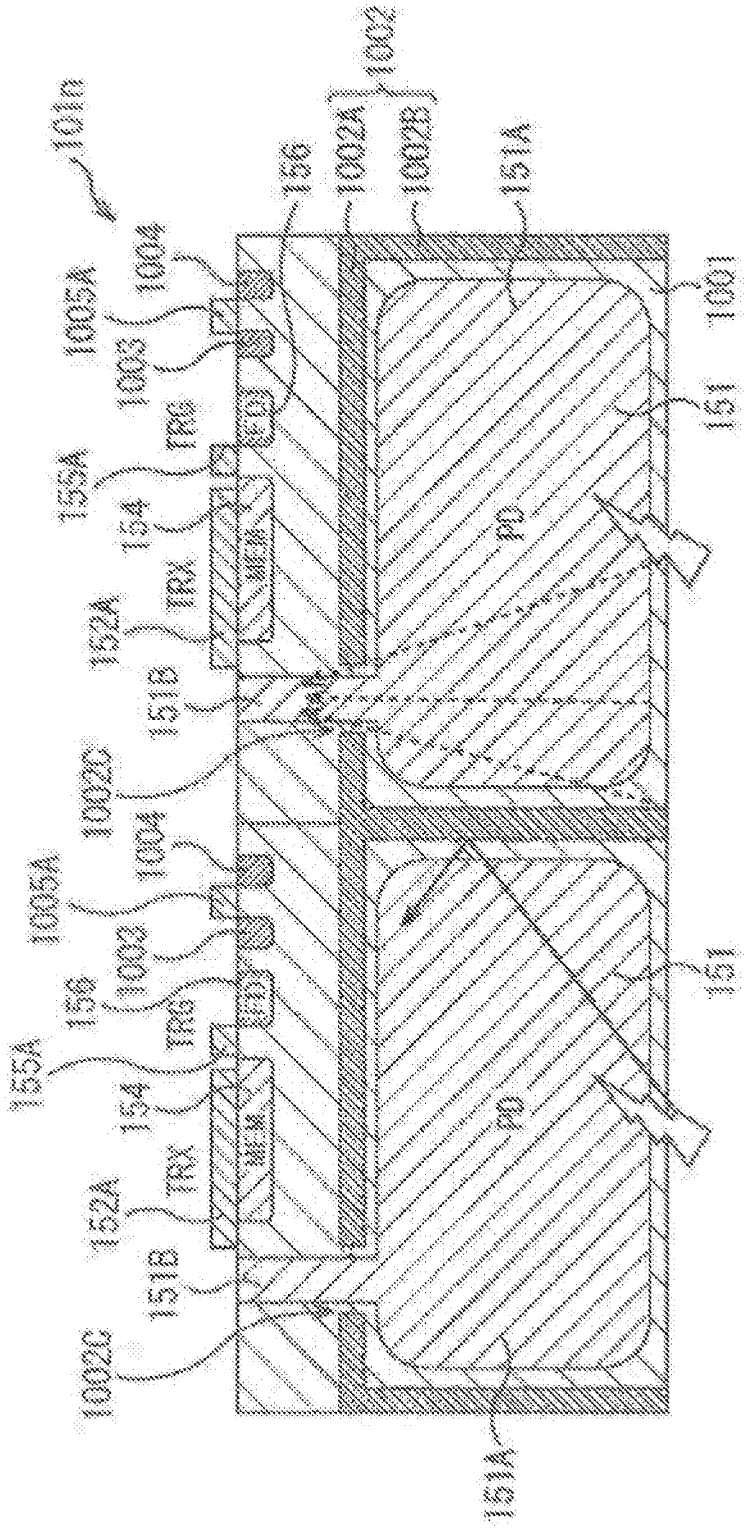

FIG. 141 is a cross-section view schematically illustrating an exemplary configuration of a solid-state image sensing device according to a fourteenth embodiment of the present technology.

Figure 142:
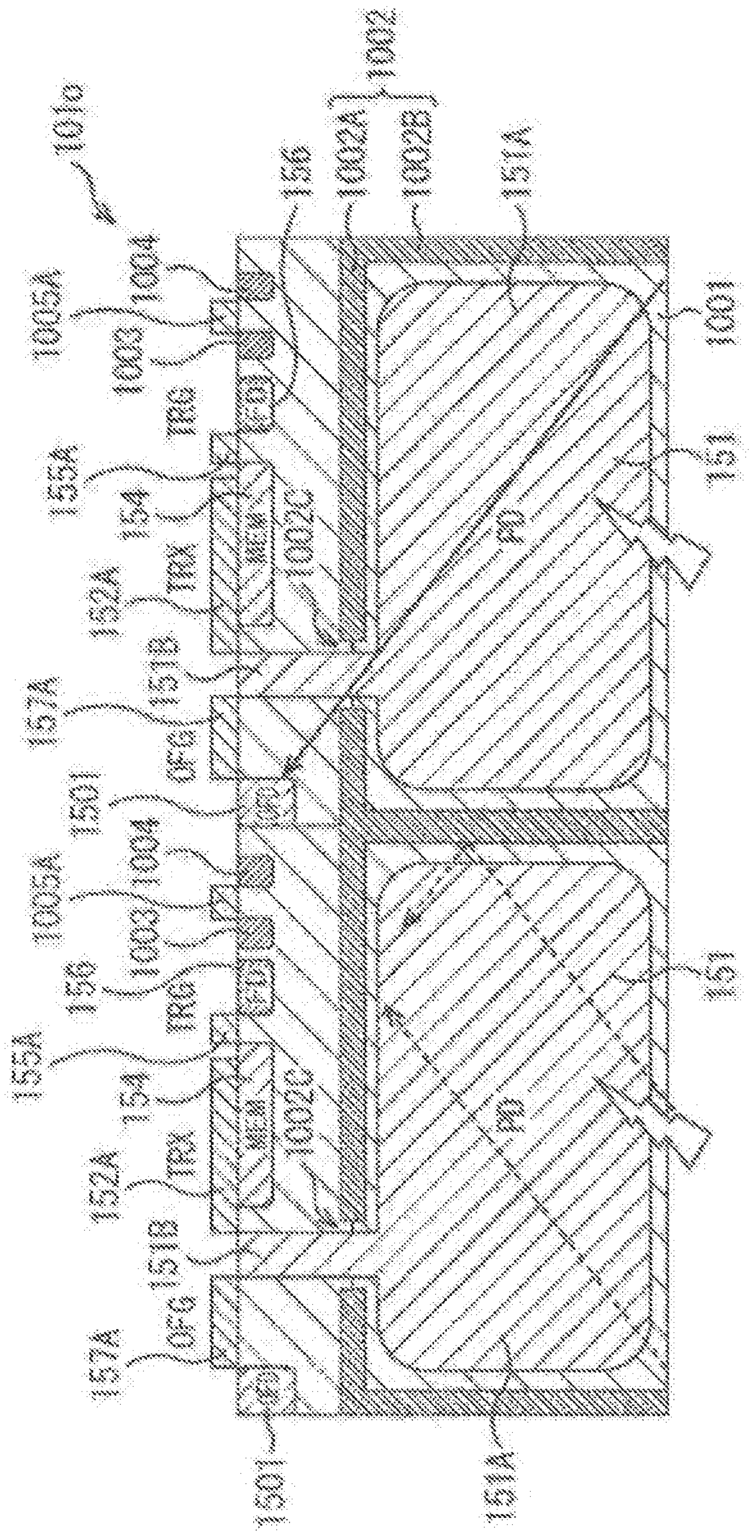

FIG. 142 is a cross-section view schematically illustrating an exemplary configuration of a solid-state image sensing device according to a fifteenth embodiment of the present technology.

Figure 143:
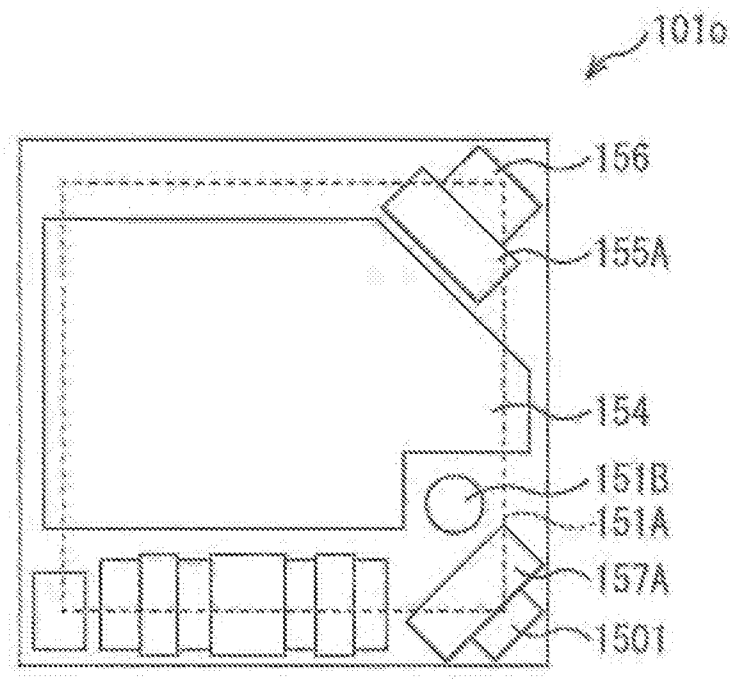

FIG. 143 is a plan view schematically illustrating an exemplary configuration of a device forming surface of the solid-state image sensing device according to the fifteenth embodiment.

Figure 144:
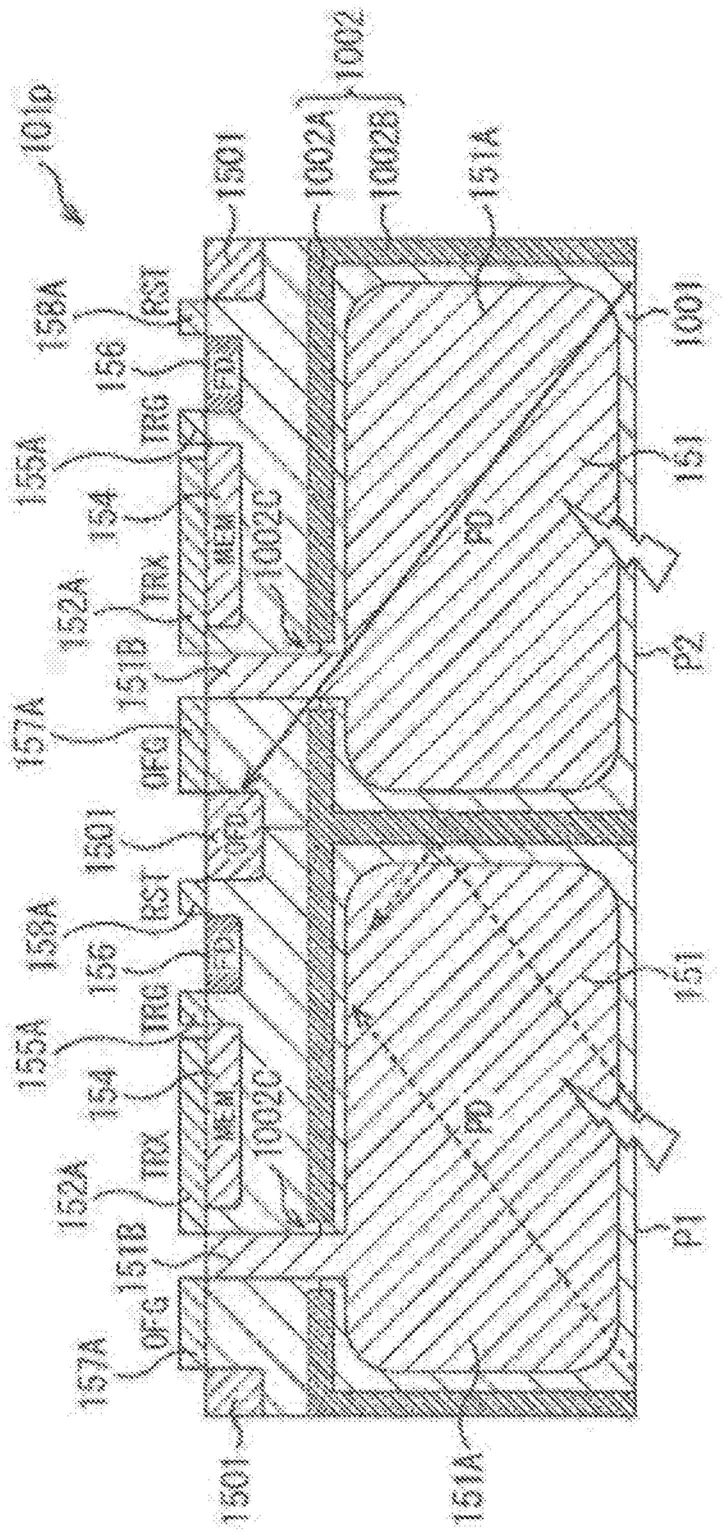

FIG. 144 is a cross-section view schematically illustrating an exemplary configuration of a solid-state image sensing device according to a sixteenth embodiment of the present technology.

Figure 145:
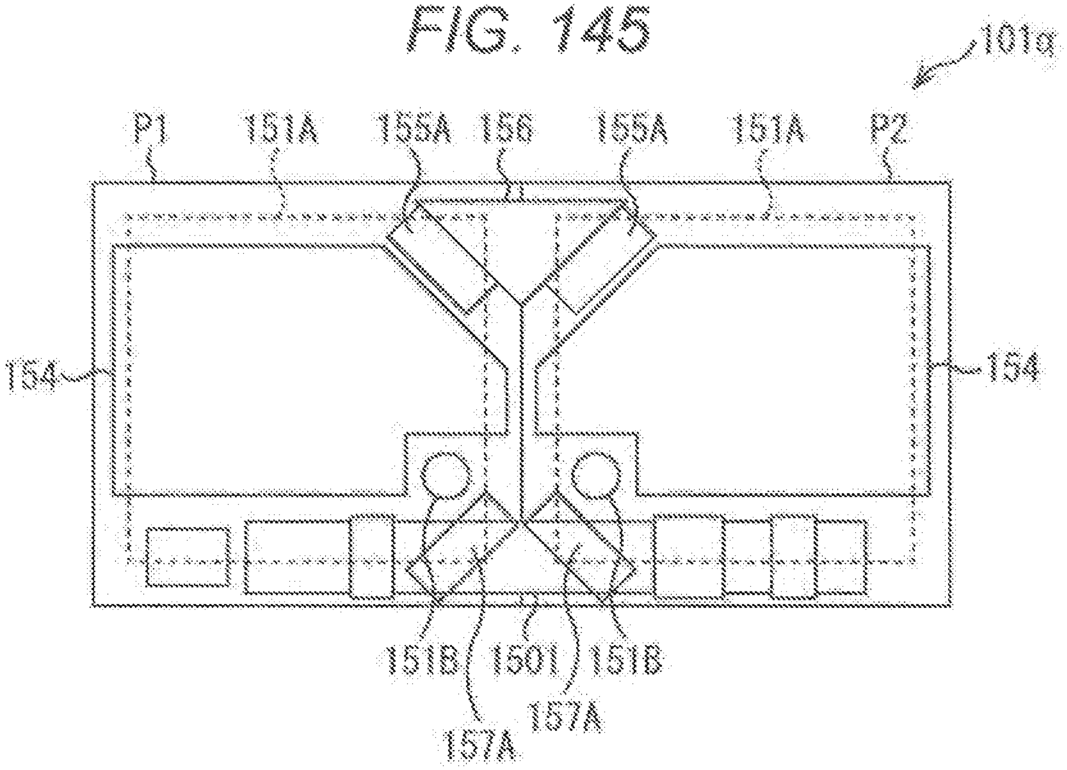

FIG. 145 is a plan view schematically illustrating an exemplary configuration of a device forming surface of a solid-state image sensing device according to a seventeenth embodiment of the present technology.

Figure 146:
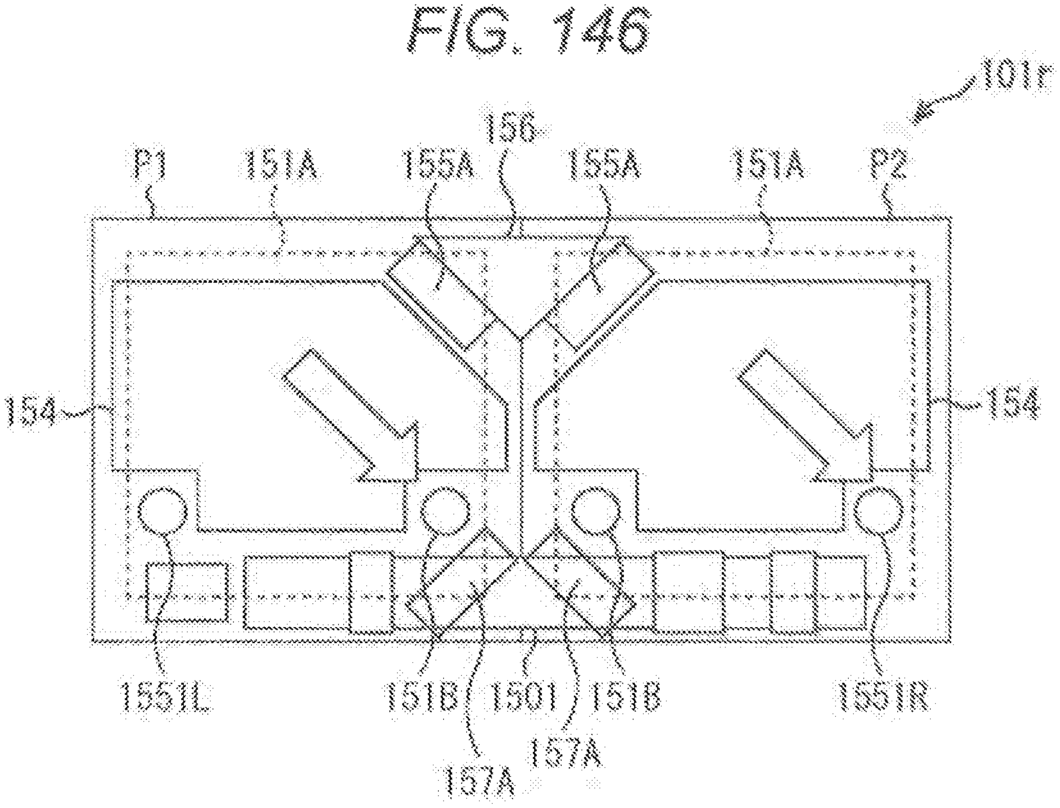

FIG. 146 is a plan view schematically illustrating an exemplary configuration of the device forming surface of the solid-state image sensing device according to the seventeenth embodiment of the present technology.

Figure 147:
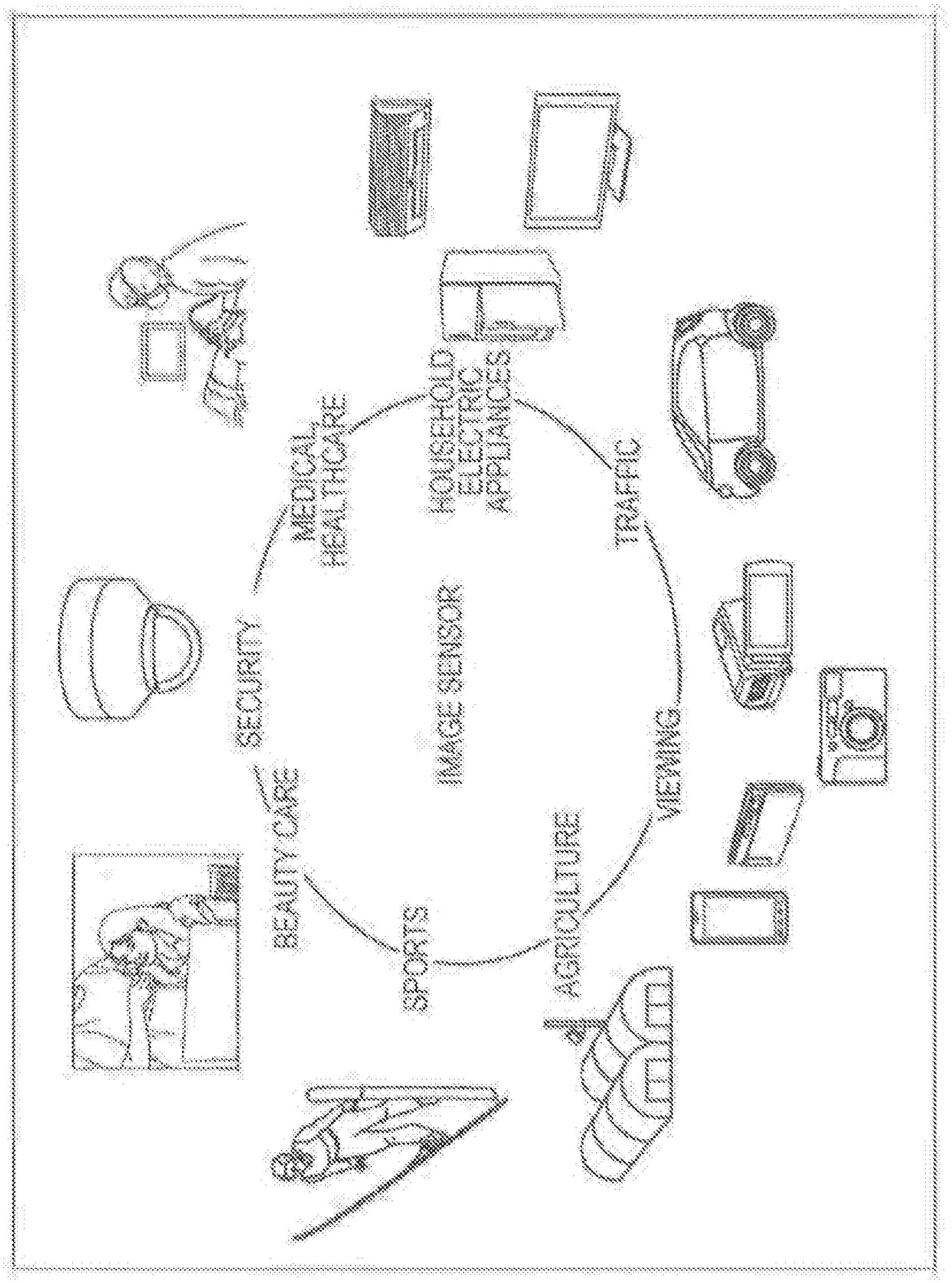

FIG. 147 is a diagram illustrating exemplary use of solid-state image sensing elements.

Figure 148:
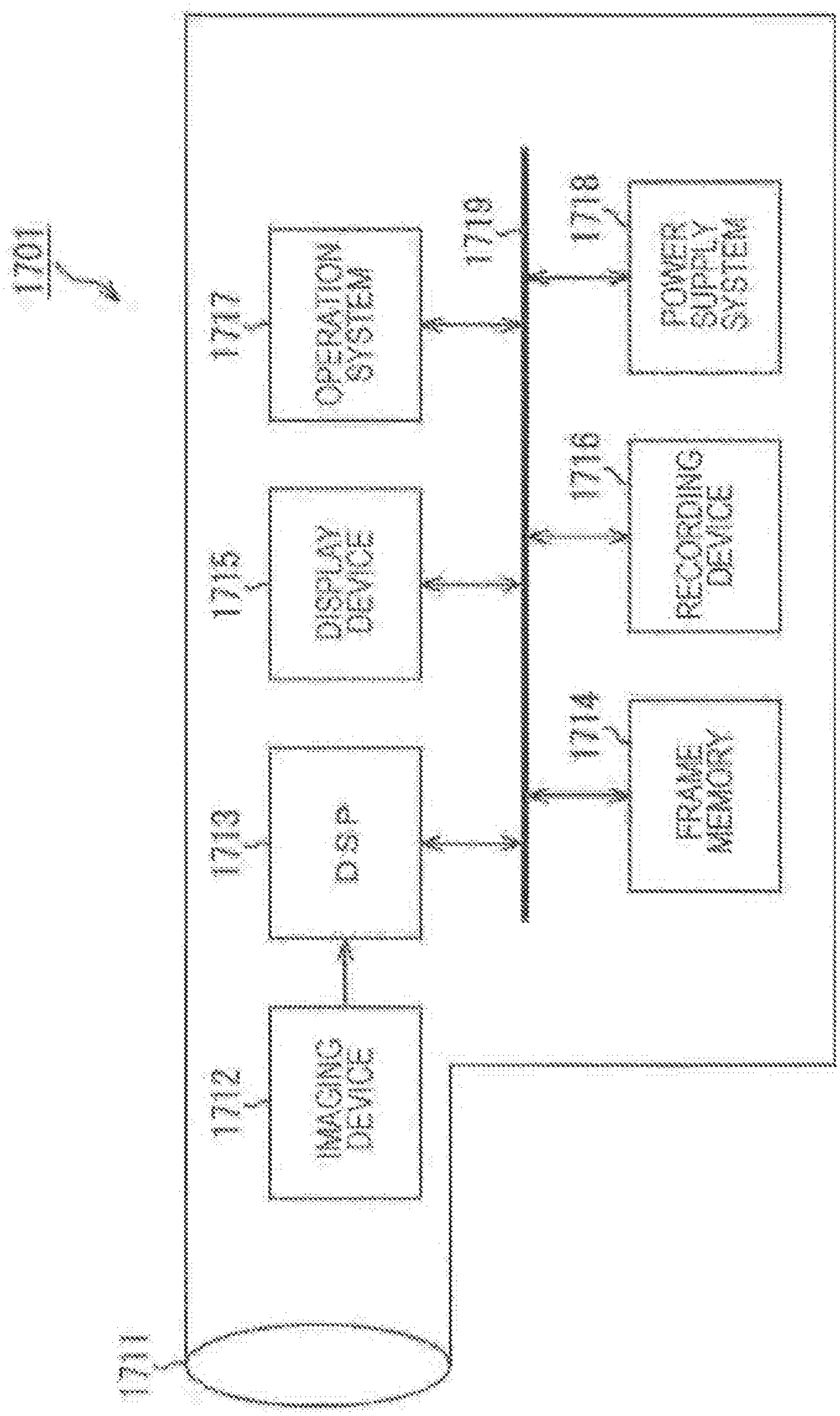

FIG. 148 is a block diagram illustrating an exemplary configuration of an electronic device.

MODE FOR CARRYING OUT THE INVENTION

Modes for carrying out the present technology (which will be called embodiments below) will be described below. Additionally, the description will be made in the following order.

1. First embodiment (first semiconductor substrate and second semiconductor substrate are applied to manufacture solid-state image sensing device)
2. Second embodiment (stopper film is deleted)
3. Third embodiment (light blocking film formed from light receiving surface is added)
4. Fourth embodiment (wiring layer is provided with light blocking film)
5. Fifth embodiment (vertical light blocking part is deleted)
6. Sixth embodiment (cross-section structure is changed)
7. Seventh embodiment (each device is in mesa structure)
8. Eighth embodiment (OFG is in vertical gate structure)
9. Ninth embodiment (pixel array part is provided with pixel ADC processing unit)
10. Tenth embodiment (conductive layer reverse to signal charge covers around light blocking film)
11. Eleventh embodiment (light blocking film is generated in different manufacture methods)
12. Twelfth embodiment (PD is provided with plug extending upward from opening of light blocking film)
13. Thirteenth embodiment (lid is provided at tip of plug of PD)

14. Fourteenth embodiment (plug of PD is closer to vertical light blocking part)
15. Fifteenth embodiment (charge discharging unit is provided where oblique light is incident)
16. Sixteenth embodiment (charge discharging unit is shared by adjacent pixels)
17. Seventeenth embodiment (FD is shared by adjacent pixels)
18. Eighteenth embodiment (dummy opening is provided)
19. Variants
20. Exemplary use of solid-state image sensing devices

1. FIRST EMBODIMENT

A first embodiment of the present technology will be first described with reference to FIG. 1 to FIG. 51.

{Exemplary Configuration of Solid-State Image Sensing Device 101*a*}

Figure 1:
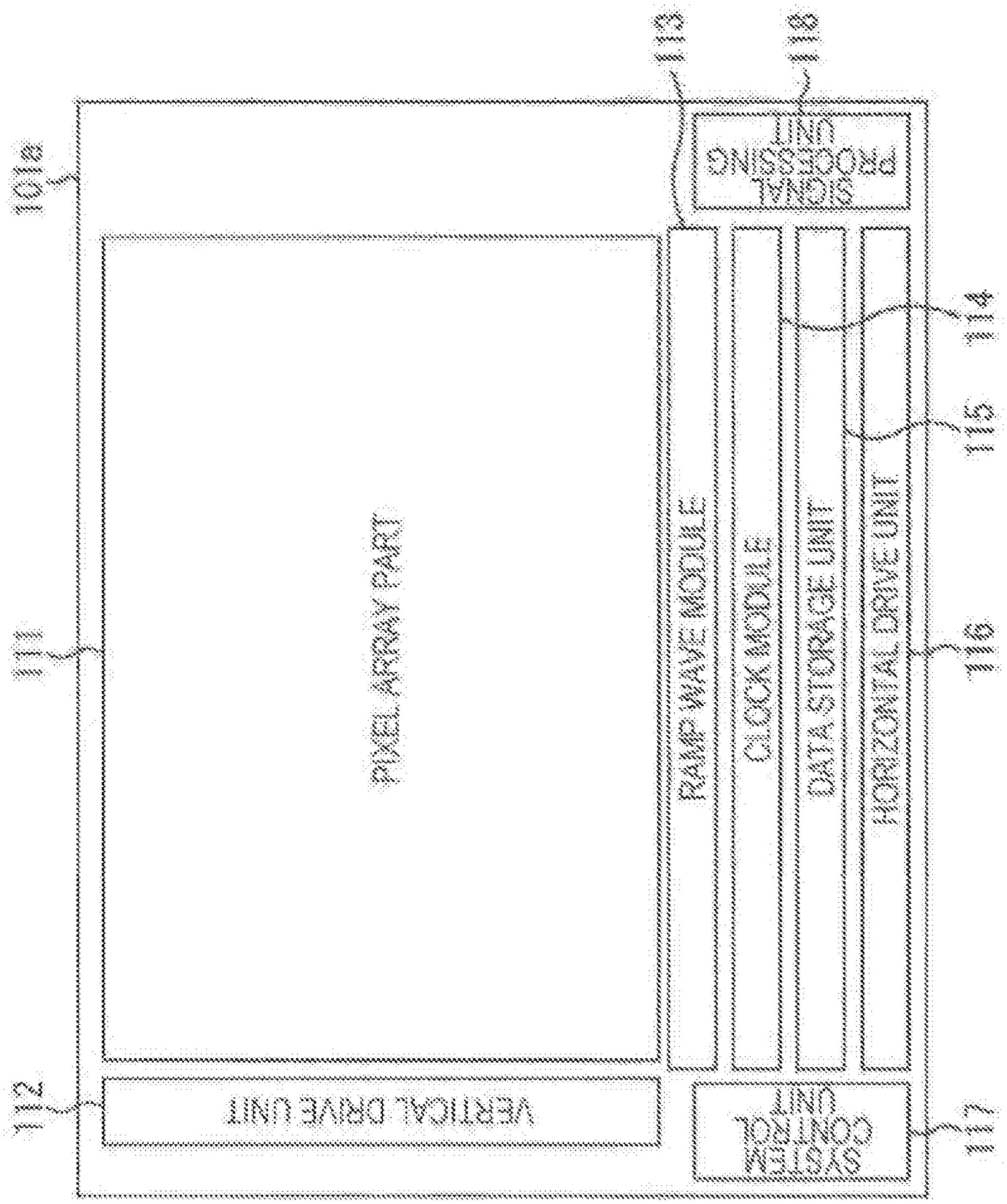
FIG. 1 is a block diagram illustrating an exemplary configuration of the functions of a solid-state image sensing device according to a first embodiment of the present technology.

FIG. 1 is a block diagram illustrating an exemplary configuration of the functions of a solid-state image sensing device 101*a* according to the first embodiment of the present technology.

The solid-state image sensing device 101*a* is a backside irradiation-type image sensor in a global shutter system configured of a complementary metal oxide semiconductor (CMOS) image sensor or the like, for example. The solid-state image sensing device 101*a* receives and photoelectrically converts a light from a subject, and generates an image signal thereby to shoot an image.

The global shutter system is a system for performing global light exposure of starting light exposure at all the pixels basically at the same time and finishing the light exposure at all the pixels at the same time. Here, all the pixels are all of the pixels in a part appearing on an image, and dummy pixels and the like are excluded. Further, the global shutter system includes a system for moving over regions to be subjected to global light exposure while performing global light exposure in units of rows (such as several tens of rows) not at all the pixels at the same time if a temporal difference or image distortion is small enough to be ignored. Further, the global shutter system includes a system for performing global light exposure on pixels in a predetermined region not all the pixels in a part appearing on an image.

The backside irradiation-type image sensor is an image sensor configured such that a photoelectric conversion unit such as photodiode for receiving a light from a subject and converting it into an electric signal is provided between a light receiving surface in which a light from a subject is incident and a wiring layer provided with a wiring of a transistor or the like for driving each pixel.

Additionally, the present technology is not limited to applications to CMOS image sensors.

The solid-state image sensing device 101*a* includes a pixel array part 111, a vertical drive unit 112, a ramp wave module 113, a clock module 114, a data storage unit 115, a horizontal drive unit 116, a system control unit 117, and a signal processing unit 118.

The pixel array part 111 is formed on a semiconductor substrate (not illustrated) in the solid-state image sensing device 101*a*. The surrounding circuits such as the vertical drive unit 112 to the signal processing unit 118 may be formed on the same semiconductor substrate as the pixel array part 111, for example, or may be formed on a logic layer stacked on the semiconductor substrate. Further, for example, some of the surrounding circuits may be formed on the same semiconductor substrate as the pixel array part 111, and the rest of them may be formed on the logic layer.

Additionally, in a case where the surrounding circuits are formed on the same semiconductor substrate as the pixel array part 111, each of the devices such as transistors configuring the surrounding circuits can be in a mesa structure.

The pixel array part 111 is formed of pixels each having a photoelectric conversion device for generating and accumulating charges depending on the amount of light incident from a subject. The pixels (not illustrated) configuring the pixel array part 111 are two-dimensionally arranged in the lateral direction (row direction) and in the longitudinal direction (column direction). For example, in the pixel array part 111, pixel drive lines (not illustrated) are wired in the row direction per row of pixels arranged in the row direction, and vertical signal lines (not illustrated) are wired in the column direction per column of pixels arranged in the column direction.

The vertical drive unit 112 is formed of a shift register, an address decoder, or the like, and supplies a signal or the like to each pixel via the pixel drive lines thereby to drive all the pixels in the pixel array part 111 at the same time or in units of row.

The ramp wave module 113 generates a ramp wave signal used for analog/digital (A/D) converting a pixel signal and supplies it to a column processing unit (not illustrated). Additionally, the column processing unit is configured of a shift register, an address decoder, or the like, for example, and performs a noise cancellation processing, a correlated double sampling processing, an A/D conversion processing, and the like thereby to generate a pixel signal. The column processing unit supplies the generated pixel signal to the signal processing unit 118.

The clock module 114 supplies an operation clock signal to each unit in the solid-state image sensing device 101*a*.

The horizontal drive unit 116 selects a unit circuit corresponding to a column of pixels in the column processing unit in turn. With the selective scanning by the horizontal drive unit 116, a pixel signal, which is processed per unit circuit in the column processing unit, is output to the signal processing unit 118 in turn.

The system control unit 117 is configured of a timing generator for generating various timing signals, or the like. The system control unit 117 drives and controls the vertical drive unit 112, the ramp wave module 113, the clock module 114, the horizontal drive unit 116, and the column processing unit on the basis of the timing signals generated by the timing generator.

The signal processing unit 118 performs a signal processing such as calculation processing on a pixel signal supplied from the column processing unit and outputs an image signal configured of each pixel signal while temporarily storing data in the data storage unit 115 as needed.

{Exemplary Configuration of Pixel}

Figure 2:
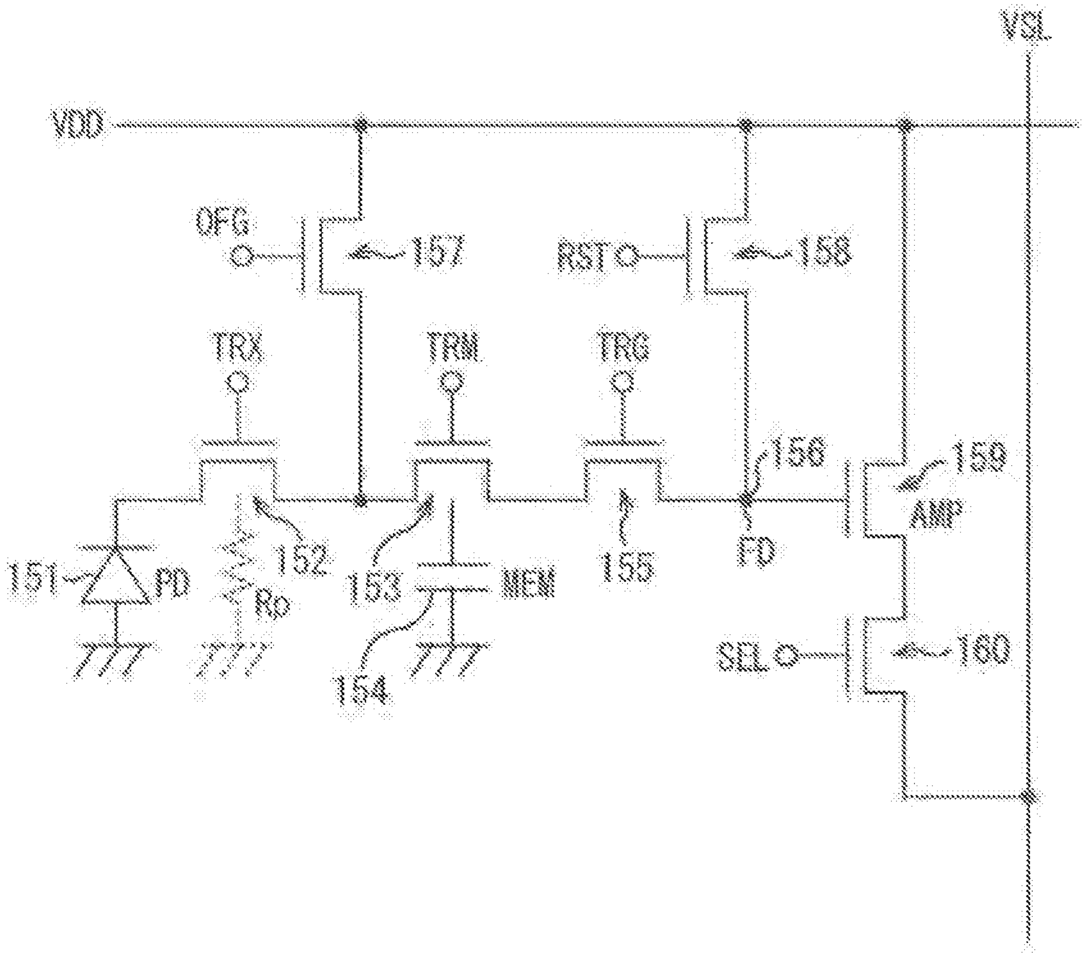
FIG. 2 is a circuit diagram illustrating an exemplary configuration of a pixel in the solid-state image sensing device according to the first embodiment.

An exemplary circuit configuration of pixels formed in the pixel array part 111 in FIG. 1 will be described below with reference to FIG. 2. FIG. 2 illustrates an exemplary circuit configuration of one pixel in the pixel array part 111.

In the example, each of the pixels in the pixel array part 111 includes a photoelectric conversion unit (PD) 151, a first transfer transistor (TRX) 152, a second transfer transistor (TRM) 153, a charge holding unit (MEM) 154, a third transfer transistor (TRG) 155, a charge voltage conversion unit (FD) 156, a discharging transistor (OFG) 157, a reset transistor (RST) 158, an amplification transistor (AMP) 159, and a select transistor (SEL) 160.

Further, in the example, each of the TRX 152, the TRM 153, the TRG 155, the OFG 157, the RST 158, the AMP 159, and the SEL 160 is configured of an N type MOS transistor. Then, the gate electrodes of the TRX 152, the TRM 153, the TRG 155, the OFG 157, the RST 158, and the SEL 160 are supplied with the drive signals TRX, TRM, TRG, OFG, RST, and SEL, respectively. The drive signals are pulse signals which are in the active state (on state) as high level state and in the non-active state (off state) as low level state. Additionally, putting a drive signal in the active state will be denoted below as turning a drive signal on, and putting a drive signal in the non-active state will be denoted below as turning a drive signal off.

The PD 151 is a photoelectric conversion device formed of a PN-junction photodiode, for example, which receives a light from a subject, and generates and accumulates charges depending on the amount of received light by photoelectric conversion.

The TRX 152 is connected between the PD 151 and the TRM 153, and transfers the charges accumulated in the PD 151 to the MEM 154 in response to the drive signal TRX applied to the gate electrode.

Additionally, as described below, at least two semiconductor substrates are applied and a joining interface as the applied surface is formed in a channel of the TRX 152 in the solid-state image sensing device 101*a*. Then, parasitic resistance Rp parallel to the PD 151 is generated on the joining interface in the TRX 152.

The TRM 153 controls a potential of the MEM 154 in response to the drive signal TRM applied to the gate electrode. For example, when the drive signal TRM is turned on and the TRM 153 is turned on, the potential of the MEM 154 is deeper, and when the drive signal TRM is turned off and the TRM 153 is turned off, the potential of the MEM 154 is shallower. Then, for example, when the drive signal TRX and the drive signal TRM are turned on and the TRX 152 and the TRM 153 are turned on, the charges accumulated in the PD 151 are transferred to the MEM 154 via the TRX 152 and the TRM 153.

The MEM 154 is a region for temporarily holding the charges accumulated in the PD 151 in order to realize the global shutter function.

The TRG 155 is connected between the TRM 153 and the FD 156, and transfers the charges held in the MEM 154 to the FD 156 in response to the drive signal TRG applied to the gate electrode. For example, when the drive signal TRM is turned off, the TRM 153 is turned off, the drive signal TRG is turned on, and the TRG 155 is turned on, the charges held in the MEM 154 are transferred to the FD 156 via the TRM 153 and the TRG 155.

The FD 156 is a floating diffusion region for converting the charges transferred from the MEM 154 via the TRG 155 into an electric signal (such as voltage signal), and outputting the electric signal. The FD 156 is connected with the RST 158, and is connected with a vertical signal line VSL via the AMP 159 and the SEL 160.

A drain of the OFG 157 is connected to a power supply VDD, and a source thereof is connected between the TRX 152 and the TRM 153. The OFG 157 initializes (resets) the PD 151 in response to the drive signal OFG applied to the gate electrode. For example, when the drive signal TRX and the drive signal OFG are turned on and the TRX 152 and the OFG 157 are turned on, the potential of the PD 151 is reset at the level of the power supply voltage VDD. That is, the PD 151 is initialized.

Further, the OFG 157 forms an overflow path between the TRX 152 and the power supply VDD, and discharges the charges overflowed from the PD 151 to the power supply VDD.

A drain of the RST 158 is connected to the power supply VDD, and a source thereof is connected to the FD 156. The RST 158 initializes (resets) each region of the MEM 154 to the FD 156 in response to the drive signal RST applied to the gate electrode. For example, when the drive signal TRG and the drive signal RST are turned on and the TRG 155 and the RST 158 are turned on, the potentials of the MEM 154 and the FD 156 are reset at the level of the power supply voltage VDD. That is, the MEM 154 and the FD 156 are initialized.

A gate electrode of the AMP 159 is connected to the FD 156, a drain thereof is connected to the power supply VDD, and the AMP 159 serves as an input unit of a source follower circuit for reading the charges obtained by photoelectric conversion in the PD 151. That is, a source of the AMP 159 is connected to the vertical signal line VSL via the SEL 160 thereby to configure the source follower circuit with a constant current source connected to one end of the vertical signal line VSL.

The SEL 160 is connected between the source of the AMP 159 and the vertical signal line VSL, and the gate electrode of the SEL 160 is supplied with the drive signal SEL as select signal. The SEL 160 is in the conducted state when the drive signal SEL is turned on, and the pixel provided with the SEL 160 is in the selected state. When the pixel enters the selected state, the pixel signal output from the AMP 159 is read by the column processing unit (not illustrated) via the vertical signal line VSL.

Further, in each pixel, the pixel drive lines (not illustrated) are wired per row of pixels, for example. Then, the drive signals TRX, TRM, TRG, OFG, RST, and SEL are supplied from the vertical drive unit 112 via the pixel drive lines to the pixels.

Additionally, the pixel circuit in FIG. 2 is an exemplary pixel circuit usable for the pixel array part 111, and a pixel circuit in other configuration can be employed. Further, the transistors of the RST 158, the AMP 159, and the SEL 160 will be denoted below as pixel transistors.

Figure 3:
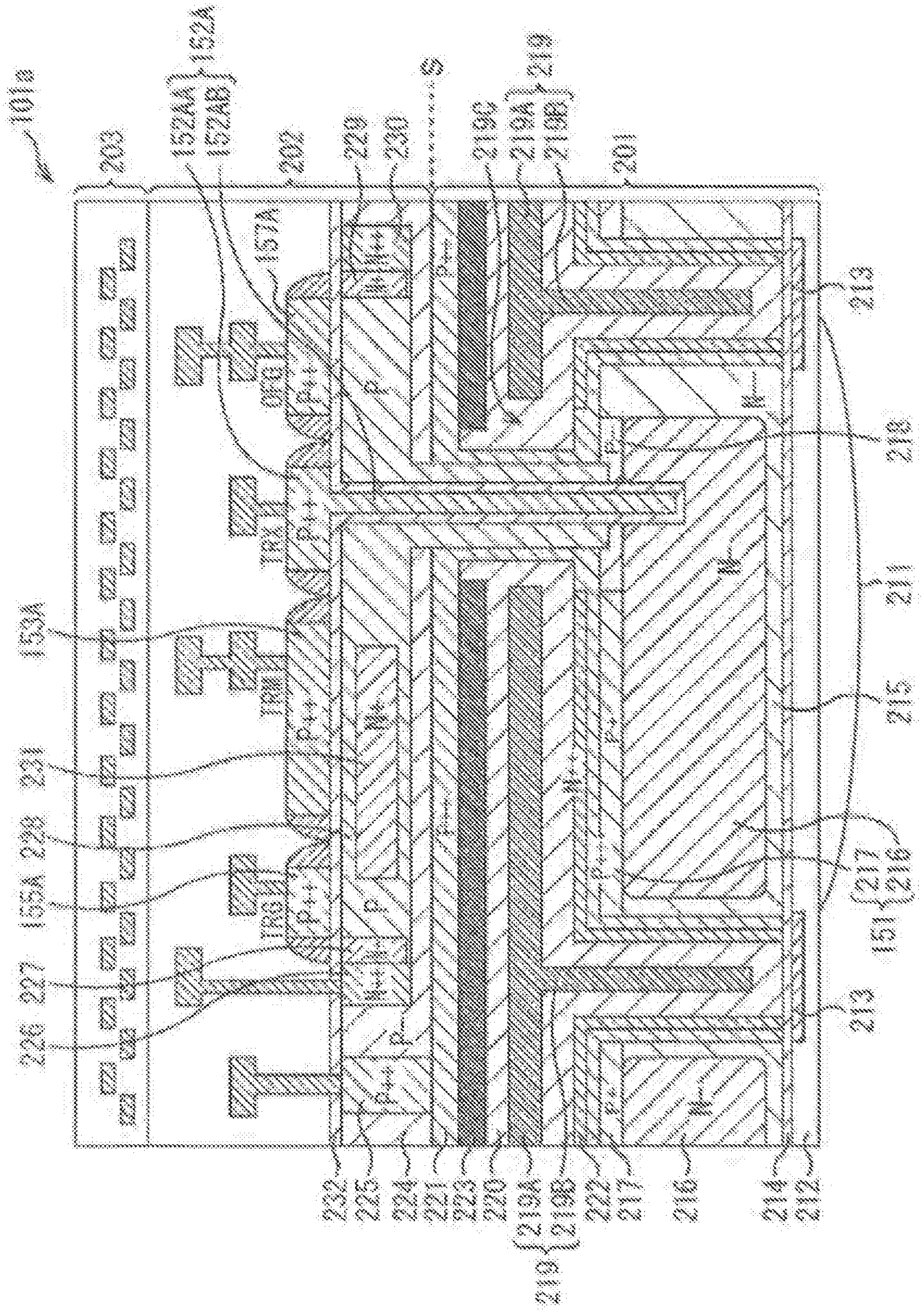
FIG. 3 is a cross-section view schematically illustrating an exemplary configuration of the solid-state image sensing device according to the first embodiment.

FIG. 3 schematically illustrates a cross section of the solid-state image sensing device 101*a* in FIG. 1. FIG. 3 illustrates a cross section of a part including one pixel in the solid-state image sensing device 101*a*, but other pixels basically have the same configuration.

Additionally, the symbols "P" and "N" in the Figure indicate a P type semiconductor region and an N type semiconductor region, respectively. Further, "+" and "−" at the ends of the symbols "P++," "P+," "P−," "P−−" as well as "N++," "N+," "N−," "N−−" indicate the concentrations of impurities in a P type semiconductor region and an N type semiconductor region, respectively. A larger number of "+" indicate a higher impurity concentration, and a larger number of "−" indicate a lower impurity concentration. This is applicable to the following Figures.

Further, the lower side in FIG. 3 is assumed as light receiving surface of the solid-state image sensing device 101*a*. In the following, the upward direction in FIG. 3 is assumed as the upper side or top side of the solid-state image sensing device 101*a*, and the downward direction is assumed as the lower side or bottom side of the solid-state image sensing device 101*a*. Further, in the following, the lower surface of each layer in the solid-state image sensing device 101*a* will be denoted as backside or lower surface, and the upper surface of each layer thereof will be denoted as surface or upper surface.

The solid-state image sensing device 101_a_ is in a three-layer structure in which a first semiconductor substrate 201, a second semiconductor substrate 202, and a logic layer 203 are stacked.

An insulative film 214, a planarizing film 212, and a micro lens 211 are stacked on the lower surface of an N−− type semiconductor region 215 in the first semiconductor substrate 201.

An N− type semiconductor region 216 is formed above the micro lens 211 inside the N−− type semiconductor region 215. A P+ type semiconductor region 217 is stacked on the N− type semiconductor region 216. The hole-accumulation diode (HAD, registered trademark) type PD 151 is configured of the N− type semiconductor region 216 and the P+ type semiconductor region 217.

A light incident in the light receiving surface of the solid-state image sensing device 101_a_ is photoelectrically converted by the PD 151, and the charges generated by the photoelectric conversion are accumulated in the N− type semiconductor region 216.

A P− type semiconductor region 218 is formed around a part where a vertical terminal (electrode) part 152AB of a gate terminal (electrode) 152A of the TRX 152 is inserted above the N− type semiconductor region 216.

A light blocking film 213 is formed between the PDs 151 (the N− type semiconductor region 216 and the P+ type semiconductor region 217) in adjacent pixels on the lower surface of the insulative film 214. The light blocking film 213 is arranged to extend over a plurality of pixels in the column direction between columns of pixels adjacent in the row direction in the pixel array part 111, for example. Further, the light blocking film 213 is arranged to extend over a plurality of pixels in the row direction between rows of pixels adjacent in the column direction in the pixel array part 111, for example.

Further, the upper surfaces and the side surfaces of the PDs 151 (the N− type semiconductor region 216 and the P+ type semiconductor region 217) are surrounded by a light blocking film 219. More specifically, the light blocking film 219 is configured of a horizontal light blocking part 219A and a vertical light blocking part 219B.

The horizontal light blocking part 219A has a planar shape parallel to the light receiving surface of the solid-state image sensing device 101_a_. The horizontal light blocking part 219A covers the top surfaces of the N− type semiconductor region 216 and the P+ type semiconductor region 217 configuring the PD 151 except an opening 219C. Further, the horizontal light blocking part 219A is arranged over the entire region of the pixel array part 111 except the opening 219C in each pixel like a horizontal light blocking part 804A according to a tenth embodiment described below with reference to FIG. 75.

The vertical light blocking part 219B has a wall shape vertical to the light receiving surface of the solid-state image sensing device 101_a_. The vertical light blocking part 219B is formed to surround the side surfaces of the N− type semiconductor region 216 and the P+ type semiconductor region 217 configuring the PD 151. Further, the vertical light blocking part 219B is arranged to extend over a plurality of pixels in the column direction between columns of pixels adjacent in the row direction in the pixel array part 111 like a vertical light blocking part 804B according to the tenth embodiment described below with reference to FIG. 74. Further, the vertical light blocking part 219B is arranged to extend over a plurality of pixels in the row direction between rows of pixels adjacent in the column direction in the pixel array part 111 like the vertical light blocking part 804B according to the tenth embodiment described below with reference to FIG. 74.

The opening 219C is provided for inserting the vertical terminal (electrode) part 152AB of the gate terminal (electrode) 152A of the TRX 152 into the N− type semiconductor region 216 and transferring the charges accumulated in the N− type semiconductor region 216 to an N+ type semiconductor region 231.

A light, which is not absorbed in the PD 151 and passes therethrough, is reflected on the horizontal light blocking part 219A, and is prevented from invading in an upper layer than the horizontal light blocking part 219A. Thereby, for example, the charges generated by the light passing through the PD 151 are prevented from invading in the N+ type semiconductor region 231 configuring the MEM 154 or an N++ type semiconductor region 230 configuring the FD 156, and a noise is prevented from occurring. Further, the vertical light blocking part 219B prevents a light incident from an adjacent pixel from leaking into the PD 151, and a noise such as mixed color from occurring.

The light blocking film 213 limits an oblique light incident in the PD 151 (the N− type semiconductor region 216). Additionally, the opening 219C is desirably as small as possible to prevent a light passing through the PD 151 from passing. Further, the opening 219C is desirably arranged at an end of the pixel (near the vertical light blocking part 219B) in order to prevent an oblique light with a large incident angle from passing.

The light blocking film 213 and the light blocking film 219 are made of a material containing specific metal, metal alloy, metal nitride, or metal silicide, for example. The light blocking film 219 is made of tungsten (W), titanium (Ti), tantalum (Ta), nickel (Ni), molybdenum (Mo), chromium (Cr), iridium (Ir), platiniridium, titanium nitride (TiN), tungsten silicon compound, or the like, for example. Additionally, the materials making the light blocking film 213 and the light blocking film 219 are not limited thereto. For example, a substance with a light blocking property other than metals may be employed.

The light blocking film 219 is covered with an insulative film 220. The insulative film 220 is made of a silicon oxide film (SiO), for example. The insulative film 220 is covered with a P++ type semiconductor region 221. An N++ type semiconductor region 222 is formed between the insulative film 220 and the P++ type semiconductor region 221 on the lower surface of the horizontal light blocking part 219A and around the vertical light blocking part 219B. A gettering effect is caused by the N++ type semiconductor region 222. A stopper film 223 is formed between the insulative film 220 and the P++ type semiconductor region 221 above the horizontal light blocking part 219A. The stopper film 223 is made of a SiN film or SiCN film, for example.

The gate terminal (electrode) 152A of the TRX 152, the gate terminal (electrode) 153A of the TRM 153, the gate terminal (electrode) 155A of the TRG 155, and the gate terminal (electrode) 157A of the OFG 157 are formed on the upper surface of a P− type semiconductor region 224 in the second semiconductor substrate 202 via an insulative film 232. The gate terminals (electrodes) 153A, 155A, and 157A are arranged above the horizontal light blocking part 219A, and the gate terminal (electrode) 152A is arranged above the opening 219C of the light blocking film 219.

Additionally, there is illustrated in the Figure an example in which each device of the transistors and the like configuring a pixel in the solid-state image sensing device 101_a_ is planar. The planar structure is employed so that terminal electrodes can be formed on the same plane and a current path can be shortened.

The TRX 152 is in a vertical gate structure in which the gate terminal (electrode) 152A is configured of a horizontal terminal (electrode) part 152AA and the vertical terminal (electrode) part 152AB. The horizontal terminal (electrode) part 152AA is parallel to the horizontal light blocking part 219A and is formed on the upper surface of the P− type semiconductor region 224 via the insulative film 232 like the gate terminals (electrodes) of other transistors. The vertical terminal (electrode) part 152AB is vertical to the horizontal light blocking part 219A and extends vertically downward from the horizontal terminal (electrode) part 152AA. The vertical terminal (electrode) part 152AB then penetrates through the second semiconductor substrate 202 from the side closer to the N+ type semiconductor region 231 (the MEM 154) than to the horizontal light blocking part 219A, and extends into the N− type semiconductor region 216 via the opening 219C of the light blocking film 219. Further, the vertical terminal (electrode) part 152AB is covered with the insulative film 232. Therefore, the gate terminal (electrode) 152A contacts the N− type semiconductor region 216 via the insulative film 232.

Additionally, FIG. 3 illustrates an example in which a cross section of the gate terminal (electrode) 152A is T-shaped, but the shape of the gate terminal (electrode) 152A is not limited to the example. For example, the cross section of the gate terminal (electrode) 152A may be L-shaped. Further, the shape of the gate terminal (electrode) 152A viewed from above may be donut-shaped or C-shaped to surround the channel.

Further, though not illustrated, the gate terminal (electrode) of the RST 158 is formed between a P++ type semiconductor region 225 and an N++ type semiconductor region 226 on the upper surface of the P− type semiconductor region 224 via the insulative film 232. Further, a sidewall is formed on the side surface of each gate terminal (electrode).

Additionally, a surface on which the gate terminal (electrode) and the like of each transistor configuring a pixel in the solid-state image sensing device 101*a* are formed (such as the upper surface of the P− type semiconductor region 224) will be denoted below as device forming surface.

The P++ type semiconductor region 225, the N++ type semiconductor region 226, an N+ type semiconductor region 227, a P type semiconductor region 228, an N+ type semiconductor region 229, and the N++ type semiconductor region 230 are formed near the surface of the P− type semiconductor region 224 in the second semiconductor substrate 202 above the horizontal light blocking part 219A.

The P++ type semiconductor region 225 is arranged on the left of the gate terminal (electrode) of the RST 158 (not illustrated) thereby to configure a charge discharging unit.

The N++ type semiconductor region 226 is arranged on the left of the gate terminal (electrode) 155A of the TRG 155 thereby to configure the FD 156.

The N+ type semiconductor region 227 is arranged on the left of the gate terminal (electrode) 155A of the TRG 155 and adjacently on the right of the N++ type semiconductor region 226.

The P type semiconductor region 228 spreads from around the left side of the gate terminal (electrode) 155A of the TRG 155 toward around the right side of the gate terminal (electrode) 157A of the OFG 157. Further, the P type semiconductor region 228 surrounds the vertical terminal (electrode) part 152AB of the TRX 152 except the tip thereof via the insulative film 232.

The N+ type semiconductor region 229 is arranged on the right of the gate terminal (electrode) 157A of the OFG 157.

The N++ type semiconductor region 230 is arranged adjacently on the right of the N+ type semiconductor region 229 thereby to configure the charge discharging unit.

The N+ type semiconductor region 231 is formed inside the P type semiconductor region 228 above the horizontal light blocking part 219A. The N+ type semiconductor region 231 spreads from around the left end of the gate terminal (electrode) 155A toward around the right end of the gate terminal (electrode) 153A. The horizontal light blocking part 219A is arranged between the N+ type semiconductor region 231 and the upper surface (opposite surface to the light receiving surface) of the N− type semiconductor region. The N+ type semiconductor region 231 configures the HAD-type MEM 154.

A wiring layer, an interlayer insulative film, and the like are formed between the insulative film 232 in the second semiconductor substrate 202 and the logic layer 203.

Each surrounding circuit in the solid-state image sensing device 101*a* is arranged on either the second semiconductor substrate 202 or the logic layer 203, for example. In a case where a surrounding circuit is formed on the second semiconductor substrate 202, each device configuring the surrounding circuit is formed in a mesa structure on the device forming surface of the second semiconductor substrate 202, for example.

Additionally, only the wirings for the surrounding circuits in horizontally-long rectangles are illustrated in the logic layer 203 in FIG. 3.

Here, the first semiconductor substrate 201 and the second semiconductor substrate 202 are applied to each other and an applied surface between the two substrates is assumed as joining interface S in the solid-state image sensing device 101*a*.

Figure 4:
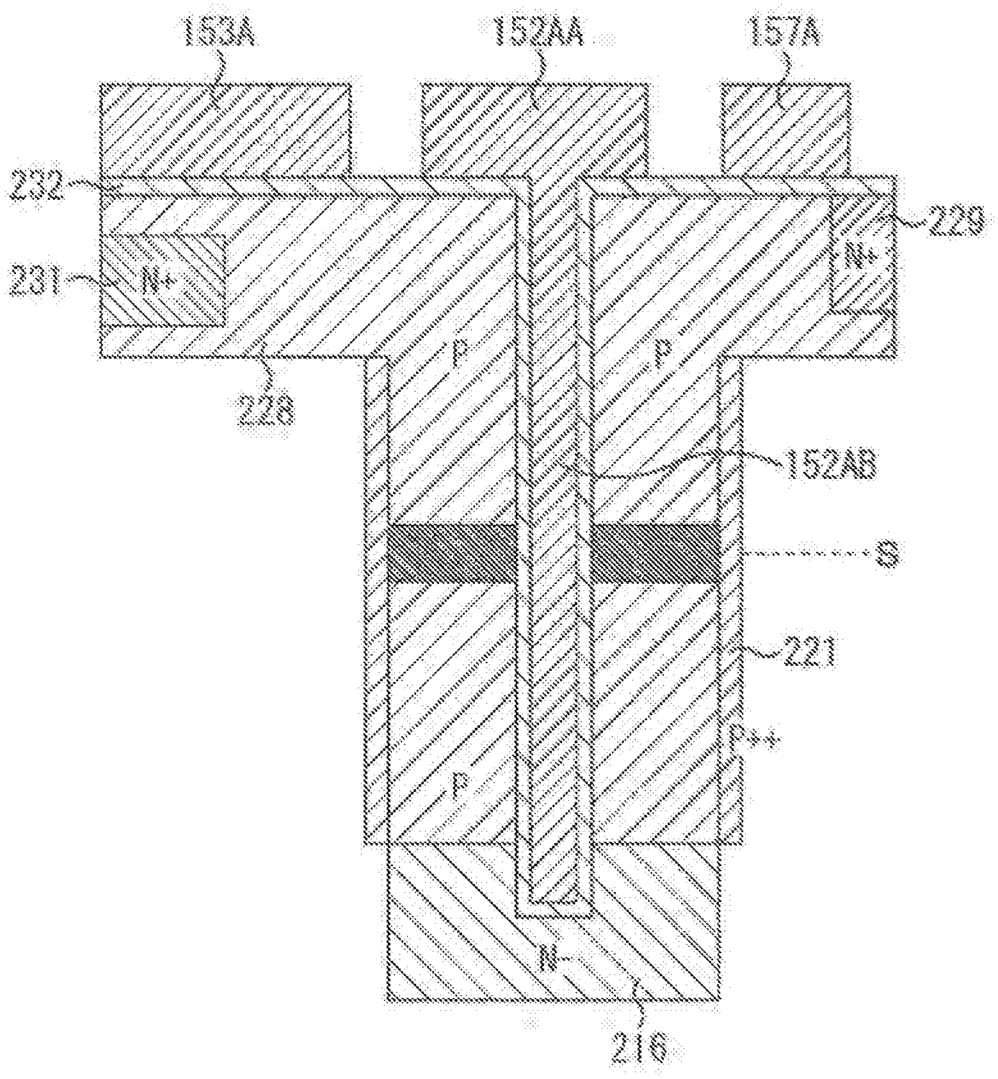
FIG. 4 is an enlarged diagram of a configuration around a TRX.

FIG. 4 is an enlarged diagram of the configuration around the TRX 152 in FIG. 3. A source end of the TRX 152 is part of the N− type semiconductor region 216 contacting the lower end of the vertical terminal (electrode) part 152AB via the insulative film 232, and a drain end thereof is around immediately below the left end of the horizontal terminal (electrode) part 152AA of the P type semiconductor region 228. The channel of the TRX 152 is then formed between the source end and the drain end of the gate terminal (electrode) 152A, and the joining interface S is formed in the channel of the TRX 152 as illustrated in FIG. 4.

Therefore, the joining interface S is vertical to a direction of current flowing between the source and the drain of the TRX 152. Further, the joining interface S can be arbitrarily set at a position in the vertical direction in the Figure. Thus, a distance between the joining interface S and the drain end of the TRX 152 can be adjusted. Further, a distance between the joining interface S and the drain end of the TRX 152 can be made identical for all the pixels in the solid-state image sensing device 101*a*.

Incidentally, a band gap is caused in the joining interface S, which easily prevents transfer of charges. Further, a crystalline direction changes around the joining interface S, and a crystal grain boundary occurs. A new lattice defect may be formed in crystal at the crystal grain boundary, and a lattice defect concentration is higher around the crystal grain boundary. Thus, the electric field is higher and hot carriers easily occur around the joining interface S, which easily causes a deterioration in transistor performance.

Figure 5:
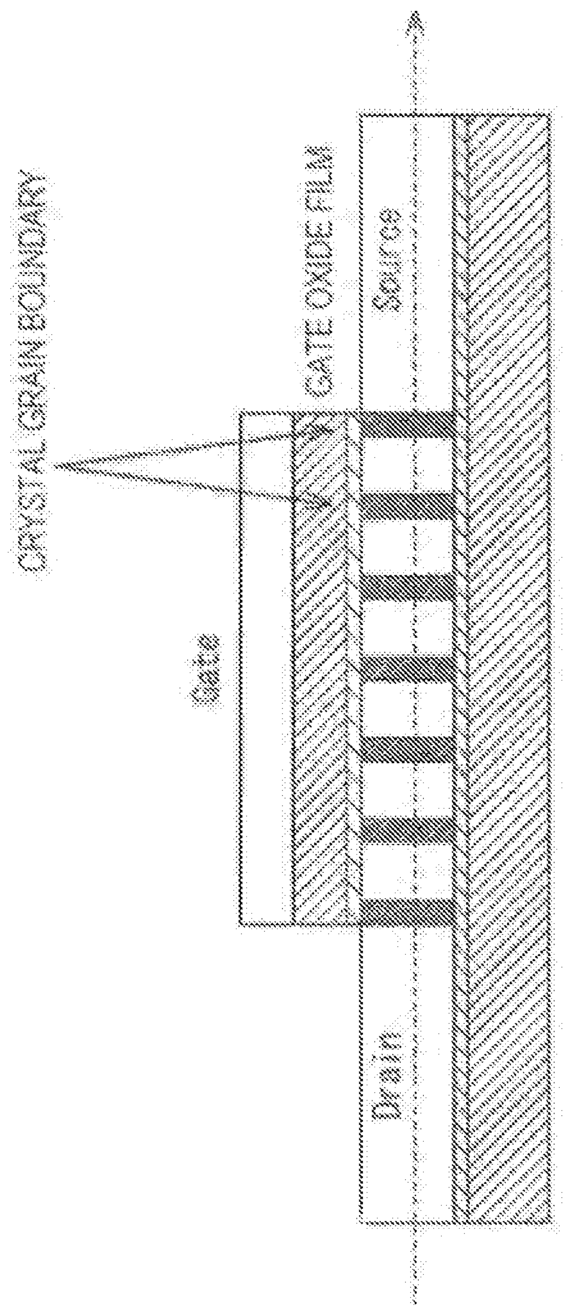
FIG. 5 is a diagram for explaining the positions of crystal grain boundaries of a polysilicon thin film transistor (TFT).

FIG. 5 is a diagram for explaining crystal grain boundaries on the joining interface, and effects of their electric property, and for explaining a position of a polysilicon thin film transistor (TFT) crystal grain boundary. As illustrated, a crystal grain boundary is positioned between a drain and a source.

Figure 6:
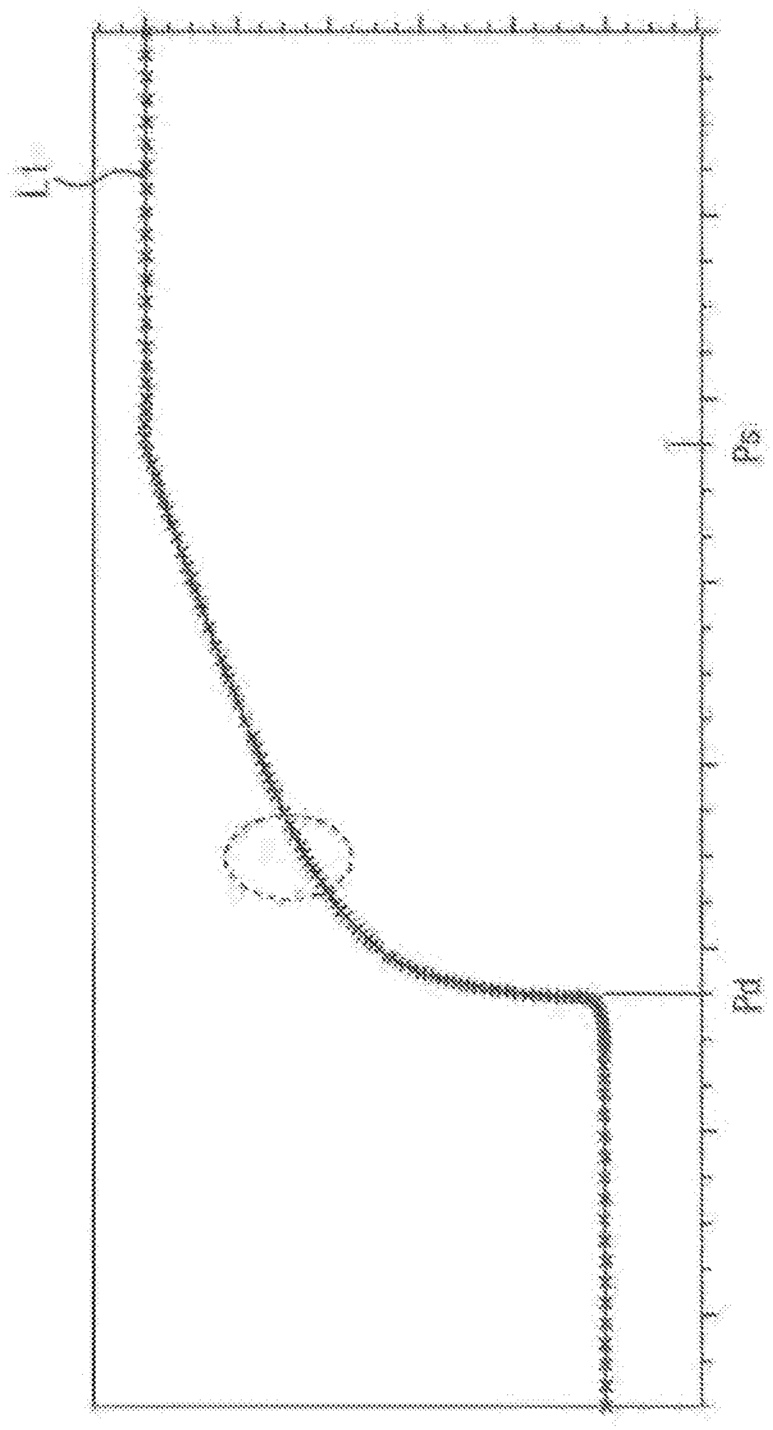
FIG. 6 is a diagram for explaining a potential barrier at a position in a channel of the TFT.

FIG. 6 is a diagram for explaining a potential barrier at a position in a polysilicon thin film transistor (TFT) channel. The horizontal axis indicates a position in the TFT channel, the vertical axis indicates a potential, and potentials depending on a position in the channel are indicated by line L1. Additionally, Pd on the horizontal axis indicates a position of the drain end of the channel, and Ps indicates a position of the source end of the channel.

If a position with a higher potential than the potential of the source end is present in the channel, charges cannot be transferred from the source to the drain. Further, if the potential is higher at any position in the channel, a trap is formed and the charge transfer performance easily deteriorates.

As illustrated in FIG. 6, the potential of the source end of the channel is high, and the potential of the drain end is low. Thus, in a case where a joining interface is formed in the TFT channel, it is desirably formed near the drain end. This is because even if a joining interface is formed near the drain end and the potential of the drain end is high, the potential is much lower than the potential of the source end, and is less influential to the charge transfer performance. That is, in a case where a joining interface is formed in the TFT channel, the joining interface is ideally formed in an oval in a dotted line in FIG. 6.

Figure 7:
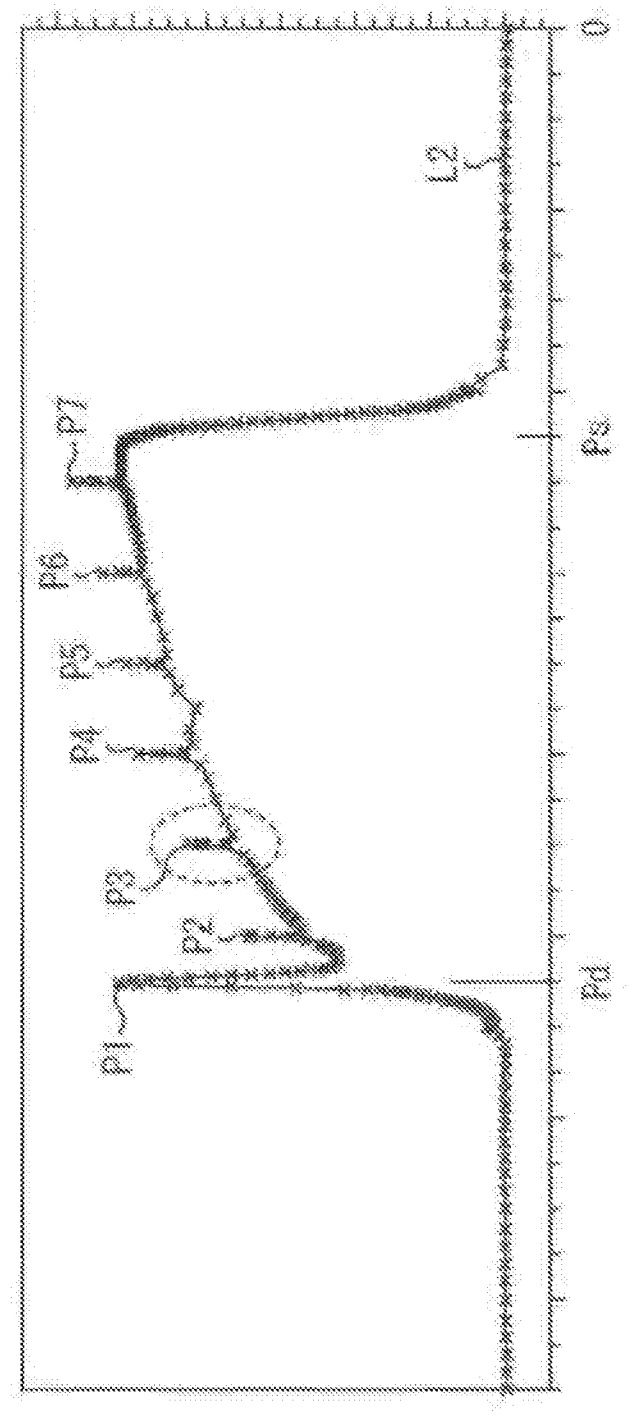
FIG. 7 is a diagram for explaining a change in electric field at each position in the channel of the TFT.

FIG. 7 is a diagram for explaining a change in electric field at each position in the TFT channel. In the Figure, the horizontal axis indicates a position in the TFT channel, the vertical axis indicates a magnitude of the electric field, and the magnitudes of the electric field depending on a position in the channel are indicated by line L2. Additionally, Pd on the horizontal axis in the Figure indicates a position of the drain end of the channel, and Ps indicates a position of the source end of the channel. As illustrated, peak P1 to peak P7 are formed on line L2.

As illustrated in FIG. 7, peak P1 is assumed to be high, and peak P2 to peak P7 are assumed to be lower than peak P1. That is, when a joining interface is formed at the drain end (position Pd on the horizontal axis), the electric field in the channel is remarkably higher at the part. In this way, when the electric field in the channel is remarkably higher, a hot carrier occurs, which has adverse effects on life of devices or resistance of gate oxide film.

Thus, in a case where a joining interface is formed in the TFT channel, the joining interface is desirably formed near the drain end (near peak P3 in the Figure) while the drain end (peak P1 in the Figure) is avoided. That is, in a case where a joining interface is formed in the TFT channel, the joining interface is ideally formed in an oval in a dotted line in FIG. 7.

Thus, the joining interface S is formed near the drain end of the TRX 152 in the solid-state image sensing device 101*a*. The joining interface S is formed substantially closer to the drain end of the TRX 152 than to the source end thereof.

Figure 8:
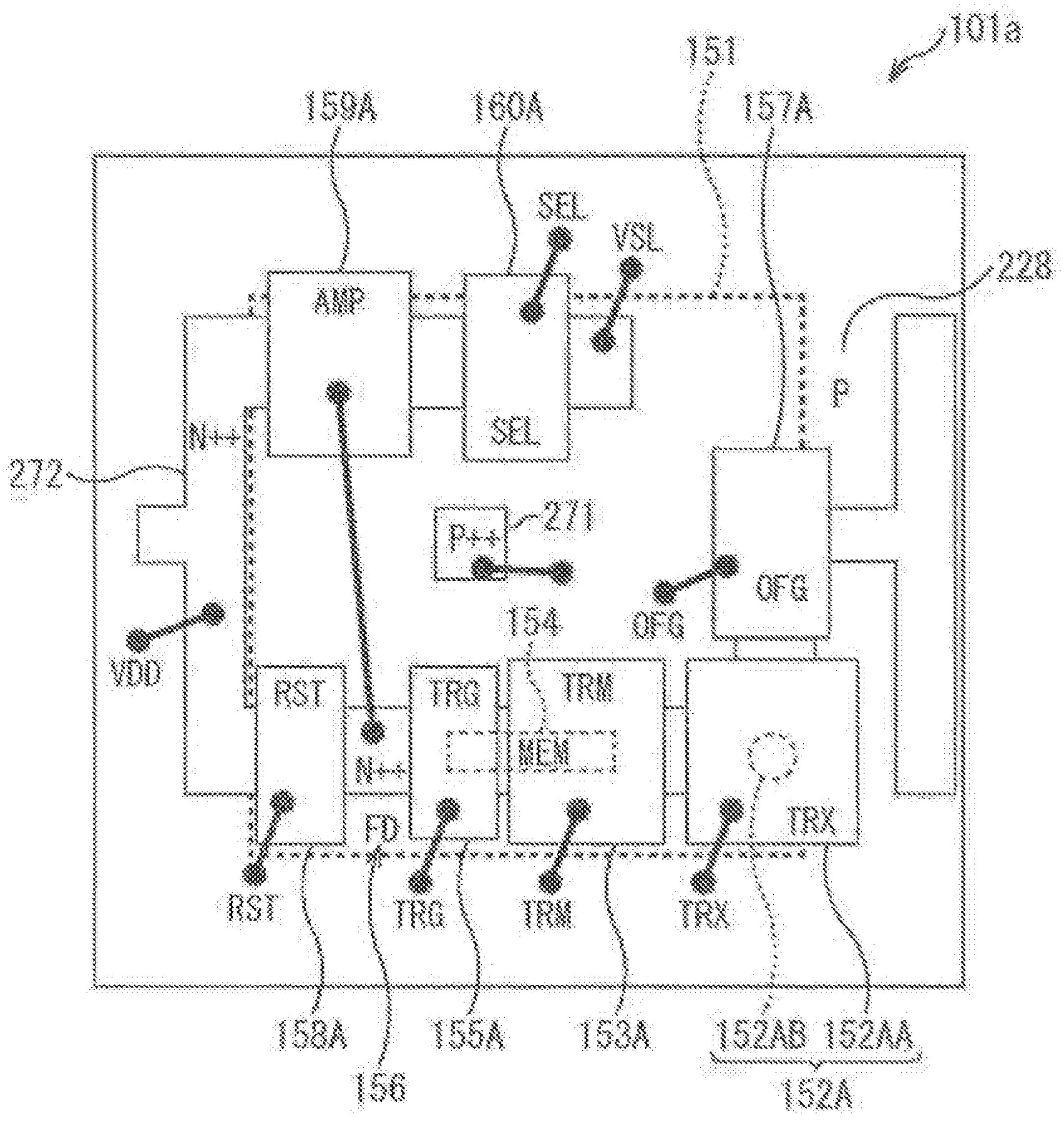
FIG. 8 is a plan view schematically illustrating an exemplary configuration of a device forming surface of the solid-state image sensing device according to the first embodiment.

FIG. 8 is a plan view schematically illustrating an exemplary configuration of the device forming surface of the second semiconductor substrate 202 in the solid-state image sensing device 101*a*. A region for one pixel in the solid-state image sensing device 101*a* is illustrated in the Figure. A square in a dotted line in the Figure indicates a position of the light receiving surface (the lower surface of the N− type semiconductor region 216) of the PD 151. Further, a circle in a dotted line in the Figure indicates a position of the vertical terminal (electrode) part 152AB of the TRX 152.

The gate terminal (electrode) 152A of the TRX 152, the gate terminal (electrode) 153A of the TRM 153, the gate terminal (electrode) 155A of the TRG 155, and the gate terminal (electrode) 158A of the RST 158 are arranged in line in the lateral direction in the Figure. The gate terminal (electrode) 159A of the AMP 159 and the gate terminal (electrode) 160A of the SEL 160 are arranged in line in the lateral direction in the Figure to oppose the line of the gate terminal (electrode) 152A, the gate terminal (electrode) 153A, the gate terminal (electrode) 155A, and the gate terminal (electrode) 158A. The gate terminal (electrode) 152A of the TRX 152 and the gate terminal (electrode) 157A of the OFG 157 are arranged in line in the longitudinal direction in the Figure. Each gate terminal (electrode) is arranged on the upper surface of the P type semiconductor region 228 via the insulative film 232 (not illustrated), and is connected in series via an N++ type semiconductor region 272.

The gate terminal (electrode) 152A, the gate terminal (electrode) 153A, the gate terminal (electrode) 155A, the gate terminal (electrode) 157A, the gate terminal (electrode) 158A, and the gate terminal (electrode) 160A are applied with the drive signals TRX, TRM, TRG, OFG, RST, and SEL via the metal wiring, respectively. The FD 156 and the gate terminal (electrode) 159A are connected via the metal wiring. The power supply voltage VDD is applied between the gate terminal (electrode) 158A and the gate terminal (electrode) 159A in the N++ type semiconductor region 272 via the metal wiring. The right side of the gate terminal (electrode) 160A in the N++ type semiconductor region 272 in the Figure is connected to the vertical signal line VSL via the metal wiring.

Further, a P-well contact 271 is formed substantially at the center of the arranged gate terminals (electrodes) of the respective transistors. The P-well contact 271 is connected to the ground via the metal wiring, for example.

Figure 9:
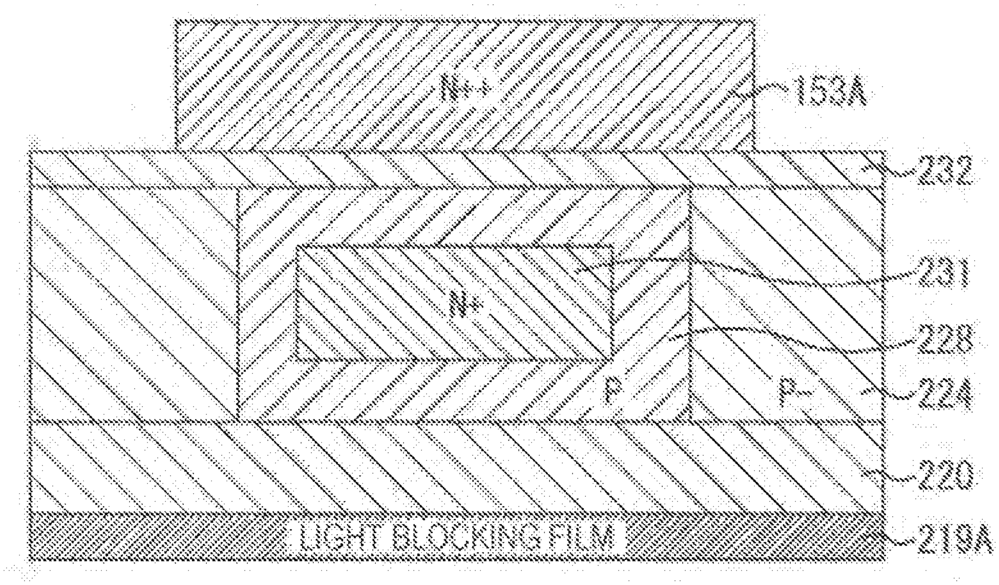
FIG. 9 is an enlarged diagram schematically illustrating a cross section around a TRM and a MEM.

FIG. 9 is an enlarged diagram schematically illustrating a cross section around the TRM 153 and the MEM 154. Additionally, some of the components illustrated in FIG. 3 are omitted from FIG. 9.

The TRM 153 is in a planar structure similarly to each transistor in a pixel. Specifically, the P type semiconductor region 228 is arranged below the gate terminal (electrode) 153A of the TRM 153 in the P− type semiconductor region 224 via the insulative film 232. The N+ type semiconductor region 231 configuring the MEM 154 is then formed in the P type semiconductor region 228. Thereby, the MEM 154 in the HAD structure is formed.

{Method for Manufacturing Solid-State Image Sensing Device 101*a*}

An exemplary method for manufacturing the solid-state image sensing device 101*a* will be described below with reference to FIG. 10 to FIG. 51. Additionally, the parts corresponding to those in FIG. 3 are denoted with the same reference numerals in FIG. 10 to FIG. 51. Incidentally, the reference numerals which have nothing to do with the description are omitted as needed for easily-understandable Figures.

Figure 10:
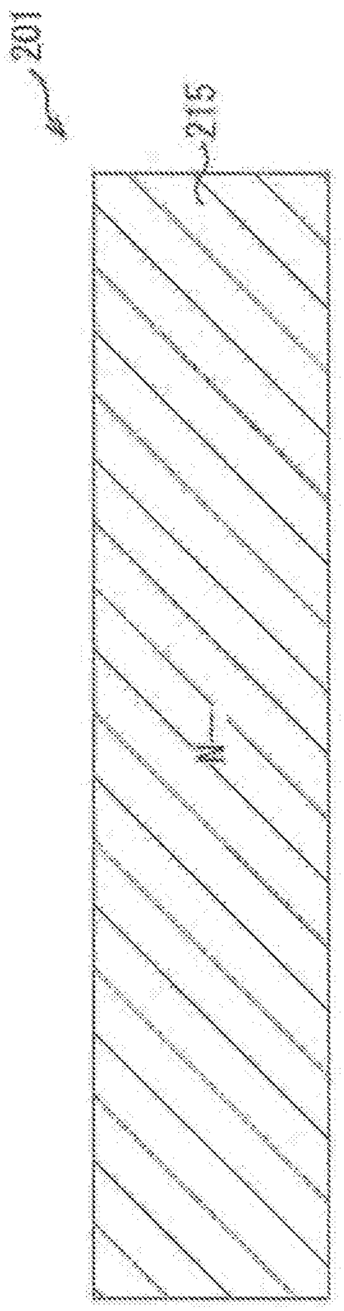
FIG. 10 is a diagram for explaining a method for manufacturing the solid-state image sensing device according to the first embodiment.

The first semiconductor substrate 201 is first prepared as illustrated in FIG. 10. In this stage, the N−− type semiconductor region 215 is formed on the first semiconductor substrate 201.

Figure 11:
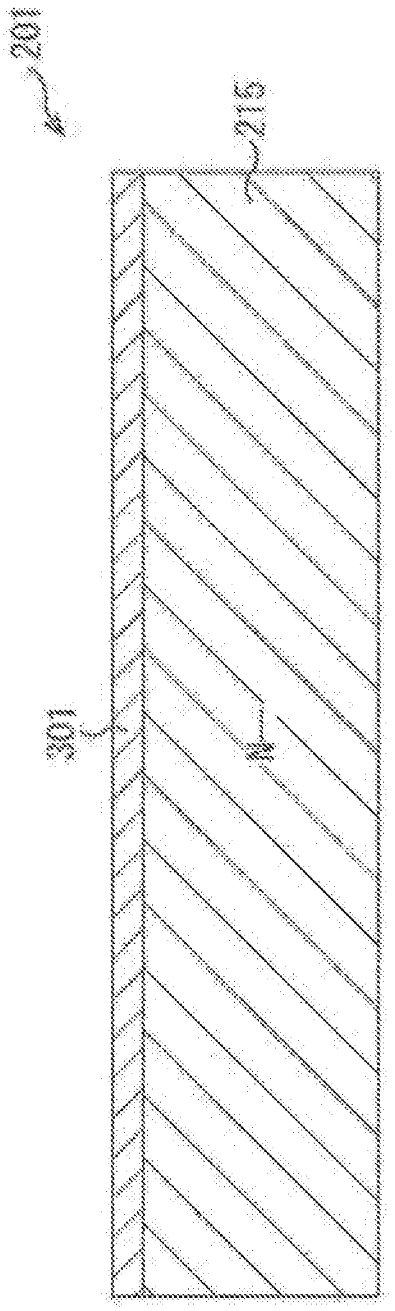
FIG. 11 is a diagram for explaining the method for manufacturing the solid-state image sensing device according to the first embodiment.

A SiO2 film 301 is then formed on the surface of the first semiconductor substrate 201 by thermal oxidization or chemical vapor deposition (CVD) as illustrated in FIG. 11.

Figure 12:
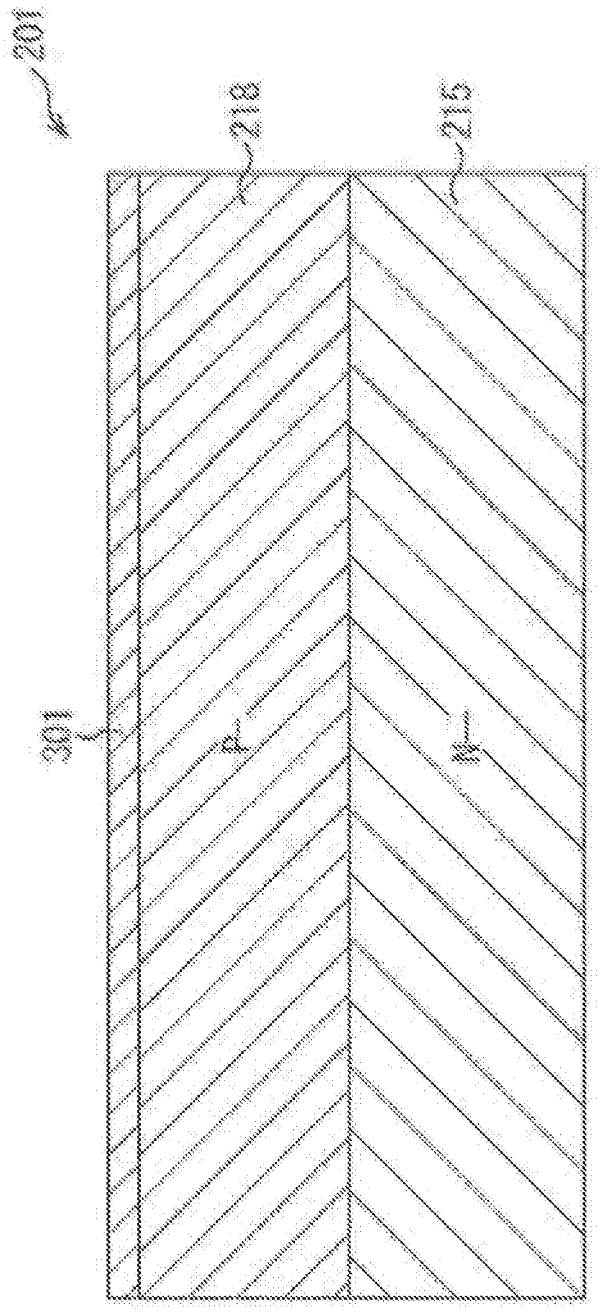
FIG. 12 is a diagram for explaining the method for manufacturing the solid-state image sensing device according to the first embodiment.

P− type ions are then implanted and the P− type semiconductor region 218 is formed between the N−− type semiconductor region 215 and the SiO2 film 301 as illustrated in FIG. 12.

Figure 13:
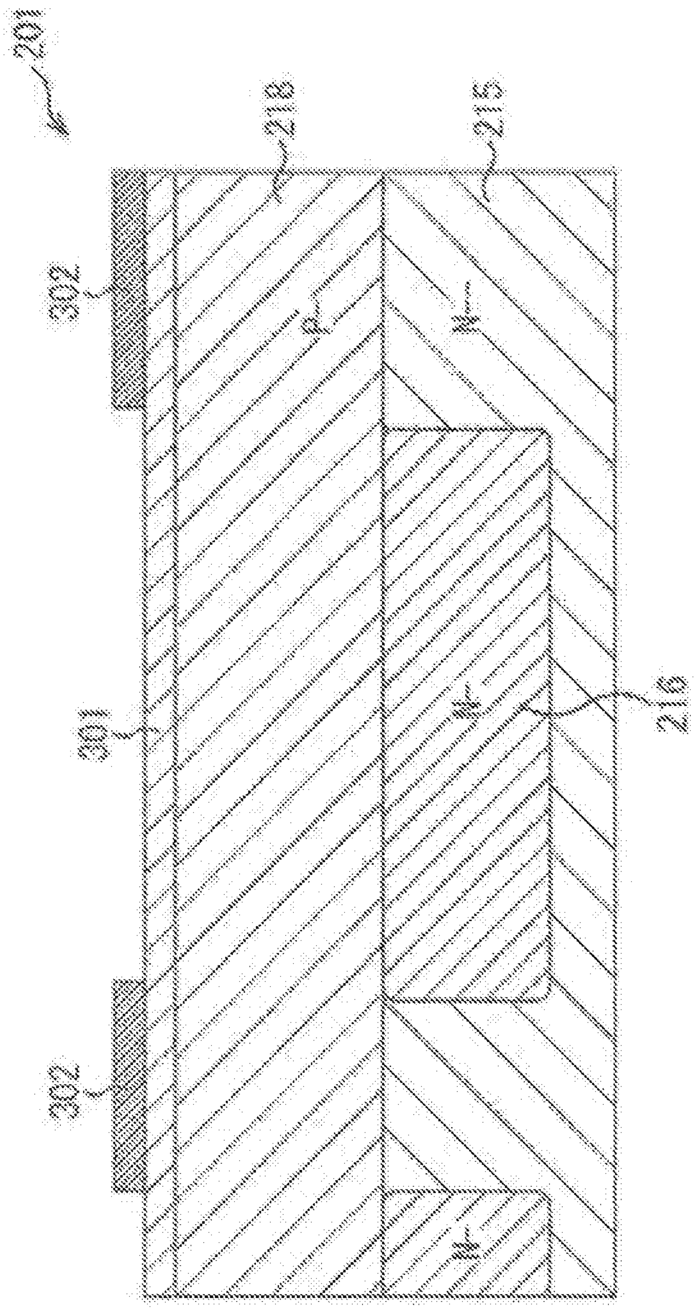
FIG. 13 is a diagram for explaining the method for manufacturing the solid-state image sensing device according to the first embodiment.

Part of the surface of the SiO2 film 301 is then masked by photoresist 302 as illustrated in FIG. 13. N− type ions are then implanted from the part not masked by the photoresist 302 and the N− type semiconductor region 216 is generated in the N−− type semiconductor region 215. Thereafter, the photoresist 302 is removed.

Figure 14:
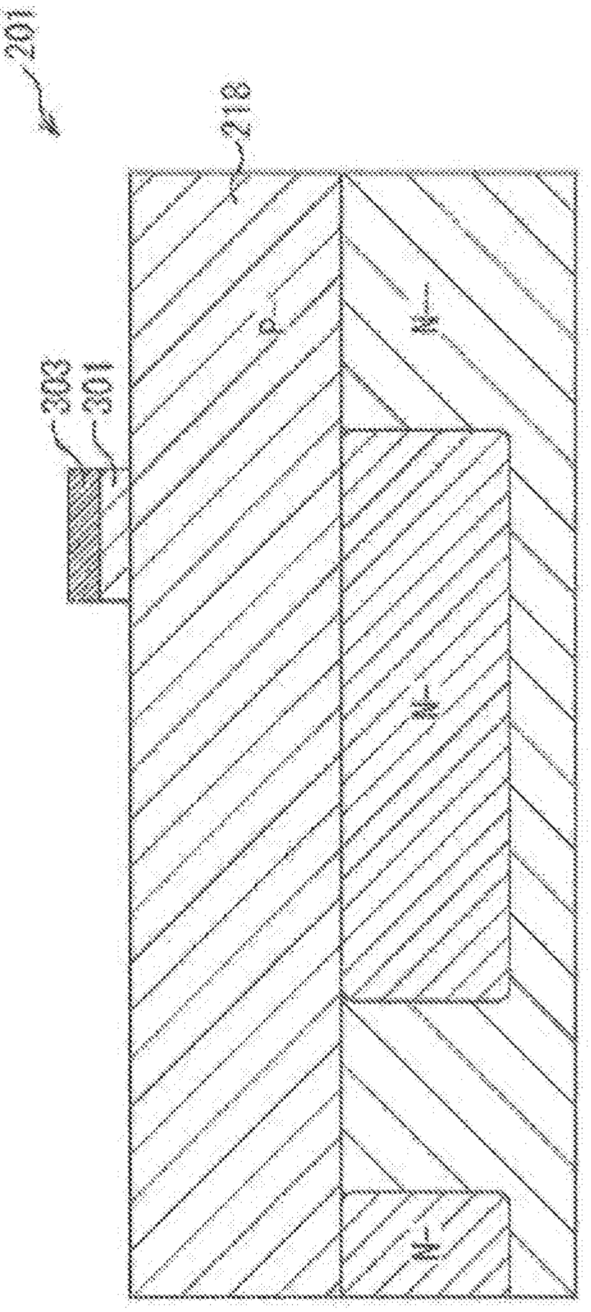
FIG. 14 is a diagram for explaining the method for manufacturing the solid-state image sensing device according to the first embodiment.

Part of the surface of the SiO2 film 301 is then masked by photoresist 303 as illustrated in FIG. 14, and the non-masked part is removed. In a later step, the opening 219C of the light blocking film 219 and the vertical terminal (electrode) part 152AB of the TRX 152 are formed at the position masked by the photoresist 303.

Figure 15:
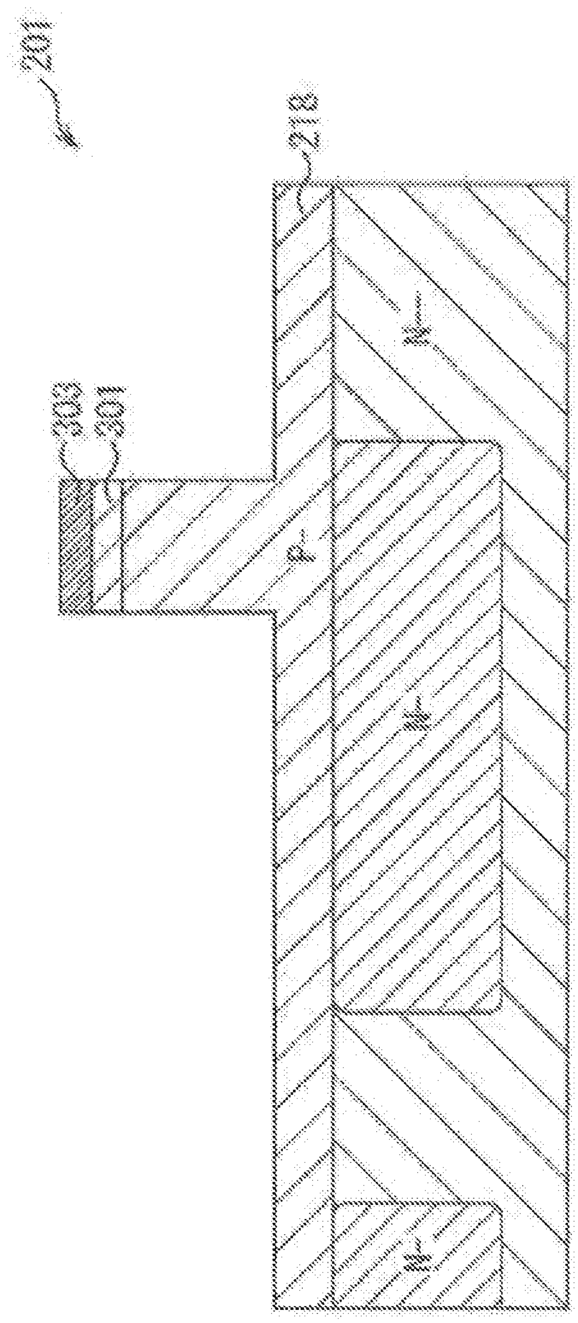
FIG. 15 is a diagram for explaining the method for manufacturing the solid-state image sensing device according to the first embodiment.

The part not masked by the photoresist 303 in the P− type semiconductor region 218 is then removed down to a predetermined depth by dry etching as illustrated in FIG. 15.

Figure 16:
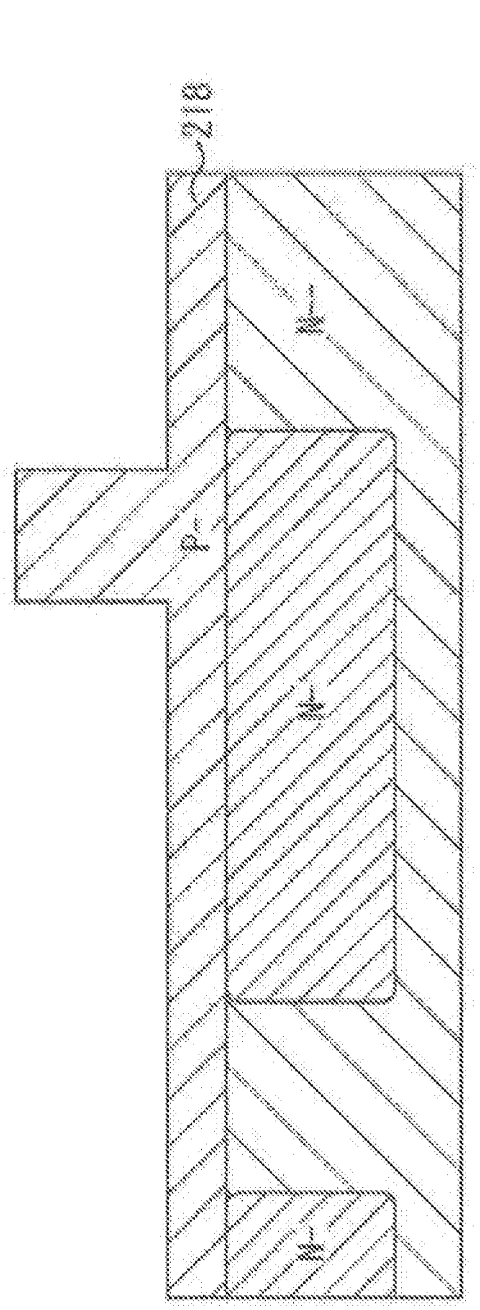
FIG. 16 is a diagram for explaining the method for manufacturing the solid-state image sensing device according to the first embodiment.

The SiO2 film 301 and the photoresist 303 are then removed as illustrated in FIG. 16.

Figure 17:
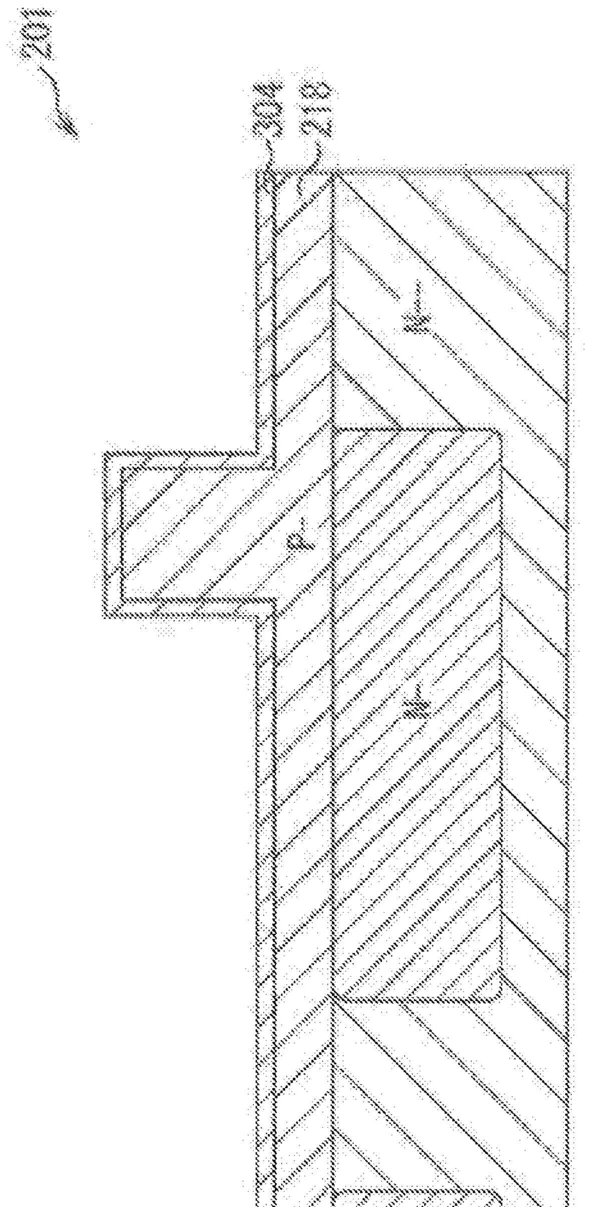
FIG. 17 is a diagram for explaining the method for manufacturing the solid-state image sensing device according to the first embodiment.

A SiO film 304 is then formed on the surface of the first semiconductor substrate 201 (the P− type semiconductor region 218) as illustrated in FIG. 17.

Figure 18:
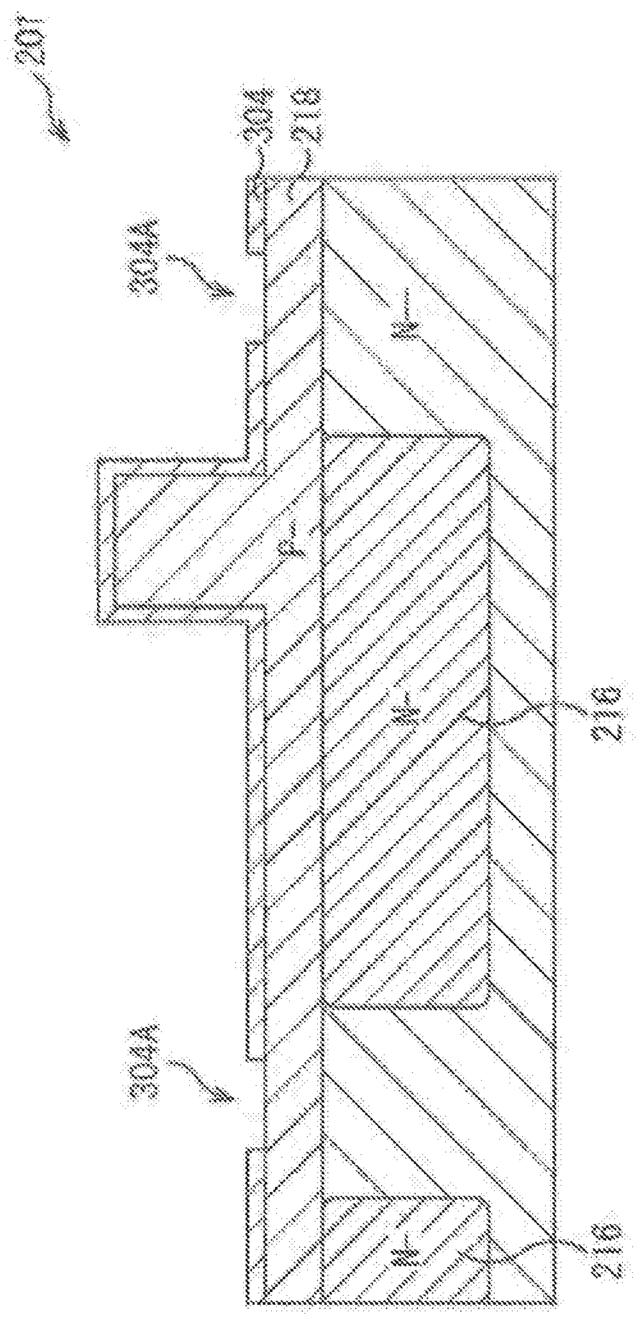
FIG. 18 is a diagram for explaining the method for manufacturing the solid-state image sensing device according to the first embodiment.

The SiO film 304 is then patterned and an opening 304A is formed on the SiO film 304 as illustrated in FIG. 18. The opening 304A is formed to surround the side surface of the N− type semiconductor region 216 in each pixel, for example.

Figure 19:
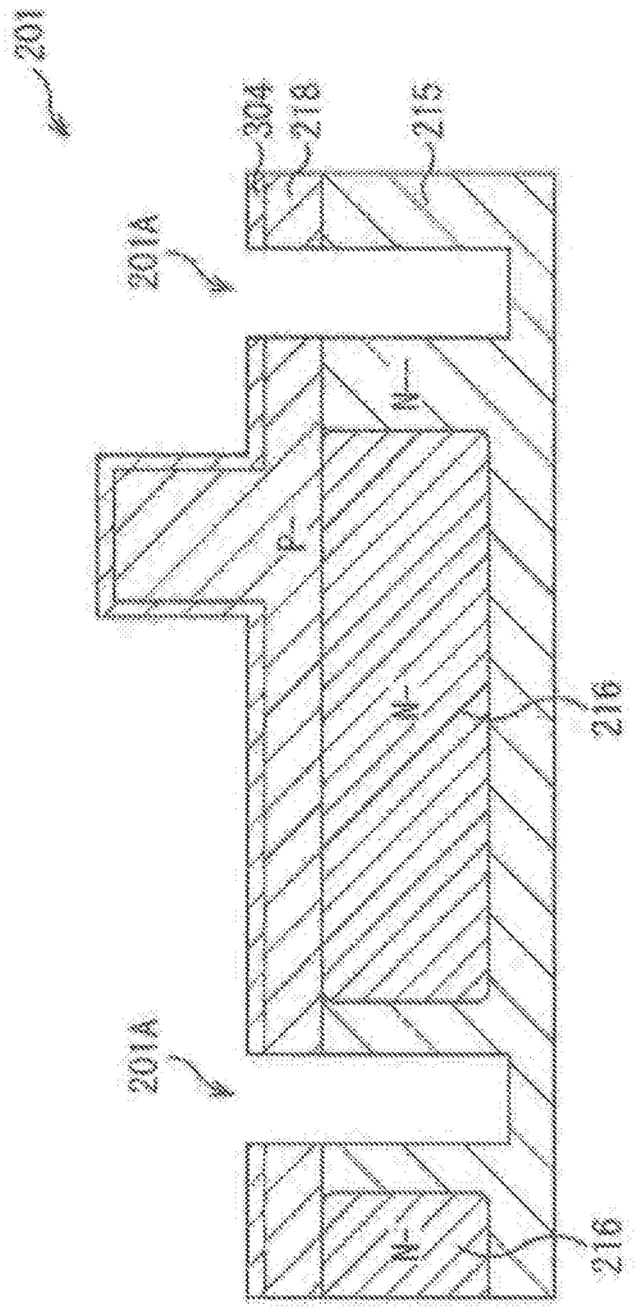
FIG. 19 is a diagram for explaining the method for manufacturing the solid-state image sensing device according to the first embodiment.

A trench 201A is then formed below the opening 304A of the SiO film 304 by dry etching as illustrated in FIG. 19. The trench 201A penetrates through the P− type semiconductor region 218, and reaches a position lower than the lower end of the N− type semiconductor region 216 in the N−− type semiconductor region 215. Further, the trench 201A is formed between the N− type semiconductor regions 216 in adjacent pixels.

Figure 20:
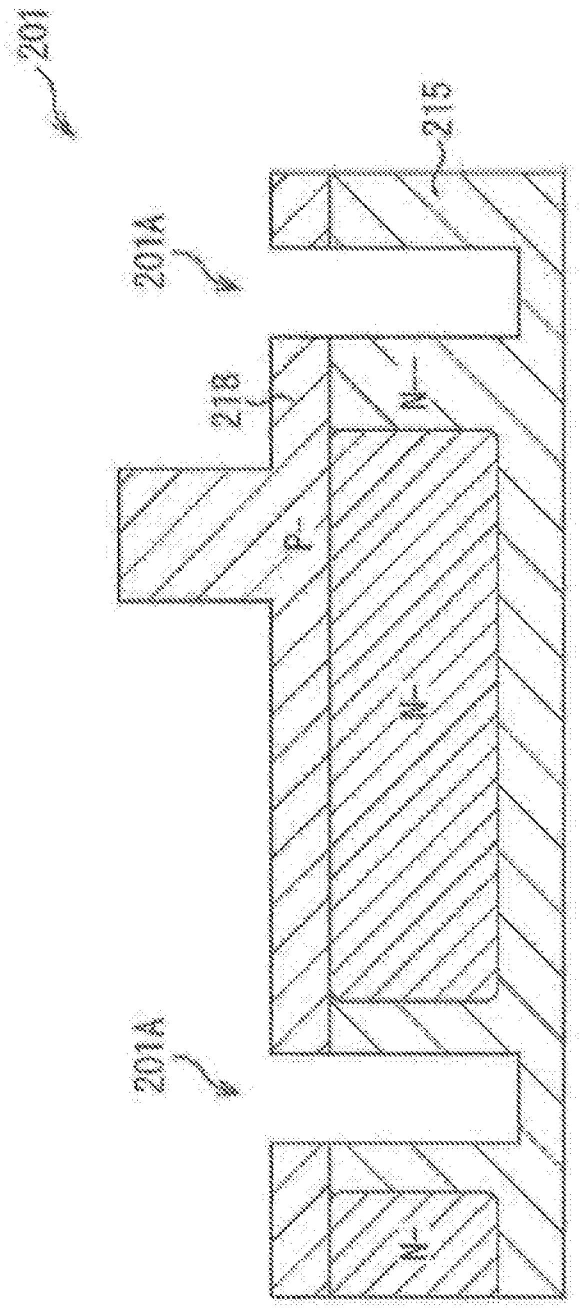
FIG. 20 is a diagram for explaining the method for manufacturing the solid-state image sensing device according to the first embodiment.

Then, the SiO film 304 is totally removed as illustrated in FIG. 20.

Figure 21:
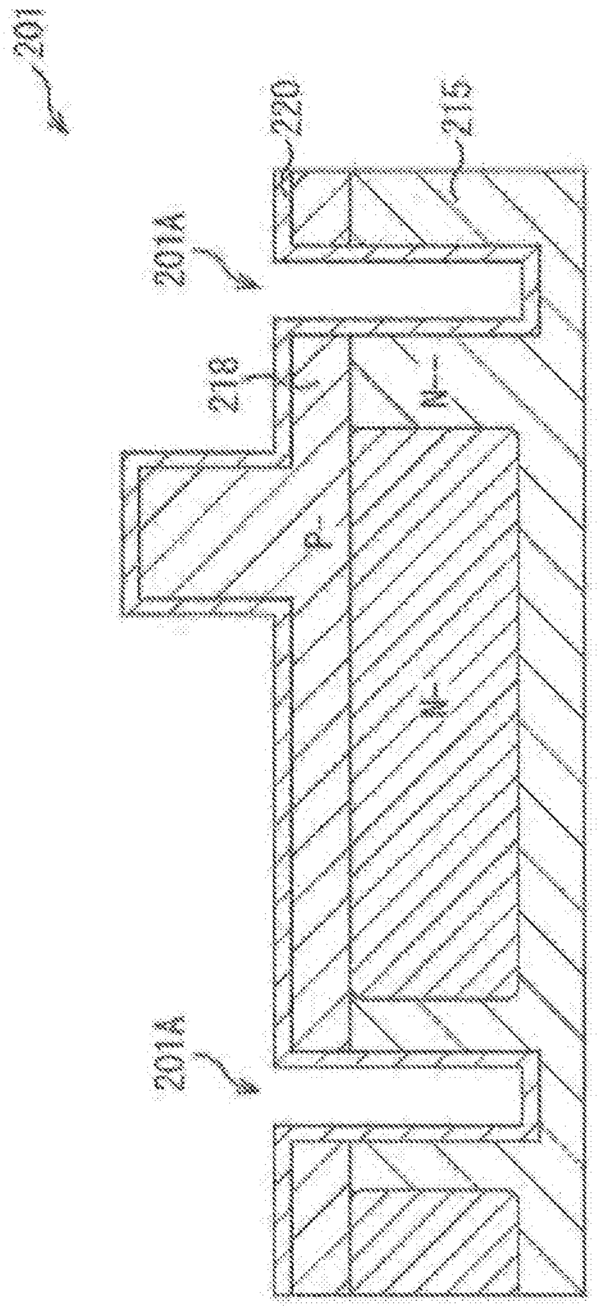
FIG. 21 is a diagram for explaining the method for manufacturing the solid-state image sensing device according to the first embodiment.

The insulative film 220 made of SiO is then formed on the surface of the first semiconductor substrate 201 by oxidization, for example, as illustrated in FIG. 21. Not only the surface of the P− type semiconductor region 218 but also the inner wall of the trench 201A is covered with the insulative film 220.

Figure 22:
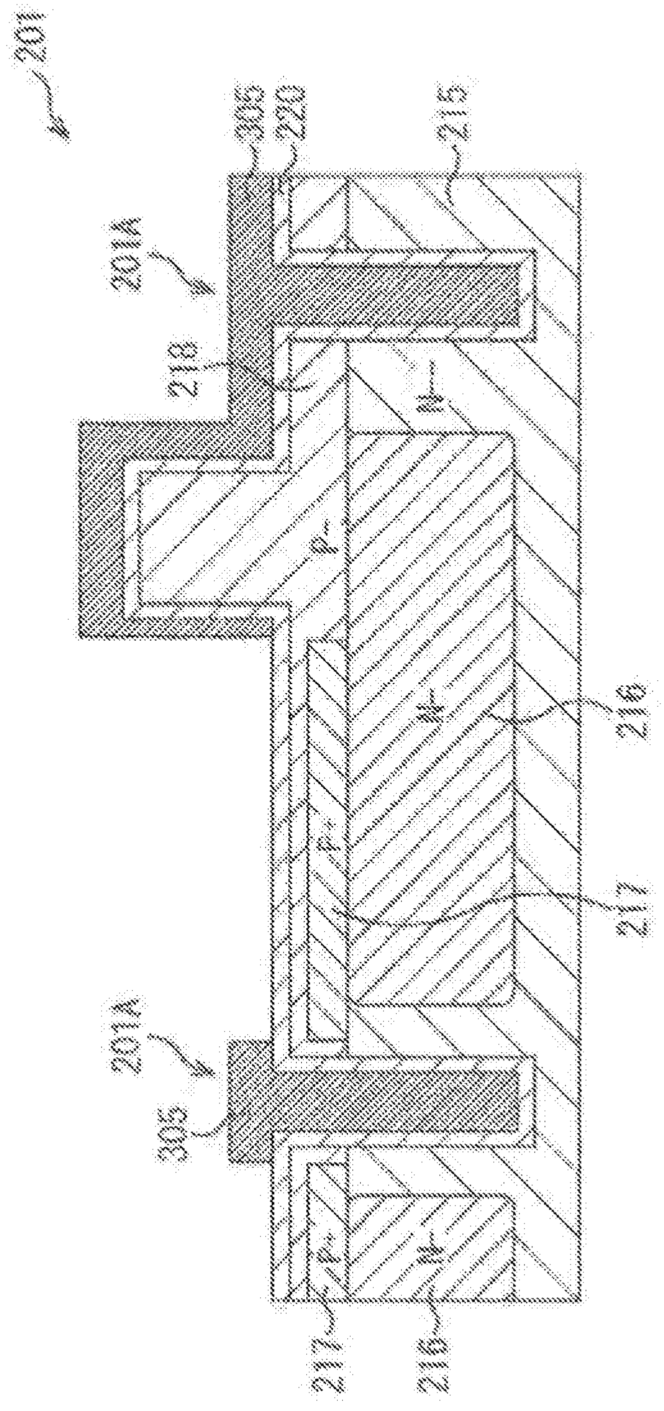
FIG. 22 is a diagram for explaining the method for manufacturing the solid-state image sensing device according to the first embodiment.

Part of the surface of the first semiconductor substrate 201 is then masked by photoresist 305 as illustrated in FIG. 22. Additionally, the inside of the trench 201A is also masked by photoresist 306. P+ type ions are then implanted from the part not masked by the photoresist 305, and the P+ type semiconductor region 217 is generated above the N− type semiconductor region 216 in the P− type semiconductor region 218. Thereafter, the photoresist 305 is removed.

Figure 23:
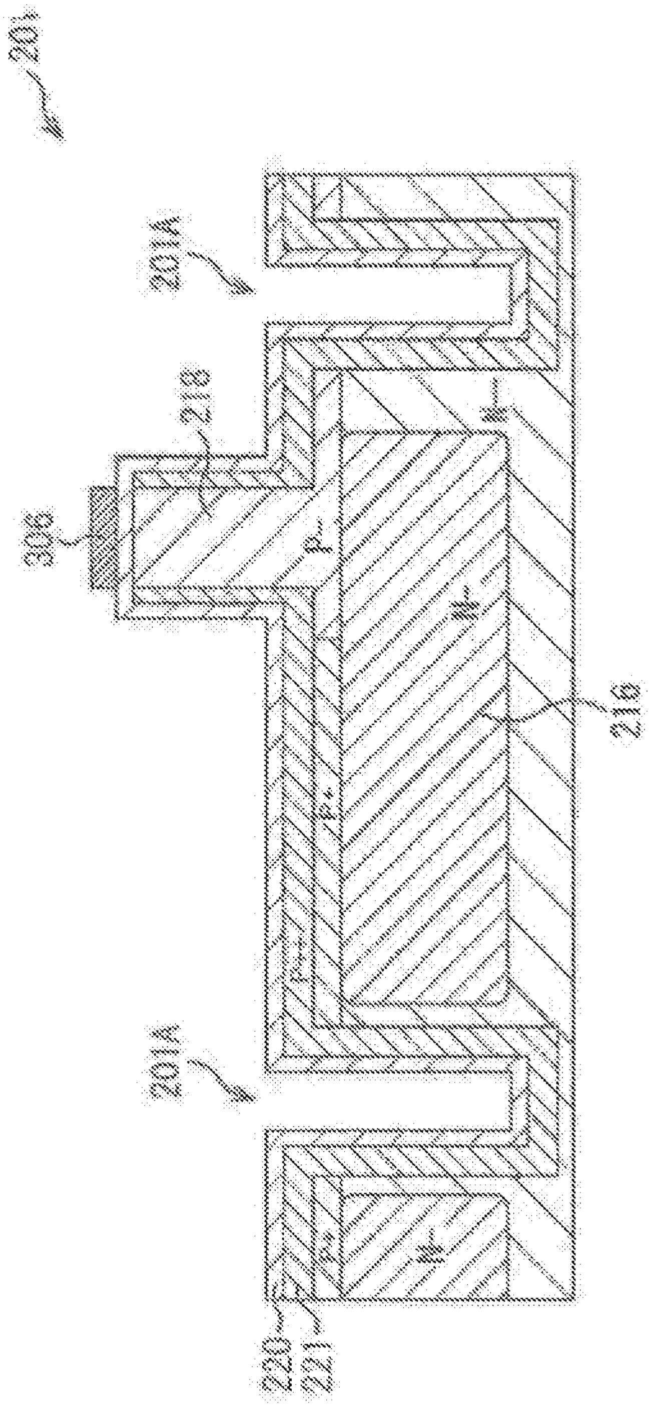
FIG. 23 is a diagram for explaining the method for manufacturing the solid-state image sensing device according to the first embodiment.

Part of the top of the convex part of the P− type semiconductor region 218 in the surface of the first semiconductor substrate 201 is then masked by the photoresist 306 as illustrated in FIG. 23. P++ type ions are then implanted from the part not masked by the photoresist 306, and the P++ type semiconductor region 221 is generated below the insulative film 220. That is, the part except the upper surface of the convex part of the P− type semiconductor region 218 below the insulative film 220 is covered with the P++ type semiconductor region 221. Thereafter, the photoresist 306 is removed.

Here, the P++ type semiconductor region 221 around the trench 201A is formed by obliquely implanting P++ ions in the trench 201A. Then, the P++ type semiconductor region 221 is almost uniform in thickness without unevenness in the horizontal direction around the trench 201A. Thus, the N− type semiconductor region 216 side surfaces of which are surrounded by the P++ type semiconductor region 221 and configuring the PD 151 can be wider in the horizontal direction and can be increased in the area of its light receiving surface. Consequently, sensitivity of the pixel is enhanced. Further, the thickness of the P++ type semiconductor region 221 is almost uniform, and thus a potential trap does not occur and the design of surface pinning is facilitated.

On the other hand, for example, in a case where the P++ type semiconductor region 221 is to be formed by implanting ions from the surface of the first semiconductor substrate 201 without the formation of the trench 201A, the thickness of the P++ type semiconductor region 221 is non-uniform in the horizontal direction, and is wider at a deeper position. Thus, the N− type semiconductor region 216 configuring the PD 151 is narrower in the horizontal direction, and is smaller in the area of its light receiving surface. Consequently, sensitivity of the pixel lowers. Further, the thickness of the P++ type semiconductor region 221 is non-uniform, and thus a potential trap occurs, which is a cause of charge transfer failure and makes the design of surface pinning more difficult.

Figure 24:
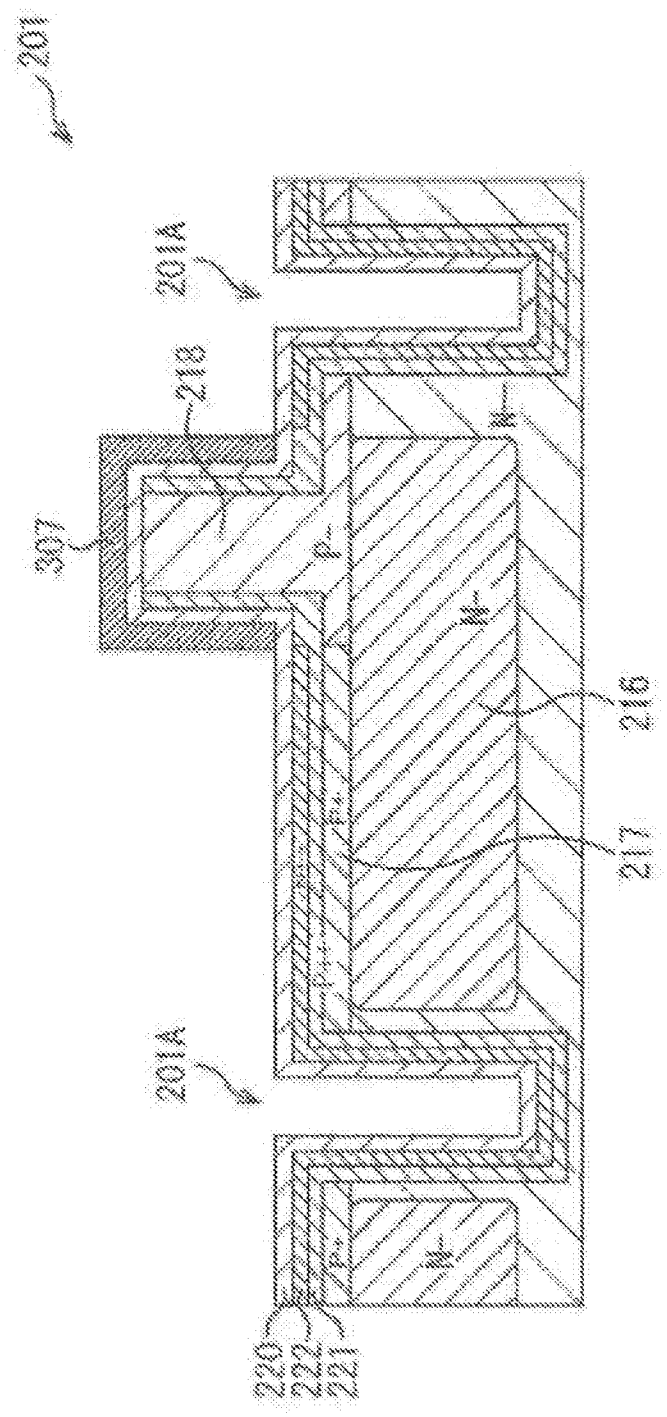
FIG. 24 is a diagram for explaining the method for manufacturing the solid-state image sensing device according to the first embodiment.

The convex part of the P− type semiconductor region 218 in the surface of the first semiconductor substrate 201 is then masked by photoresist 307 as illustrated in FIG. 24. N++ type ions and carbon (C) ions are then implanted from the part not masked by the photoresist 307. Thereby, the N++ type semiconductor region 222 is generated between the insulative film 220 and the P++ type semiconductor region 221. Thereafter, the photoresist 307 is removed.

Figure 25:
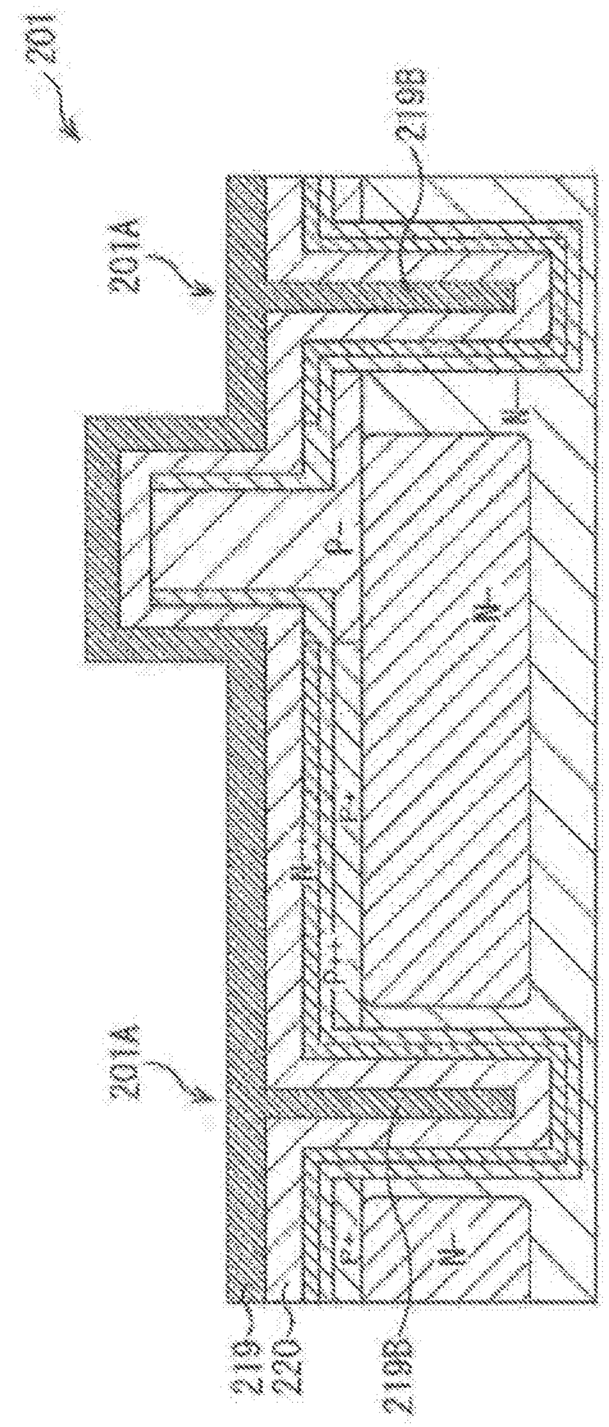
FIG. 25 is a diagram for explaining the method for manufacturing the solid-state image sensing device according to the first embodiment.

The light blocking film 219 is then formed on the surface of the first semiconductor substrate 201 by CVD as illustrated in FIG. 25. The light blocking film 219 is embedded also in the trench 201A and the vertical light blocking part 219B is formed.

Figure 26:
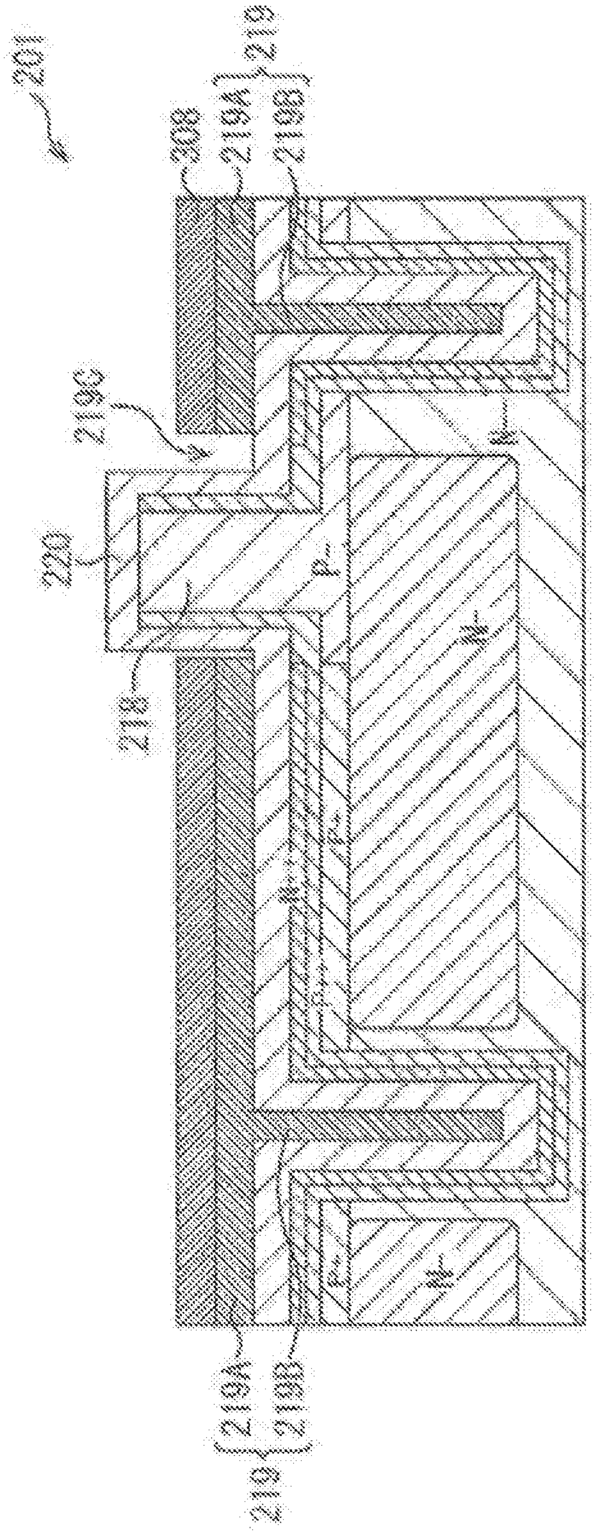
FIG. 26 is a diagram for explaining the method for manufacturing the solid-state image sensing device according to the first embodiment.

The part except around the convex part of the P− type semiconductor region 218 in the surface of the first semiconductor substrate 201 is then masked by photoresist 308 as illustrated in FIG. 26. The light blocking film 219 at the part not masked by the photoresist 308 is then removed by dry etching. Thereby, the horizontal light blocking part 219A and the opening 219C in the light blocking film 219 are formed. Thereafter, the photoresist 308 is removed.

Figure 27:
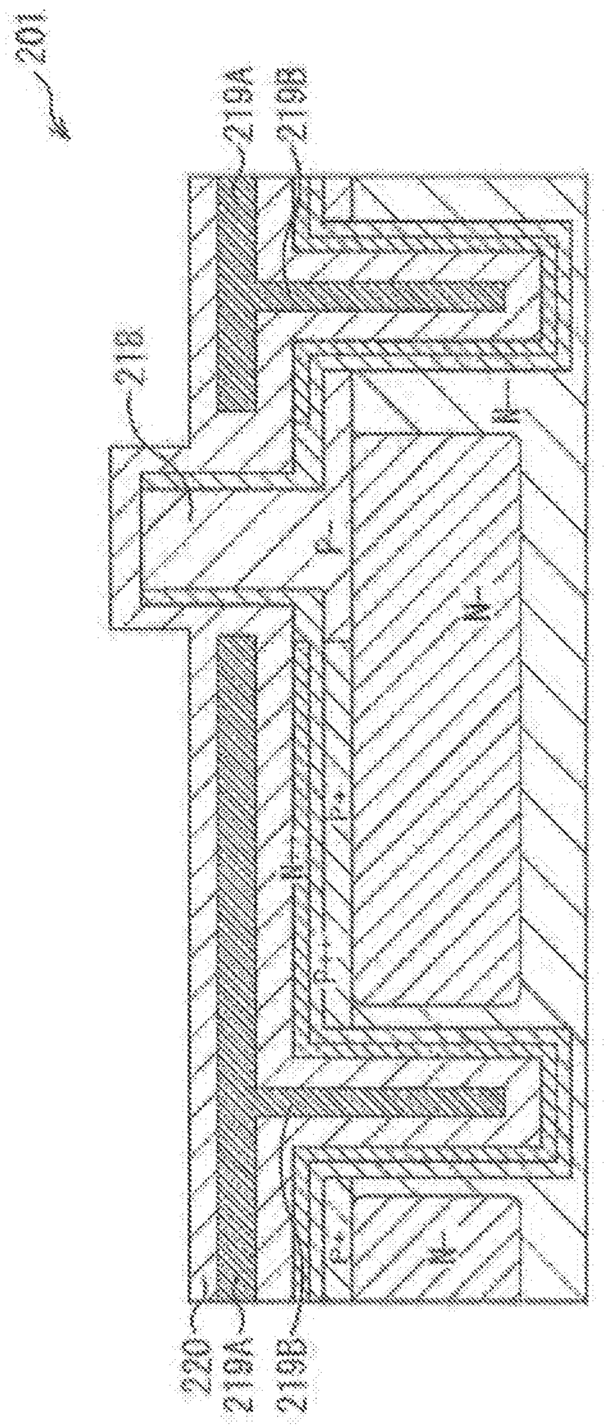
FIG. 27 is a diagram for explaining the method for manufacturing the solid-state image sensing device according to the first embodiment.

A SiO film is then formed on the surface of the first semiconductor substrate 201 by CVD as illustrated in FIG. 27. The SiO film is combined with the SiO film formed in the step in FIG. 21 described above thereby to configure the insulative film 220.

Figure 28:
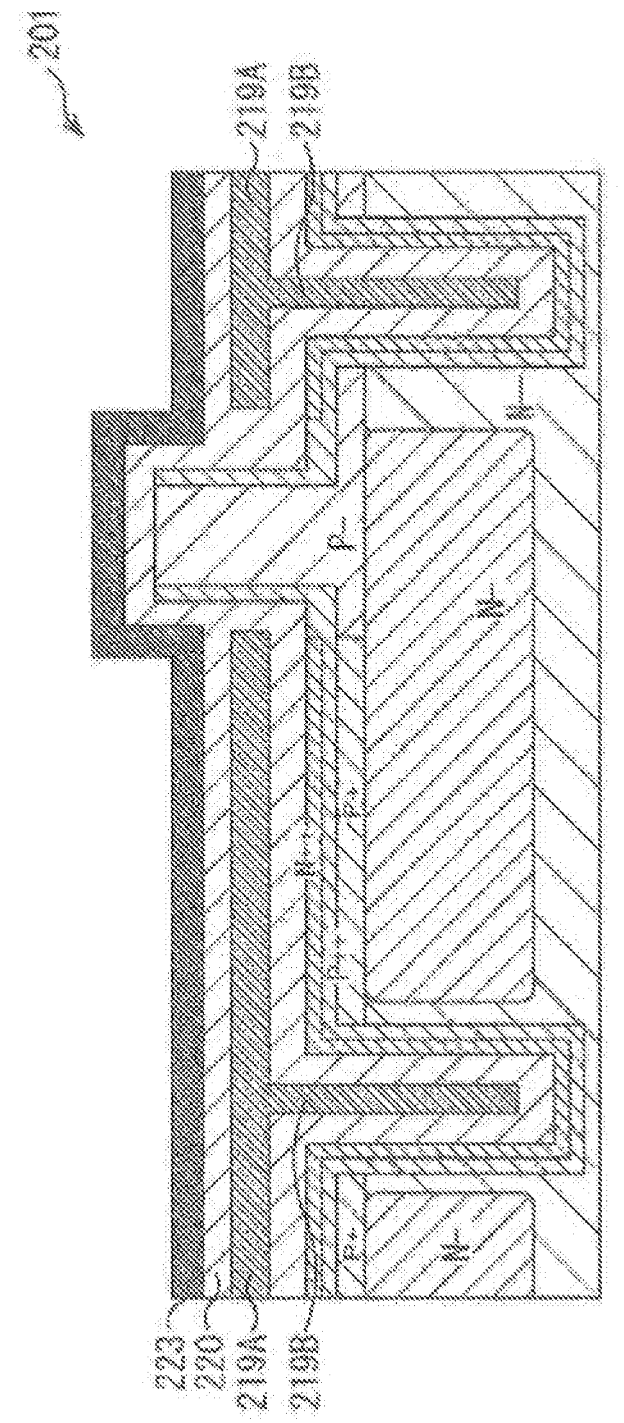
FIG. 28 is a diagram for explaining the method for manufacturing the solid-state image sensing device according to the first embodiment.

The stopper film 223 is then formed on the surface of the first semiconductor substrate 201 as illustrated in FIG. 28.

Figure 29:
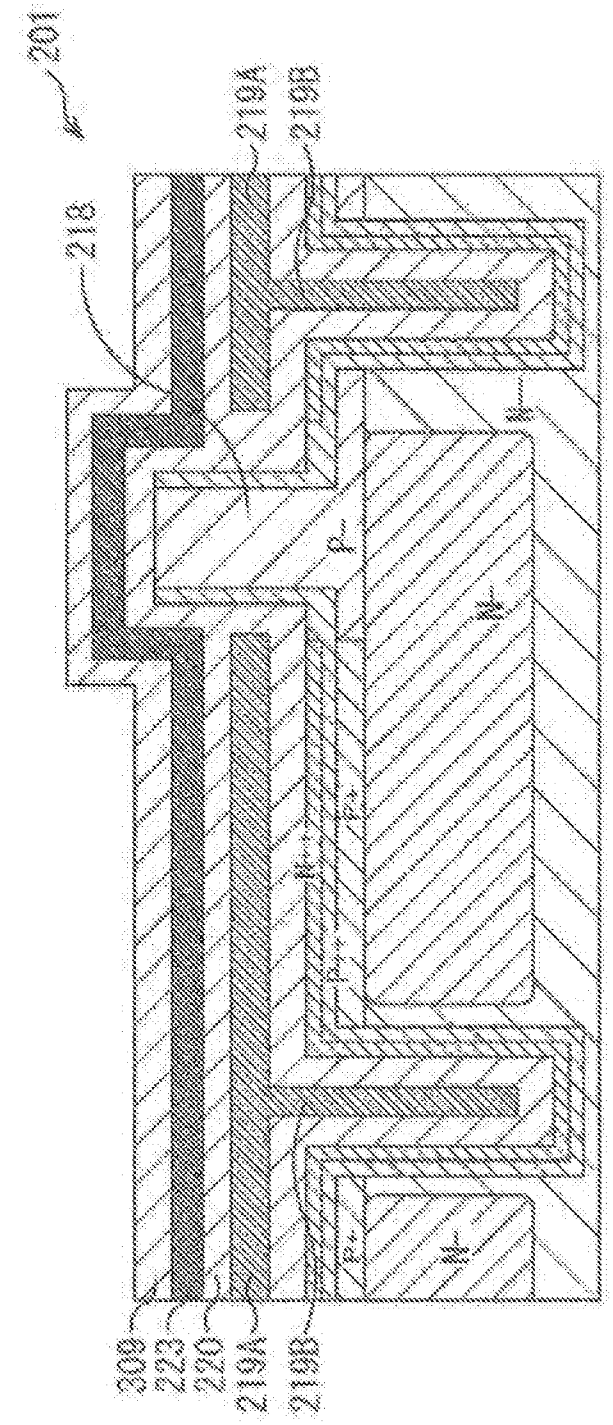
FIG. 29 is a diagram for explaining the method for manufacturing the solid-state image sensing device according to the first embodiment.

A SiO film 309 is then formed on the surface of the stopper film 223 by CVD as illustrated in FIG. 29.

Figure 30:
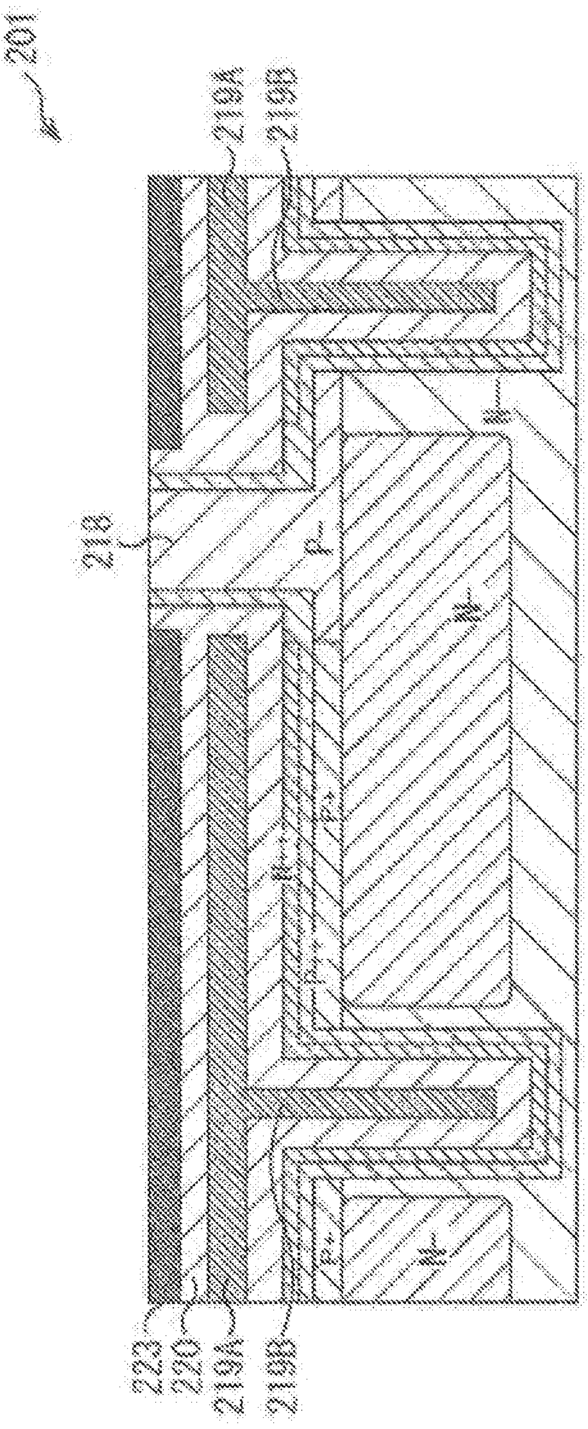
FIG. 30 is a diagram for explaining the method for manufacturing the solid-state image sensing device according to the first embodiment.

The surface of the first semiconductor substrate 201 is then planarized by chemical mechanical polishing (CMP) as illustrated in FIG. 30. Thereby, the surface of the P− type semiconductor region 218 is exposed. At this time, the stopper film 223 prevents the SiO film 309 from being excessively polished. Further, though not illustrated in FIG. 30, the SiO film 309 remaining on the surface of the stopper film 223 serves as part of the insulative film 220.

Figure 31:
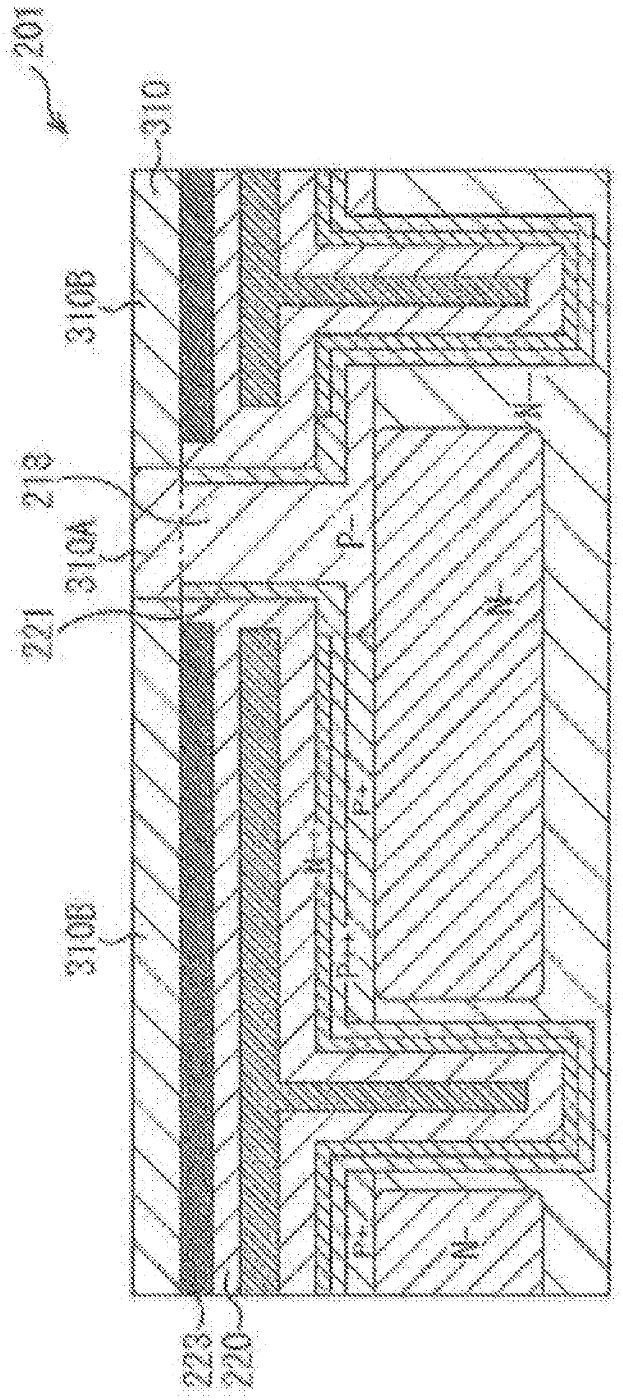
FIG. 31 is a diagram for explaining the method for manufacturing the solid-state image sensing device according to the first embodiment.

A silicon film 310 is then formed on the surface of the first semiconductor substrate 201 by epitaxial growth as illustrated in FIG. 31. At this time, monocrystal silicon 310A is epitaxially grown only above the P− type semiconductor region 218 and the P++ type semiconductor region 221, and polysilicon 3108 is formed at other part.

Additionally, the silicon film 310 may be formed in a method other than epitaxial growth, for example. Further, amorphous silicon may be formed instead of the polysilicon 310B, for example. Furthermore, silicon may be directly joined with other silicon without epitaxial growth, for example.

Figure 32:
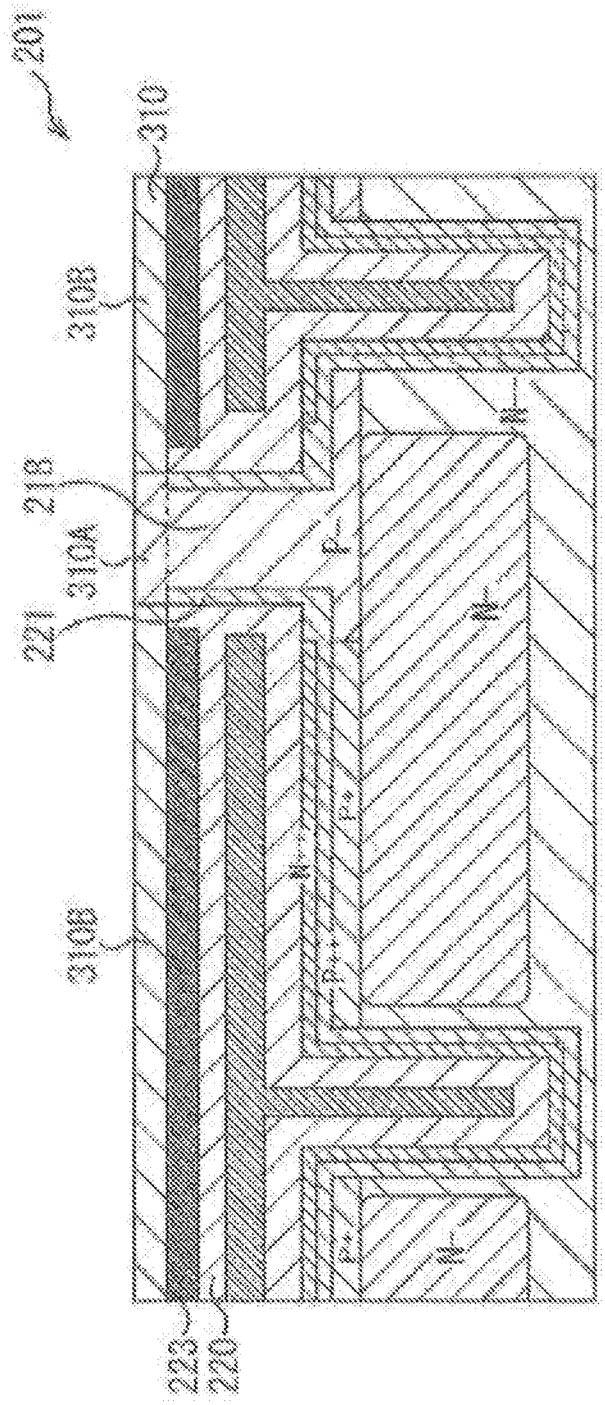
FIG. 32 is a diagram for explaining the method for manufacturing the solid-state image sensing device according to the first embodiment.

The surface of the silicon film 310 is then polished by CMP as illustrated in FIG. 32.

Figure 33:
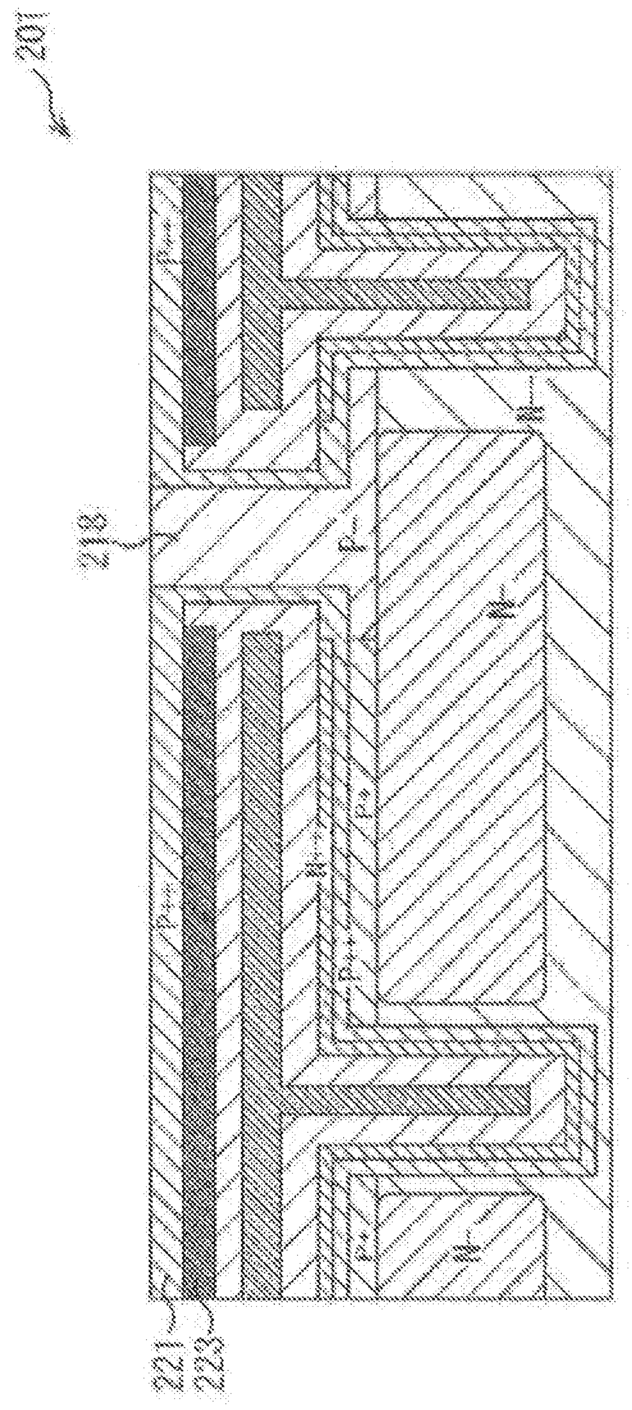
FIG. 33 is a diagram for explaining the method for manufacturing the solid-state image sensing device according to the first embodiment.

P− type ions and P++ type ions are then implanted in the silicon film 310 as illustrated in FIG. 33. Specifically, P− type ions are implanted above the P− type semiconductor region 218 in the silicon film 310, and P++ type ions are implanted in other part. Thereby, the P++ type semiconductor region 221 spreads to the surface of the second semiconductor substrate 202. Further, the P− type semiconductor region 218 extends to the surface of the first semiconductor substrate 201.

Figure 34:
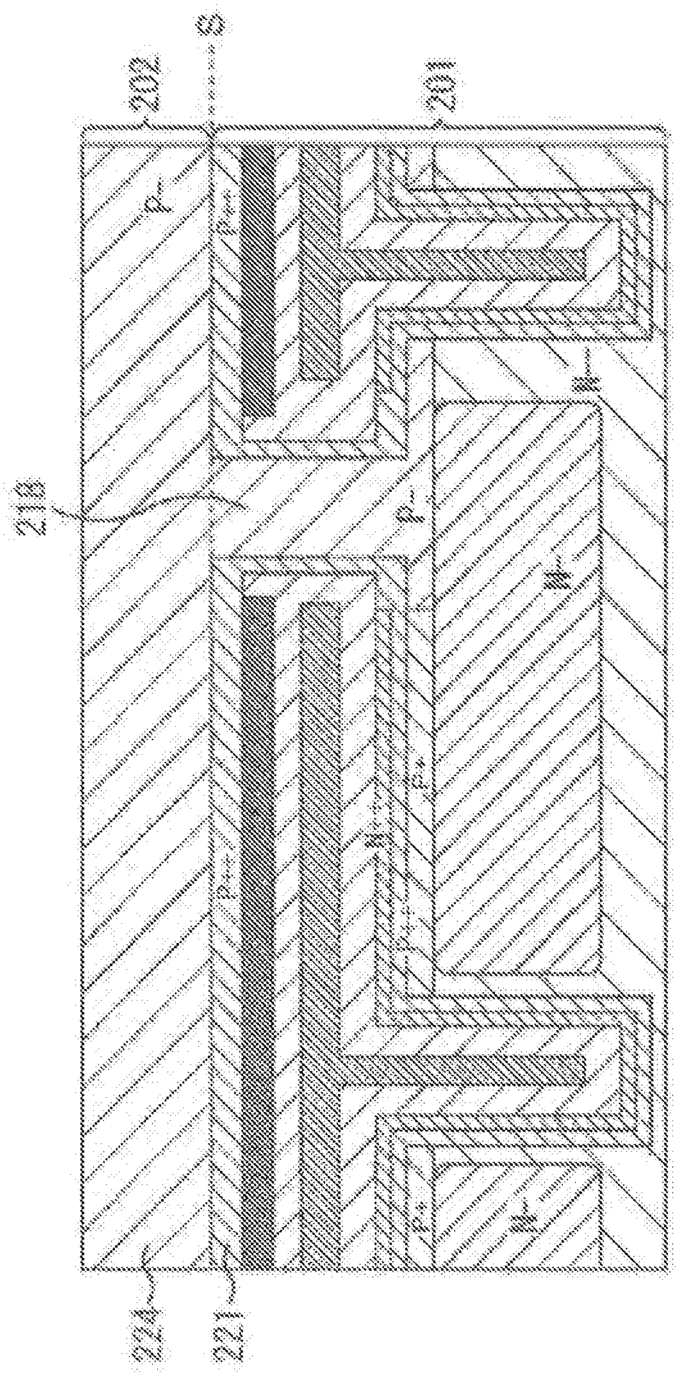
FIG. 34 is a diagram for explaining the method for manufacturing the solid-state image sensing device according to the first embodiment.

The second semiconductor substrate 202 is then applied to the upper surface of the first semiconductor substrate 201 as illustrated in FIG. 34. In the step, the surface where the first semiconductor substrate 201 and the second semiconductor substrate 202 are applied is assumed as joining interface S.

Here, the second semiconductor substrate 202 employs a P− type monocrystal silicon substrate with crystal orientation of Si(111), for example. Mobility in a channel is higher with the crystal orientation (111) than with (100) plane, for example, and thus the transfer property is enhanced when charges are transferred from the PD 151 to the MEM 154. Additionally, the crystal orientation is not limited to (111), and joining can be performed in any orientation.

Further, a method for applying the first semiconductor substrate 201 and the second semiconductor substrate 202 is not particularly limited, and a technique used for applying a silicon on insulator (SOI) substrate may be employed, for example. For example, methods such as plasma joining, direct joining using van der Waals binding, joining under vacuum atmosphere, and thermal annealing processing after application may be employed.

Further, a surface processing method before the first semiconductor substrate 201 and the second semiconductor substrate 202 are applied is not particularly limited, and a processing is performed to be hydrophilic or hydrophobic, thereby reducing voids on the joining interface S and enhancing the joining intensity.

For example, there may be employed a method in which the respective surfaces of the first semiconductor substrate 201 and the second semiconductor substrate 202 are immersed in a hydrofluoric acid solution, dried, and then joined, the respective surfaces thereof are immersed in a solution of ammonia and hydrogen peroxide water, dried and then joined, the respective surfaces thereof are immersed in a solution of hydrochloric acid or sulfuric acid and hydrogen peroxide water, dried, and then joined, the respective surfaces thereof are subjected to plasm irradiation under vacuum, and then joined, or the respective surfaces thereof are subjected to plasm irradiation under ammonium or hydrogen atmosphere, and then joined.

Further, the inside of the second semiconductor substrate 202 may be previously a SOI substrate such that the thickness of the second semiconductor substrate 202 can be adjusted when being polished later. For example, the second semiconductor substrate 202 is made of a SOI substrate, thereby preventing the second semiconductor substrate 202 from being excessively polished.

Figure 35:
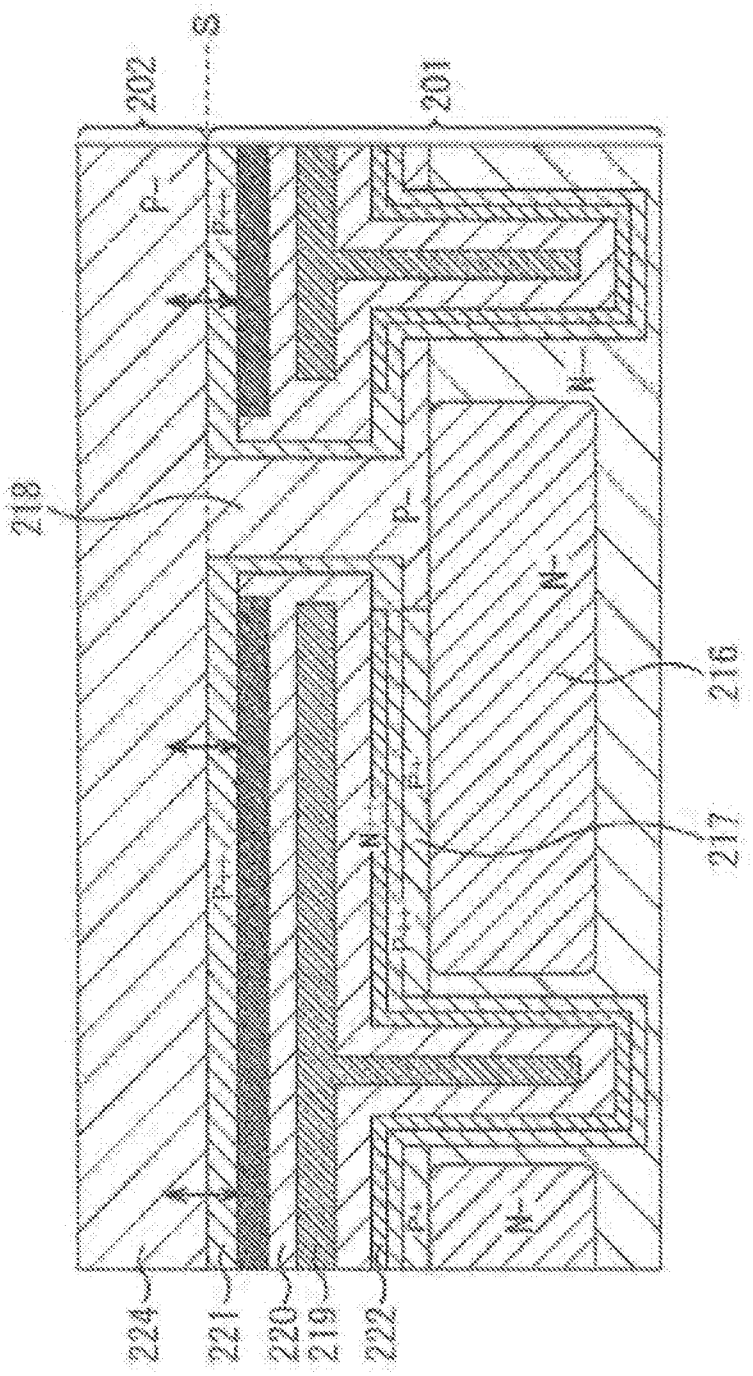
FIG. 35 is a diagram for explaining the method for manufacturing the solid-state image sensing device according to the first embodiment.

A thermal annealing processing is then performed as illustrated in FIG. 35. Thereby, the tightness of the joining interface S between the first semiconductor substrate 201 and the second semiconductor substrate 202 is increased. Further, P+ type impurities are diffused in the P++ type semiconductor region 221 to be a pinning layer. Furthermore, the N++ type semiconductor region 222 serves as a gettering layer, and the crystalline property of the HAD structure formed of the N− type semiconductor region 216 and the P+ type semiconductor region 217 is enhanced.

Figure 36:
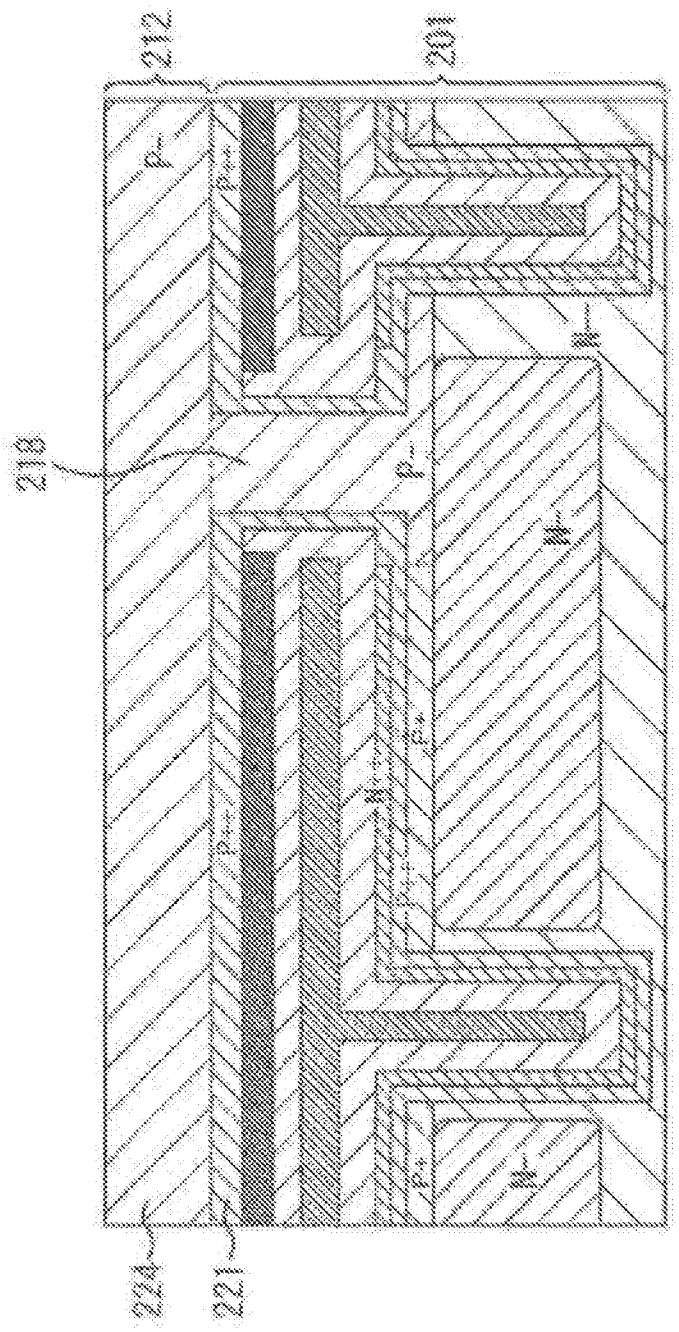
FIG. 36 is a diagram for explaining the method for manufacturing the solid-state image sensing device according to the first embodiment.

The surface of the second semiconductor substrate 202 (the surface of the P− type semiconductor region 224) is then polished by CMP as illustrated in FIG. 36.

Figure 37:
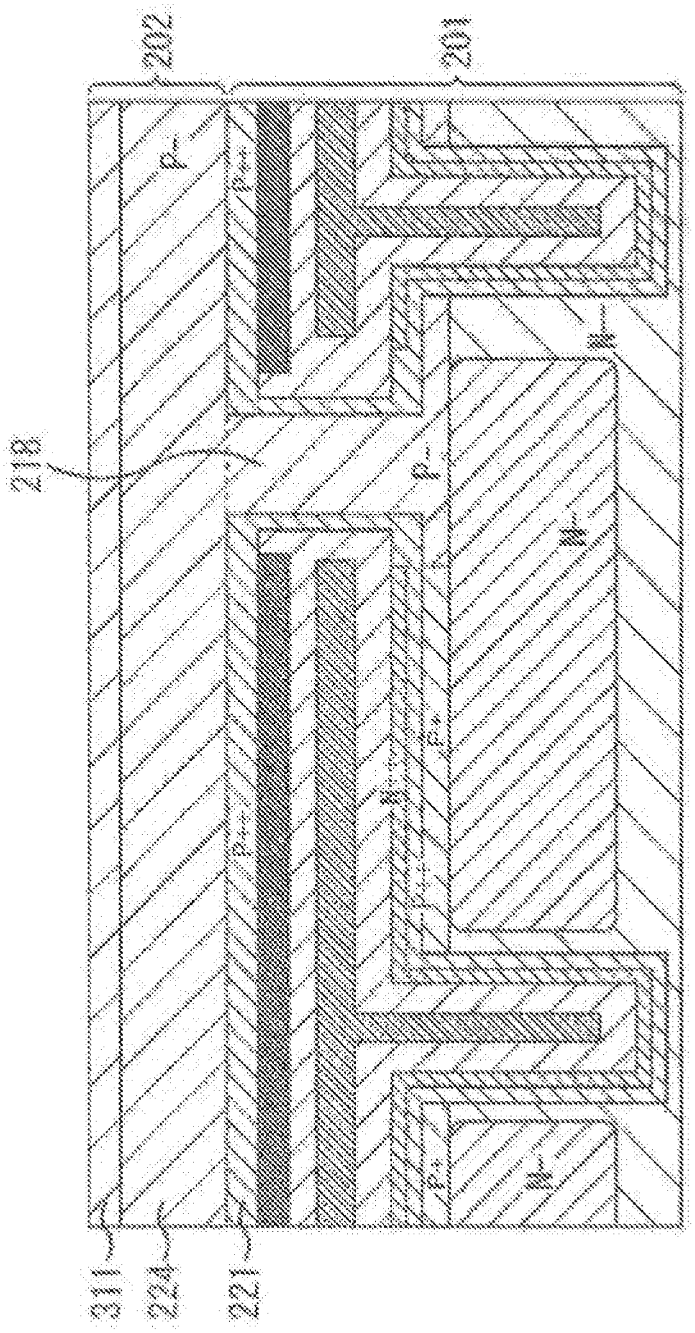
FIG. 37 is a diagram for explaining the method for manufacturing the solid-state image sensing device according to the first embodiment.

A SiO film 311 is then formed on the surface of the second semiconductor substrate 202 as illustrated in FIG. 37.

Figure 38:
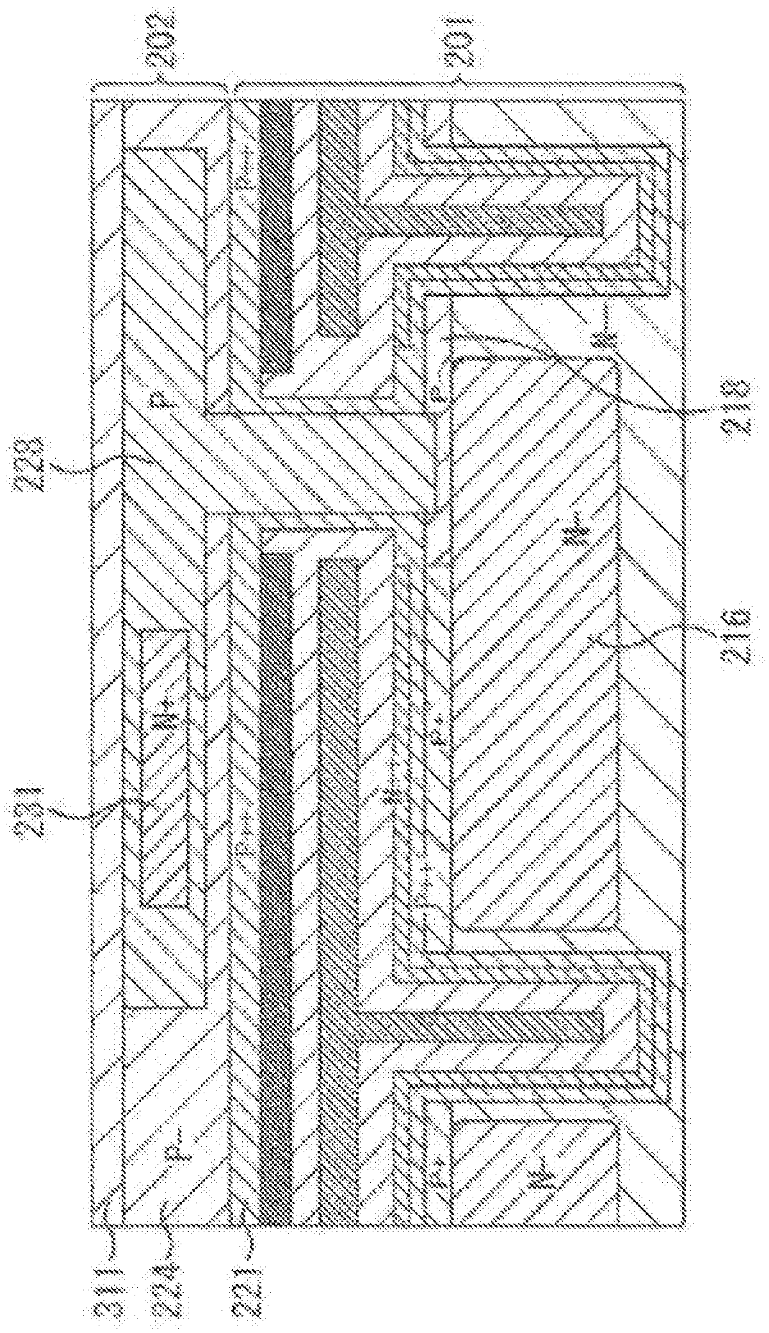
FIG. 38 is a diagram for explaining the method for manufacturing the solid-state image sensing device according to the first embodiment.

P type ions are then implanted and the P type semiconductor region 228 is generated as illustrated in FIG. 38. Further, N+ type ions are implanted and the N+ type semiconductor region 231 is generated in the P type semiconductor region 228. The MEM 154 is configured of the N+ type semiconductor region 231. Further, a charge transfer path from the N− type semiconductor region 216 (the PD 151) to the N+ type semiconductor region 231 (the MEM 154) and the channel of each transistor are configured of the P type semiconductor region 228.

Figure 39:
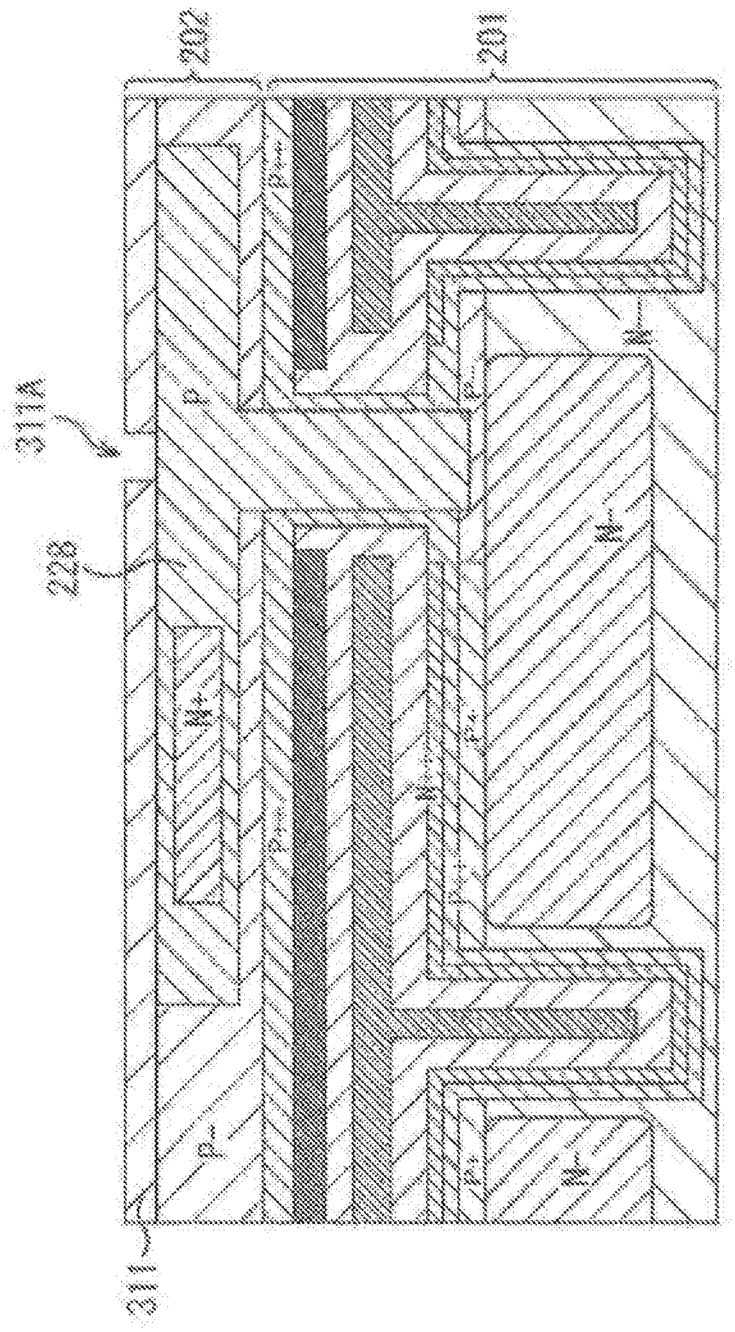
FIG. 39 is a diagram for explaining the method for manufacturing the solid-state image sensing device according to the first embodiment.

The SiO film 311 is then patterned as illustrated in FIG. 39. That is, an opening 311A is formed at the part where the vertical terminal (electrode) part 152AB of the TRX 152 is formed in the SiO film 311.

Figure 40:
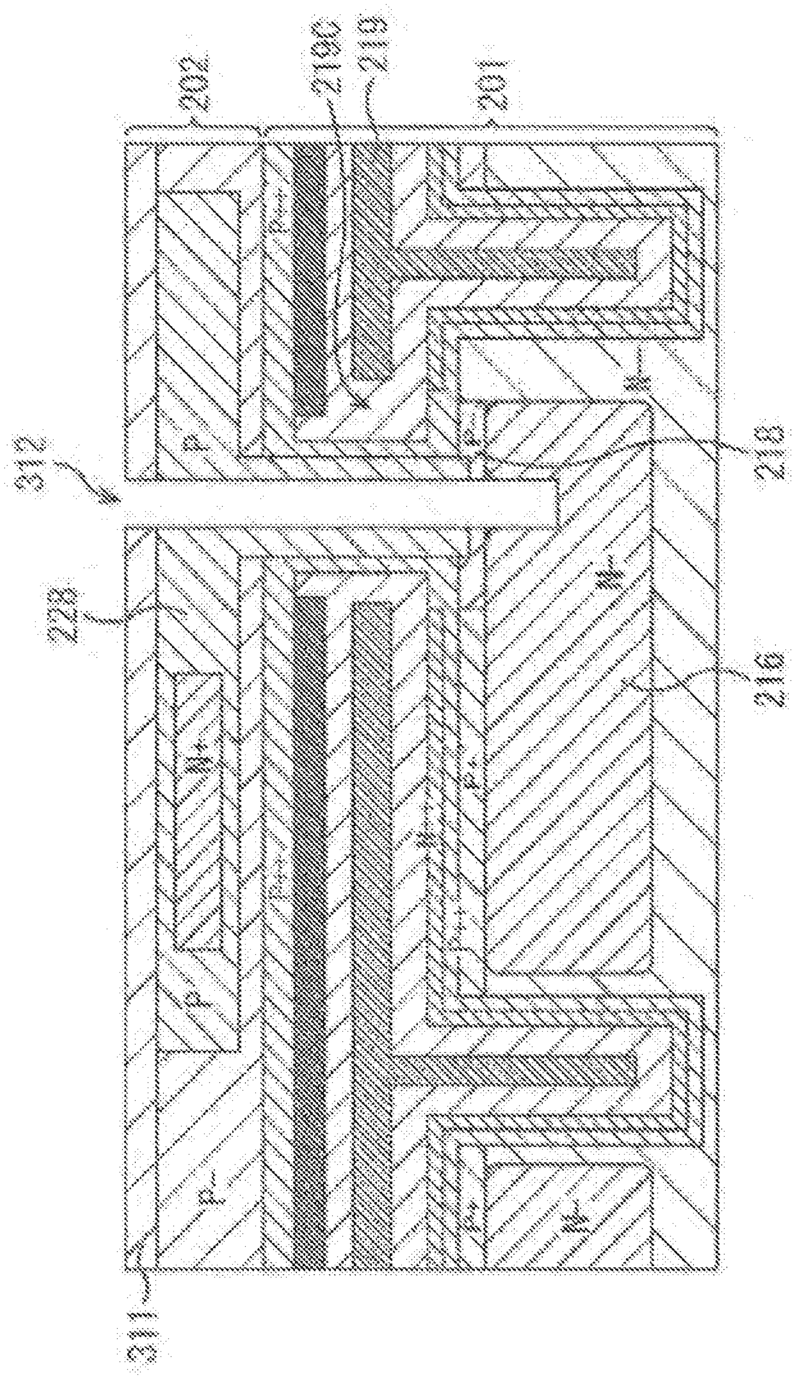
FIG. 40 is a diagram for explaining the method for manufacturing the solid-state image sensing device according to the first embodiment.

A trench 312 is then formed below the opening 311A of the SiO film 311 by dry etching as illustrated in FIG. 40. The trench 312 penetrates through the second semiconductor substrate 202, passes through the opening 219C of the light blocking film 219, and reaches the inside of the N− type semiconductor region 216.

Figure 41:
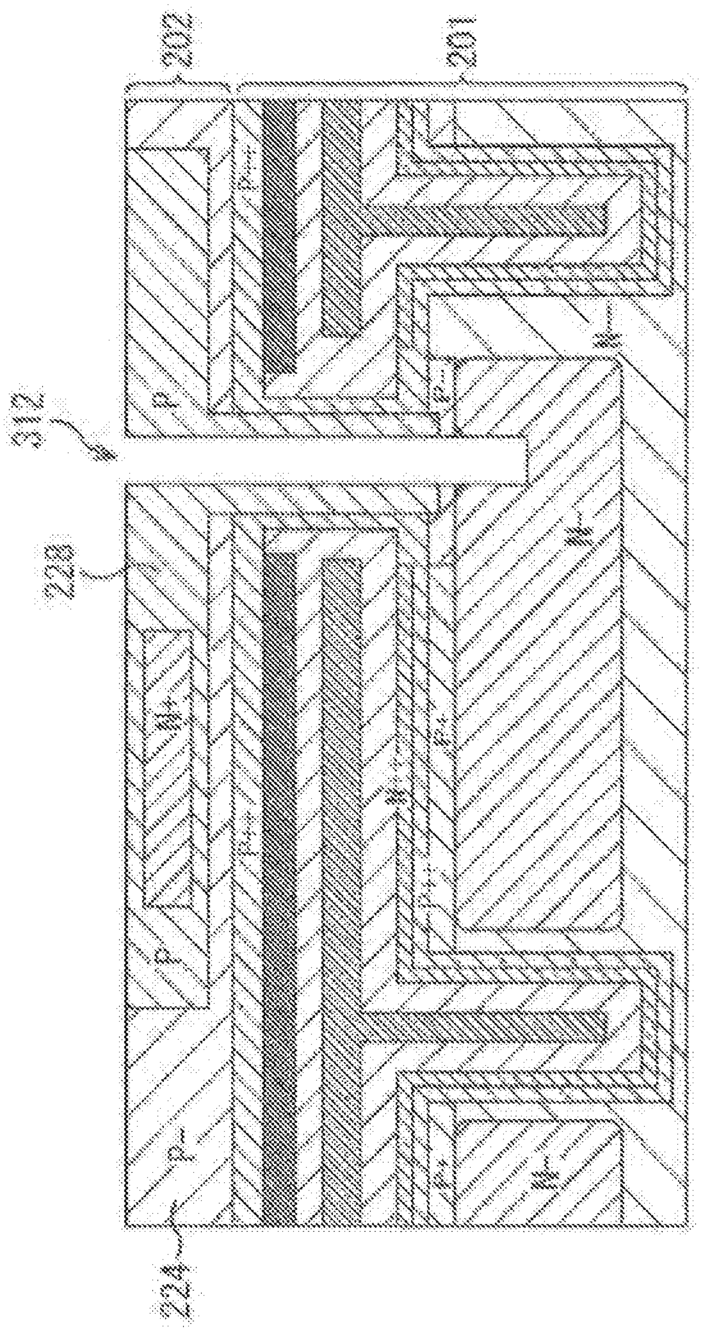
FIG. 41 is a diagram for explaining the method for manufacturing the solid-state image sensing device according to the first embodiment.

The SiO film 311 is then removed as illustrated in FIG. 41.

Figure 42:
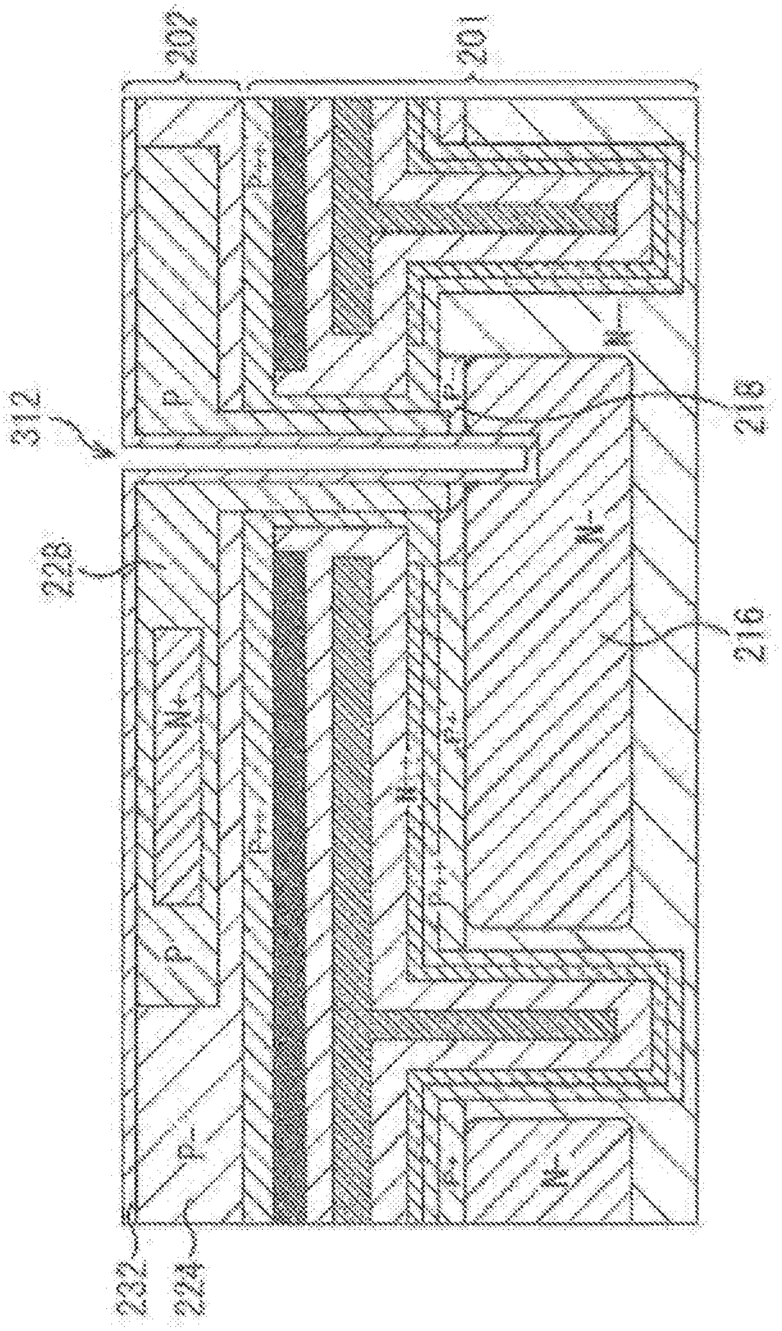
FIG. 42 is a diagram for explaining the method for manufacturing the solid-state image sensing device according to the first embodiment.

The surfaces of the second semiconductor substrate 202 and the trench 312 are then oxidized and the insulative film 232 is formed as illustrated in FIG. 42.

Figure 43:
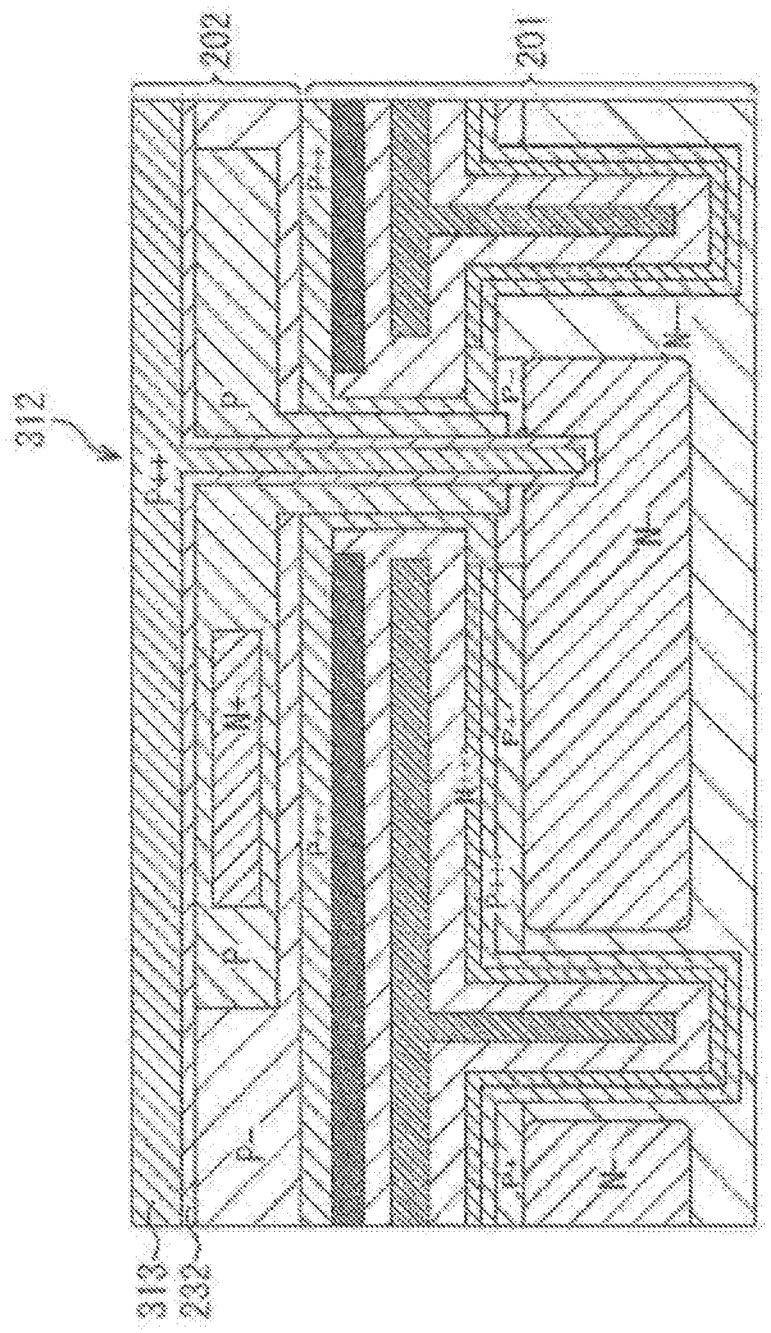
FIG. 43 is a diagram for explaining the method for manufacturing the solid-state image sensing device according to the first embodiment.

Polysilicon is then formed on the surface of the second semiconductor substrate 202 and inside the trench 312 by CVD as illustrated in FIG. 43. P++ type ions are then implanted in the formed polysilicon. Thereby, a P++ type silicon film 313 is generated.

Figure 44:
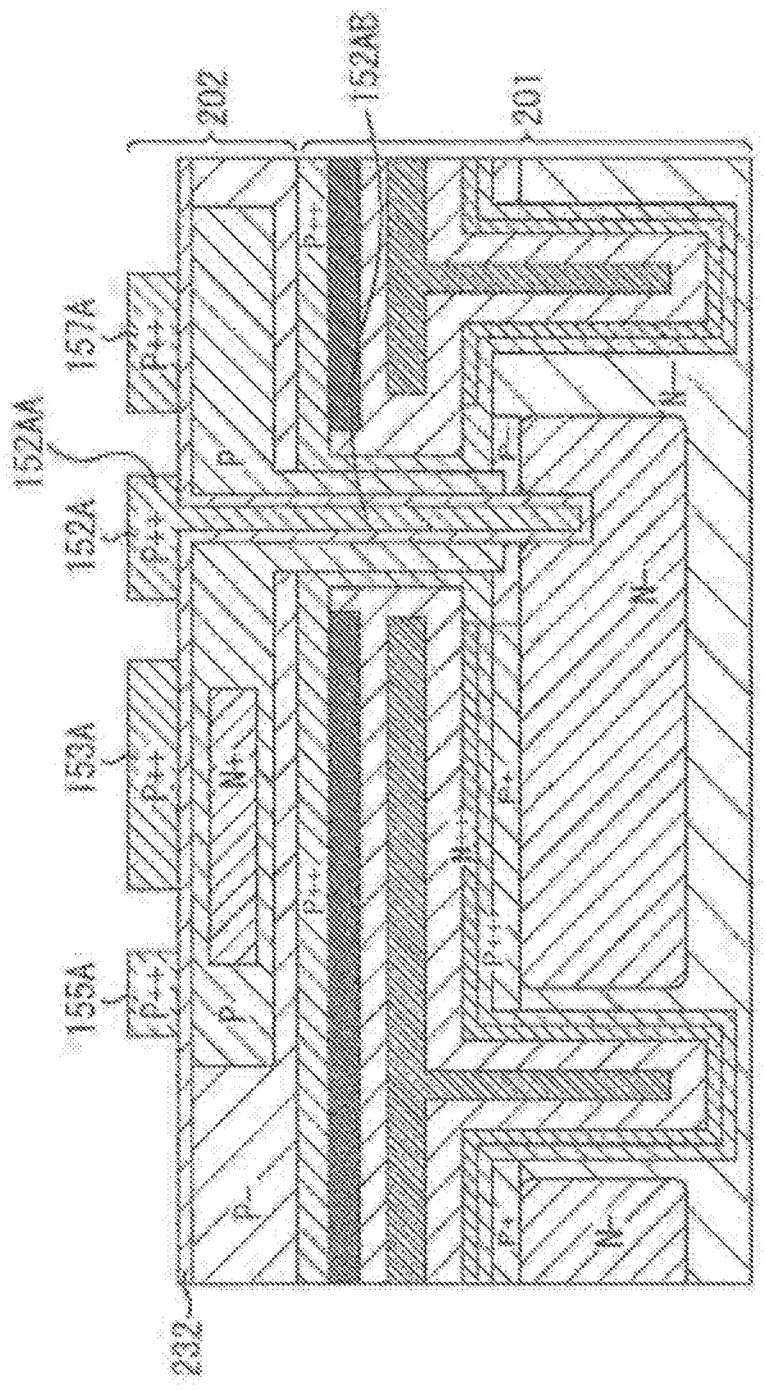
FIG. 44 is a diagram for explaining the method for manufacturing the solid-state image sensing device according to the first embodiment.

The P++ type silicon film 313 is then machined by dry etching and the gate terminal (electrode) of each transistor is generated as illustrated in FIG. 44. FIG. 44 illustrates how the gate terminal (electrode) 152A of the TRX 152, the gate terminal (electrode) 153A of the TRM 153, the gate terminal (electrode) 155A of the TRG 155, and the gate terminal (electrode) 157A of the OFG 157 are generated.

Figure 45:
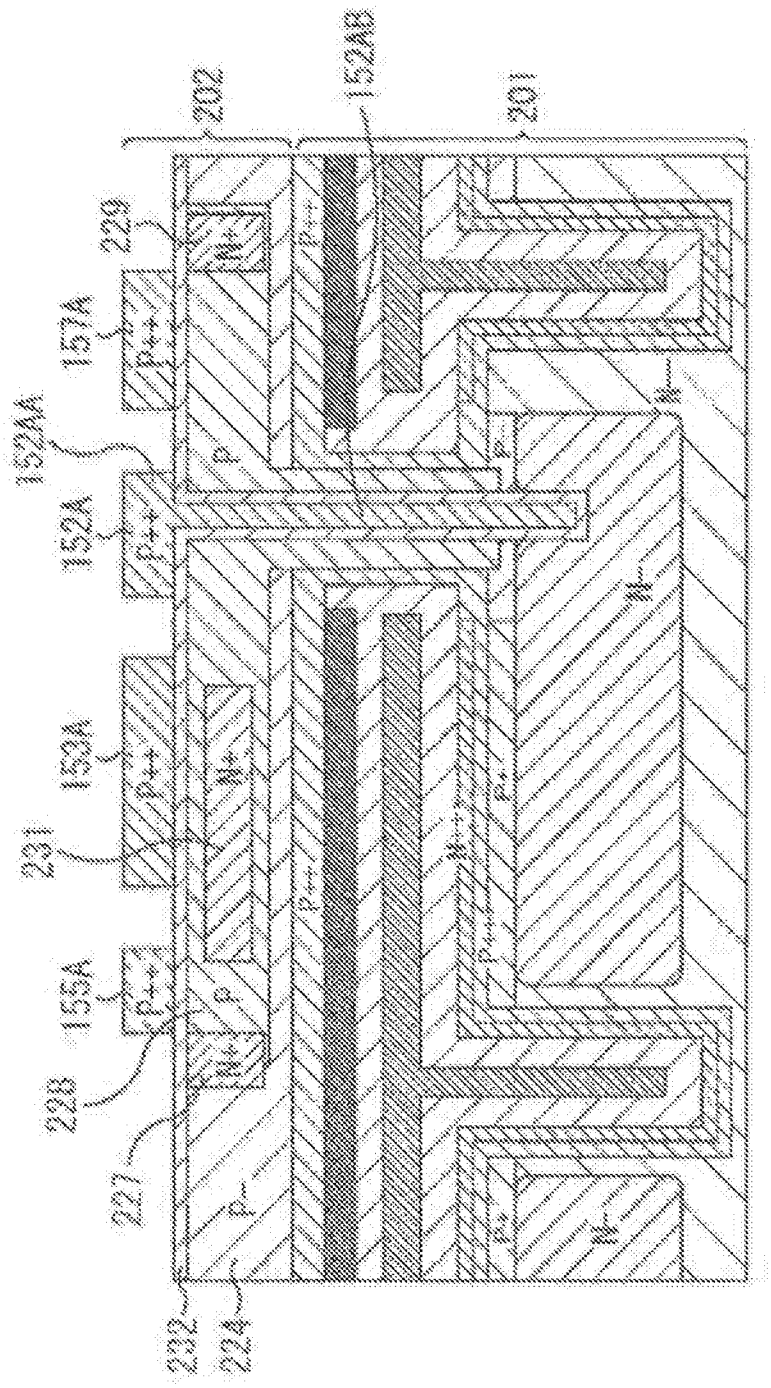
FIG. 45 is a diagram for explaining the method for manufacturing the solid-state image sensing device according to the first embodiment.

A lightly doped drain (LDD) is then generated as illustrated in FIG. 45. Specifically, N+ type ions are implanted and the N+ type semiconductor region 227 is generated on the left of the gate terminal (electrode) 155A and around the boundary between the P− type semiconductor region 224 and the P type semiconductor region 228. Further, N+ type ions are implanted and the N+ type semiconductor region 229 is generated on the right of the gate terminal (electrode) 157A and inside the P type semiconductor region 228.

Figure 46:
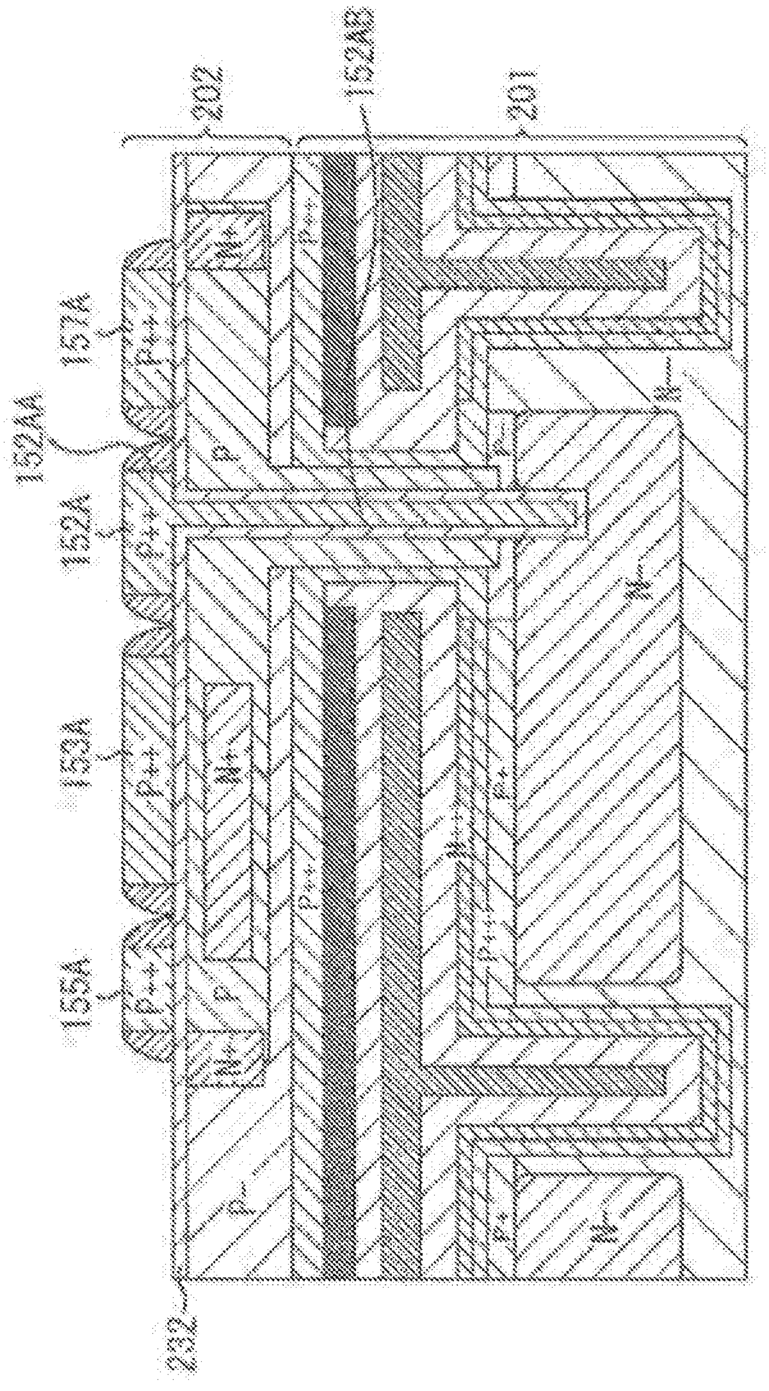
FIG. 46 is a diagram for explaining the method for manufacturing the solid-state image sensing device according to the first embodiment.

A sidewall is then formed on the side surface of the gate terminal (electrode) of each transistor as illustrated in FIG. 46.

Figure 47:
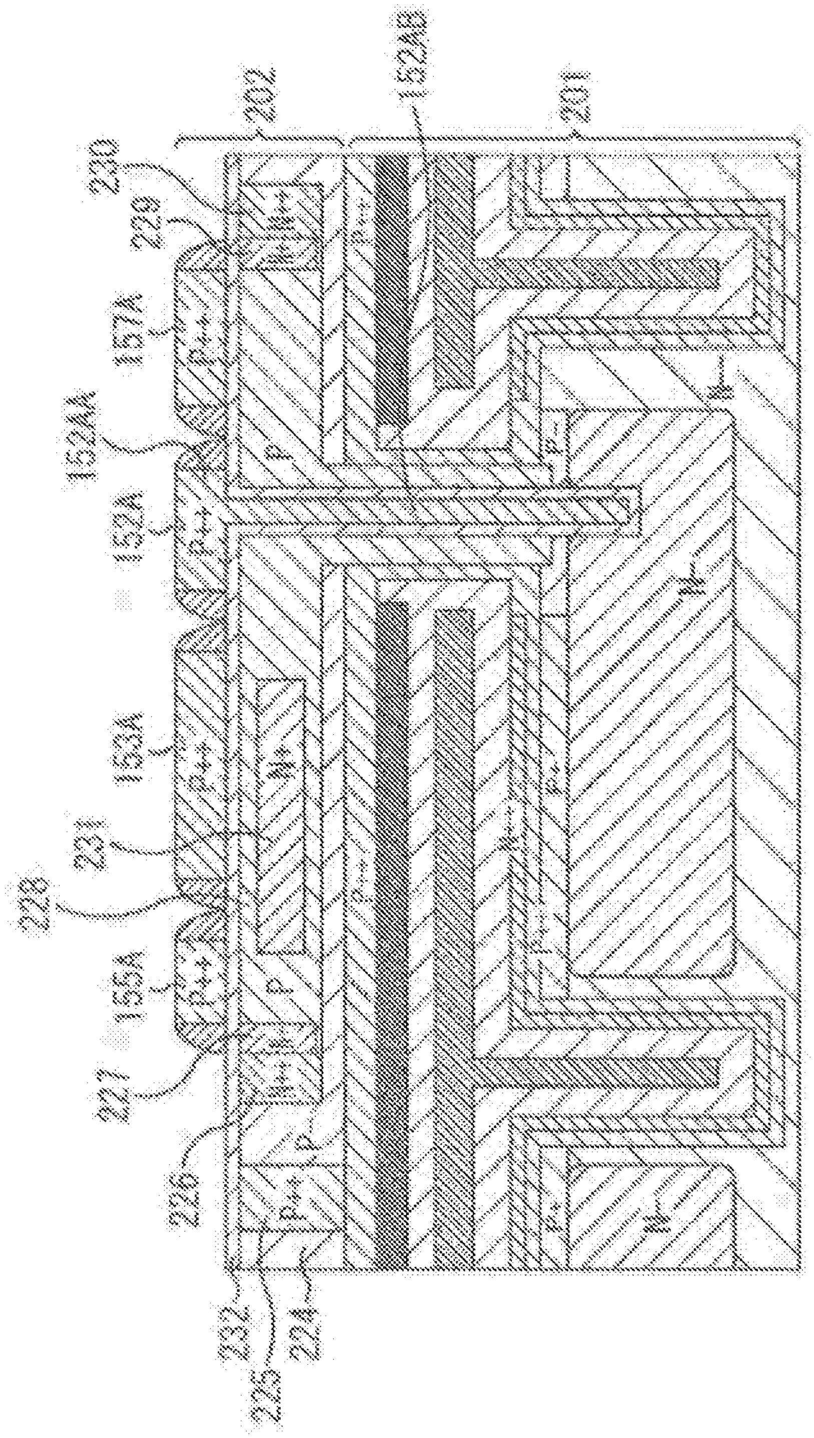
FIG. 47 is a diagram for explaining the method for manufacturing the solid-state image sensing device according to the first embodiment.

N++ type ions and P++ type ions are then implanted as illustrated in FIG. 47. Thereby, the N++ type semiconductor region 226 configuring the FD 156 is generated on the left of the N+ type semiconductor region 227. Further, the N++ type semiconductor region 230 configuring the charge discharging unit is generated on the right of the N+ type semiconductor region 229. Furthermore, the P++ type semiconductor region 225 configuring the charge discharging unit is generated around the left end of the Figure in the P− type semiconductor region 224.

Figure 48:
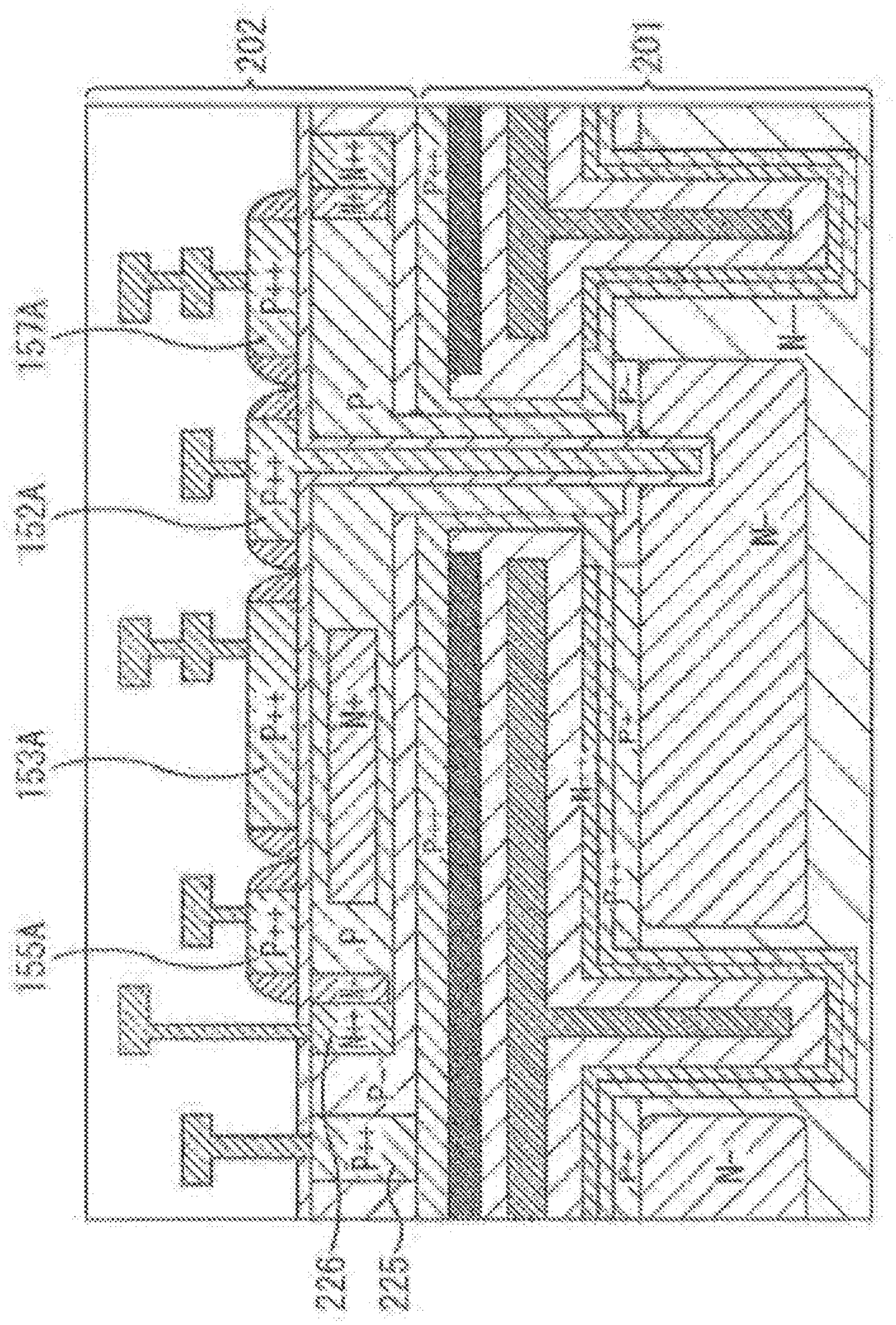
FIG. 48 is a diagram for explaining the method for manufacturing the solid-state image sensing device according to the first embodiment.

An interlayer insulative film and a wiring layer are then formed on the upper layer of the device forming surface of the second semiconductor substrate 202 as illustrated in FIG. 48.

Figure 49:
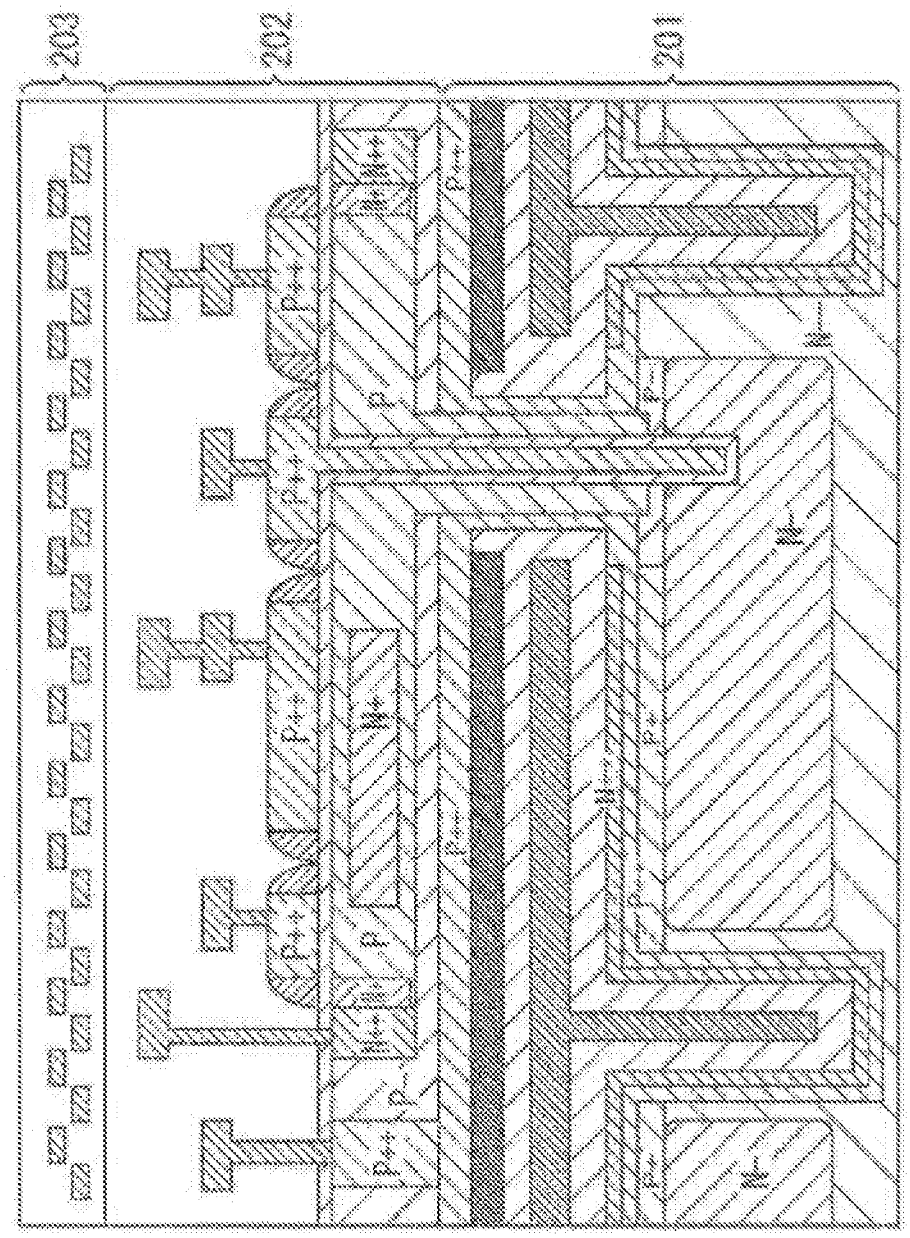
FIG. 49 is a diagram for explaining the method for manufacturing the solid-state image sensing device according to the first embodiment.

The logic layer 203 is then applied to the upper surface of the second semiconductor substrate 202 as illustrated in FIG. 49. Additionally, the method for joining the second semiconductor substrate 202 and the logic layer 203 may employ the method described in Japanese Patent Application Laid-Open No. 2012-204810, for example.

Figure 50:
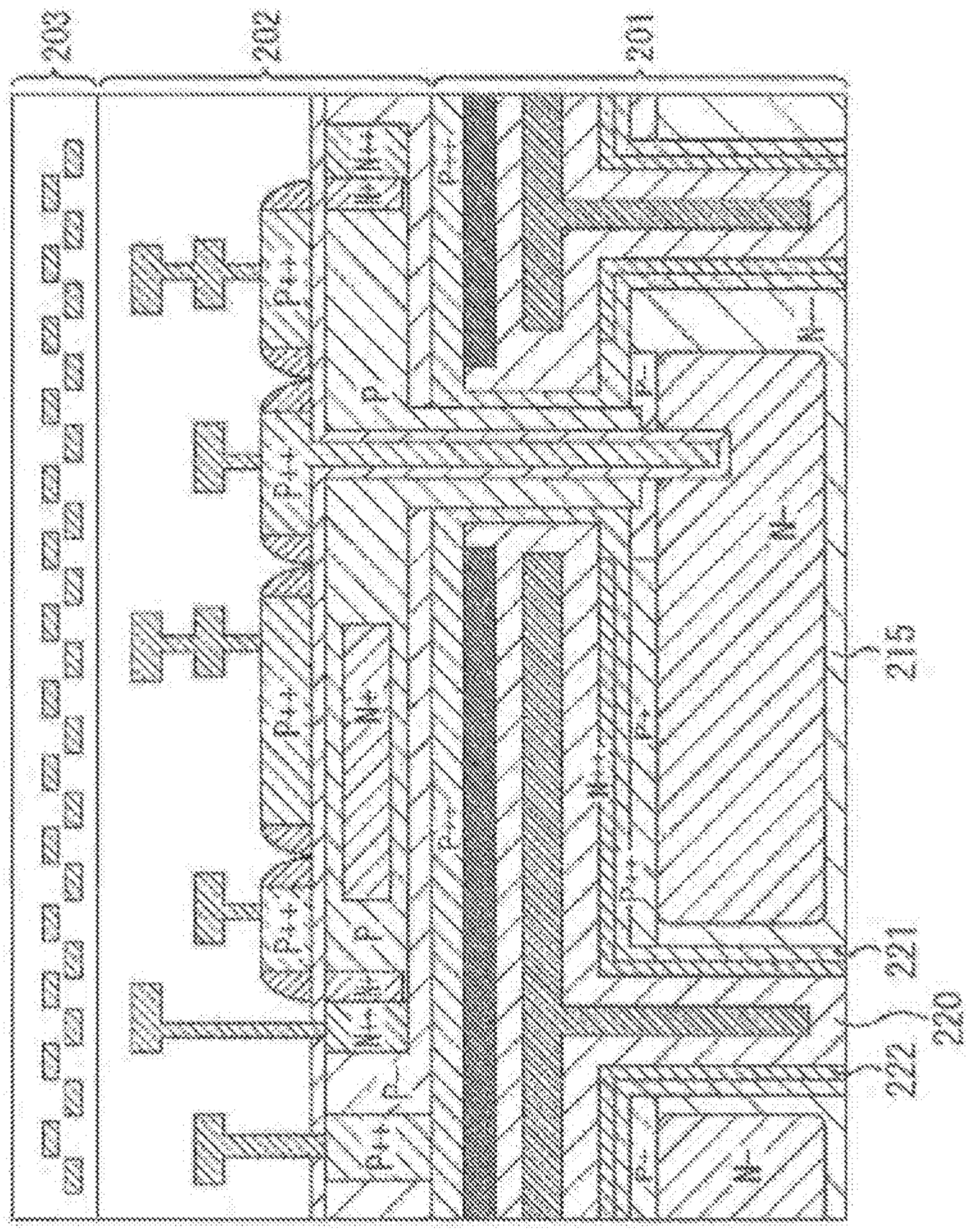
FIG. 50 is a diagram for explaining the method for manufacturing the solid-state image sensing device according to the first embodiment.

The lower surface of the first semiconductor substrate 201 is then polished and planarized by CMP as illustrated in FIG. 50.

Figure 51:
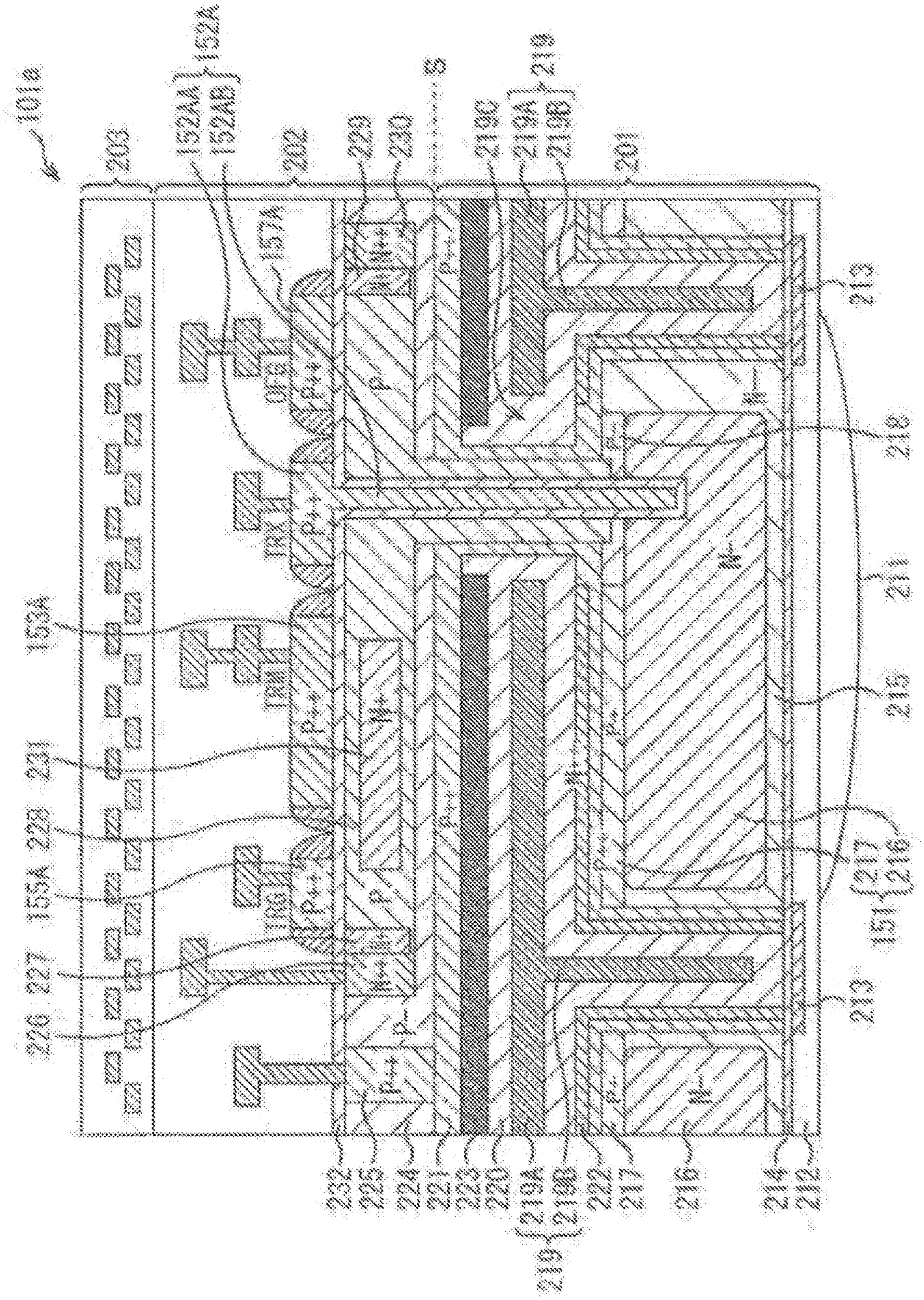
FIG. 51 is a diagram for explaining the method for manufacturing the solid-state image sensing device according to the first embodiment.

The lower surface of the first semiconductor substrate 201 is then machined and the solid-state image sensing device 101*a* is completed as illustrated in FIG. 51. Specifically, the insulative film 214 is generated on the lower surface of the first semiconductor substrate 201. Further, the light blocking film 213 is generated between the PDs 151 in adjacent pixels (the N− type semiconductor region 216 and the P+ type semiconductor region 217) on the lower surface of the insulative film 214. The light blocking film 213 is formed to clog the vertical light blocking part 2198, the insulative film 220, the N++ type semiconductor region 222, and the P++ type semiconductor region 221 from the lower surface of the insulative film 214.

Further, the planarizing film 212 is generated on the lower surface of the insulative film 214. Further, the micro lens 211 and the like are formed on the lower surface of the planarizing film 212 and the solid-state image sensing device 101*a* is completed.

As described above, in the solid-state image sensing device 101*a*, a light is blocked between pixels by the vertical light blocking part 2198 so that a light leaked from an adjacent pixel is prevented from being incident in the PD 151, and a noise such as mixed color is prevented from occurring.

Further, a light which is not absorbed in the PD 151 and passes therethrough is blocked by the horizontal light blocking part 219A and is prevented from invading in an upper layer than the horizontal light blocking part 219A. Thereby, the charges generated by the light passing through the PD 151 are prevented from invading in the MEM 154 or the FD 156, and a noise is prevented from occurring. The effect is larger as the charges are accumulated in the MEM 154 or the FD 156 for a longer time.

Further, the horizontal light blocking part 219A prevents an electric field occurring in a transistor configuring each pixel from influencing the PD 151. That is, a dark current caused due to an electric field of each transistor is prevented from flowing into the PD 151, and a noise is prevented from occurring.

Further, in the solid-state image sensing device 101*a*, the joining interface S between the first semiconductor substrate 201 and the second semiconductor substrate 202 can be arranged only at any position in the channel of the TRX 152 for all the pixels. Further, in an image sensor with more than hundreds of thousands of pixels, the joining interface S can be arranged at the same position in the channel of the TRX 152 for all the pixels. Further, a joining interface may not be formed inside the PD 151, inside the MEM 154, inside the FD 156, and inside the transistors other than the TRX 152.

Further, the joining interface S can be formed near the drain end of the channel of the TRX 152 in the solid-state image sensing device 101*a*. Thereby, a deterioration in charge transfer performance is restricted and life of devices or resistance of gate oxide films can be enhanced.

Further, parasitic resistance is caused in the joining interface S, and the parasitic resistance is to be a cause of leak current. The parasitic resistance is represented by parasitic resistance Rp in FIG. 2 described above, and a leak current is caused in the TRX 152 due to the parasitic resistance Rp.

Here, in a case where the TRX 152 is off, a current does not flow into the parasitic resistance Rp, and a noise does not occur. On the other hand, in a case where the TRX 152 is on, a noise due to the parasitic resistance Rp can occur in a signal by the charges transferred from the PD 151 to the MEM 154. However, the channel of the TRX 152 is configured in the HAD structure or the switching speed of the TRX 152 is further increased so that the signal transferred from the PD 151 to the MEM 154 is sufficiently larger for a noise caused due to the parasitic resistance Rp. Thus, a solution such as improving the channel structure of the TRX 152 or the switching speed can sufficiently decrease the effects of noises due to the leak current.

Further, in the solid-state image sensing device 101*a*, each transistor configuring each pixel, the MEM 154, and the FD 156 are formed in the second semiconductor substrate 202 as monocrystal substrate. Therefore, the excellent I-V property compatible with fine pixel signals can be obtained, thereby restricting a variation in performance per pixel.

2. SECOND EMBODIMENT

A second embodiment of the present technology will be described below with reference to FIG. 52.

Figure 52:
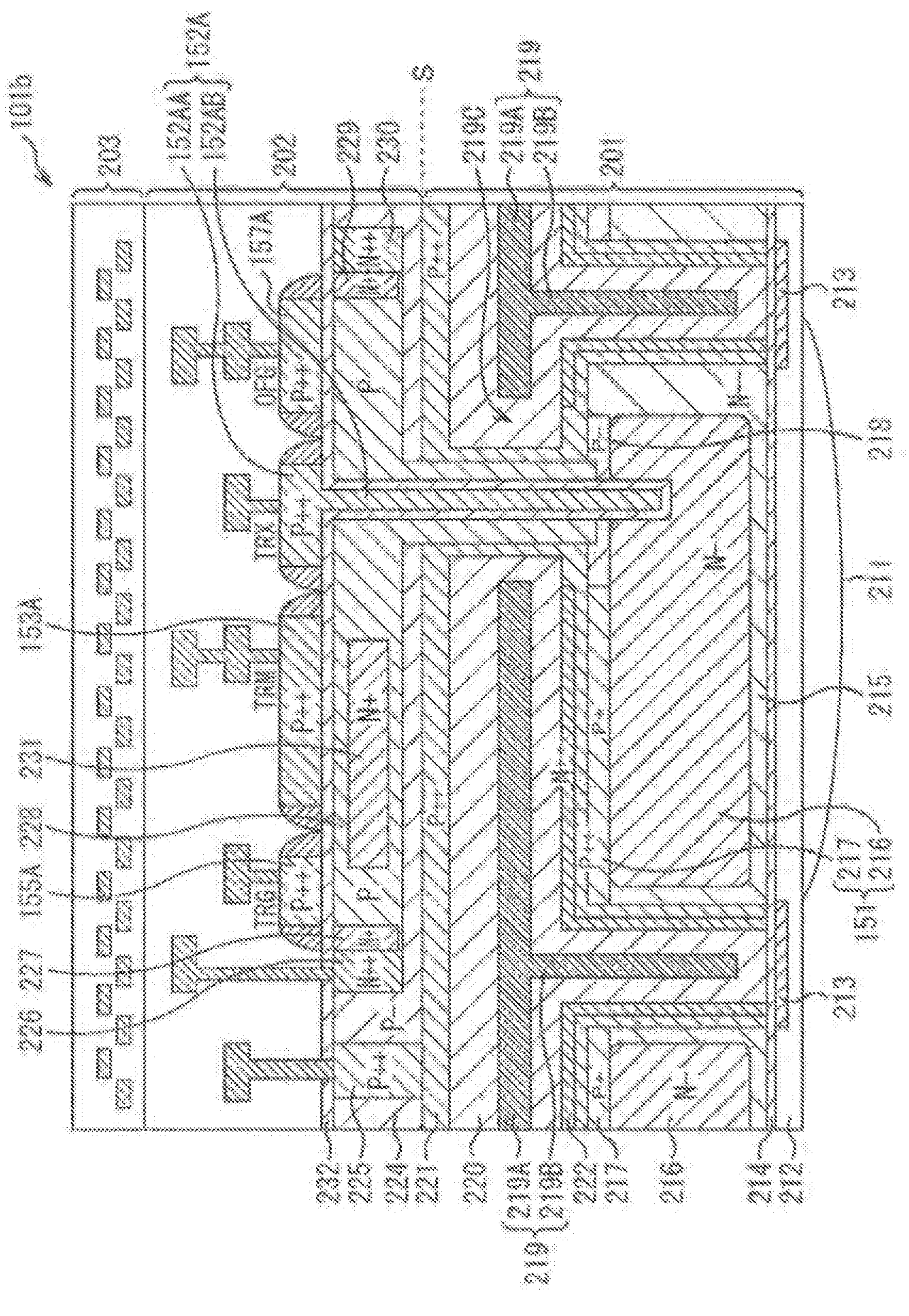
FIG. 52 is a cross-section view schematically illustrating an exemplary configuration of a solid-state image sensing device according to a second embodiment of the present technology.

FIG. 52 is a cross-section view schematically illustrating an exemplary configuration of a solid-state image sensing device 101*b* according to the second embodiment of the present technology. Additionally, the parts corresponding to those in FIG. 3 are denoted with the same reference numerals in the Figure, and the description thereof will be omitted as needed.

The solid-state image sensing device 101*b* in FIG. 52 is different from the solid-state image sensing device 101*a* in FIG. 3 in that the stopper film 223 is deleted and instead the insulative film 220 is formed at the deleted part.

As described above with reference to FIG. 30, the stopper film 223 is used only for preventing the solid-state image sensing device 101*a* from being excessively polished when manufactured, and does not play a special role after the manufacture. Thus, the stopper film 223 can be deleted as in the solid-state image sensing device 101*b*.

3. THIRD EMBODIMENT

A third embodiment of the present technology will be described below with reference to FIG. 53.

Figure 53:
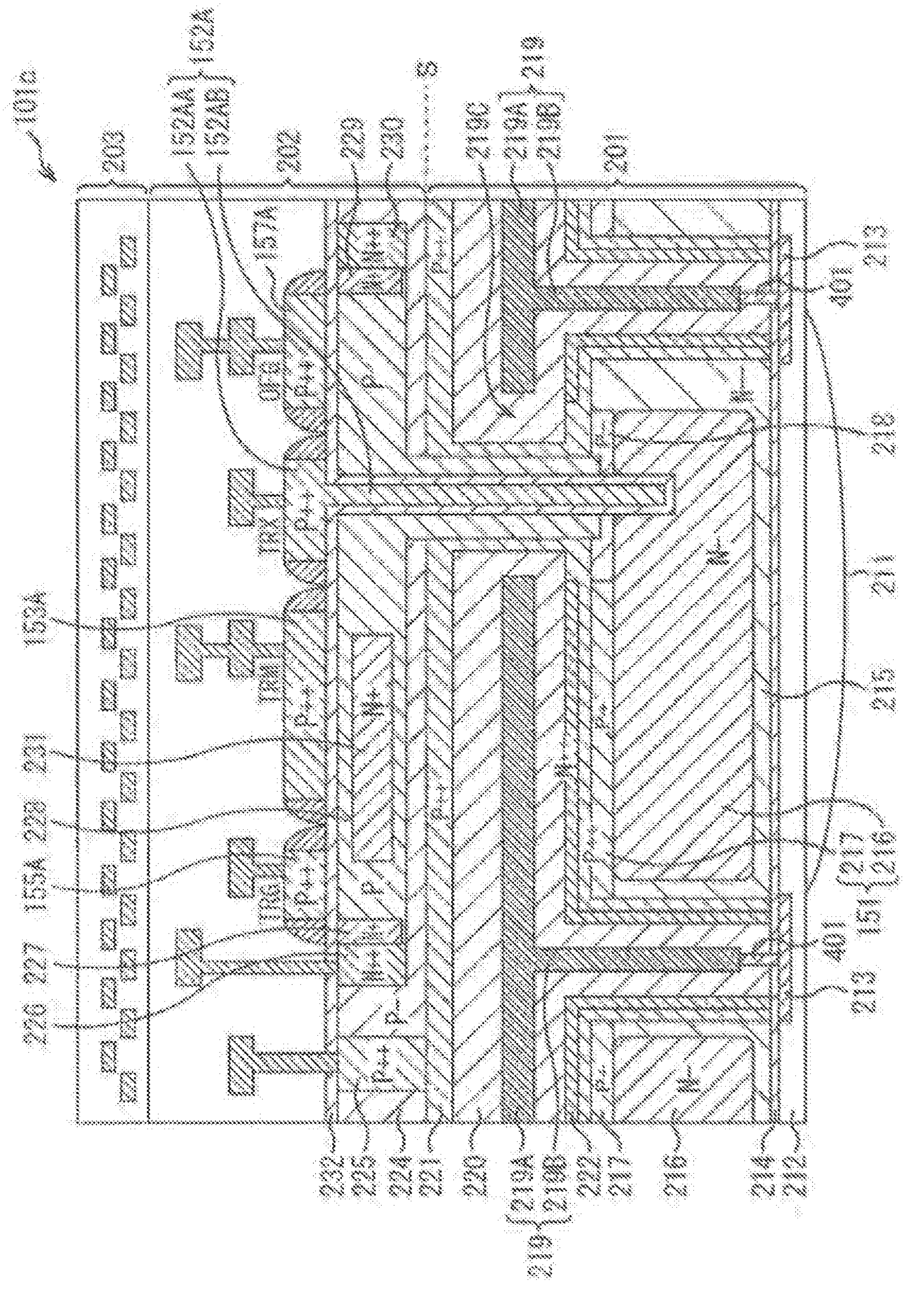
FIG. 53 is a cross-section view schematically illustrating an exemplary configuration of a solid-state image sensing device according to a third embodiment of the present technology.

FIG. 53 is a cross-section view schematically illustrating an exemplary configuration of a solid-state image sensing device 101*c* according to the third embodiment of the present technology. Additionally, the parts corresponding to those in FIG. 52 are denoted with the same reference numerals in the Figure, and the description thereof will be omitted as needed.

The solid-state image sensing device 101*c* in FIG. 53 is different from the solid-state image sensing device 101*b* in FIG. 52 in that the light blocking film 213 on the light receiving surface side of the first semiconductor substrate 201 and the vertical light blocking part 219B of the light blocking film 219 are connected via a light blocking film 401. The light blocking film 401 is arranged to extend over a plurality of pixels in the column direction between columns of pixels adjacent in the row direction in the pixel array part 111 similarly to the vertical light blocking part 2198. Further, the light blocking film 401 is arranged to extend over a plurality of pixels in the row direction between rows of pixels adjacent in the column direction in the pixel array part 111 similarly to the vertical light blocking part 2198. Thereby, the light blocking performance between adjacent pixels is enhanced and a color mixture is prevented from occurring.

Additionally, the light blocking film 401 is made of the same material as the light blocking film 219, for example.

Further, the light blocking film 401 is formed by forming the insulative film 214 in the step in FIG. 51 described above, then patterning the lower surface of the first semiconductor substrate 201 thereby to form a trench by etching, and embedding a metal film in the formed trench.

That is, the light blocking film 401 is formed from the light receiving surface side of the N− type semiconductor region 216 configuring the PD 151, and the vertical light blocking part 219B is formed from the upper surface side of the N− type semiconductor region 216, which are finally joined.

4. FOURTH EMBODIMENT

A fourth embodiment of the present technology will be described below with reference to FIG. 54.

Figure 54:
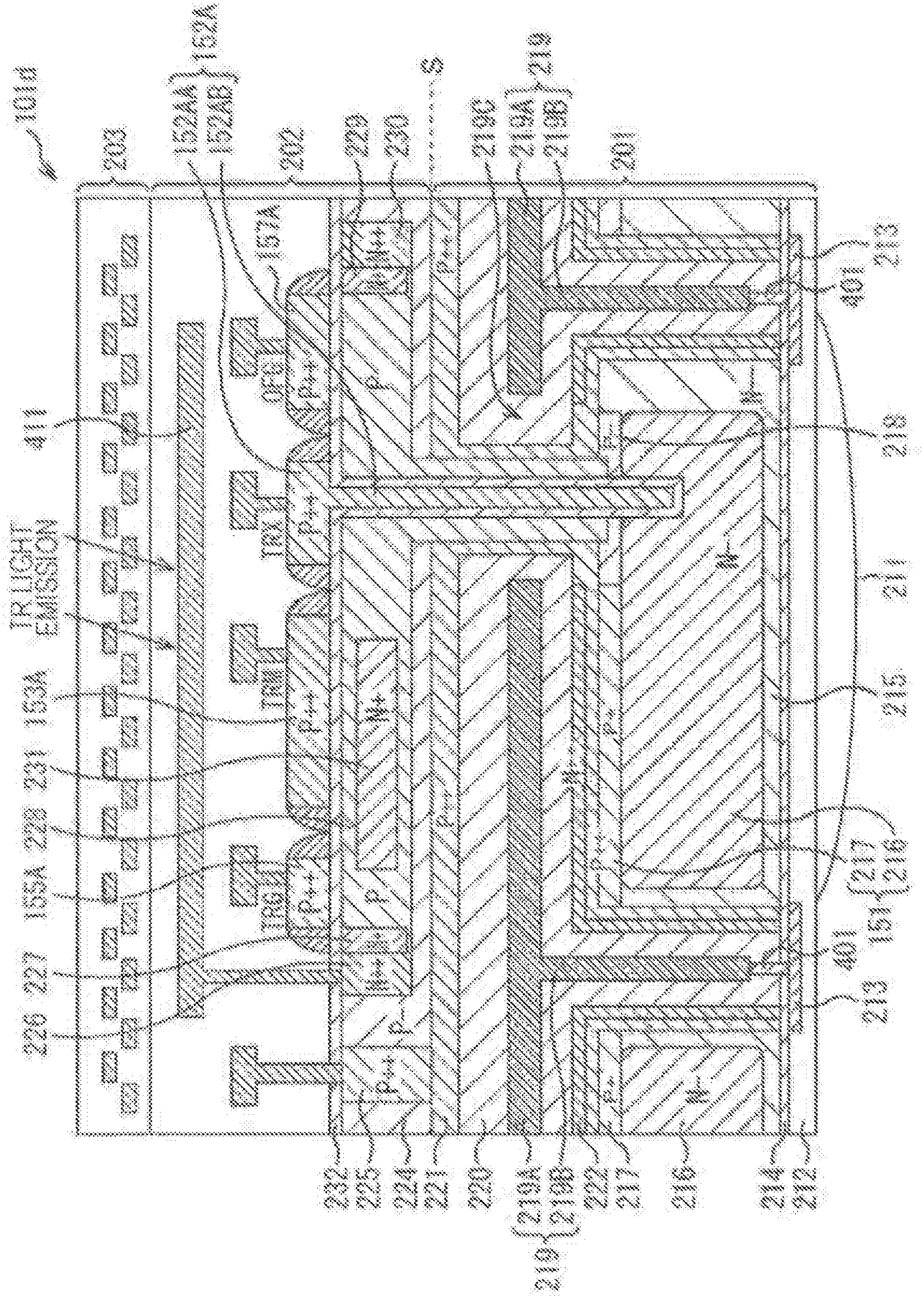
FIG. 54 is a cross-section view schematically illustrating an exemplary configuration of a solid-state image sensing device according to a fourth embodiment of the present technology.

FIG. 54 is a cross-section view schematically illustrating an exemplary configuration of a solid-state image sensing device 101*d* according to the fourth embodiment of the present technology. Additionally, the parts corresponding to those in FIG. 53 are denoted with the same reference numerals in the Figure, and the description thereof will be omitted as needed.

The solid-state image sensing device 101*d* in FIG. 54 is different from the solid-state image sensing device 101*c* in FIG. 53 in that a light blocking film 411 is formed. The light blocking film 411 is formed to cover at least the upper surface of the N+ type semiconductor region 231 (the opposite surface to the surface opposing the horizontal light blocking part 219A) configuring the MEM 154 in the wiring layer of the second semiconductor substrate 202 (farther away from the horizontal light blocking part 219A than the device forming surface of the second semiconductor substrate 202). Additionally, for example, the light blocking film 411 may be formed to entirely cover the second semiconductor substrate 202.

The light blocking film 411 prevents a light emitted when a transistor in the logic layer 203 is operated from being incident in the device forming surface of the second semiconductor substrate 202, for example. Thereby, for example, a light from a transistor in the logic layer 203 is prevented from being incident in the P type semiconductor region 228, charges are prevented from being generated, the generated charges are prevented from being mixed into the N+ type semiconductor region 231, and a noise is prevented from occurring. Further, a noise due to an electric field caused by the logic layer 203 can be prevented.

5. FIFTH EMBODIMENT

A fifth embodiment of the present technology will be described below with reference to FIG. 55.

Figure 55:
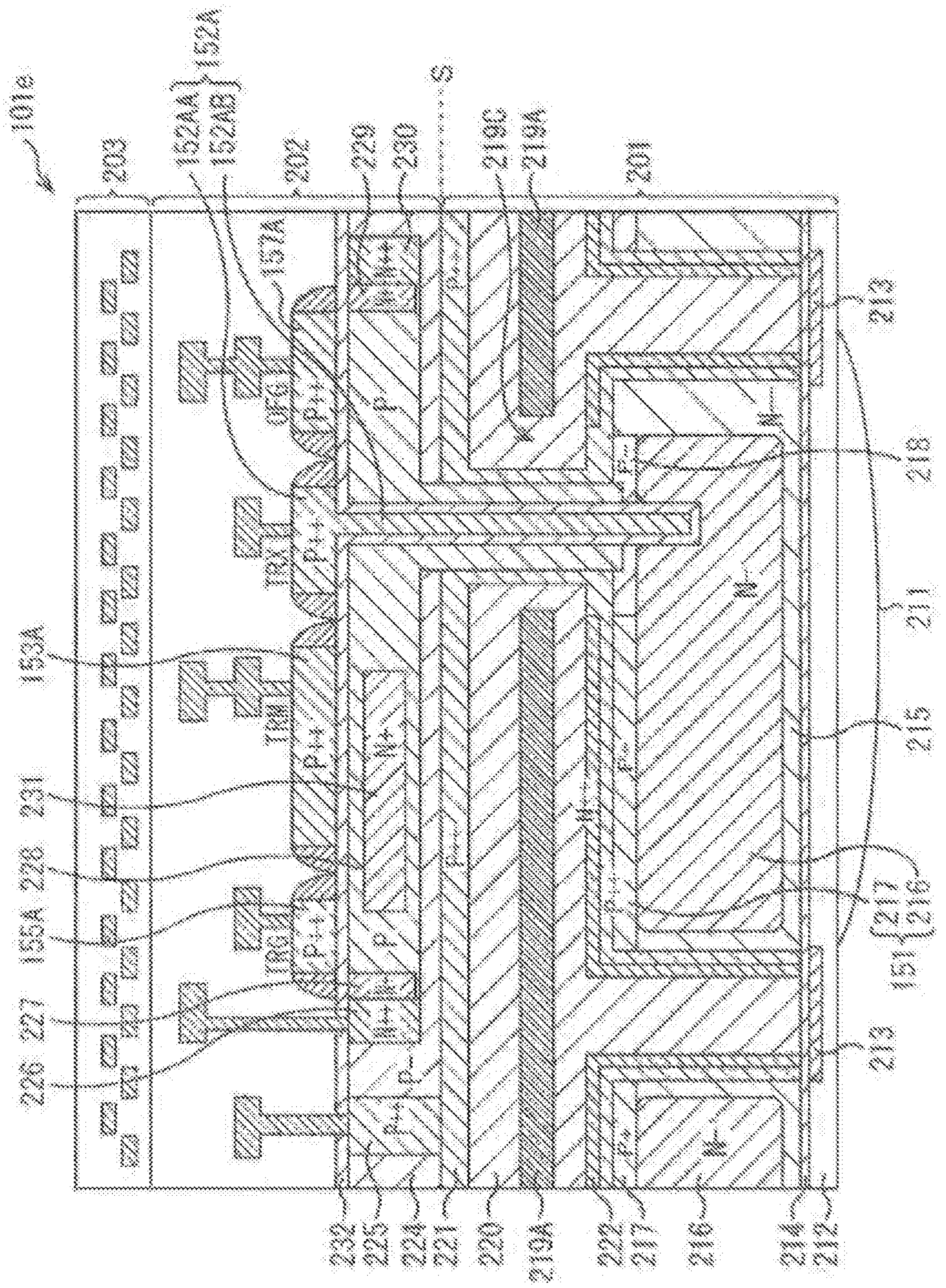
FIG. 55 is a cross-section view schematically illustrating an exemplary configuration of a solid-state image sensing device according to a fifth embodiment of the present technology.

FIG. 55 is a cross-section view schematically illustrating an exemplary configuration of a solid-state image sensing device 101*e* according to the fifth embodiment of the present technology. Additionally, the parts corresponding to those in FIG. 52 are denoted with the same reference numerals in the Figure, and the description thereof will be omitted as needed.

The solid-state image sensing device 101*e* in FIG. 55 is different from the solid-state image sensing device 101*b* in FIG. 52 in that the light blocking film 219 is configured of only the horizontal light blocking part 219A and the vertical light blocking part 2198 is not formed. The insulative film 220 is formed at the part corresponding to the vertical light blocking part 2198 in the solid-state image sensing device 101*b*.

The solid-state image sensing device 101*e* is lower in the light blocking performance between adjacent pixels than the solid-state image sensing device 101*b* due to the absence of the vertical light blocking part 219B. However, an incident light into an adjacent pixel can be sufficiently blocked only by the insulative film 220, thereby restricting noises such as mixed color from occurring.

6. SIXTH EMBODIMENT

A sixth embodiment of the present technology will be described below with reference to FIG. 56 and FIG. 57.

The sixth embodiment is different from the first embodiment and the like described above in that the configuration of the cross section of a pixel is different.

{Exemplary Configuration of Solid-State Image Sensing Device 101*f*}

Figure 56:
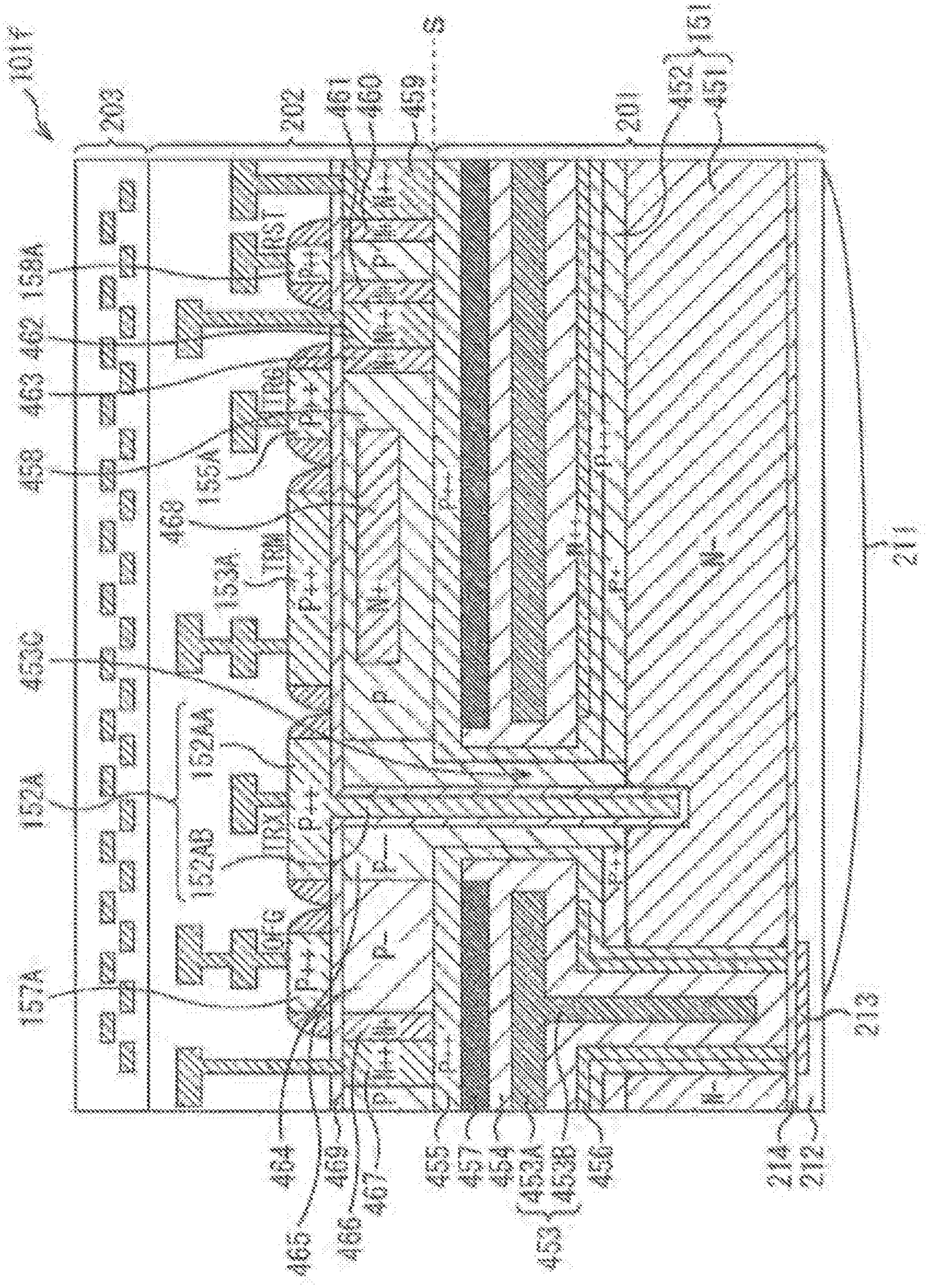
FIG. 56 is a cross-section view schematically illustrating an exemplary configuration of a solid-state image sensing device according to a sixth embodiment of the present technology.
Figure 57:
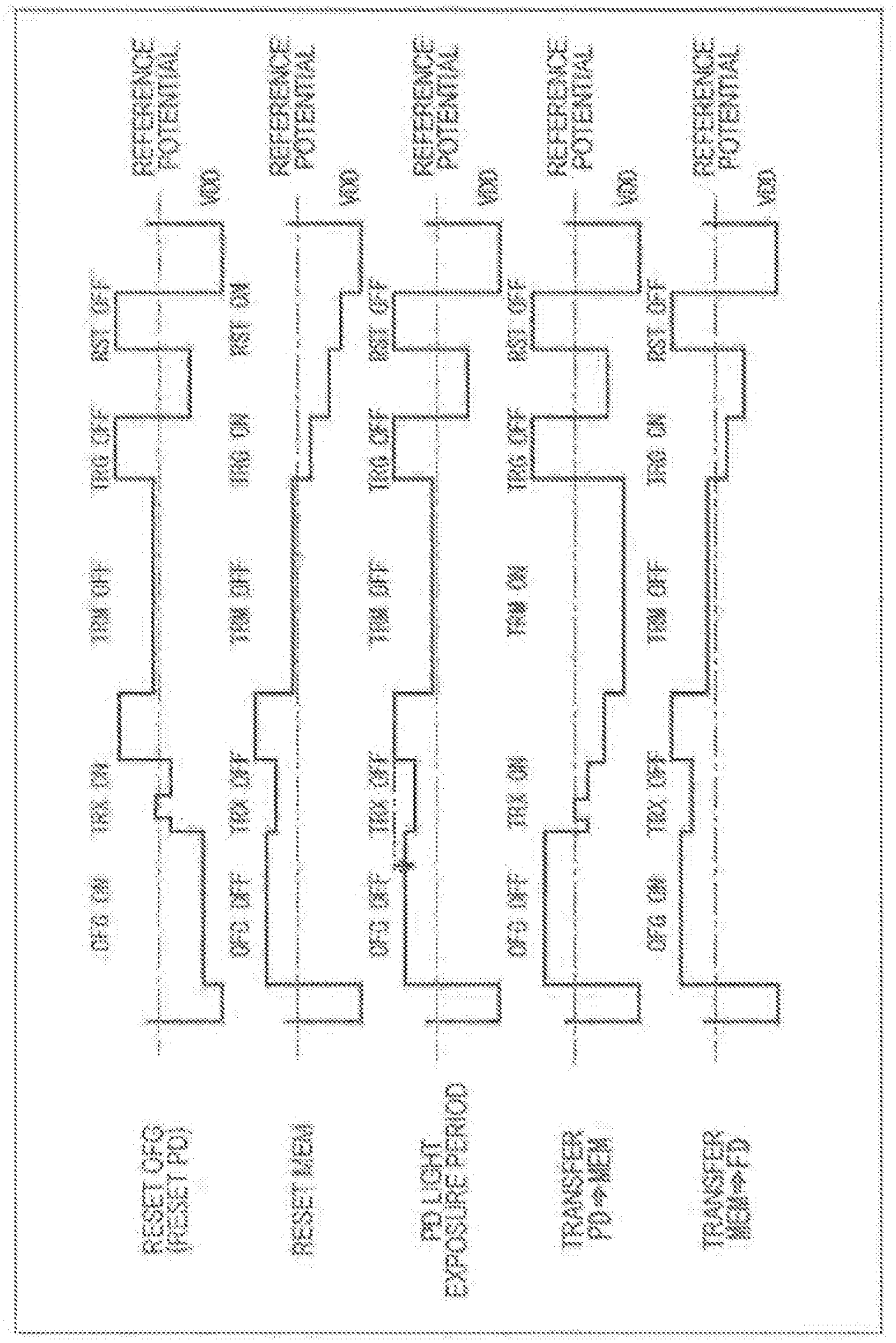
FIG. 57 is a diagram for explaining how to drive the solid-state image sensing device according to the sixth embodiment by way of example.

FIG. 56 is a cross-section view schematically illustrating an exemplary configuration of a solid-state image sensing device 101*f* according to the sixth embodiment of the present technology. Additionally, the parts corresponding to those in FIG. 3 are denoted with the same reference numerals in the Figure, and the description thereof will be omitted as needed.

The insulative film 214, the planarizing film 212, and the micro lens 211 are stacked on the lower surface of an N− type semiconductor region 451 in the first semiconductor substrate 201. A P+ type semiconductor region 452 is formed on the N− type semiconductor region 451. The PD 151 is configured of the N− type semiconductor region 451 and the P+ type semiconductor region 452.

A light incident in a light receiving surface of the solid-state image sensing device 101*f* is photoelectrically converted by the PD 151, and charges generated by the photoelectric conversion are accumulated in the N− type semiconductor region 451.

The light blocking film 213 is formed between the PDs 151 in adjacent pixels (the N− type semiconductor region 451 and the P+ type semiconductor region 452) on the lower surface of the insulative film 214.

Further, the upper surface and the side surface of the PD 151 (the N− type semiconductor region 451 and the P+ type semiconductor region 452) are surrounded by a light blocking film 453. The light blocking film 453 is made of the same material as the light blocking film 219 in FIG. 3, for example. Further, the light blocking film 453 is configured of a horizontal light blocking part 453A and a vertical light blocking part 453B.

The horizontal light blocking part 453A has a planar shape parallel to the light receiving surface of the solid-state image sensing device 101*f*. The horizontal light blocking part 453A covers the upper surfaces of the N− type semiconductor region 451 and the P+ type semiconductor region 452 configuring the PD 151 except an opening 453C. Further, the horizontal light blocking part 453A is arranged over the entire region of the pixel array part 111 except the opening 453C in each pixel like the horizontal light blocking part 453A according to the tenth embodiment described below with reference to FIG. 75.

The vertical light blocking part 453B has a wall shape vertical to the light receiving surface of the solid-state image sensing device 101*f*. The vertical light blocking part 453B is formed to surround the side surfaces of the N− type semiconductor region 451 and the P+ type semiconductor region 452 configuring the PD 151. Further, the vertical light blocking part 453B is arranged to extend over a plurality of pixels in the column direction between columns of pixels adjacent in the row direction in the pixel array part 111 like the vertical light blocking part 804B according to the tenth embodiment described below with reference to FIG. 74. Further, the vertical light blocking part 453B is arranged to extend over a plurality of pixels in the row direction between rows of pixels adjacent in the column direction in the pixel array part 111 like the vertical light blocking part 804B according to the tenth embodiment described below with reference to FIG. 74.

The opening 453C is provided for inserting the vertical terminal (electrode) part 152AB of the gate terminal (electrode) 152A of the TRX 152 into the N− type semiconductor region 451 and transferring the charges accumulated in the N− type semiconductor region 451 to an N+ type semiconductor region 468.

A light which is not absorbed in the PD 151 and passes therethrough is reflected on the horizontal light blocking part 453A, and is prevented from invading in an upper surface than the horizontal light blocking part 453A. Thereby, for example, the charges generated by the light passing through the PD 151 are prevented from invading in the N+ type semiconductor region 468 configuring the MEM 154 or an N++ type semiconductor region 462 configuring the FD 156, and a noise is prevented from occurring. Further, the vertical light blocking part 453B prevents a light incident from an adjacent pixel from leaking into the PD 151, and a noise such as mixed color from occurring.

Additionally, the opening 453C is desirably as small as possible such that a light passing through the PD 151 does not pass. Further, the opening 453C is desirably arranged at an end of the pixel (near the vertical light blocking part 453B) in order to prevent an oblique light with a large incident angle from passing.

The light blocking film 453 is covered with an insulative film 454. The insulative film 454 is made of a silicon oxide film (SiO), for example. The insulative film 454 is covered with a P++ type semiconductor region 455. An N++ type semiconductor region 456 is formed between the insulative film 454 and the P++ type semiconductor region 455 below the horizontal light blocking part 453A and around the vertical light blocking part 453B. A gettering effect is caused by the N++ type semiconductor region 456. A stopper film 457 is formed between the insulative film 454 and the P++ type semiconductor region 455 above the horizontal light blocking part 453A. The stopper film 457 is made of a SiN film or SiCN film, for example.

The gate terminal (electrode) 152A of the TRX 152, the gate terminal (electrode) 153A of the TRM 153, the gate terminal (electrode) 155A of the TRG 155, the gate terminal (electrode) 157A of the OFG 157, and the gate terminal (electrode) 158A of the RST 158 are formed on the device forming surface of the second semiconductor substrate 202 via an insulative film 469. The gate terminals (electrodes) 153A, 155A, 157A, and 158A are arranged above the horizontal light blocking part 453A, and the gate terminal (electrode) 152A is arranged above the opening 453C of the light blocking film 453.

The gate terminal (electrode) 152A of the TRX 152 is configured of the horizontal terminal (electrode) part 152AA and the vertical terminal (electrode) part 152AB. The horizontal terminal (electrode) part 152AA is formed on the device forming surface of the second semiconductor substrate 202 via the insulative film 469 like the gate terminals (electrodes) of other transistors. The vertical terminal (electrode) part 152AB extends vertically downward from the horizontal terminal (electrode) part 152AA, penetrates through the second semiconductor substrate 202, and extends into the N− type semiconductor region 451 via the opening 453C of the light blocking film 453. Further, the vertical terminal (electrode) part 152AB is covered with the insulative film 469. Thus, the gate terminal (electrode) 152A contacts the N− type semiconductor region 451 via the insulative film 469.

An N++ type semiconductor region 459, an N+ type semiconductor region 460, an N+ type semiconductor region 461, the N++ type semiconductor region 462, an N+ type semiconductor region 463, a P−− type semiconductor region 464, a P− type semiconductor region 465, an N+ type semiconductor region 466, and an N++ type semiconductor region 467 are formed around the surface of the P-type semiconductor region 458 in the second semiconductor substrate 202 above the horizontal light blocking part 453A.

The P type semiconductor region 458 is arranged at least from around the right end of the horizontal terminal (electrode) part 152AA of the TRX 152 to around the right end of the gate terminal (electrode) 155A of the TRG 155. Therefore, the P type semiconductor region 458 is arranged at least immediately below the gate terminal (electrode) 153A of the TRM 153 and immediately below the gate terminal (electrode) 155A of the TRG 155.

The N++ type semiconductor region 459 is arranged on the right of the gate terminal (electrode) 158A of the RST 158 thereby to configure the charge discharging unit.

The N+ type semiconductor region 460 is arranged on the right of the gate terminal (electrode) 158A of the RST 158 and adjacently on the left of the N++ type semiconductor region 459.

The N+ type semiconductor region 461 is arranged on the left of the gate terminal (electrode) 158A of the RST 158.

The N++ type semiconductor region 462 is arranged adjacently on the left of the N+ type semiconductor region 461 thereby to configure the FD 156.

The N+ type semiconductor region 463 is arranged on the right of the gate terminal (electrode) 155A of the TRG 155 and adjacently on the left of the N++ type semiconductor region 462.

The P−− type semiconductor region 464 is arranged immediately below the gate terminal (electrode) 152A of the TRX 152. Further, the P−− type semiconductor region 464 surrounds the vertical terminal (electrode) part 152AB of the TRX 152 except the tip thereof via the insulative film 469.

The P− type semiconductor region 465 is arranged from around the left side of the gate terminal (electrode) 152A to around the right end of the gate terminal (electrode) 157A.

The N+ type semiconductor region 466 is arranged on the left of the gate terminal (electrode) 157A and adjacently on the left of the P− type semiconductor region 465.

The N++ type semiconductor region 467 is arranged adjacently on the left of the N+ type semiconductor region 466 thereby to configure the charge discharging unit.

The N+ type semiconductor region 468 is formed inside the P type semiconductor region 458 above the horizontal light blocking part 453A. The N+ type semiconductor region 468 spreads from around the left end of the gate terminal (electrode) 155A to around the left end of the gate terminal (electrode) 153A. The N+ type semiconductor region 468 configures the HAD-type MEM 154.

{Example of how to Drive Solid-State Image Sensing Device 101*f*}

How to drive the solid-state image sensing device 101*f* will be described below with reference to the potential diagram of FIG. 57 by way of example.

At first, the TRX 152 and the OFG 157 are turned on, and the TRM 153, the TRG 155, and the RST 158 are turned off. The charges accumulated in the PD 151 (the N− type semiconductor region 451) are then transferred to the N++ type semiconductor region 467 as charge discharging unit via the TRX 152 and the OFG 157 to be discharged to the outside. Thereby, the PD 151 is reset.

Then, the TRX 152 and the OFG 157 are turned off, and the TRG 155 and the RST 158 are turned on. The charges accumulated in the MEM 154 (the N+ type semiconductor region 468) and the FD 156 (the N++ type semiconductor region 462) are then transferred to the N++ type semiconductor region 459 as charge discharging unit via the TRG 155 and the RST 158 to be discharged to the outside. Thereby, the MEM 154 and the FD 156 are reset.

Then, the TRG 155 and the RST 158 are turned off and a light exposure period starts. During the light exposure period, the PD 151 (the N− type semiconductor region 451) generates and accumulates the charges depending on the amount of received light. Here, a potential difference due to a difference in impurity concentration is between the P type semiconductor region 458 and the P− type semiconductor region 465, and thus when the TRX 152, the TRM 153, and the OFG 157 are off, the potential of the channel of the OFG 157 is slightly lower than the potential of the channel of the TRM 153 closer to the TRX 152. Thereby, an overflow path is formed between the PD 151 (the N− type semiconductor region 451) and the N++ type semiconductor region 467 as charge discharging unit. Thus, the charges overflowed from the PD 151 (the N− type semiconductor region 451) are discharged to the N++ type semiconductor region 467 via the overflow path without leaking into the MEM 154 (the N+ type semiconductor region 468).

Then, the TRX 152 and the TRM 153 are turned on and the light exposure period ends. Here, a potential difference due to a difference in impurity concentration is between the P−− type semiconductor region 464 and the N+ type semiconductor region 468, and thus when the TRX 152 and the TRM 153 are turned on, the potential of the channel of the TRM 153 is lower than the potential of the channel of the TRX 152. Thereby, the charges accumulated in the PD 151 (the N− type semiconductor region 451) during the light exposure period are transferred to and held in the MEM 154 (the N+ type semiconductor region 468) via the TRX 152 and the TRM 153.

Then, the TRX 152 and the TRM 153 are turned off and the TRG 155 is turned on. Thereby, the charges held in the MEM 154 (the N+ type semiconductor region 468) are transferred to the FD 156 (the N++ type semiconductor region 462) via the TRM 153 and the TRG 155. The potential of the FD 156 is then output as signal level to the vertical signal line VSL via the AMP 159 and the SEL 160.

Additionally, the solid-state image sensing device 101*f* can produce the similar effects to the solid-state image sensing device 101*a* in FIG. 3.

7. SEVENTH EMBODIMENT

A seventh embodiment of the present technology will be described below with reference to FIG. 58 to FIG. 63.

While there has been described the solid-state image sensing device 101*a* in which each device such as transistor configuring a pixel is in a planar structure, the seventh embodiment will be described assuming that each device is in a mesa structure.

Figure 58:
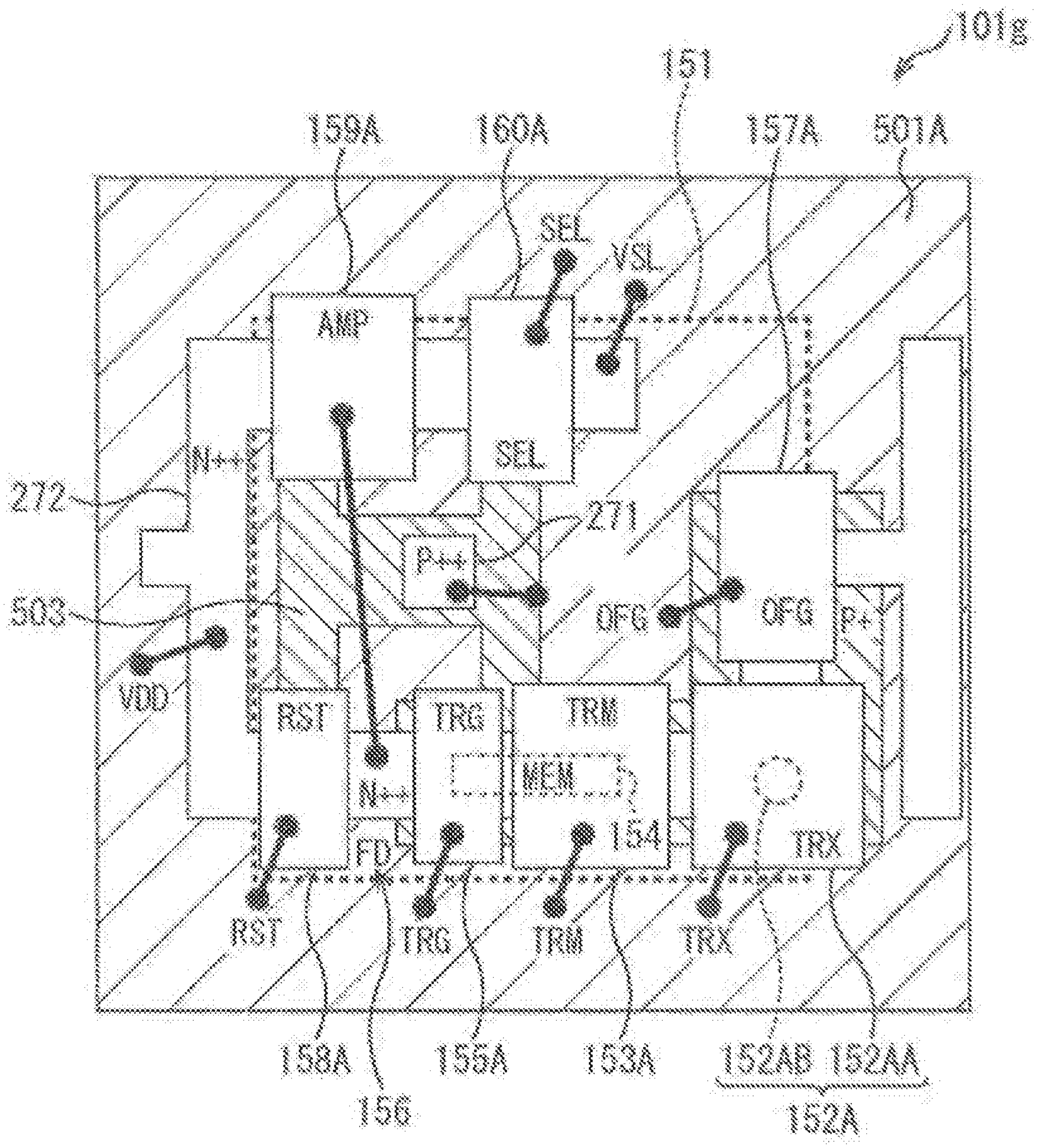
FIG. 58 is a plan view schematically illustrating an exemplary configuration of a device forming surface of a solid-state image sensing device according to a seventh embodiment of the present technology.

FIG. 58 is a plan view schematically illustrating an exemplary configuration of the device forming surface of the second semiconductor substrate 202 in a solid-state image sensing device 101*g* according to the seventh embodiment of the present technology. Additionally, the parts corresponding to those in FIG. 8 are denoted with the same reference numerals in the Figure.

The arrangement of each device in the solid-state image sensing device 101*g* in FIG. 58 is similar to that of each device in the solid-state image sensing device 101*a*. Incidentally, the TRX 152, the TRM 153, the TRG 155, the OFG 157, the RST 158, the AMP 159, and the SEL 160 are configured of a mesa transistor, respectively. Further, each device is in a mesa structure, and thus a horizontal light blocking part 501A of a light blocking film 501 corresponding to the light blocking film 219 in the solid-state image sensing device 101*a* is formed around the surface of the device forming surface of the second semiconductor substrate 202 via an insulative film 502 (FIG. 59 and others).

Figure 59:
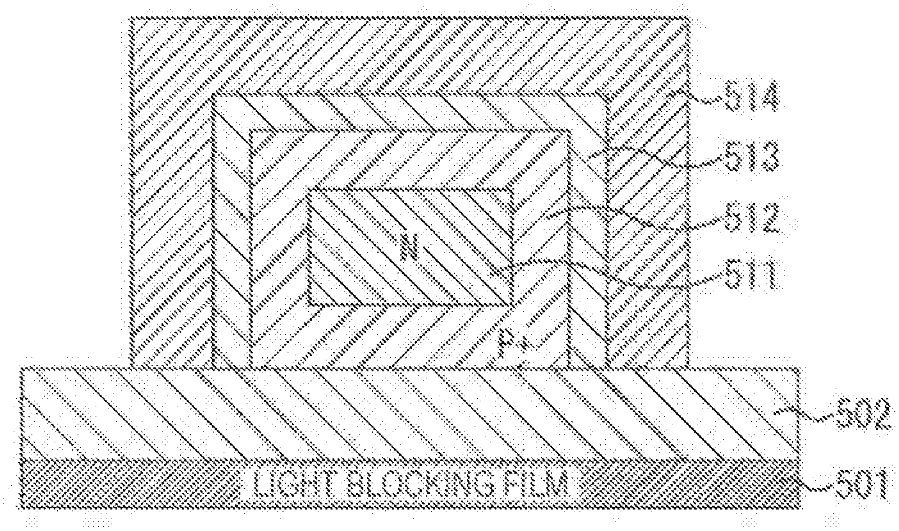
FIG. 59 is a cross-section view schematically illustrating an exemplary configuration of the TRM and the MEM in a mesa structure.

FIG. 59 is a cross-section view schematically illustrating an exemplary configuration of the TRM 153 and the MEM 154. A P+ type semiconductor region 512 is formed on the insulative film 502 formed on the surface of the device forming surface of the second semiconductor substrate 202. An N type semiconductor region 511 configuring the MEM 154 is then formed in the P+ type semiconductor region 512. The N type semiconductor region 511 is covered with the P+ type semiconductor region 512 thereby to configure the HAD-type MEM 154. The upper surface and the side surface of the P+ type semiconductor region 512 are covered with a polysilicon film 514 via an insulative film 513. The insulative film 513 is made of a SiO film, for example. The polysilicon film 514 configures the gate terminal (electrode) 153A of the TRM 153.

In the planar structure in FIG. 9 described above, an electric field by the gate terminal (electrode) 153A is given to the channel (the MEM 154 (the N+ type semiconductor region 231)) only in one direction. On the other hand, in the mesa structure in FIG. 59, an electric field by the gate terminal (electrode) 153A (the polysilicon film 514) is given to the channel (the MEM 154 (the N type semiconductor region 511)) in three directions. Therefore, a change in electric field given to the MEM 154 is larger in the mesa structure. Then, the amount of charges accumulated in the MEM 154 can be accordingly increased depending on a larger change in electric field. Further, the charge transfer property in the channel (the MEM 154) is enhanced.

FIG. 60 to FIG. 63 are the cross-section views schematically illustrating an exemplary configuration of each transistor in the solid-state image sensing device 101*g*. Additionally, the parts corresponding to those in FIG. 59 are denoted with the same reference numerals in the Figures.

Figure 60:
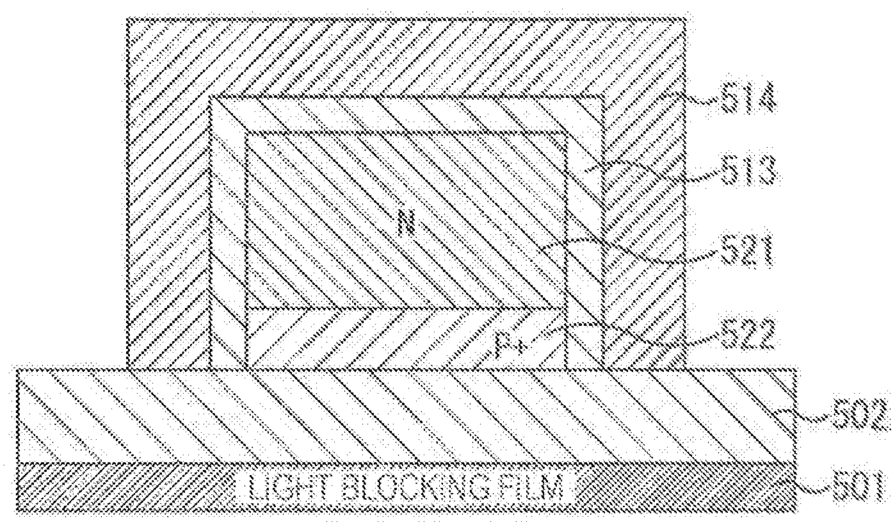
FIG. 60 is a cross-section view schematically illustrating an exemplary configuration of a mesa-structured transistor.

In the exemplary configuration of FIG. 60, a P+ type semiconductor region 522 is formed on the upper surface of the insulative film 502, and an N type semiconductor region 521 is formed on the P+ type semiconductor region 522. The upper surface and the side surface of the N type semiconductor region 521 and the P+ type semiconductor region 522 are covered with the polysilicon film 514 via the insulative film 513.

Figure 61:
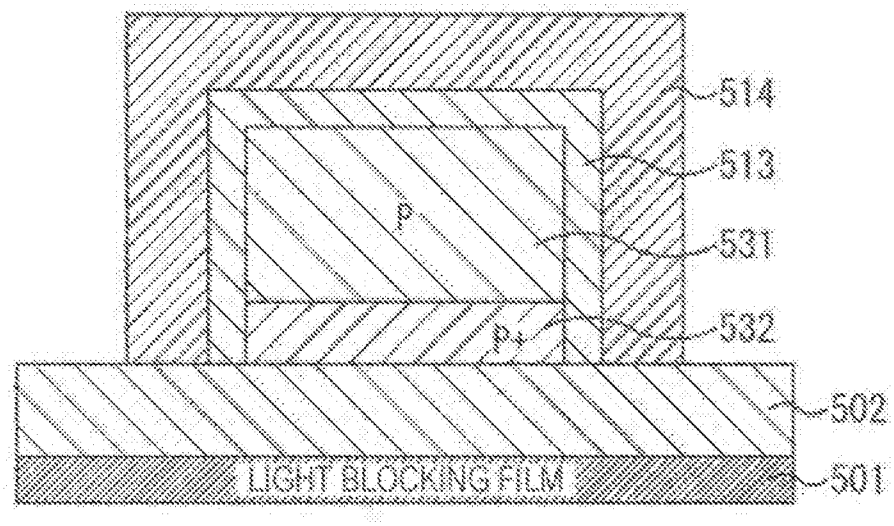
FIG. 61 is a cross-section view schematically illustrating an exemplary configuration of a mesa-structured transistor.

The exemplary configuration of FIG. 61 is different from the exemplary configuration of FIG. 60 in that a P type semiconductor region 531 is formed instead of the N type semiconductor region 521.

Additionally, in a case where the TRM 153 and the TRG 155 have the configuration of FIG. 59 and each transistor other than the TRM 153 and the TRG 155 has the exemplary configuration of FIG. 60 or FIG. 61, the P+ type semiconductor region 512 of the TRM 153 and the P+ type semiconductor region 522 of each transistor are connected via a P+ type semiconductor region 503 in FIG. 58. The P+ type semiconductor region 503 is then connected to the ground via the P-well contact 271 and the metal wiring, for example. Thereby, the body potential of each transistor is stabilized.

Figure 62:
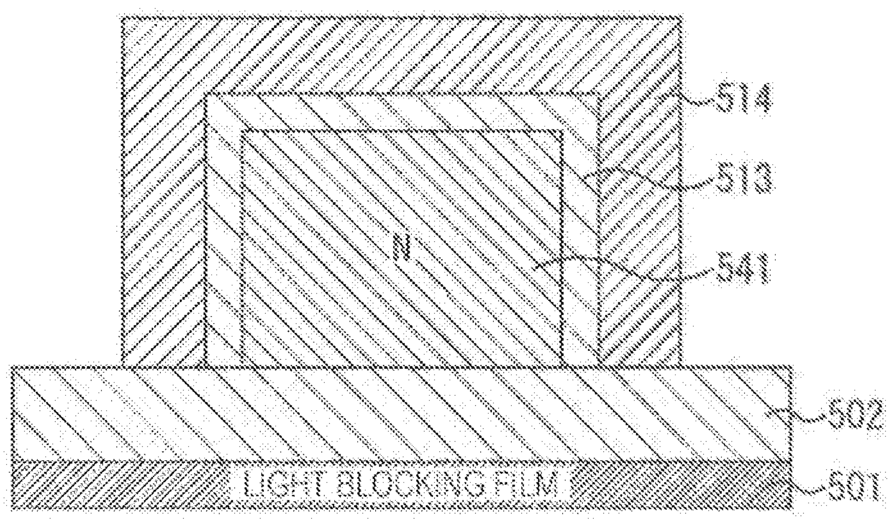
FIG. 62 is a cross-section view schematically illustrating an exemplary configuration of a mesa-structured transistor.

The exemplary configuration of FIG. 62 is different from the exemplary configuration of FIG. 60 in that an N type semiconductor region 541 is formed instead of the N type semiconductor region 521 and the P+ type semiconductor region 522.

Figure 63:
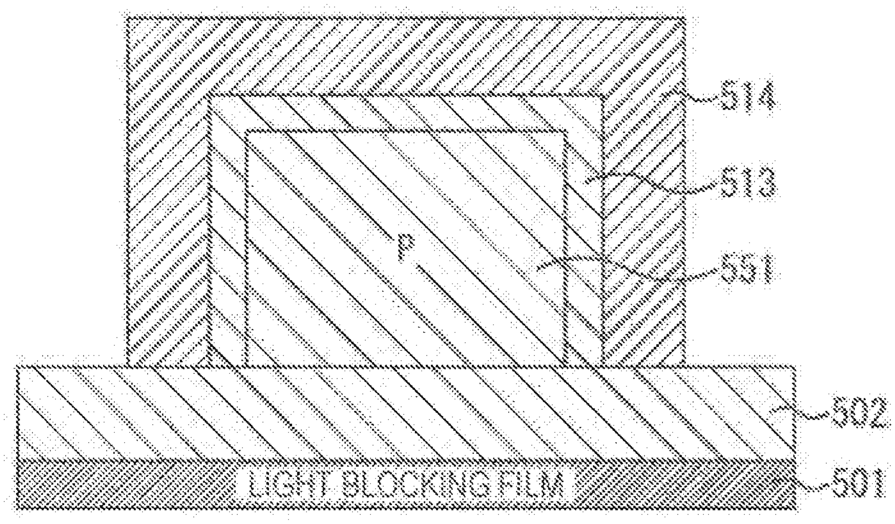
FIG. 63 is a cross-section view schematically illustrating an exemplary configuration of a mesa-structured transistor.

The exemplary configuration of FIG. 63 is different from the exemplary configuration of FIG. 62 in that a P type semiconductor region 551 is formed instead of the N type semiconductor region 531.

Additionally, the transistors in the mesa structure are employed so that the response speed of each transistor can be increased, the transistors can be completely insulated from each other, and a noise can be prevented from being mixed. Further, the AMP 159 is in the mesa structure thereby to reduce random noises. Further, the FD 156 is in the mesa structure thereby to improve the charge transfer speed.

8. EIGHTH EMBODIMENT

An eighth embodiment of the present technology will be described below with reference to FIG. 64 to FIG. 67.

The eighth embodiment is different from the first embodiment and others described above in the circuit configuration and cross section configuration of a pixel.

{Exemplary Configuration of Solid-State Image Sensing Device 101*h*}

Figure 64:
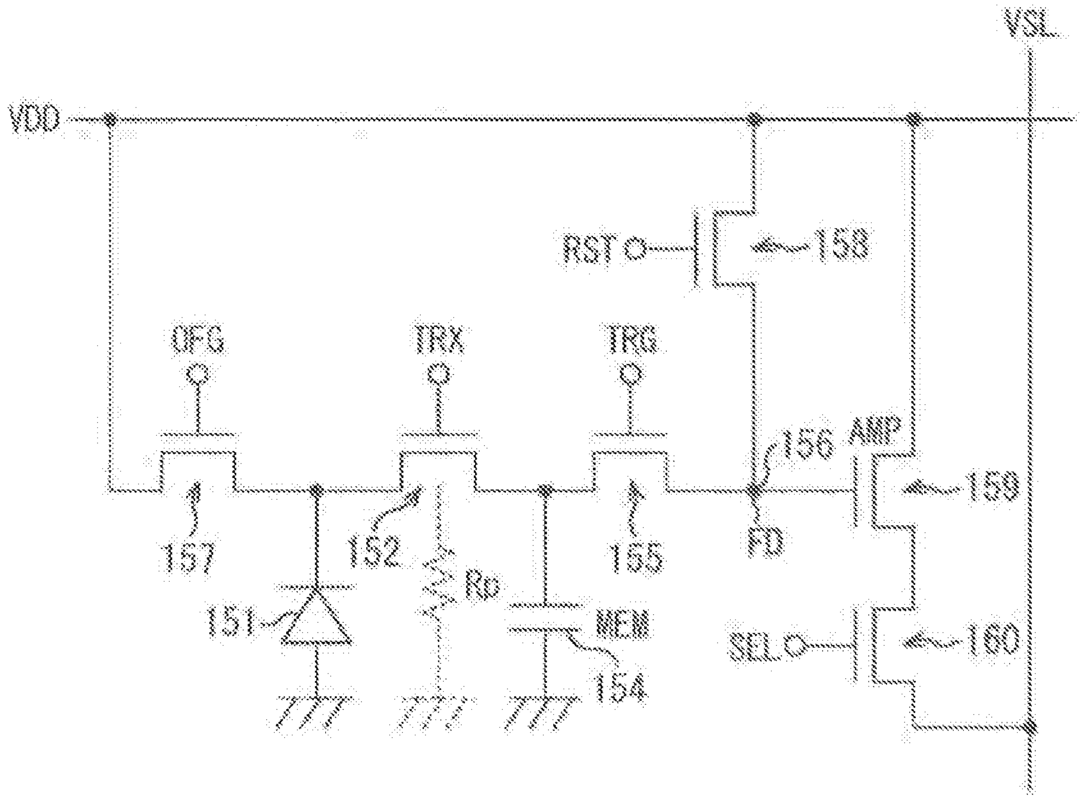
FIG. 64 is a circuit diagram illustrating an exemplary configuration of a pixel in a solid-state image sensing device according to an eighth embodiment of the present technology.

FIG. 64 illustrates an exemplary circuit configuration of one pixel in a solid-state image sensing device 101*h* (FIG. 65) according to the eighth embodiment of the present technology. Additionally, the parts corresponding to those in FIG. 2 are denoted with the same reference numerals in the Figure.

The circuit configuration of FIG. 64 is different from the circuit configuration of FIG. 2 in that the TRM 153 is deleted and the connection positions of the MEM 154 and the OFG 157 are different. Specifically, the TRX 152 and the TRG 155 are directly connected to each other not via the TRM 153. One end of the MEM 154 is connected between the TRX 152 and the TRG 155 and the other end thereof is connected to the ground. The OFG 157 is connected between the power supply VDD and the cathode of the PD 151.

Figure 65:
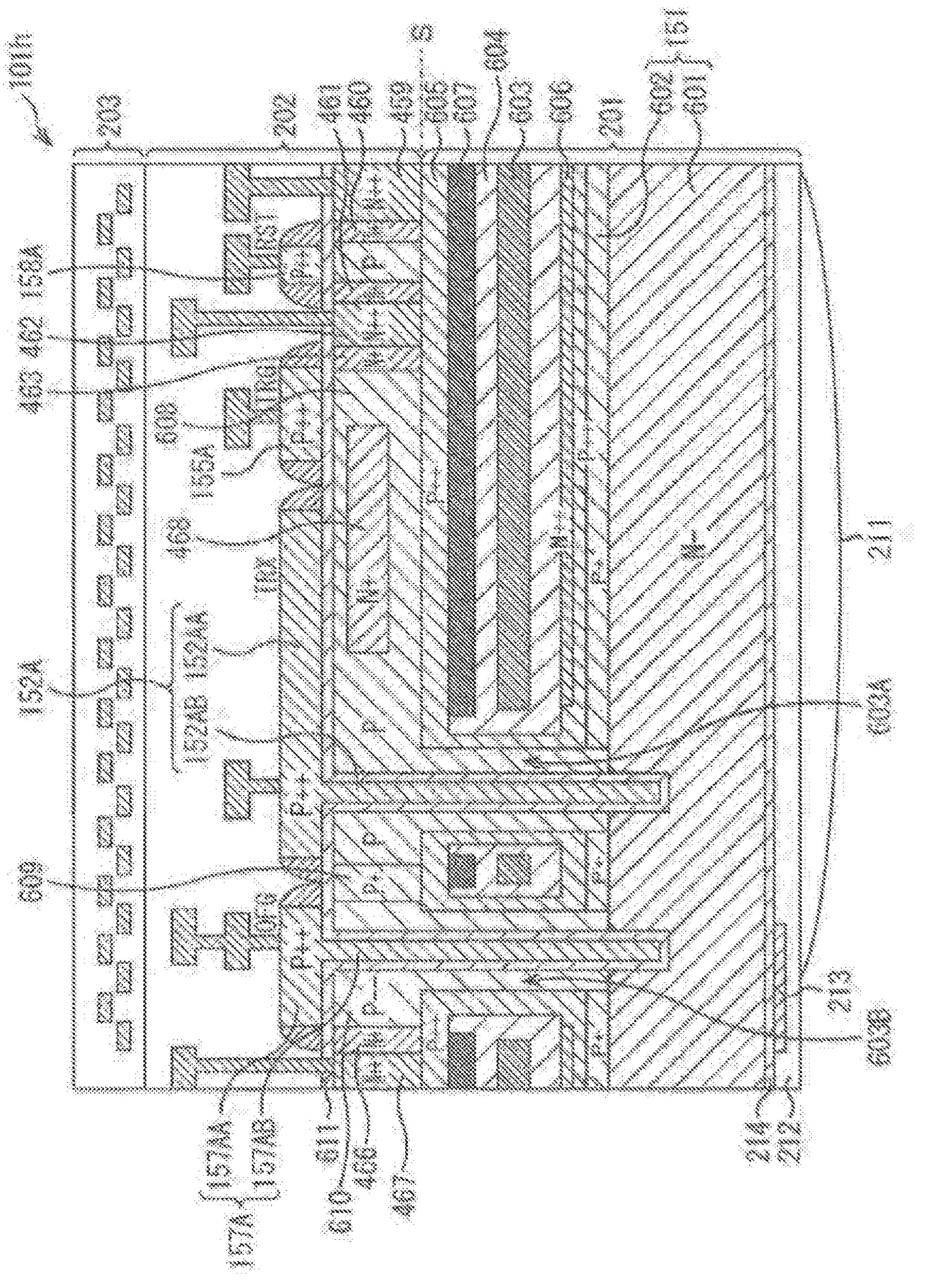
FIG. 65 is a cross-section view schematically illustrating an exemplary configuration of the solid-state image sensing device according to the eighth embodiment.

FIG. 65 is a cross-section view schematically illustrating an exemplary configuration of the solid-state image sensing device 101*h*. Note that the parts corresponding to those in FIG. 56 are denoted with the same reference numerals in the Figure, and the description thereof will be omitted as needed.

The insulative film 214, the planarizing film 212, and the micro lens 211 are stacked on the lower surface of an N− type semiconductor region 601 in the first semiconductor substrate 201. A P+ type semiconductor region 602 is formed on the N− type semiconductor region 601. The PD 151 is configured of the N− type semiconductor region 601 and the P+ type semiconductor region 602.

A light incident in a light receiving surface of the solid-state image sensing device 101*h* is photoelectrically converted by the PD 151, and the charges generated by the photoelectric conversion are accumulated in the N− type semiconductor region 601.

The light blocking film 213 is formed between the PDs 151 (the N− type semiconductor region 601 and the P+ type semiconductor region 602) in adjacent pixels on the lower surface of the insulative film 214.

Further, the upper surface of the PD 151 (the N− type semiconductor region 601 and the P+ type semiconductor region 602) is surrounded by a light blocking film 603. The light blocking film 603 is made of the same material as the light blocking film 453 in FIG. 56, for example.

The light blocking film 603 has a planar shape parallel to the light receiving surface of the solid-state image sensing device 101*f*. The light blocking film 603 covers the upper surface of the N− type semiconductor region 601 and the P+ type semiconductor region 602 configuring the PD 151 except an opening 603A and an opening 603B. Further, the light blocking film 603 is arranged over the entre pixel array part 111 except the opening 603A and the opening 603B in each pixel like the horizontal light blocking part 804A according to the tenth embodiment described below with reference to FIG. 75.

The opening 603A is provided for inserting the vertical terminal (electrode) part 152AB of the gate terminal (electrode) 152A of the TRX 152 into the N− type semiconductor region 601 and transferring the charges accumulated in the N− type semiconductor region 601 to the N+ type semiconductor region 468.

The opening 603B is provided for inserting the vertical terminal (electrode) part 157AB of the gate terminal (electrode) 157A of the OFG 157A into the N− type semiconductor region 601 and transferring the charges accumulated in the N− type semiconductor region 601 to the N++ type semiconductor region 467.

A light which is not absorbed in the PD 151 and passes therethrough is reflected on the light blocking film 603 and is prevented from invading in an upper layer than the light blocking film 603. Thereby, the charges caused by the light passing through the PD 151 are prevented from invading in the N+ type semiconductor region 468 configuring the MEM 154 or the N++ type semiconductor region 462 configuring the FD 156, and a noise is prevented from occurring, for example.

Additionally, the opening 603A and the opening 603B are desirably as small as possible such that a light passing through the PD 151 does not pass.

The light blocking film 603 is covered with an insulative film 604. The insulative film 604 is made of a silicon oxide film (SiO), for example. The insulative film 604 is covered with a P++ type semiconductor region 605. An N++ type semiconductor region 606 is formed between the lower surface of the insulative film 604 and the P++ type semiconductor region 605. A gettering effect is caused by the N++ type semiconductor region 606. A stopper film 607 is formed between the insulative film 604 and the P++ type semiconductor region 605 above the light blocking film 603. The stopper film 607 is made of a SiN film or SiCN film, for example.

The gate terminal (electrode) 152A of the TRX 152, the gate terminal (electrode) 155A of the TRG 155, the gate terminal (electrode) 157A of the OFG 157, and the gate terminal (electrode) 158A of the RST 158 are formed on the device forming surface of the second semiconductor substrate 202 via an insulative film 611. The gate terminals (electrodes) 155A and 158A are arranged above the light blocking film 603, the gate terminal (electrode) 152A is arranged above the opening 603A of the light blocking film 603, and the gate terminal (electrode) 157A is arranged above the opening 603B of the light blocking film 603.

The gate terminal (electrode) 152A of the TRX 152 is configured of the horizontal terminal (electrode) part 152AA and the vertical terminal (electrode) part 152AB. The horizontal terminal (electrode) part 152AA is formed on the device forming surface of the second semiconductor substrate 202 via the insulative film 611 like the gate terminals (electrodes) of other transistors. The vertical terminal (electrode) part 152AB extends vertically downward from the horizontal terminal (electrode) part 152AA, penetrates through the second semiconductor substrate 202, and extends into the N− type semiconductor region 601 via the opening 603A of the light blocking film 603. Further, the vertical terminal (electrode) part 152AB is covered with the insulative film 611. Therefore, the gate terminal (electrode) 152A contacts the N− type semiconductor region 601 via the insulative film 611.

The OFG 157 is in the vertical gate structure, and the gate terminal (electrode) 152A is configured of the horizontal terminal (electrode) part 157AA and the vertical terminal (electrode) part 157AB. The horizontal terminal (electrode) part 152AA is formed on the device forming surface of the second semiconductor substrate 202 via the insulative film 611 like the gate terminals (electrodes) of other transistors. The vertical terminal (electrode) part 157AB extends vertically downward from the horizontal terminal (electrode) part 157AA, penetrates through the second semiconductor substrate 202, and extends into the N− type semiconductor region 601 via the opening 603B of the light blocking film 603. Further, the vertical terminal (electrode) part 157AB is covered with the insulative film 611. Therefore, the gate terminal (electrode) 157A contacts the N− type semiconductor region 601 via the insulative film 611.

Therefore, the TRX 152 and the OFG 157 are electrically connected via the N− type semiconductor region 601.

The N++ type semiconductor region 459, the N+ type semiconductor region 460, the N+ type semiconductor region 461, the N++ type semiconductor region 462, the N+ type semiconductor region 463, a P+ type semiconductor region 609, a P−− type semiconductor region 610, the N+ type semiconductor region 466, and the N++ type semiconductor region 467 are formed around the surface of the P type semiconductor region 608 in the second semiconductor substrate 202 above the light blocking film 603.

The P+ type semiconductor region 609 is arranged between the horizontal terminal (electrode) part 152AA of the TRX 152 and the horizontal terminal (electrode) part 157AA of the OFG 157.

The P−− type semiconductor region 610 is arranged immediately below the horizontal terminal (electrode) part 157AA of the OFG 157. Further, the P−− type semiconductor region 610 surrounds the vertical terminal (electrode) part 157AB of the OFG 157 except the tip thereof via the insulative film 611.

Figure 66:
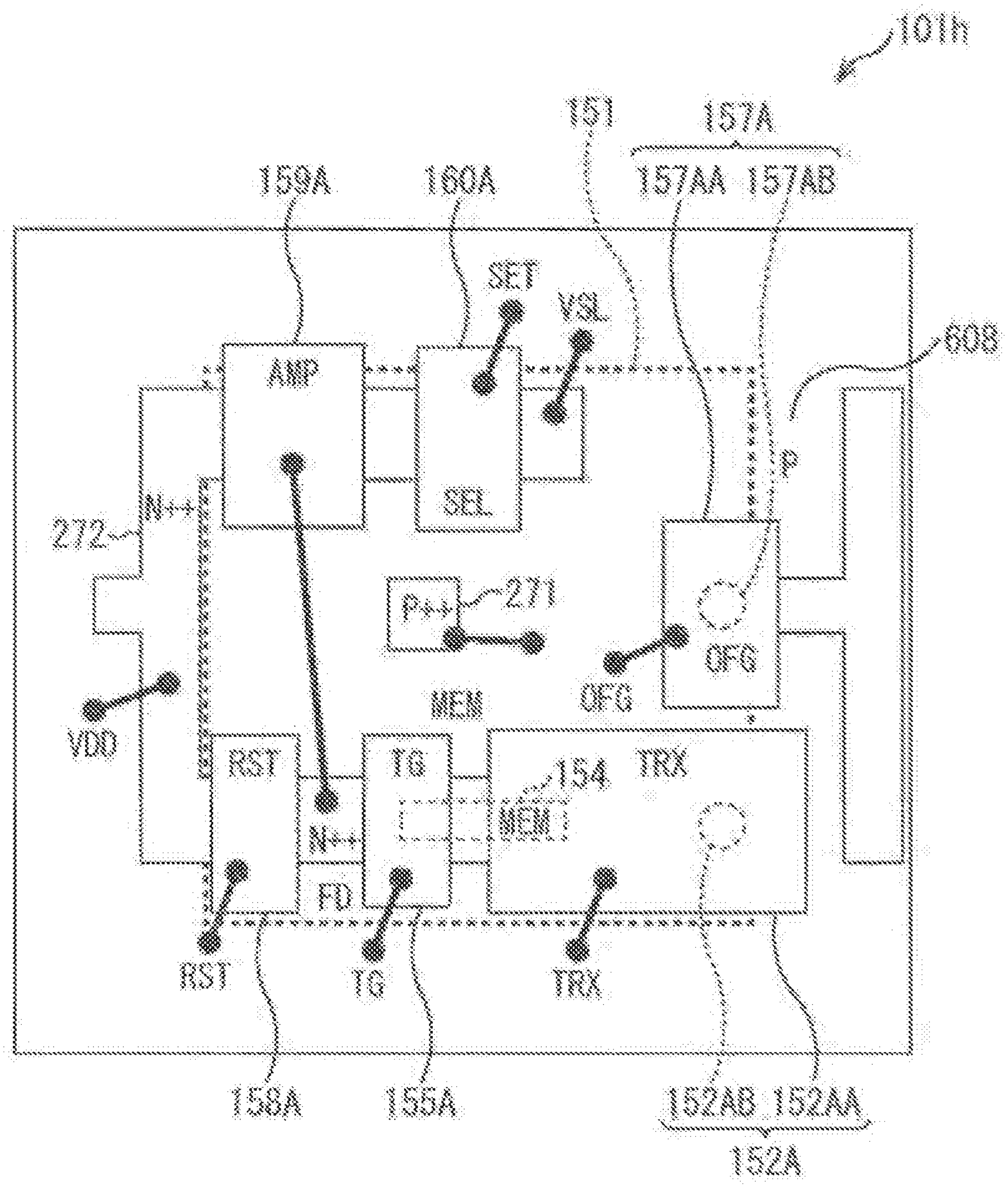
FIG. 66 is a plan view schematically illustrating an exemplary configuration of a device forming surface of the solid-state image sensing device according to the eighth embodiment.

FIG. 66 is a plan view schematically illustrating an exemplary configuration of the device forming surface of the second semiconductor substrate 202 in the solid-state image sensing device 101*h*. A region for one pixel in the solid-state image sensing device 101*h* is illustrated in the Figure. The square region in a dotted line in the Figure indicates a position of the light receiving surface of the PD 151 (the lower surface of the N− type semiconductor region 601). Additionally, the parts corresponding to those in FIG. 8 are denoted with the same reference numerals in the Figure, and the description thereof will be omitted as needed.

The exemplary configuration of a pixel in FIG. 66 is different from the exemplary configuration of a pixel in FIG. 8 in that the TRM 153A is deleted and the horizontal terminal (electrode) part 152AA of the TRX 152 spreads almost to the gate terminal (electrode) 153A in FIG. 8. Further, a difference lies in that the vertical terminal (electrode) part 157AB is added to the OFG 157 and the TRX 152 is not directly connected to the OFG 157. Further, a difference lies in that each gate terminal (electrode) is arranged on the upper surface of the P type semiconductor region 608 via the insulative film 611 (not illustrated).

{Example of how to Drive Solid-State Image Sensing Device 101*h*}

Figure 67:
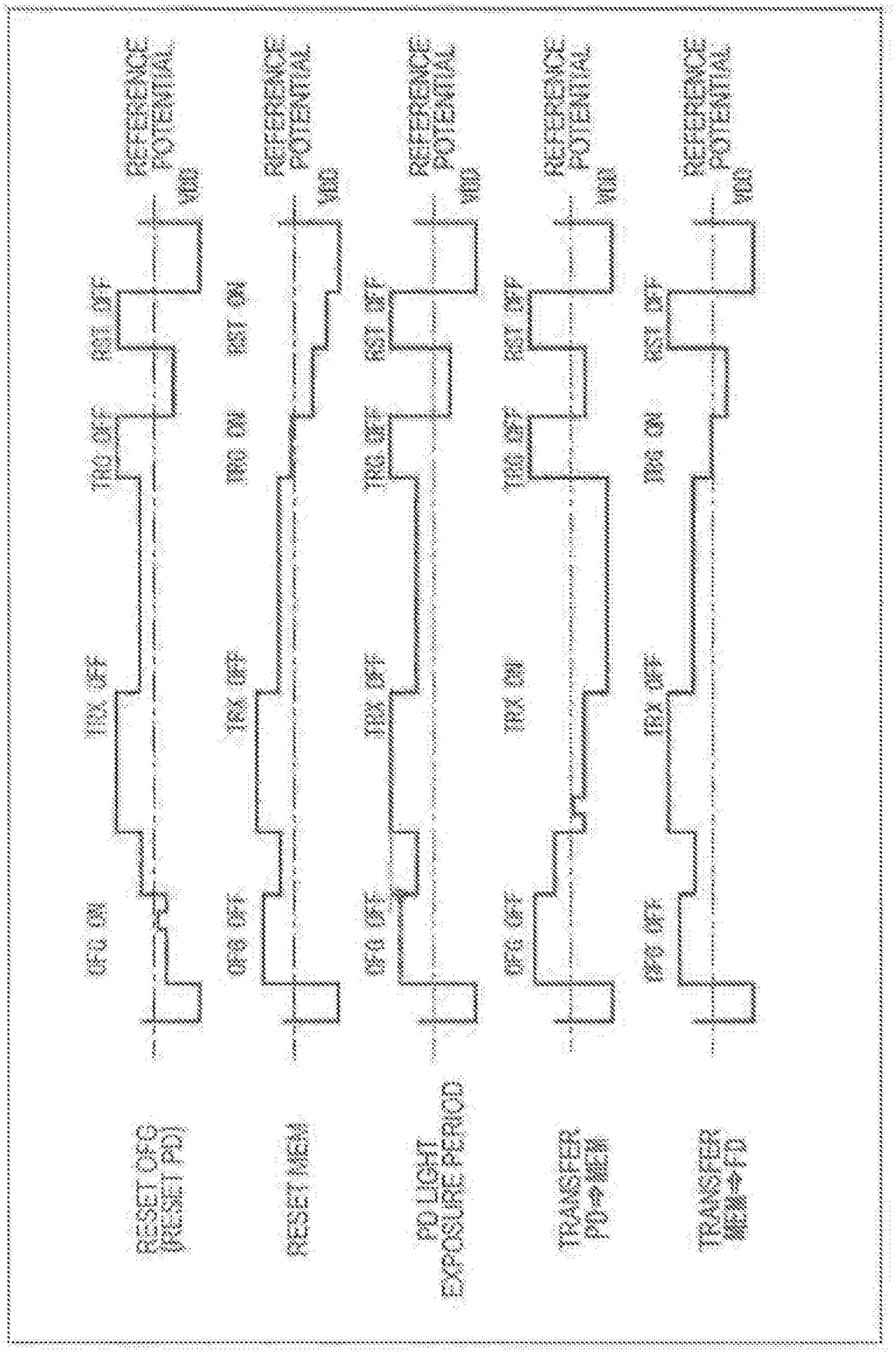
FIG. 67 is a diagram for explaining how to drive the solid-state image sensing device according to the eighth embodiment by way of example.

How to drive the solid-state image sensing device 101*h* will be described below with reference to the potential diagram of FIG. 67 by way of example.

At first, the OFG 157 is turned on, and the TRX 152, the TRG 155, and the RST 158 are turned off. The charges accumulated in the PD 151 (the N− type semiconductor region 601) are then transferred to the N++ type semiconductor region 467 as charge discharging unit via the OFG 157 to be discharged to the outside. Thereby, the PD 151 is reset.

Then, the OFG 157 is turned off, and the TRG 155 and the RST 158 are turned on. Then, the charges accumulated in the MEM 154 (the N+ type semiconductor region 468) and the FD 156 (the N++ type semiconductor region 462) are transferred to the N++ type semiconductor region 459 as charge discharging unit via the TRG 155 and the RST 158 to be discharged to the outside. Thereby, the MEM 154 and the FD 156 are reset.

The TRG 155 and the RST 158 are then turned off, and a light exposure period starts. During the light exposure period, the PD 151 (the N− type semiconductor region 601) generates and accumulates the charges depending on the amount of received light. Here, when the TRX 152 and the OFG 157 is off, the potential of the channel of the OFG 157 is set to be slightly lower than the potential of the channel of the TRX 152. Thereby, an overflow path is formed between the PD 151 (the N− type semiconductor region 601) and the N++ type semiconductor region 467 as charge discharging unit. Therefore, the charges overflowed from the PD 151 (the N− type semiconductor region 601) are discharged to the N++ type semiconductor region 467 via the overflow path without leaking into the MEM 154 (the N+ type semiconductor region 468).

The TRX 152 is then turned on and the light exposure period ends. Thereby, the charges accumulated in the PD 151 (the N− type semiconductor region 601) during the light exposure period are transferred to and held in the MEM 154 (the N+ type semiconductor region 468) via the TRX 152.

Then, the TRX 152 is turned off and the TRG 155 is turned on. Thereby, the charges held in the MEM 154 (the N+ type semiconductor region 468) are transferred to the FD 156 (the N++ type semiconductor region 462) via the TRG 155. The potential of the FD 156 is then output as signal level to the vertical signal line VSL via the AMP 159 and the SEL 160.

Additionally, the solid-state image sensing device 101*h* can produce the effects almost similar to the solid-state image sensing device 101*a* in FIG. 3 except the effects obtained by the vertical light blocking part 219B.

9. NINTH EMBODIMENT

A ninth embodiment of the present technology will be described below with reference to FIG. 68 to FIG. 72. The ninth embodiment is different from the first embodiment in the arrangement of the surrounding circuits.

Figure 68:
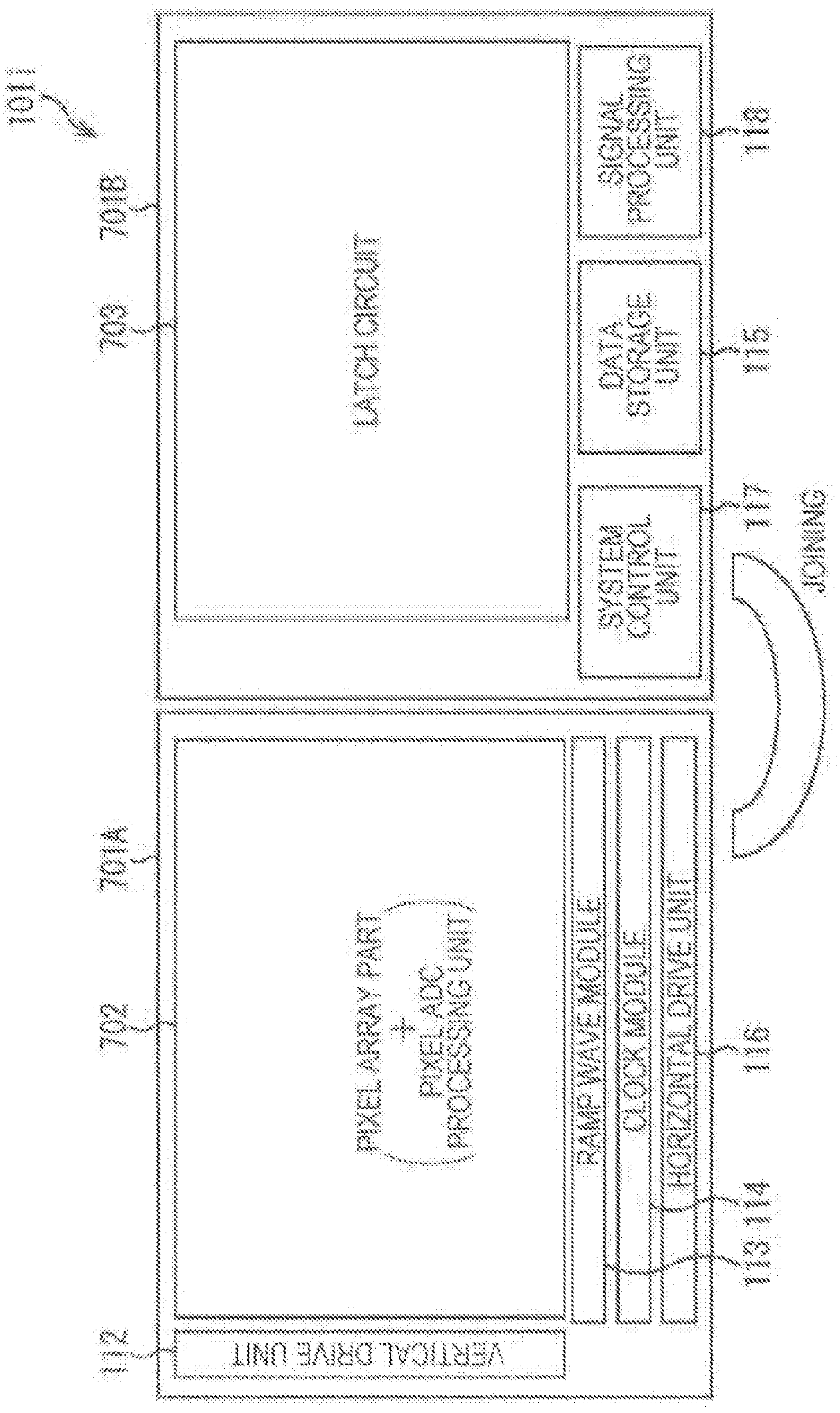
FIG. 68 is a block diagram illustrating an exemplary configuration of a solid-state image sensing device according to a ninth embodiment of the present technology.

FIG. 68 is a block diagram illustrating an exemplary configuration of the functions of a solid-state image sensing device 101*i* according to the ninth embodiment of the present technology. Additionally, the parts corresponding to those in FIG. 1 are denoted with the same reference numerals in the Figure, and the description thereof will be omitted as needed.

The solid-state image sensing device 101*i* in FIG. 68 is different from the solid-state image sensing device 101*a* in FIG. 1 in that a pixel array part 702 is provided with a pixel ADC processing unit and is in a two-layer structure of a first layer 701A and a second layer 701B. For example, the first layer 701A is configured of the second semiconductor substrate 202, and the second layer 701B is formed on a third semiconductor substrate (not illustrated).

The first layer 701A is configured to include the pixel array part 702, the vertical drive unit 112, the ramp wave module 113, the clock module 114, and the horizontal drive unit 116. The vertical drive unit 112, the ramp wave module 113, the clock module 114, and the horizontal drive unit 116 are formed on the device forming surface of the second semiconductor substrate 202 as monocrystal silicon substrate by use of the devices in the mesa structure, for example. Further, the pixel ADC (A/D converter) processing unit arranged in the pixel array part 702 is also formed on the device forming surface of the second semiconductor substrate 202 as monocrystal silicon substrate by use of the devices in the mesa structure, for example. Furthermore, the ADC for AD converting a pixel signal of each pixel in the pixel array part 702 is provided per pixel.

The second layer 701B is configured to include a latch circuit 703, the data storage unit 115, the system control unit 117, and the signal processing unit 118. The latch circuit 703 is arranged at a position corresponding to the ADC provided per pixel in the pixel array part 702.

Further, the first layer 701A is joined with the second layer 701B via Cu—Cu joining, for example.

The advantages of an ADC provided per pixel will be described herein with reference to FIG. 69 and FIG. 70.

Figure 69:
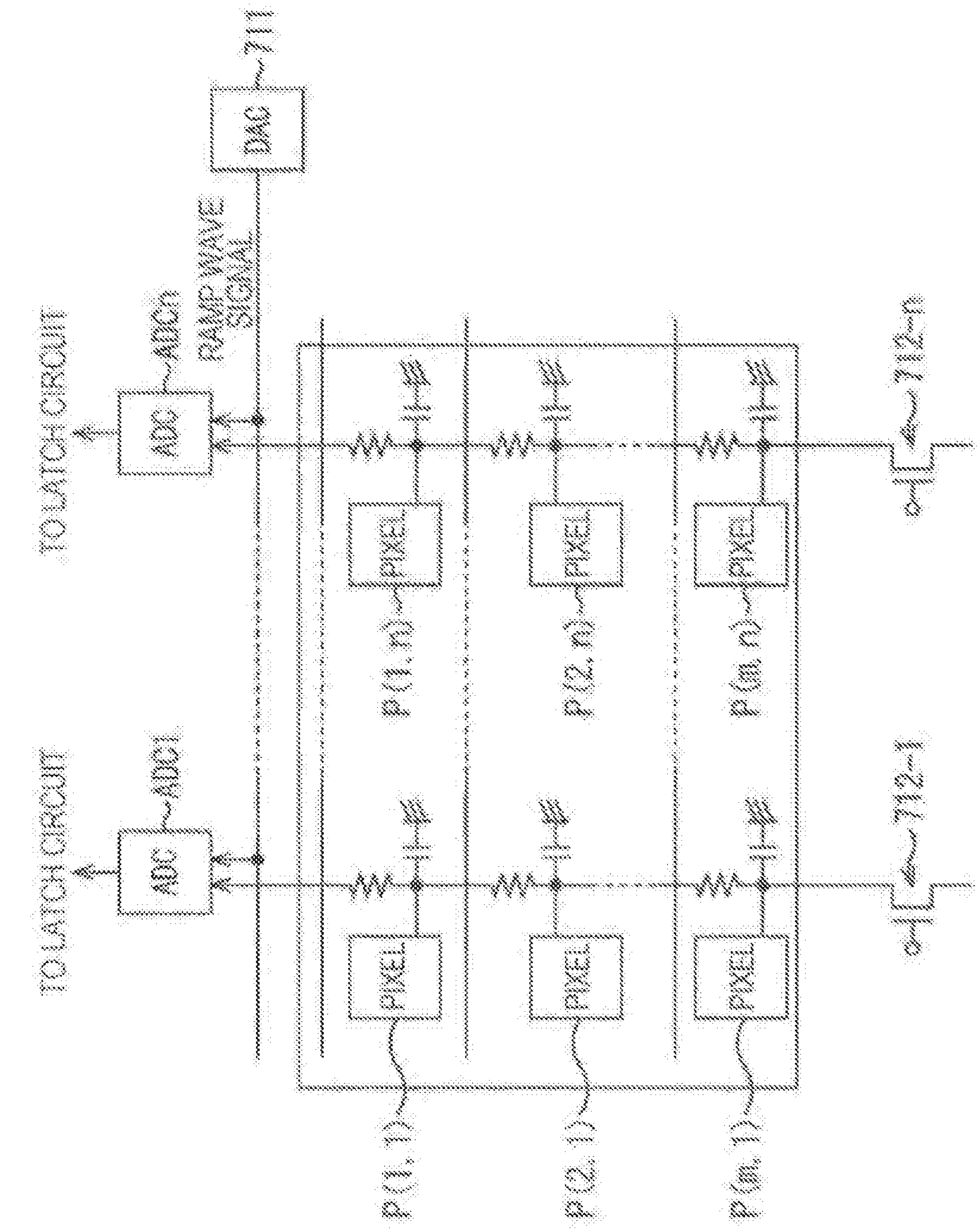
FIG. 69 is a diagram for explaining an advantage of an ADC provided per pixel.

FIG. 69 illustrates part of an equivalent circuit in a case where an ADC is provided per line. In the example, pixel signals output from the pixels in the same column in the longitudinal direction are supplied to the same ADC. For example, the pixel signals output from the pixels P(1, 1) to P(m, 1) at the first column are supplied to ADC1, and the pixel signals output from the pixels P(1, n) to P(m, n) at the n-th column are supplied to ADCn. Each ADC AD-converts a pixel signal and supplies a converted digital pixel signal to the latch circuit on the basis of a ramp wave signal supplied from a DAC 711. Further, the current value of a pixel signal flowing on a bit line connecting each pixel and an ADC is amplified by amplification transistors 712-1 to 712-*n*.

Here, as illustrated, wiring resistance and parasitic capacitance are caused in the wiring between each pixel and an ADC. Further, the wiring resistance and the parasitic capacitance are different between the pixels in the upper stage and the pixels in the lower stage in the Figure since the distances of the wirings between the pixels in the same column and the ADC are different. For example, the wiring resistance and the parasitic capacitance are different between the pixel P(1, 1) and the pixel P(m, 1), for example. Thus, a time constant of the wiring between a pixel and an ADC is different among the pixels in the same column.

Therefore, a noise such as transverse thread or vertical shading easily occurs on a shot image. Further, the amplification rate of the amplification transistors 712-1 to 712-*n* needs to be increased in order to reduce the effects of signal loss due to the wiring resistance and the parasitic capacitance of a pixel signal flowing on the bit line. Therefore, the consumed power in the amplification transistors 712-1 to 712-*n* increases, and thus the drive frequency is difficult to increase.

Figure 70:
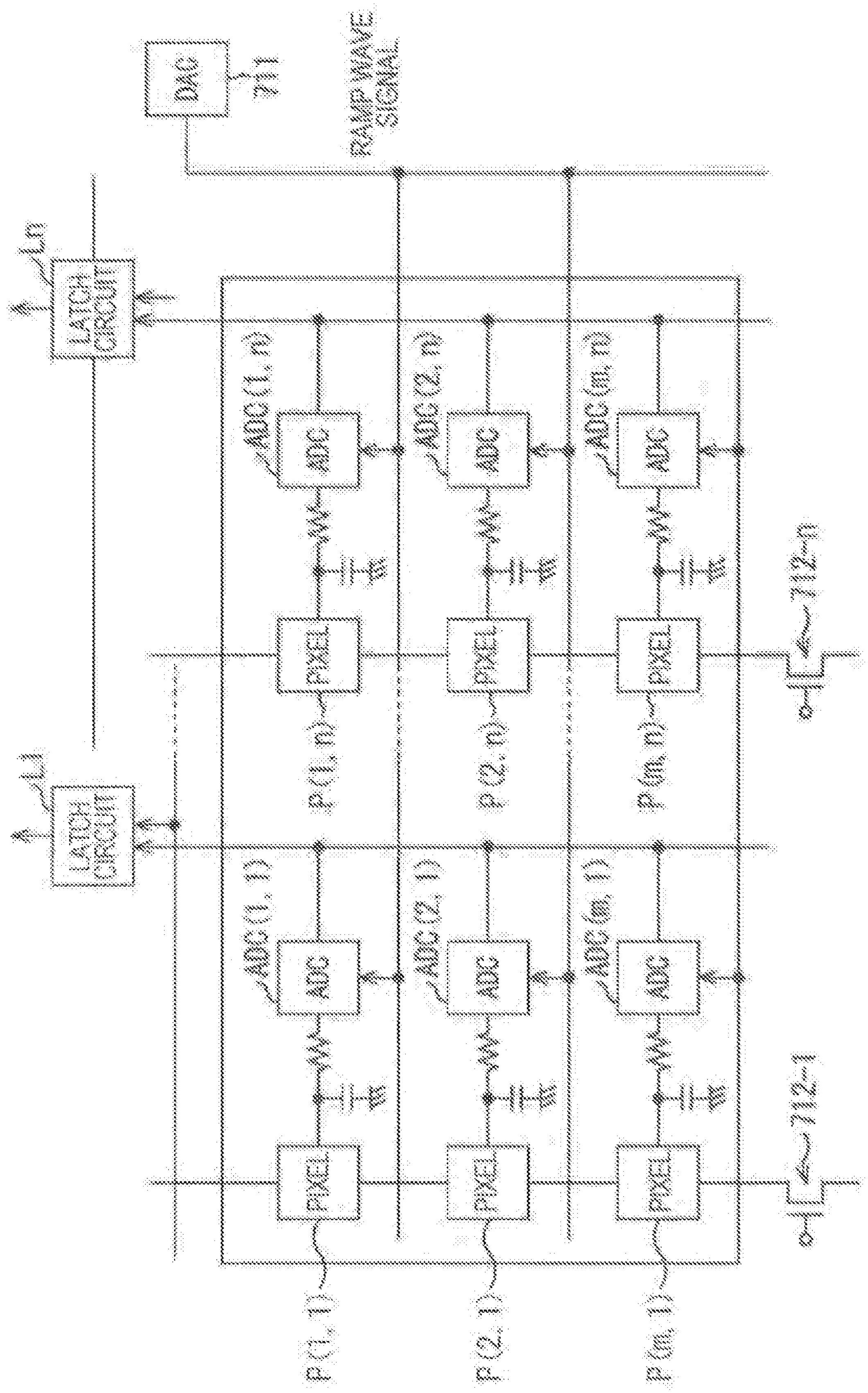
FIG. 70 is a diagram for explaining an advantage of an ADC provided per pixel.

On the other hand, FIG. 70 illustrates an equivalent circuit in a case where an ADC is provided per pixel. That is, the ADC (1, 1) to the ADC (m, n) are provided for the pixels P(1, 1) to P(m, n), respectively. Then, a pixel signal output from each pixel is AD-converted per pixel by a different ADC on the basis of a ramp wave signal supplied from the DAC 711. The AD-converted pixel signals are supplied to the latch circuits L1 to Ln provided per column via the bit lines, respectively.

In this case, the wiring resistance and the parasitic capacitance caused in the wiring between each pixel and an ADC are lower than in the example of FIG. 69, and are almost similar in all the pixels. Therefore, the time constants of the wirings between a pixel and an ADC are almost equal in all the pixels.

Thus, a noise such as transverse thread or vertical shading is reduced. Further, the time constant of the wiring decreases, which enables high-speed drive using a high-frequency clock. Furthermore, the amplification rate of the amplification transistors 712-1 to 712-*n* can be reduced due to the decrease in noise, thereby reducing the consumed power.

Figure 71:
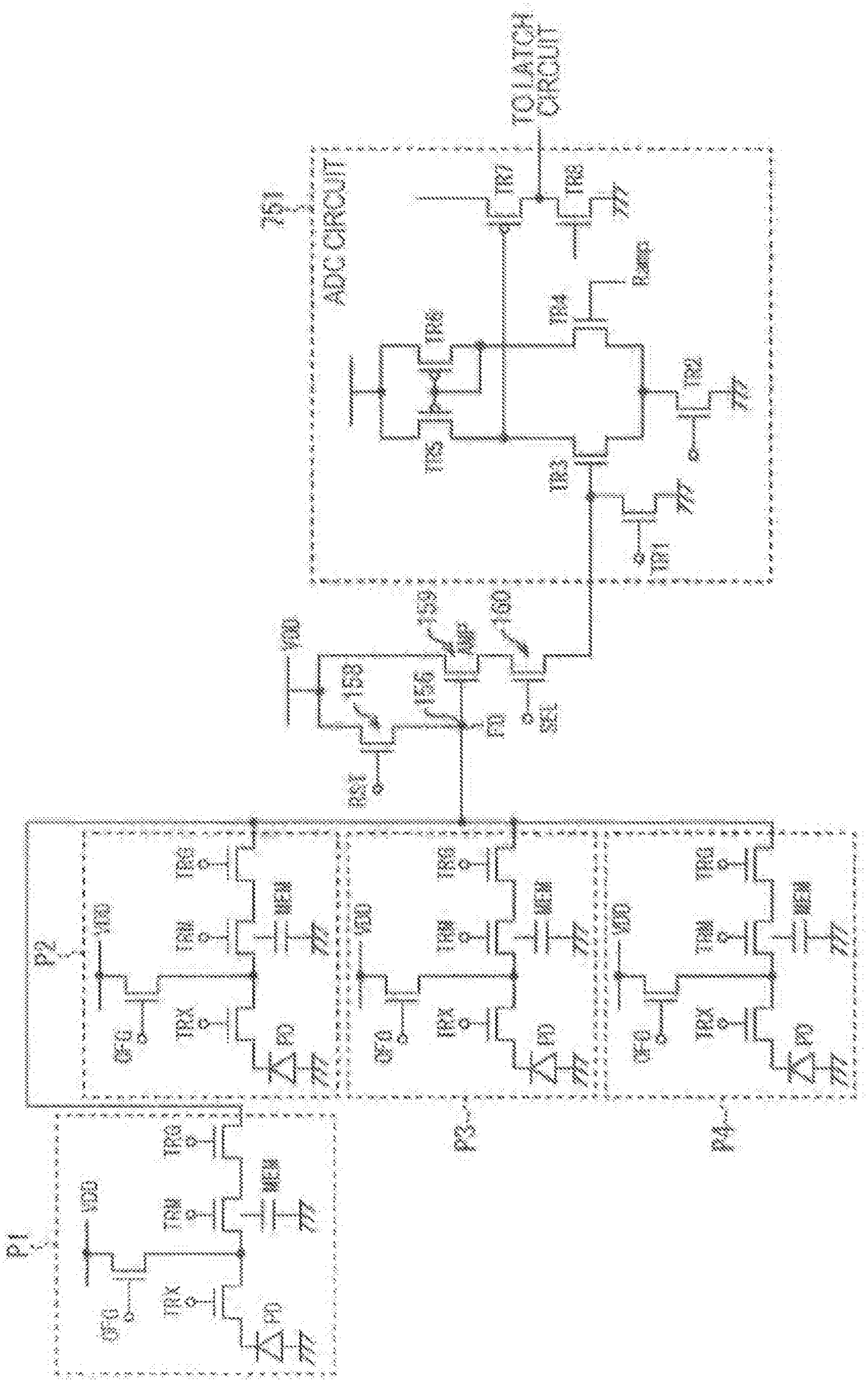
FIG. 71 is a circuit diagram illustrating an exemplary configuration of a circuit in a case where an ADC is provided per pixels.
Figure 72:
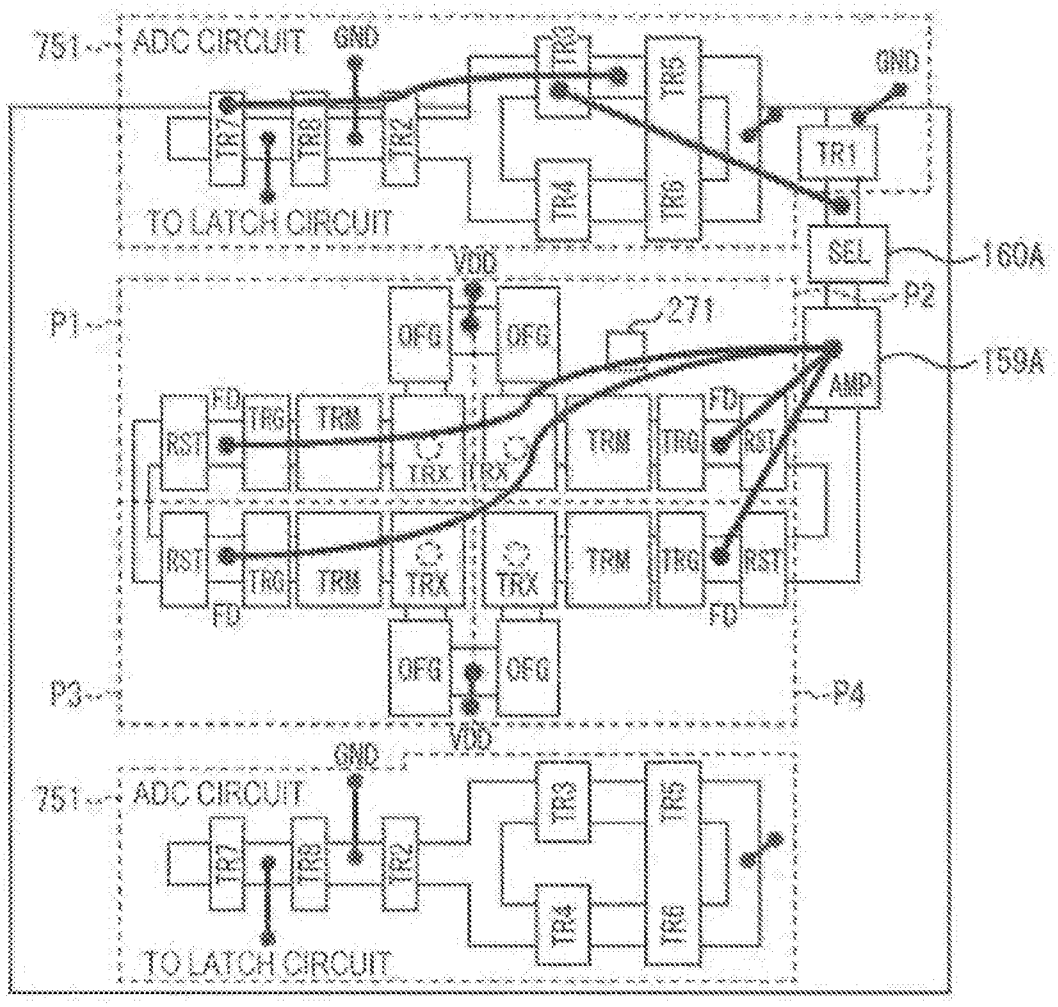
FIG. 72 is a plan view schematically illustrating an exemplary configuration of a device forming surface in a case where an ADC is provided per pixels.

Additionally, an ADC can be provided not per pixel but per pixels in the solid-state image sensing device 101*i* as illustrated in FIG. 71 and FIG. 72.

FIG. 71 illustrates an exemplary circuit configuration of four pixels in the solid-state image sensing device 101*i*. Additionally, the parts corresponding to those in FIG. 2 are denoted with the same reference numerals in the Figure. Incidentally, some reference numerals are omitted for easily-understandable Figure.

In the example, the four pixels P1 to P4 share the FD 156, the RST 158, the AMP 159, the SEL 160, and an ADC circuit 751. Further, the ADC circuit 751 is configured of transistors TR1 to TR8. A digital signal output from the ADC circuit 751 is supplied to the latch circuit 703.

Therefore, the charges held in the MEMs 154 in the pixels P1 to P4 are transferred to the FD 156 in turn, and a pixel signal corresponding to the charges held in the FD 156 is supplied to the ADC circuit 751 via the AMP 159 and the SEL 160.

FIG. 72 is a plan view schematically illustrating an exemplary configuration of the device forming surface of the second semiconductor substrate 202 in the solid-state image sensing device 101*i*. The region of four pixels in the solid-state image sensing device 101*i* is illustrated in the Figure. Additionally, the parts corresponding to those in FIG. 8 are denoted with the same reference numerals in the Figure. Incidentally, some reference numerals are omitted for easily-understandable Figure.

Additionally, the example of FIG. 72 is different from the example of FIG. 71 in that the FD 156 and the RST 158 are provided per pixel and the AMP 159, the SEL 160, and the ADC circuit 751 are shared among the pixels P1 to P4.

The pixel P1 to the pixel P4 are arranged to be adjacent to each other. The pixel P1 and the pixel P2 are adjacent in the lateral direction in the Figure, and the layouts in the pixels are symmetric to each other. The pixel P3 and the pixel P4 are adjacent in the lateral direction in the Figure, and the layouts in the pixels are symmetric to each other. The pixel P1 and the pixel P3 are adjacent in the longitudinal direction in the Figure, and the layouts in the pixels are vertically symmetric to each other. The pixel P2 and the pixel P4 are adjacent in the longitudinal direction in the Figure, and the layouts in the pixels are vertically symmetric to each other.

The AMP 159 is arranged adjacently on the right of the pixel P2 in the Figure. The SEL 160 is arranged above the AMP 159A in the Figure.

The ADC circuit 751 is arranged upward adjacent to the pixel P1 and the pixel P2 in the Figure. Further, each transistor configuring the ADC circuit 751 is assumed to be in the mesa structure as described above, for example.

In this way, the ADC circuit 751 is shared among a plurality of pixels so that the effects almost similar to those in a case where the ADC is provided per pixel can be obtained and the device can be downsized.

10. TENTH EMBODIMENT

A tenth embodiment of the present technology will be described below with reference to FIG. 73 to FIG. 83. Additionally, the tenth embodiment is different from the first embodiment mainly in the cross section configuration and the manufacture method of a pixel.

{Exemplary Configuration of Solid-State Image Sensing Device 101*j*}

Figure 73:
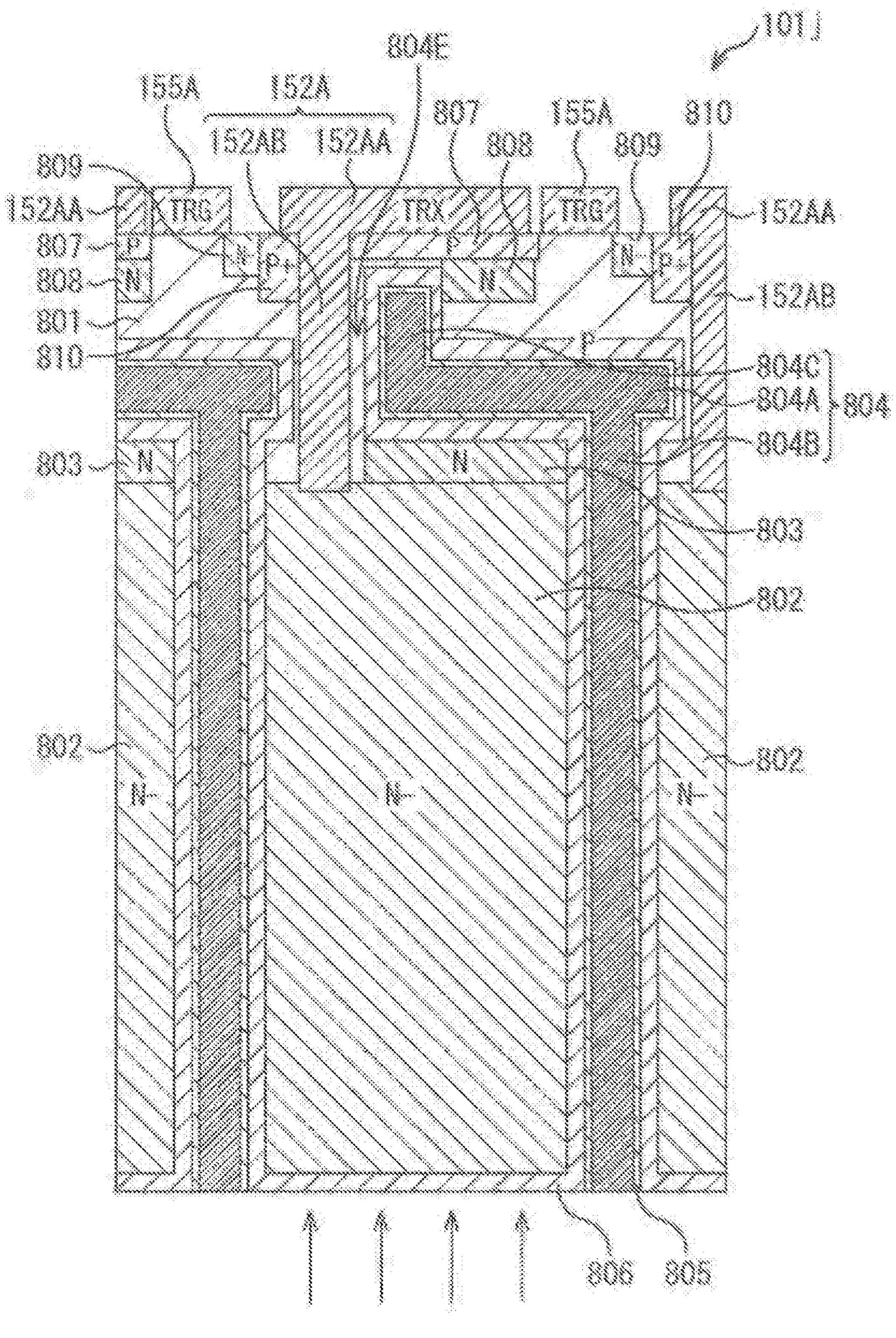
FIG. 73 is a cross-section view schematically illustrating an exemplary configuration of a solid-state image sensing device according to a tenth embodiment of the present technology.

FIG. 73 schematically illustrates a cross section of a solid-state image sensing device 101*j* according to the tenth embodiment of the present technology. The parts corresponding to those in FIG. 3 are denoted with the same reference numerals in the Figure.

FIG. 73 illustrates a cross section of a part including one pixel in the solid-state image sensing device 101*j*, but other pixels basically have the same configuration. The lower side in the Figure is a light receiving surface (backside) of the solid-state image sensing device 101*j*.

An N− type semiconductor region 802 and an N type semiconductor region 803 configuring the PD 151 are embedded in a semiconductor substrate 801 in the solid-state image sensing device 101*j*. A light incident in the light receiving surface of the solid-state image sensing device 101*j* is photoelectrically converted in the N− type semiconductor region 802, and the generated charges are accumulated in the N type semiconductor region 803.

Additionally, a definite border line as illustrated in the Figure is not necessarily provided between the N− type semiconductor region 802 and the N type semiconductor region 803, and an N type impurity concentration gradually increases from the N− type semiconductor region 802 toward the N type semiconductor region 803, for example.

Figure 82:
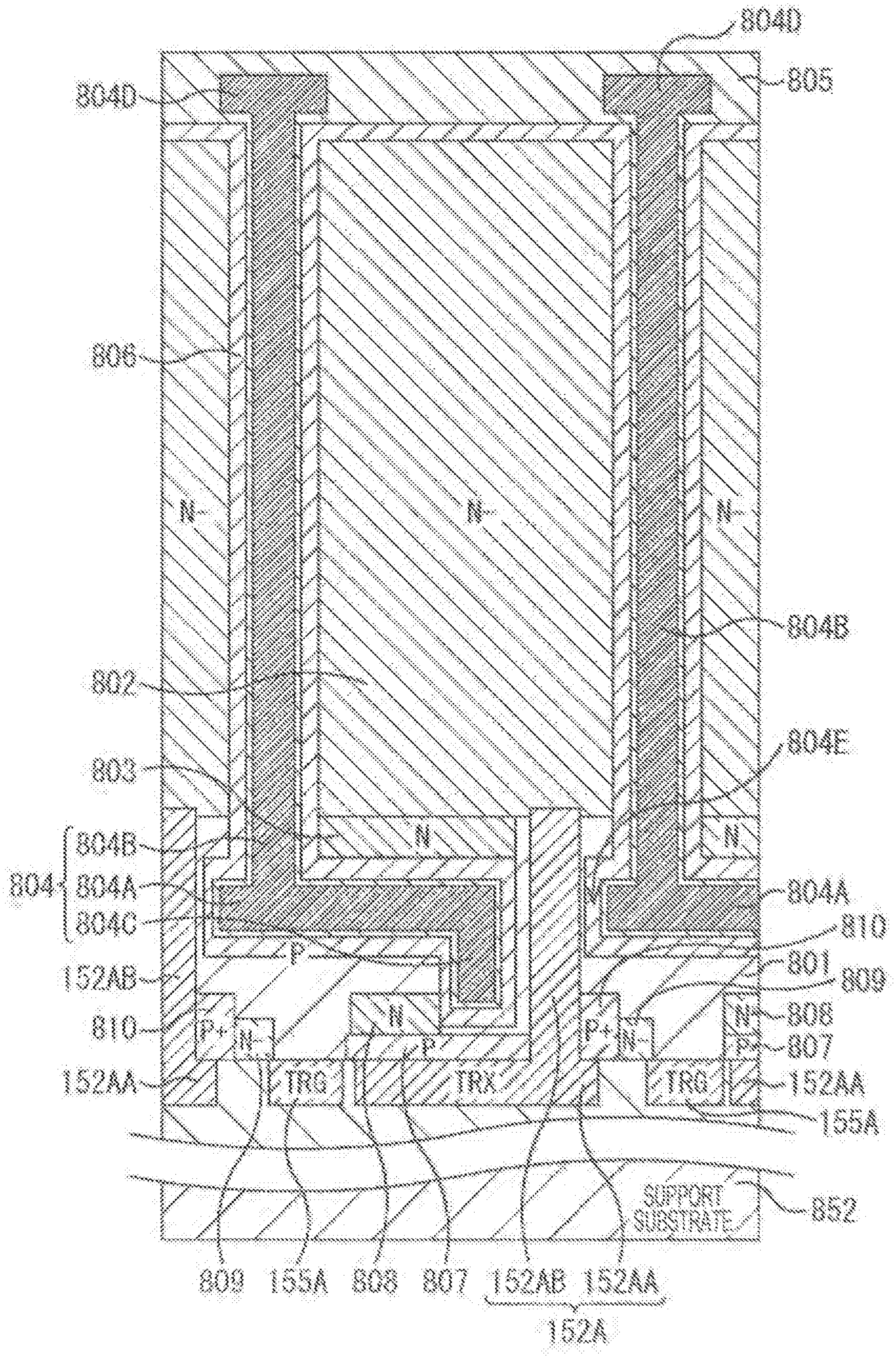
FIG. 82 is a diagram for explaining the method for manufacturing the solid-state image sensing device according to the tenth embodiment.

The upper surface and the side surface of the PD 151 (the N− type semiconductor region 802 and the N type semiconductor region 803) are surrounded by a light blocking film 804. More specifically, the light blocking film 804 is configured of the horizontal light blocking part 804A, the vertical light blocking part 804B, a vertical light blocking part 804C, and a horizontal light blocking part 804D (FIG. 82). Further, the light blocking film 804 is made of the same material as the light blocking film 219 in FIG. 3, for example.

The horizontal light blocking part 804A has a planar shape parallel to the light receiving surface of the solid-state image sensing device 101*j*. The horizontal light blocking part 804A covers the upper surfaces of the N− type semiconductor region 802 and the N type semiconductor region 803 configuring the PD 151 except an opening 804E.

The vertical light blocking part 804B has a wall shape vertical to the light receiving surface of the solid-state image sensing device 101*j*. The vertical light blocking part 804B is formed to surround the side surfaces of the N− type semiconductor region 802 and the N type semiconductor region 803 configuring the PD 151.

The vertical light blocking part 804C is arranged around the border between the horizontal light blocking part 804A and the opening 804E, and has a wall shape vertical to the light receiving surface. The vertical light blocking part 804C is formed opposite to the vertical light blocking part 804B (closer to an N type semiconductor region 808) with reference to the horizontal light blocking part 804A in a direction vertical to the horizontal light blocking part 804A. Further, the vertical light blocking part 804C is formed at a different position from the vertical light blocking part 804B in a direction parallel to the horizontal light blocking part 804A. Furthermore, the vertical light blocking part 804C is formed to block a light at least between the vertical terminal (electrode) part 152AB of the TRX 152 and the N type semiconductor region 808 configuring the MEM 154.

The horizontal light blocking part 804D will be described below.

The opening 804E is provided for inserting the vertical terminal (electrode) part 152AB of the TRX 152 into the N− type semiconductor region 802 and transferring the charges accumulated in the N type semiconductor region 803 to the N type semiconductor region 808.

Additionally, the opening 804E is desirably as small as possible such that a light passing through the PD 151 does not pass. Further, the opening 804E is desirably arranged at an end of the pixel (near the vertical light blocking part 804B) in order to prevent an oblique light with a large incident angle from passing.

Additionally, at least one of the vertical light blocking part 804C and the horizontal light blocking part 804D may not be formed.

The light blocking film 804 is covered with an insulative film 805. The insulative film 805 employs a high dielectric film made of $HfO_2$, $TaO_2$, $Al_2O_3$, or the like with high dielectric constant, for example.

The surrounding of the light blocking film 804 and the lower surface of the N− type semiconductor region 802 are covered with a P type semiconductor region 806 as conductive layer reverse to signal charge. The thickness of the P type semiconductor region 806 is almost uniform, and is assumed to be within 20 nm, for example. The P type semiconductor region 806 has as high an impurity concentration as possible to restrict charges from occurring at a defect level present at an interface between the light blocking film 804 and the semiconductor substrate 801, and works as a pinning layer.

Additionally, the insulative film 805 is made of a high dielectric film, and has a predetermined potential, thereby enhancing the pinning effect of the P type semiconductor region 806. Further, a potential is directly given to the light blocking film 804 from the outside, thereby obtaining a similar effect.

The gate terminal (electrode) 152A of the TRX 152 and the gate terminal (electrode) 155A of the TRG 155 are formed on the upper surface (the device forming surface) of the semiconductor substrate 801. The gate terminal (electrode) 155A is arranged above the horizontal light blocking part 804A, and the gate terminal (electrode) 152A is arranged above the opening 804E of the light blocking film 804.

The gate terminal (electrode) 152A of the TRX 152 is configured of the horizontal terminal (electrode) part 152AA and the vertical terminal (electrode) part 152AB. The horizontal terminal (electrode) part 152AA is formed on the upper surface (the device forming surface) of the semiconductor substrate 801 like the gate terminal (electrode) 155A. The vertical terminal (electrode) part 152AB extends vertically downward from the horizontal terminal (electrode) part 152AA, and extends into the N− type semiconductor region 802 via the opening 804E of the light blocking film 804.

A P type semiconductor region 807, an N− type semiconductor region 809, and a P+ type semiconductor region 810 are formed around the surface of the semiconductor substrate 801 above the horizontal light blocking part 219A.

The P type semiconductor region 807 is arranged on the right of the vertical terminal (electrode) part 152AB of the TRX 152 and immediately below the horizontal terminal (electrode) part 152AA.

The N− type semiconductor region 809 is arranged on the right of the gate terminal (electrode) 155A of the TRG 155 thereby to configure the FD 156.

The P+ type semiconductor region 810 is arranged between the vertical terminal (electrode) part 152AB of the TRX 152 and the N− type semiconductor region 809.

The N type semiconductor region 808 is arranged immediately below the P type semiconductor region 807 thereby to configure the MEM 152. The vertical light blocking part 804C is arranged between the vertical terminal (electrode) part 152AB of the gate terminal (electrode) 152A and the N type semiconductor region 808.

When the drive signal TRX applied to the gate terminal (electrode) 152A of the TRX 152 is turned on and the TRX 152 is turned on, a channel is formed between the N− type semiconductor region 802 (the PD 151) and the N type semiconductor region 808 (the MEM 154). The charges accumulated in the N type semiconductor region 803 are then transferred to the N type semiconductor region 808 via the channel, and held in the N type semiconductor region 808.

Further, when the drive signal TRG applied to the gate terminal (electrode) 155A of the TRG 155 is turned on and the TRG 155 is turned on, a channel is formed between the N type semiconductor region 808 (the MEM 154) and the N− type semiconductor region 809 (the FD 156). The charges held in the N type semiconductor region 808 are then transferred to the N− type semiconductor region 809 via the channel. The potential of the N− type semiconductor region 809 is then output as signal level to the vertical signal line VSL via the AMP 159 and the SEL 160 (not illustrated).

Figure 74:
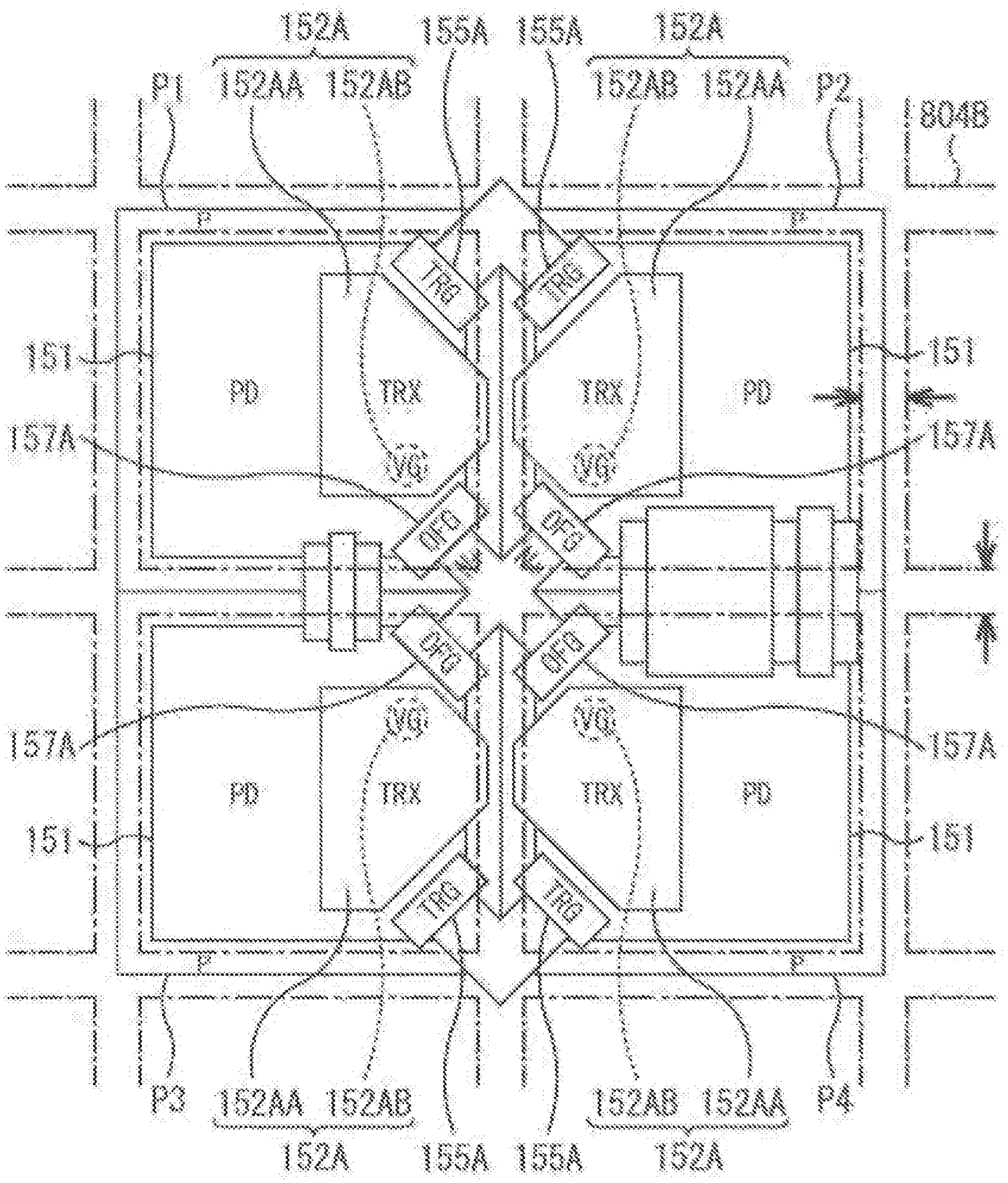
FIG. 74 is a plan view schematically illustrating an exemplary configuration of a device forming surface and a position of a vertical light blocking part of the solid-state image sensing device according to the tenth embodiment.
Figure 75:
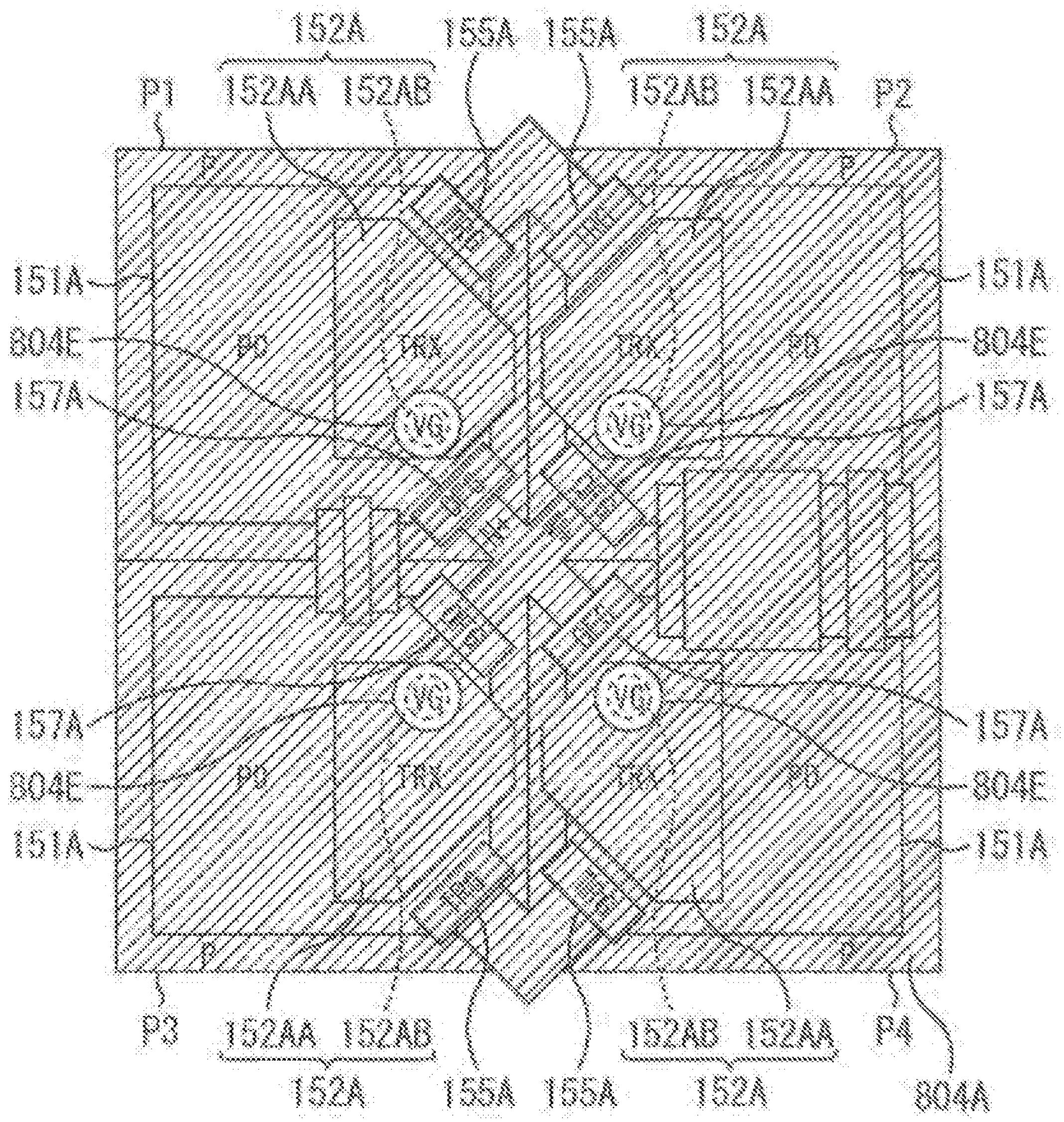
FIG. 75 is a plan view illustrating a position of a horizontal light blocking part in the solid-state image sensing device according to the tenth embodiment.

FIG. 74 and FIG. 75 are plan views schematically illustrating exemplary configurations of the device forming surface of the solid-state image sensing device 101*j*, respectively. Additionally, in FIG. 74, a region in which the vertical light blocking part 804B is arranged is indicated in an auxiliary dashed-dotted line. That is, as indicated by the arrows in the Figure, the vertical light blocking part 804B is arranged between two auxiliary lines. Further, FIG. 75 illustrates that the auxiliary lines indicating the region where the vertical light blocking part 804B is arranged are deleted from FIG. 74 and a shaded pattern indicating the region in which the horizontal light blocking part 804A is arranged is added.

FIG. 74 and FIG. 75 illustrate four pixels P1 to P4 configuring the pixel array part 111. The pixel P1 and the pixel P2 are adjacent in the lateral direction (the row direction) in the Figures, and the layouts in the pixels are symmetric to each other. The pixel P3 and the pixel P4 are adjacent in the lateral direction (the row direction) in the Figures, and the layouts in the pixels are symmetric to each other. The pixel P1 and the pixel P3 are adjacent in the longitudinal direction (the column direction) in the Figures, and the layouts in the pixels are vertically symmetric to each other. The pixel P2 and the pixel P4 are adjacent in the longitudinal direction (the column direction) in the Figures, and the layouts in the pixels are vertically symmetric to each other.

Further, as illustrated in FIG. 74, the vertical light blocking part 804B is arranged to extend over a plurality of pixels in the column direction between columns of pixels adjacent in the row direction in the pixel array part 111 in which a plurality of pixels are arranged in the row direction and in the column direction. Further, the vertical light blocking part 804B is arranged to extend over a plurality of pixels in the row direction between rows of pixels adjacent in the column direction in the pixel array part 111.

Furthermore, as illustrated in FIG. 75, the horizontal light blocking part 219A is arranged over the entire region except the opening 219C in each pixel. Thereby, in each pixel, a light is blocked by the horizontal light blocking part 804A except the opening 804E surrounding the vertical terminal (electrode) part 152AB of the TRX 152.

Therefore, a light which is not absorbed in the PD 151 and passes therethrough is reflected on the horizontal light blocking part 804A and is prevented from invading in an upper layer than the horizontal light blocking part 804A. Even if a light which is not absorbed in the PD 151 and passes therethrough passes through the opening 804E of the light blocking film 804, the vertical light blocking part 804C prevents the light from invading toward the N type semiconductor region 808 configuring the MEM 154. Thereby, for example, the charges generated by the light passing through the PD 151 are prevented from invading in the N type semiconductor region 808 configuring the MEM 154 or the N− type semiconductor region 809 configuring the FD 156, and a noise is prevented from occurring. Further, the vertical light blocking part 804B prevents a light incident from an adjacent pixel from leaking into the PD 151, and a noise such as mixed color from occurring.

Further, the channel formed on the surface of the semiconductor substrate 801 immediately below the horizontal terminal (electrode) part 152AA of the gate terminal (electrode) 152A can be formed to be shallower than the N type semiconductor region 808, the P+ type semiconductor region 810, and the like. Thus, the thickness of the horizontal light blocking part 804A can be adjusted or the vertical light blocking part 804C can be provided below the horizontal terminal (electrode) part 152AA. Thereby, the charges can be further prevented from leaking into the N type semiconductor region 808 or the N− type semiconductor region 809.

Furthermore, a region in which the gate terminal (electrode) 152A contacts the insulative film is in a metal gate structure, thereby further enhancing the light blocking capability.

{Method for Manufacturing Solid-State Image Sensing Device 101*j*}

A method for manufacturing the solid-state image sensing device 101*j* will be described below with reference to FIG. 76 to FIG. 83. Additionally, the parts corresponding to those in FIG. 73 are denoted with the same reference numerals in FIG. 76 to FIG. 83. Incidentally, the reference numerals which have nothing to do with the description will be omitted as needed for easily-understandable Figures.

Figure 76:
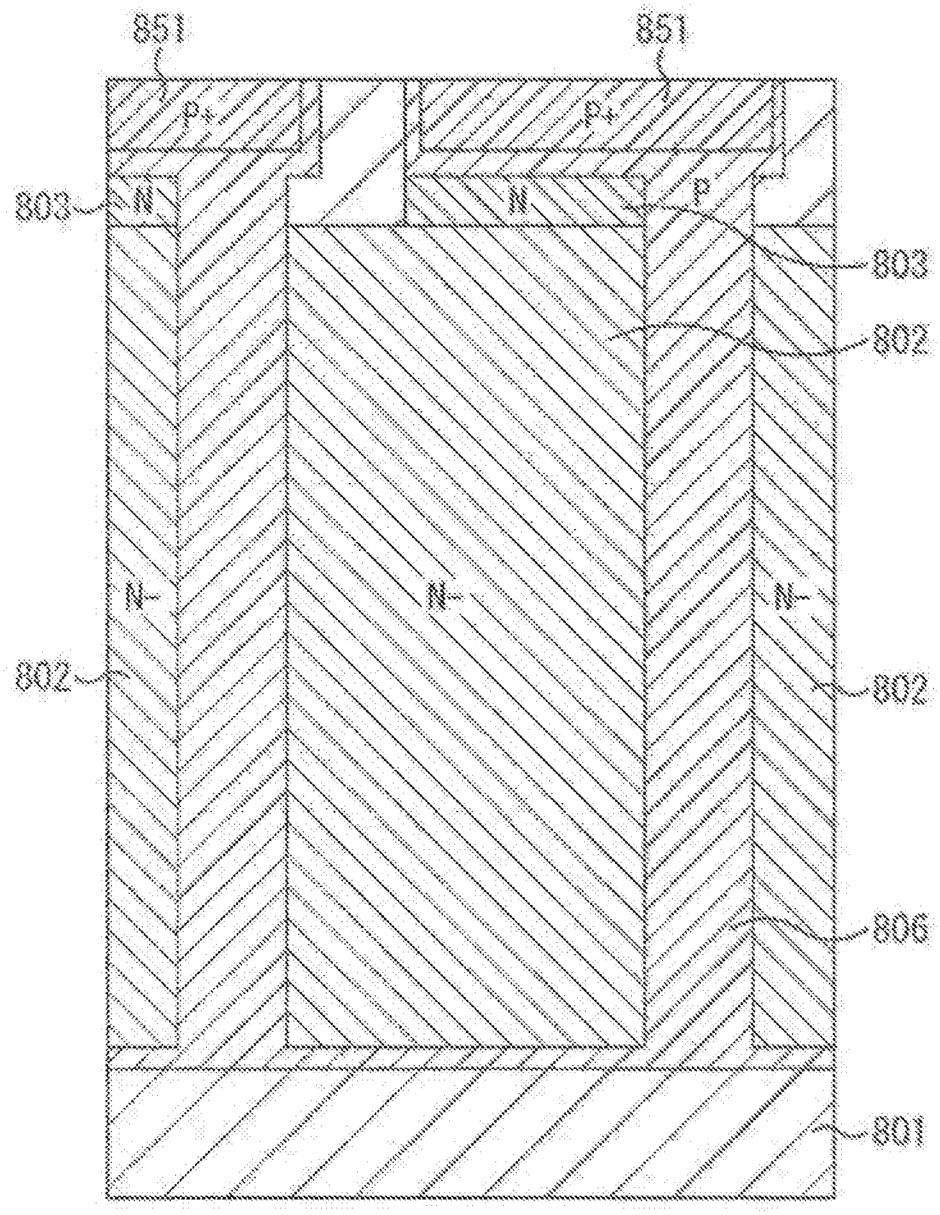
FIG. 76 is a diagram for explaining a method for manufacturing the solid-state image sensing device according to the tenth embodiment.

At first, as illustrated in FIG. 76, ions (such as boron) are implanted in the semiconductor substrate 801 made of monocrystal silicon so that the P type semiconductor region 806 as conductive layer reverse to signal charge and a P+ type semiconductor region 851 used as sacrifice film are formed. The P type semiconductor region 806 and the P+ type semiconductor region 851 are formed in a region serving as the light blocking film 804 and the pinning layer described above. At this time, the impurity concentrations in the P type semiconductor region 806 and the P+ type semiconductor region 851 are adjusted such that only the P+ type semiconductor region 851 is removed and the P type semiconductor region 806 is not removed in a later wet etching step.

Then, the N− type semiconductor region 802 and the N type semiconductor region 803, which are the same conductive layers as signal charge, are formed on part of the pinning layer by ion implantation in order to form a depletion layer for performing photoelectric conversion.

Figure 77:
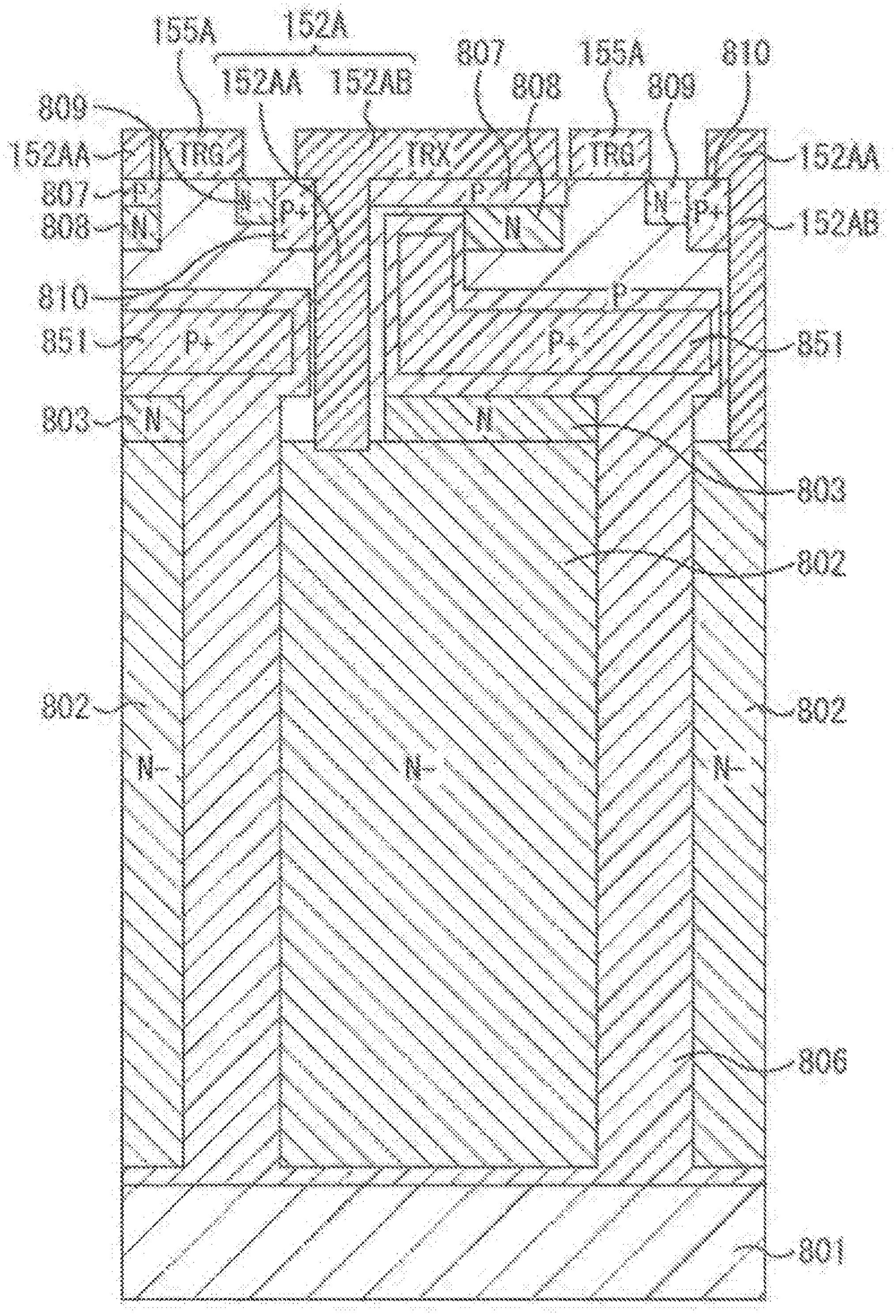
FIG. 77 is a diagram for explaining the method for manufacturing the solid-state image sensing device according to the tenth embodiment.

Then, as illustrated in FIG. 77, a monocrystal silicon film is formed on the upper surface of the semiconductor substrate 801 by epitaxial growth. The transfer channels, the transfer gates, the charge holding unit, and the surrounding circuits, and the like are then formed on the generated monocrystal silicon film. Specifically, the gate terminal (electrode) 152A, the gate terminal (electrode) 155A, the P type semiconductor region 807, the N type semiconductor region 808, the N− type semiconductor region 809, the P+ type semiconductor region 810, and the like are formed, for example.

Figure 78:
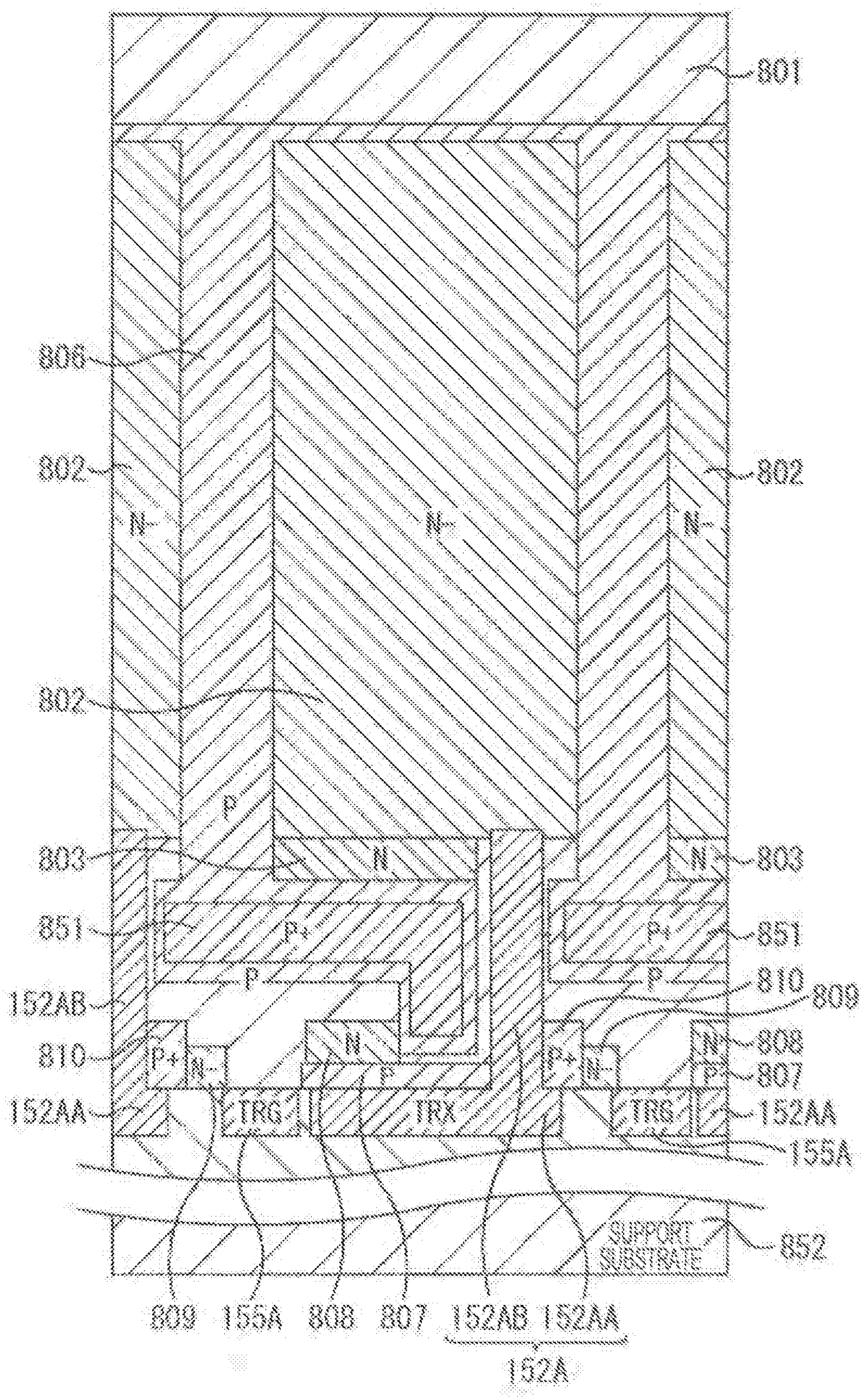
FIG. 78 is a diagram for explaining the method for manufacturing the solid-state image sensing device according to the tenth embodiment.

Then, as illustrated in FIG. 78, a wiring layer (not illustrated) is formed on the upper surface of the semiconductor substrate 801, and then a support substrate 852 is applied to the upper surface of the semiconductor substrate 801. Here, the support substrate 852 may be formed with a signal circuit.

Additionally, FIG. 78 and its subsequent Figures are vertically reverse to the previous Figures.

Figure 79:
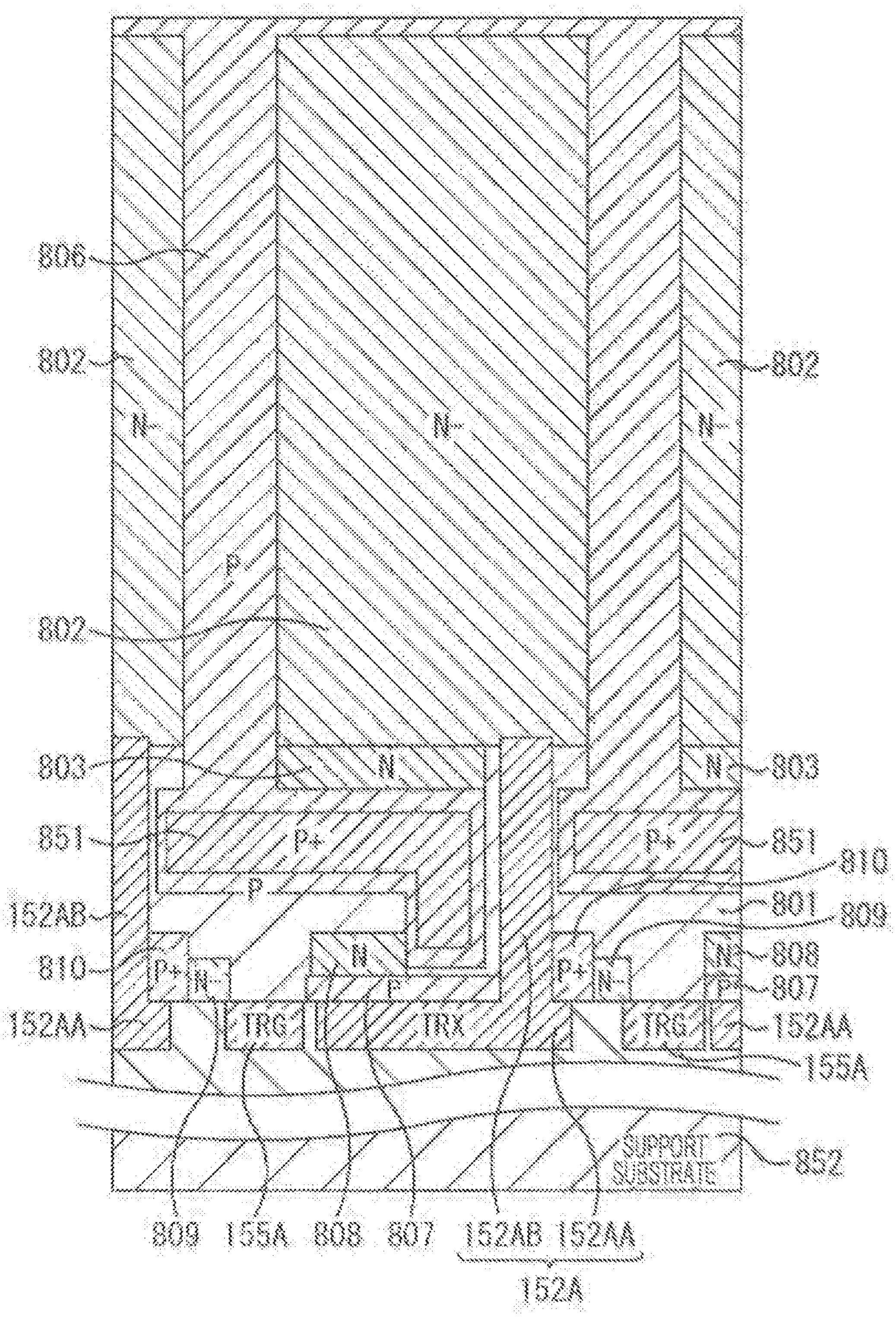
FIG. 79 is a diagram for explaining the method for manufacturing the solid-state image sensing device according to the tenth embodiment.

Then, as illustrated in FIG. 79, the backside of the semiconductor substrate 801 is thinned up to around the surface of the N− type semiconductor region 802 (the PD 151) by CMP.

Figure 80:
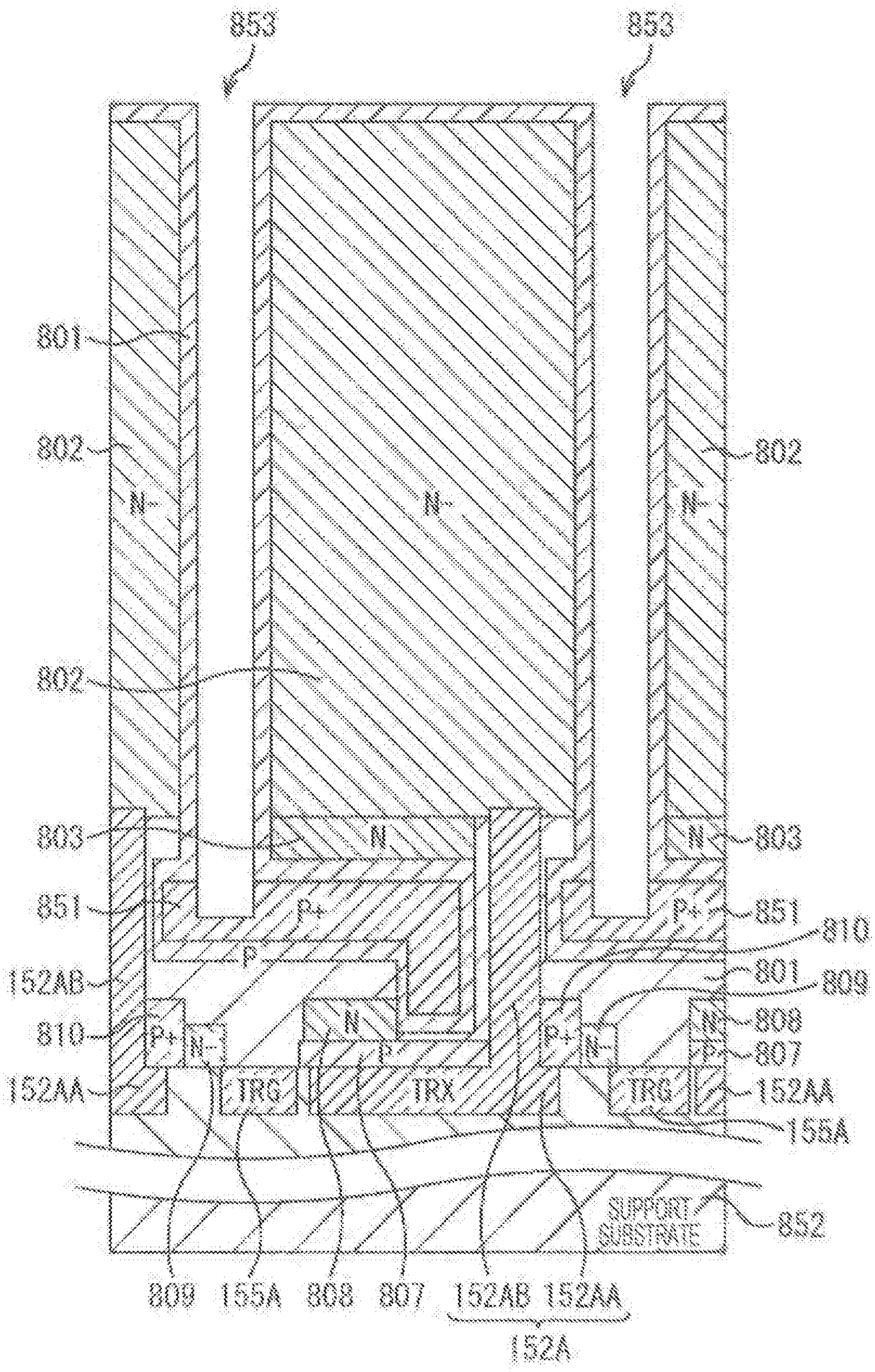
FIG. 80 is a diagram for explaining the method for manufacturing the solid-state image sensing device according to the tenth embodiment.

Then, as illustrated in FIG. 80, the P type semiconductor region 806 is removed by dry etching such as reactive ion etching (RIE) from the backside of the semiconductor substrate 801. Thereby, a trench 853, which vertically extends from the backside of the semiconductor substrate 801 and reaches the P+ type semiconductor region 851, is formed. Additionally, the P type semiconductor region 806 is not uniformly removed, and remain as thin as to sufficiently function as a pinning layer around the trench 853.

Figure 81:
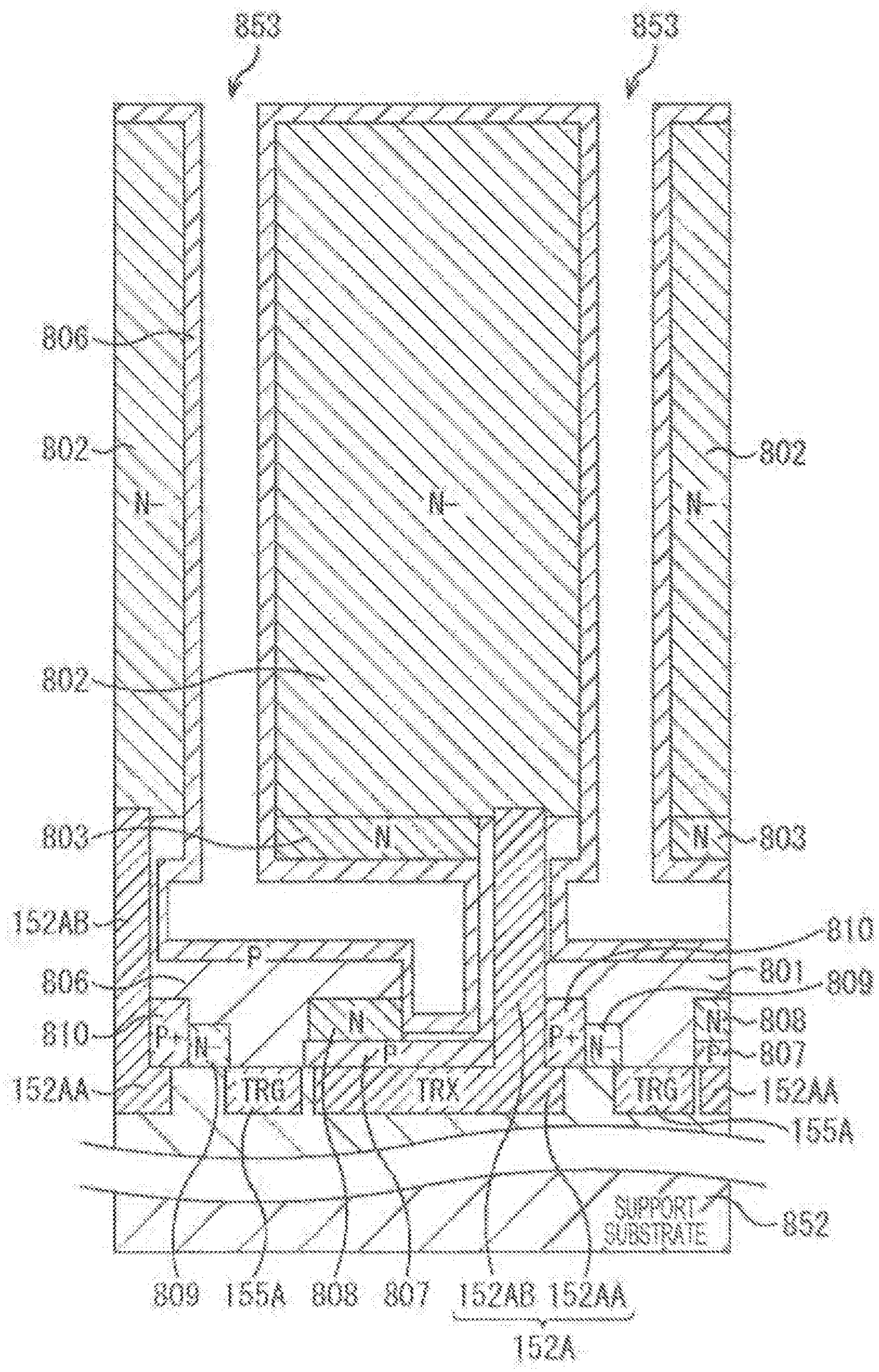
FIG. 81 is a diagram for explaining the method for manufacturing the solid-state image sensing device according to the tenth embodiment.

Then, as illustrated in FIG. 81, the P+ type semiconductor region 851 is removed by wet etching using an acid-based solution. Here, as described above, the component ratio of the solution is adjusted such that the P type semiconductor region 806 remains as a pinning layer and only the P+ type semiconductor region 851 is removed. Thereby, the trench 853 extends to the part where the P+ type semiconductor region 851 is removed. Further, the P type semiconductor region 806 is formed to be uniformly thin.

Then, as illustrated in FIG. 82, the insulative film 805 is formed on the inner wall of the trench 853 by the atomic layer deposition (ALD) method or the like, for example, in order to restrict the interface level of silicon on the inner wall of the trench 853.

Then, a metal film is embedded in the trench 853 by a method such as CVD, and the horizontal light blocking part 804A, the vertical light blocking part 804B, and the vertical light blocking part 804C of the light blocking film 804 are formed. Further, the horizontal light blocking part 804D is formed on the backside of the semiconductor substrate 801 to clog the inlet port of the trench 853. The horizontal light blocking part 804D is arranged to extend over a plurality of pixels in the column direction between columns of pixels adjacent in the row direction in the pixel array part 111, for example. Further, the horizontal light blocking part 804D is arranged to extend over a plurality of pixels in the row direction between rows of pixels adjacent in the column direction in the pixel array part 111, for example.

Additionally, at this time, a metal film for blocking a light in a pixel region for determining the black level of a pixel signal and part of a phase difference detection pixel may be formed.

Further, the insulative film 805 is formed on the backside of the semiconductor substrate 801.

Figure 83:
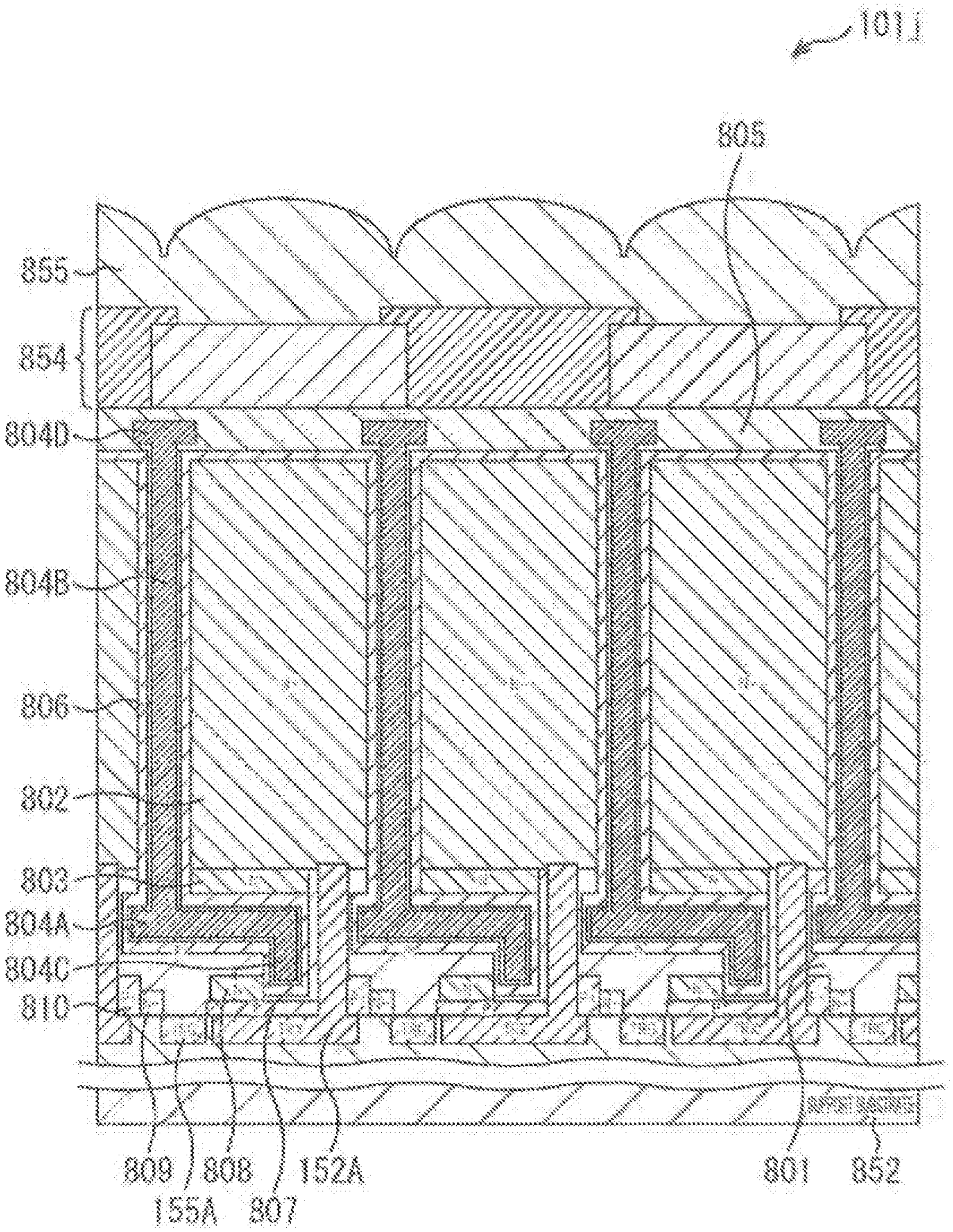
FIG. 83 is a diagram for explaining the method for manufacturing the solid-state image sensing device according to the tenth embodiment.

An on-chip color filter 854, an on-chip micro lens 855, and the like are then formed on the backside of the semiconductor substrate 801, and the solid-state image sensing device 101*j* is completed as illustrated in FIG. 83.

The solid-state image sensing device 101*j* can produce the effects almost similar to the solid-state image sensing device 101*a* described above.

Further, a joining interface between applied substrates is not present in the solid-state image sensing device 101*j* unlike the solid-state image sensing device 101*a*, and thus a defect level is not present in the channel of the TRX 152. Further, the PD 151, the TRX 152, the MEM 154, and the like are all made of monocrystal silicon. Therefore, bad charge transfer between the PD 151 and the MEM 154 can be prevented.

Further, the solid-state image sensing device 101*j* is provided with the vertical light blocking part 804C for blocking a light between the vertical terminal (electrode) part 152AB of the TRX 152 and the N type semiconductor region 808 configuring the MEM 154, thereby further enhancing the light blocking performance.

Furthermore, the P type semiconductor region 806 can be formed to be uniformly thin and the volume of the N− type semiconductor region 802 configuring the PD 151 can be increased in the solid-state image sensing device 101*j*. Consequently, the amount of saturation charges increases and the sensitivity is enhanced. Moreover, the obliquely-incident light property is enhanced.

Additionally, for example, in the step in FIG. 76 described above, the pillared P type semiconductor region 806 may be in a structure in which a conductive layer (P type conductive layer, and which will be denoted as inner conductive layer below) with a reverse conductive type to signal charge is arranged in the core of the pillar, a silicon layer in which impurities are not implanted (which will be simply denoted as silicon layer below) is arranged around the inner conductive layer, and a conductive layer (P type conductive layer, and which will be denoted as outer conductive layer below) with a reverse conductive type to signal charge is arranged around the silicon layer. Thereby, for example, in the steps in FIG. 80 and FIG. 81 described above, the inner conductive layer is removed by dry etching, and then the silicon layer is removed by wet etching using an alkaline-based solution and only the outer conductive layer is left, thereby easily forming a conductive layer with the same shape as the P type semiconductor region 806 in FIG. 73.

11. ELEVENTH EMBODIMENT

An eleventh embodiment of the present technology will be described below with reference to FIG. 84 to FIG. 129.

{Exemplary Configuration of Solid-State Image Sensing Device 101*k*}

Figure 84:
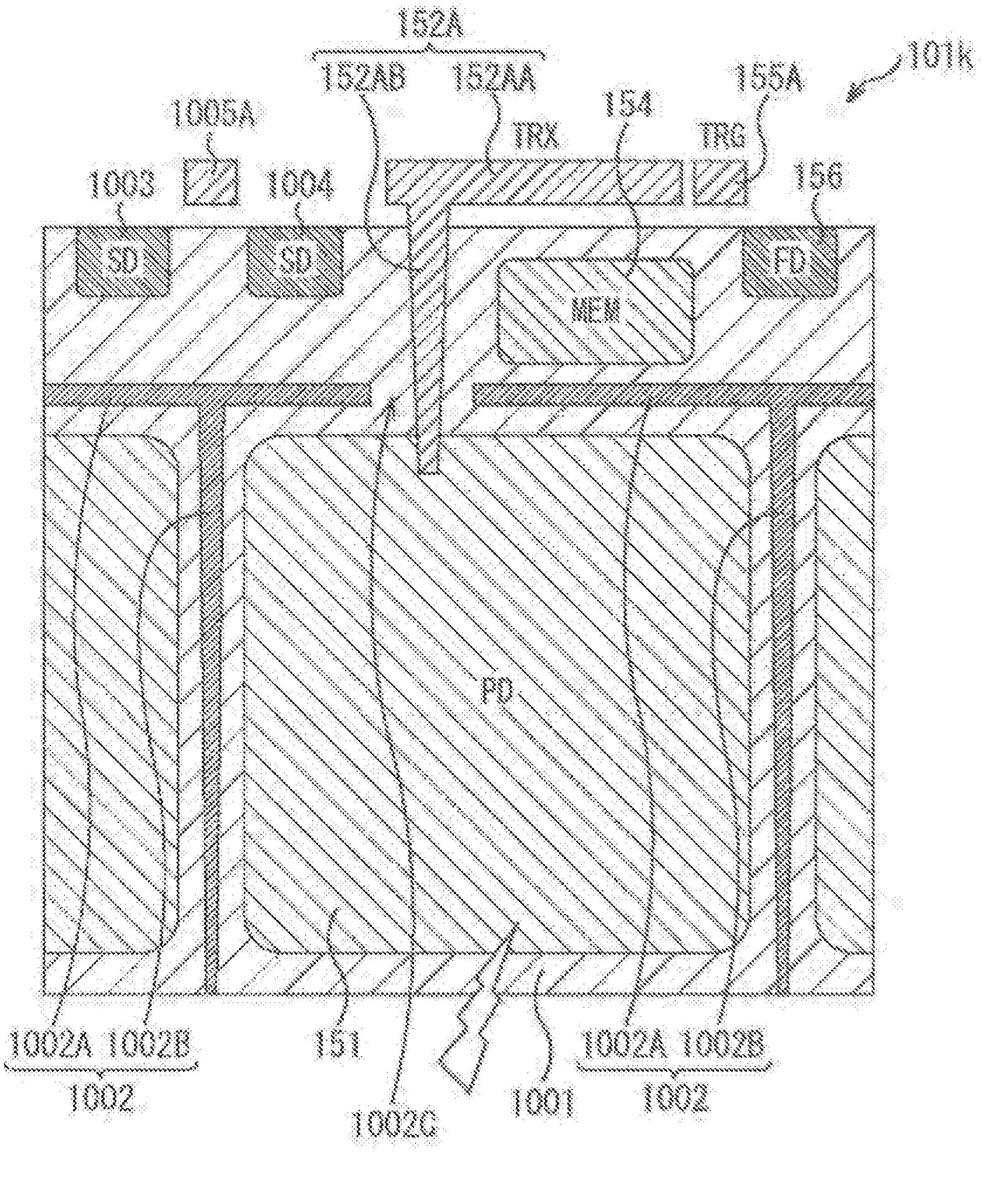
FIG. 84 is a cross-section view schematically illustrating an exemplary configuration of a solid-state image sensing device according to an eleventh embodiment of the present technology.

FIG. 84 schematically illustrates a cross section of a solid-state image sensing device 101*k* according to the eleventh embodiment of the present technology. FIG. 84 illustrates a cross section of a part including one pixel in the solid-state image sensing device 101*k*, but other pixels basically have the same configuration. Further, the lower side in FIG. 84 is assumed as a light receiving surface of the solid-state image sensing device 101*k*.

The solid-state image sensing device 101*k* is different from the solid-state image sensing device 101*j* according to the tenth embodiment of the present technology described above mainly in the cross section configuration and the manufacture method of a pixel.

The PD 151 is embedded around the backside of a semiconductor substrate 1001 in the solid-state image sensing device 101*k*. Further, the upper surface and the side surface of the PD 151 are covered with a light blocking film 1002. Specifically, the light blocking film 1002 is configured of a horizontal light blocking part 1002A and a vertical light blocking part 10028. Further, the light blocking film 1002 is made of the same material as the light blocking film 219 in FIG. 3, for example.

The horizontal light blocking part 1002A has a planar shape parallel to the light receiving surface of the solid-state image sensing device 101*k*. The horizontal light blocking part 1002A covers the upper surface of the PD 151 except an opening 1002C. Further, the horizontal light blocking part 1002A is arranged in the entire region of the pixel array part 111 except the opening 1002C in each pixel similarly to the horizontal light blocking part 804A according to the tenth embodiment described above with reference to FIG. 75.

The vertical light blocking part 1002B has a wall shape vertical to the light receiving surface of the solid-state image sensing device 101*k*. The vertical light blocking part 1002B is formed to surround the side surface of the PD 151. Further, the vertical light blocking part 1002B is arranged to extend over a plurality of pixels in the column direction between columns of pixels adjacent in the row direction in the pixel array part 111 like the vertical light blocking part 804B according to the tenth embodiment described above with reference to FIG. 74. Furthermore, the vertical light blocking part 1002B is arranged to extend over a plurality of pixels in the row direction between rows of pixels adjacent in the column direction in the pixel array part 111 like the vertical light blocking part 804B according to the tenth embodiment described above with reference to FIG. 74.

The opening 1002C is provided for inserting the vertical terminal (electrode) part 152AB of the gate terminal (electrode) 152A of the TRX 152 in the PD 151 and transferring the charges accumulated in the PD 151 to the MEM 154.

A light which is not absorbed in the PD 151 and passes therethrough is reflected on the horizontal light blocking part 1002A and is prevented from invading in an upper layer than the horizontal light blocking part 1002A. Thereby, for example, the charges generated by the light passing through the PD 151 are prevented from invading in the MEM 154 or the FD 156, and a noise is prevented from occurring. Further, the vertical light blocking part 1002B prevents a light incident from an adjacent pixel from leaking into the PD 151, and a noise such as mixed color from occurring.

Additionally, the opening 1002C is desirably as small as possible such that a light passing through the PD 151 does not pass. Further, the opening 1002C is desirably arranged at an end of the pixel (near the vertical light blocking part 1002B) in order to prevent an oblique light with a large incident angle from passing.

The gate terminal (electrode) of the TRX 152, the gate terminal (electrode) 155A of the TRG 155, and a gate terminal (electrode) 1005A of a pixel transistor are formed on the upper surface (a device forming surface) of the semiconductor substrate 1001. The gate terminal (electrode) 155A and the gate terminal (electrode) 1005A are arranged above the horizontal light blocking part 1002A, and the gate terminal (electrode) 152A is arranged above the opening 1002C of the light blocking film 1002.

The gate terminal (electrode) 152A of the TRX 152 is configured of the horizontal terminal (electrode) part 152AA and the vertical terminal (electrode) part 152AB. The horizontal terminal (electrode) part 152AA is formed on the device forming surface of the semiconductor substrate 1001 like the gate terminals (electrodes) of other transistors. The vertical terminal (electrode) part 152AB extends vertically downward from the horizontal terminal (electrode) part 152AA, and extends into the PD 151 via the opening 1002C of the light blocking film 1002.

The FD 156 and source drain regions (SD) 1003, 1004 are formed around the upper surface of the semiconductor substrate 1001 above the horizontal light blocking part 1002A. The FD 156 is arranged on the right of the gate terminal (electrode) 155A. The SD 1003 and the SD 1004 are arranged on both sides of the gate terminal (electrode) 1005A.

Further, the MEM 154 is formed slightly deeper than the upper surface of the semiconductor substrate 1001 immediately below the horizontal terminal (electrode) part 152AA of the gate terminal (electrode) 152A and above the horizontal light blocking part 1002A.

When the drive signal TRX applied to the gate terminal (electrode) 152A of the TRX 152 is turned on and the TRX 152 is turned on, a channel is formed between the PD 151 and the MEM 154. The charges accumulated in the PD 151 are then transferred to the MEM 154 via the channel and held in the MEM 154.

Further, when the drive signal TRG applied to the gate terminal (electrode) 155A of the TRG 155 is turned on and the TRG 155 is turned on, a channel is formed between the MEM 154 and the FD 156. The charges held in the MEM 154 are then transferred to the FD 156 via the channel. The potential of the FD 156 is then output as signal level to the vertical signal line VSL via the AMP 159 and the SEL 160 (not illustrated).

{Method for Manufacturing Solid-State Image Sensing Device 101k}

A method for manufacturing the solid-state image sensing device 101k will be described below with reference to FIG. 85 to FIG. 129.

(First Manufacture Method)

A first method for manufacturing the solid-state image sensing device 101k will be first described with reference to FIG. 85 to FIG. 98.

Figure 85:
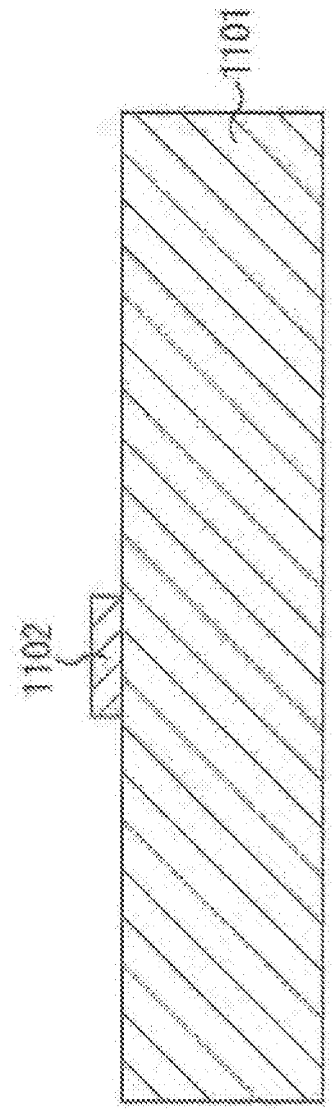
FIG. 85 is a diagram for explaining a first method for manufacturing the solid-state image sensing device according to the eleventh embodiment.

At first, as illustrated in FIG. 85, a hard mask 1102 is formed on the surface of a semiconductor substrate 1101. The hard mask 1102 is made of SiO2 or SiN, for example. Further, the hard mask 1102 is formed at the position where the opening 1002C of the light blocking film 1002 is formed.

Figure 86:
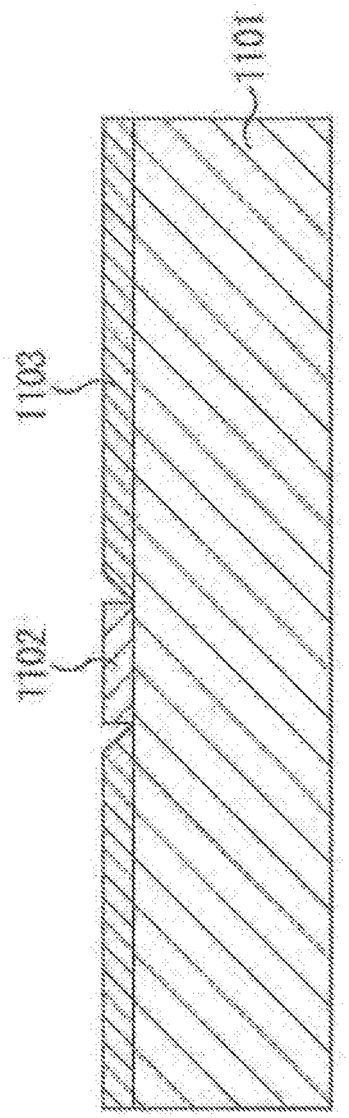
FIG. 86 is a diagram for explaining the first method for manufacturing the solid-state image sensing device according to the eleventh embodiment.

Then, as illustrated in FIG. 86, a sacrifice film 1103 is formed at the region on the surface of the semiconductor substrate 1101 except the hard mask 1102. The sacrifice film 1103 employs SiGe as a material lattice-matched with silicon, for example.

Further, the thickness of the sacrifice film 1103 is set to be 200 nm or more, for example, in consideration of the light blocking property and the visual property. Here, the visual property indicates a visual property of an alignment mark since part of the sacrifice film 1103 is not removed and remains and is used as alignment mark as described below.

Figure 87:
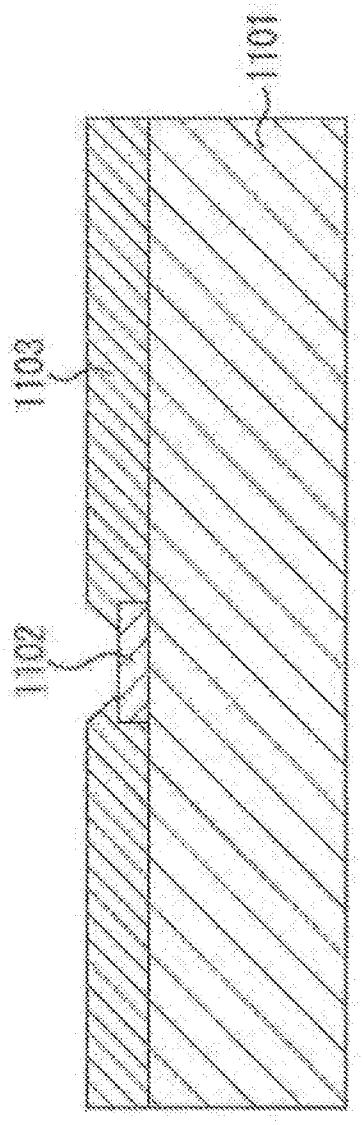
FIG. 87 is a diagram for explaining the first method for manufacturing the solid-state image sensing device according to the eleventh embodiment.
Figure 88:
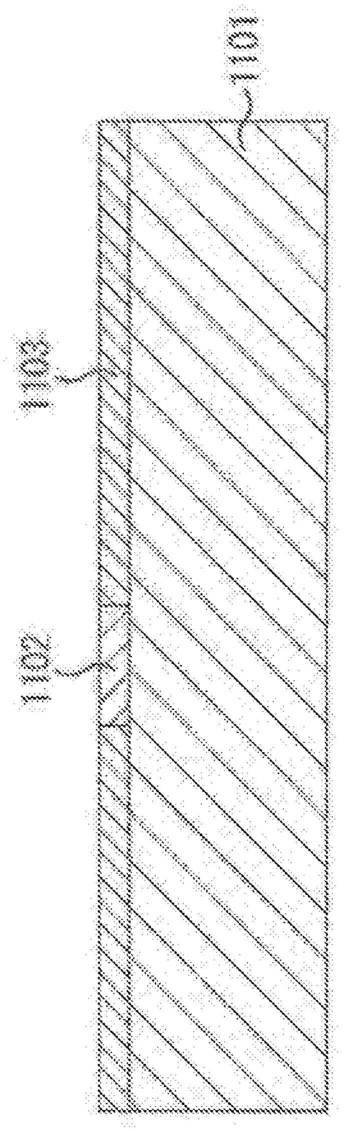
FIG. 88 is a diagram for explaining the first method for manufacturing the solid-state image sensing device according to the eleventh embodiment.

Additionally, as illustrated in FIG. 87, the sacrifice film 1103 may be grown beyond the upper end of the hard mask 1102. In this case, the sacrifice film 1103 is polished to a predetermined thickness by CMP as illustrated in FIG. 88.

Figure 89:
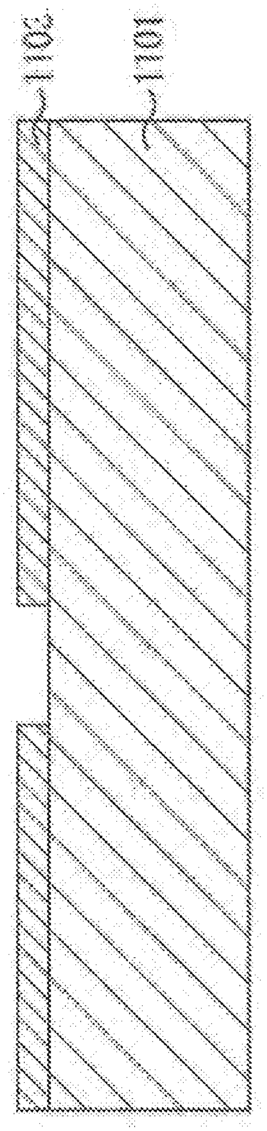
FIG. 89 is a diagram for explaining the first method for manufacturing the solid-state image sensing device according to the eleventh embodiment.

The hard mask 1102 is then removed by wet etching as illustrated in FIG. 89.

Figure 90:
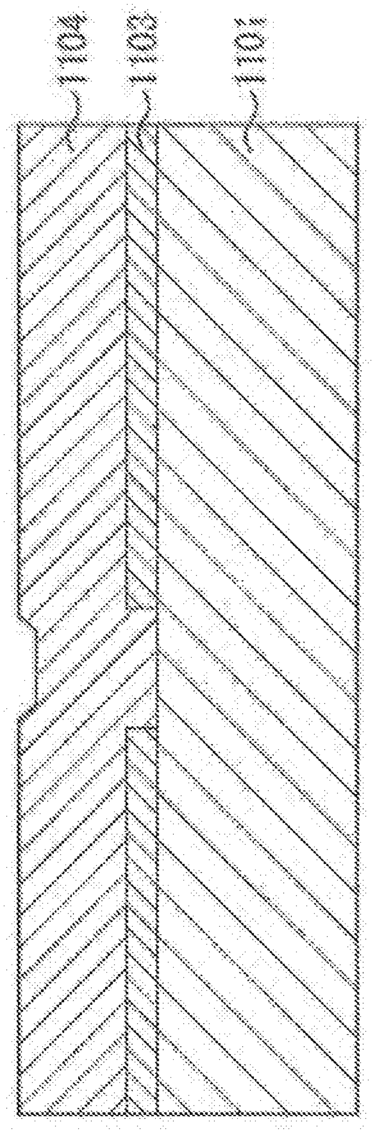
FIG. 90 is a diagram for explaining the first method for manufacturing the solid-state image sensing device according to the eleventh embodiment.

A silicon film 1104 is then formed on the upper surfaces of the semiconductor substrate 1101 and the sacrifice film 1103 by epitaxial growth as illustrated in FIG. 90.

Figure 91:
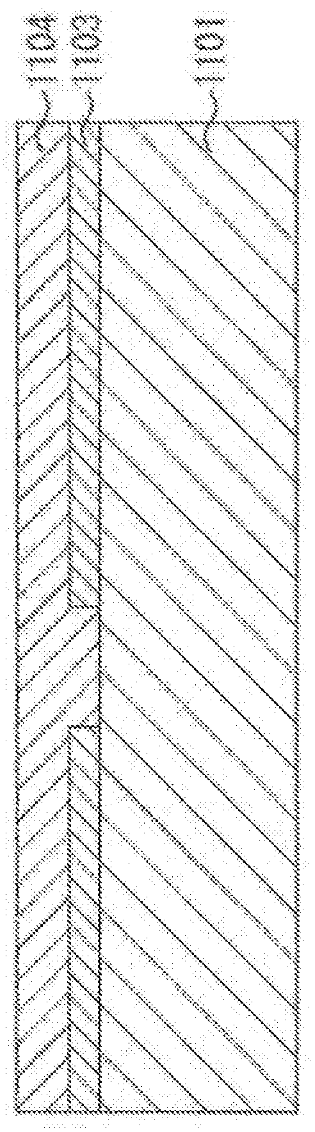
FIG. 91 is a diagram for explaining the first method for manufacturing the solid-state image sensing device according to the eleventh embodiment.

The silicon film 1104 is then polished to a predetermined thickness by CMP as illustrated in FIG. 91.

Figure 92:
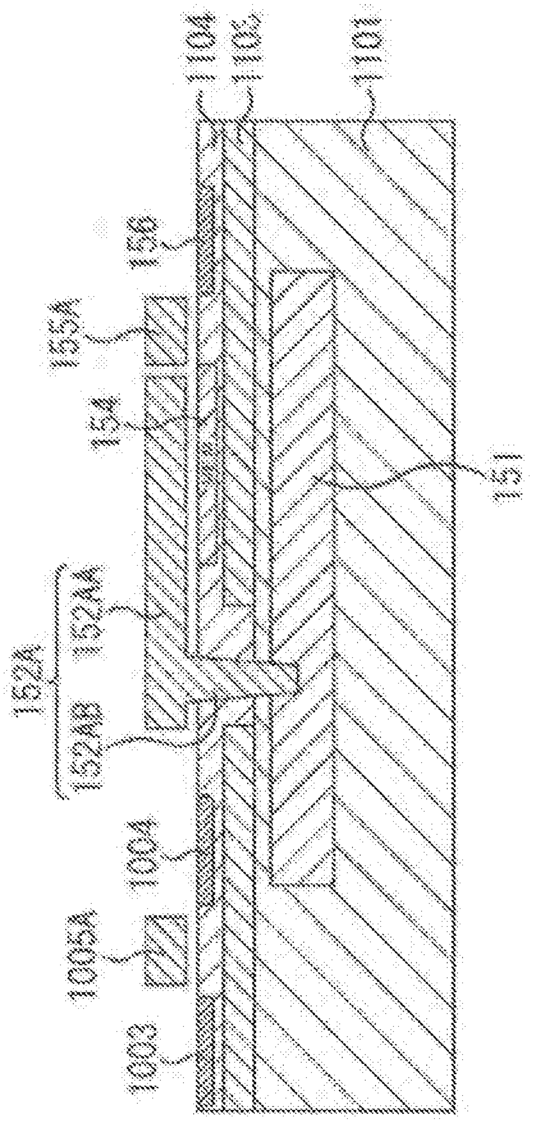
FIG. 92 is a diagram for explaining the first method for manufacturing the solid-state image sensing device according to the eleventh embodiment.

A pixel circuit is then formed as illustrated in FIG. 92. That is, the PD 151, the gate terminal (electrode) 152A, the MEM 154, the gate terminal (electrode) 155A, the SD 1003, the SD 1004, the gate terminal (electrode) 1005A, and the like are formed. Further, a wiring layer (not illustrated) is formed on the silicon film 1104, for example.

A support substrate (not illustrated) is then applied on the wiring layer (not illustrated). Further, the backside of the semiconductor substrate 1001 is thinned up to around the surface of the PD 151 as illustrated in FIG. 93.

Figure 93:
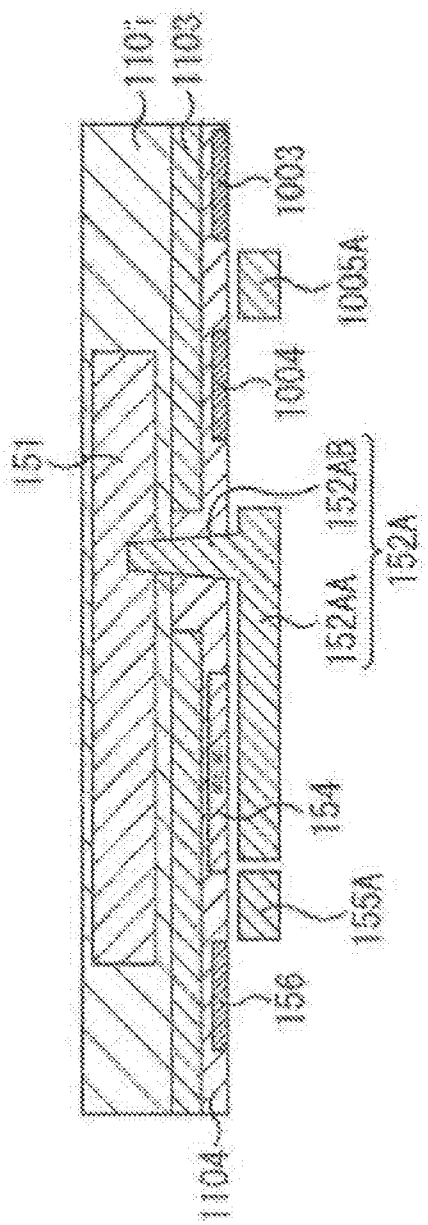
FIG. 93 is a diagram for explaining the first method for manufacturing the solid-state image sensing device according to the eleventh embodiment.

Additionally, FIG. 93 and its subsequent Figures are vertically reverse to the previous Figures.

Figure 94:
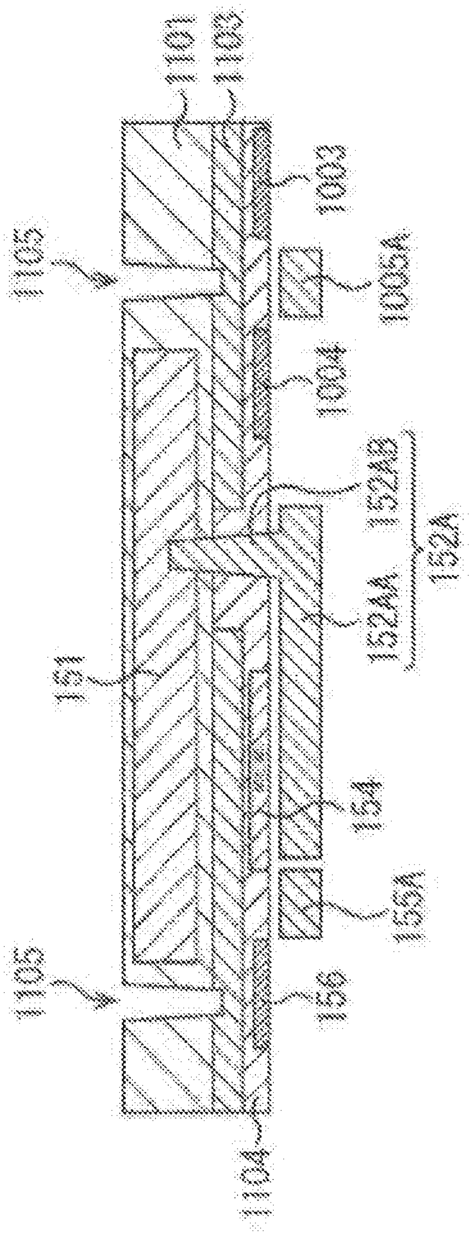
FIG. 94 is a diagram for explaining the first method for manufacturing the solid-state image sensing device according to the eleventh embodiment.

A trench 1105 is then formed on the backside of the semiconductor substrate 1001 as illustrated in FIG. 94. The trench 1105 is formed at the position where the vertical light blocking part 10028 of the light blocking film 1002 is formed, and the tip thereof reaches the sacrifice film 1103.

Additionally, the trench 1105 is formed in a method similar to the method described above with reference to FIG. 19, for example.

Further, the trench 1105 is not formed in a region (such as scribe region) other than the pixel region.

Figure 95:
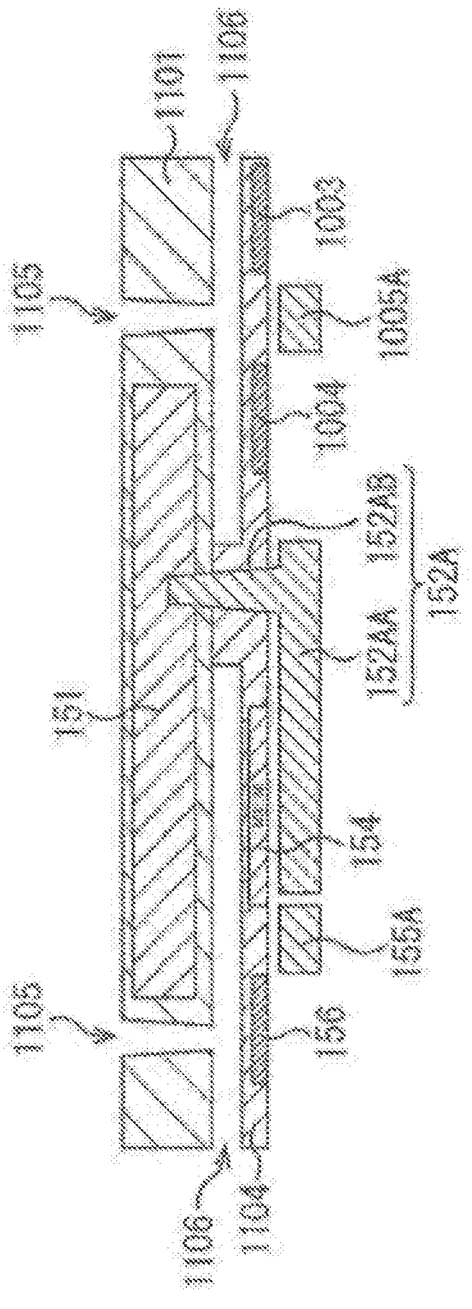
FIG. 95 is a diagram for explaining the first method for manufacturing the solid-state image sensing device according to the eleventh embodiment.

The sacrifice film 1103 is then removed by wet etching using a predetermined solution as illustrated in FIG. 95. A cavity 1106, which horizontally spreads at the position where the sacrifice film 1103 is removed, and leads to the trench 1105, is then formed. The thickness of the cross section of the cavity 1106 is almost uniform.

Additionally, a mixed solution of HF, H2O2, and CH3COOH is used for wet etching, for example.

Figure 96:
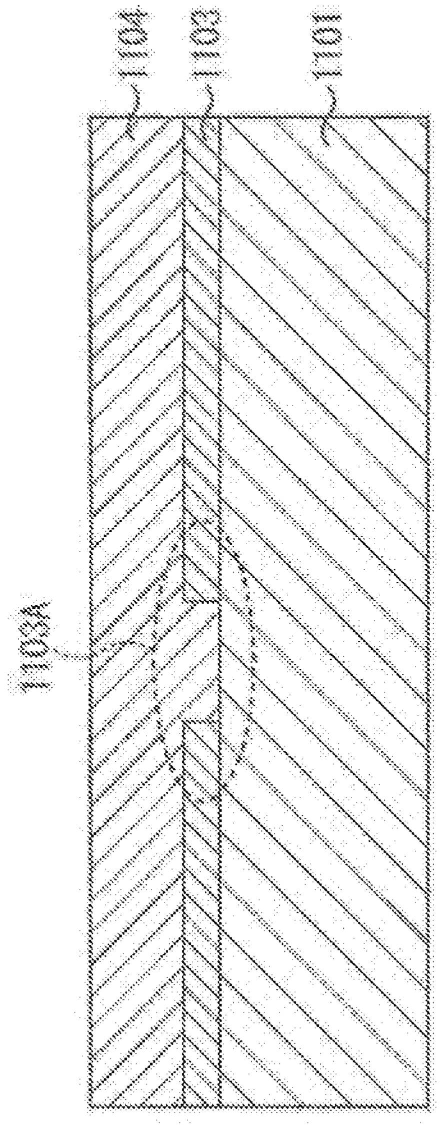
FIG. 96 is a diagram for explaining the first method for manufacturing the solid-state image sensing device according to the eleventh embodiment.

Further, as described above, the trench 1105 is not formed in the region other than the pixel region. Thus, the sacrifice film 1103 is not removed by wet etching in the step in FIG. 95 and remains as it is as illustrated in FIG. 96. An opening 1103A of the sacrifice film 1103 surrounded in a dotted line in the Figure is then used as alignment mark.

Figure 97:
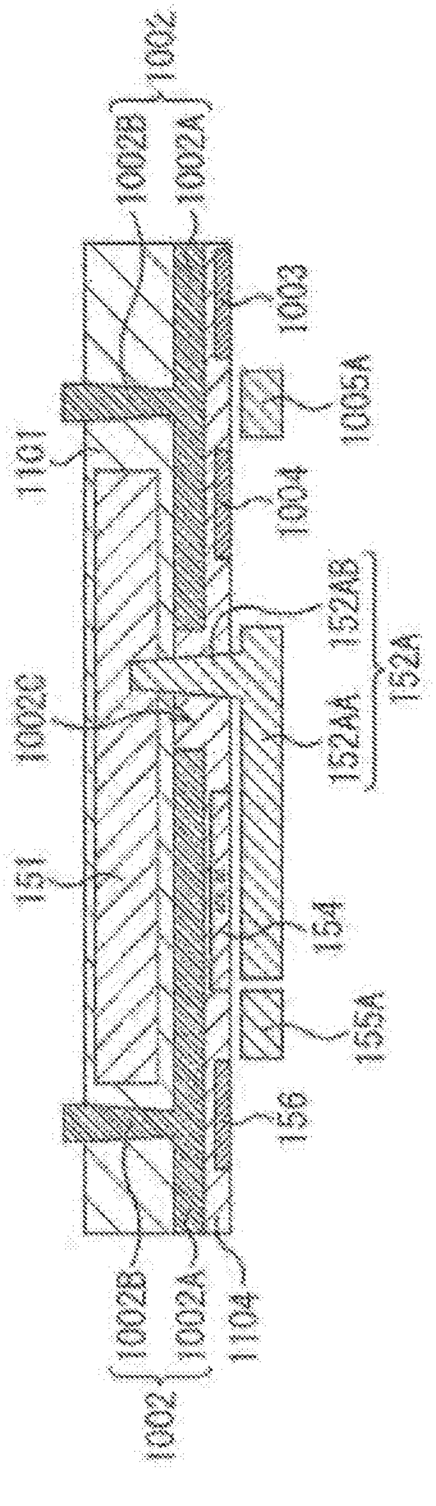
FIG. 97 is a diagram for explaining the first method for manufacturing the solid-state image sensing device according to the eleventh embodiment.

The light blocking film 1002 is then generated as illustrated in FIG. 97. For example, a fixed charge film (not illustrated) is first formed on the surfaces of the trench 1105 and the cavity 1106. The fixed charge film is made of HfO2, Al2O3, or the like, for example.

An insulative film (not illustrated) is then formed on the surface of the fixed charge film. The insulative film is made of a SiO2 film, for example.

The light blocking film 1002 is then embedded in the trench 1105 and the cavity 1106.

Figure 98:
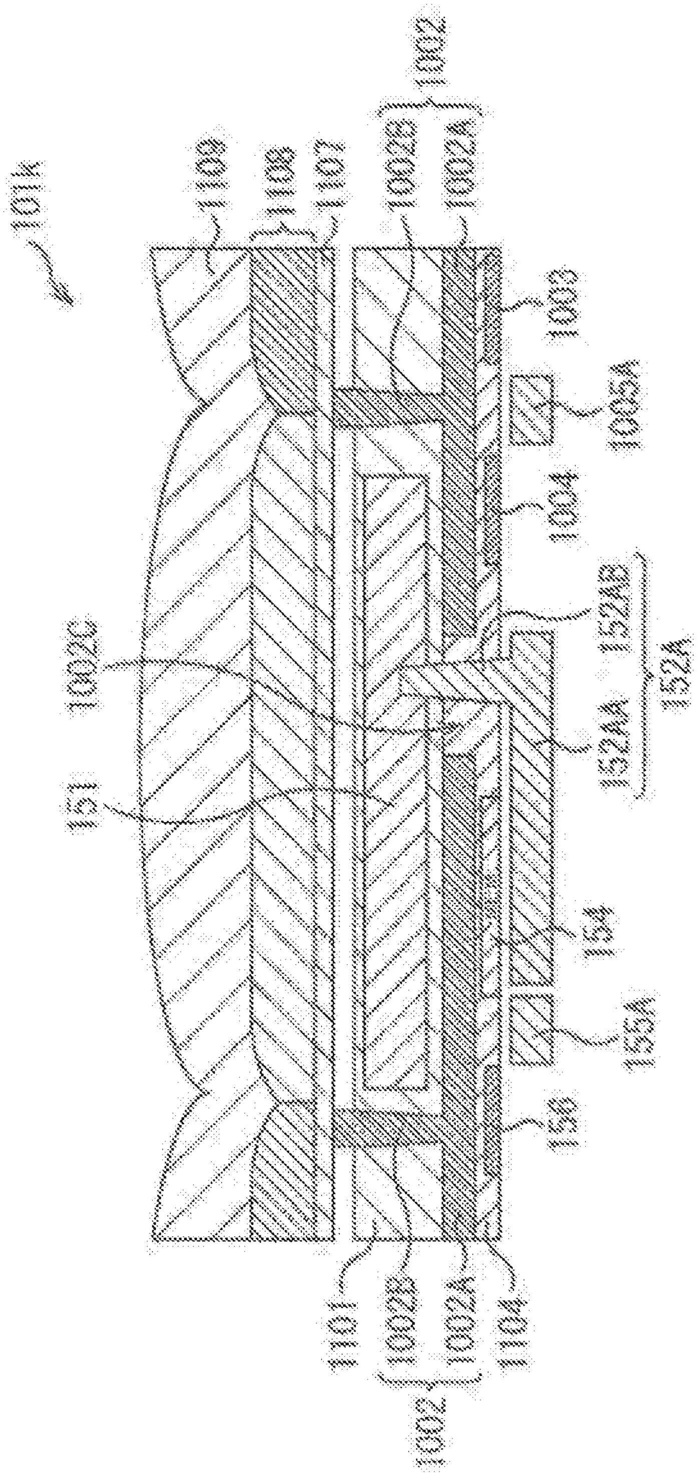
FIG. 98 is a diagram for explaining the first method for manufacturing the solid-state image sensing device according to the eleventh embodiment.

Then, as illustrated in FIG. 98, a planarizing film 1107 is formed on the backside of the semiconductor substrate 1101, and then an on-chip color filter 1108, an on-chip micro lens 1109, and the like are formed so that the solid-state image sensing device 101k is completed.

In the first manufacture method, an alignment mark of the solid-state image sensing device 101k can be formed as described above with reference to FIG. 96 without a special manufacture step.

Figure 99:
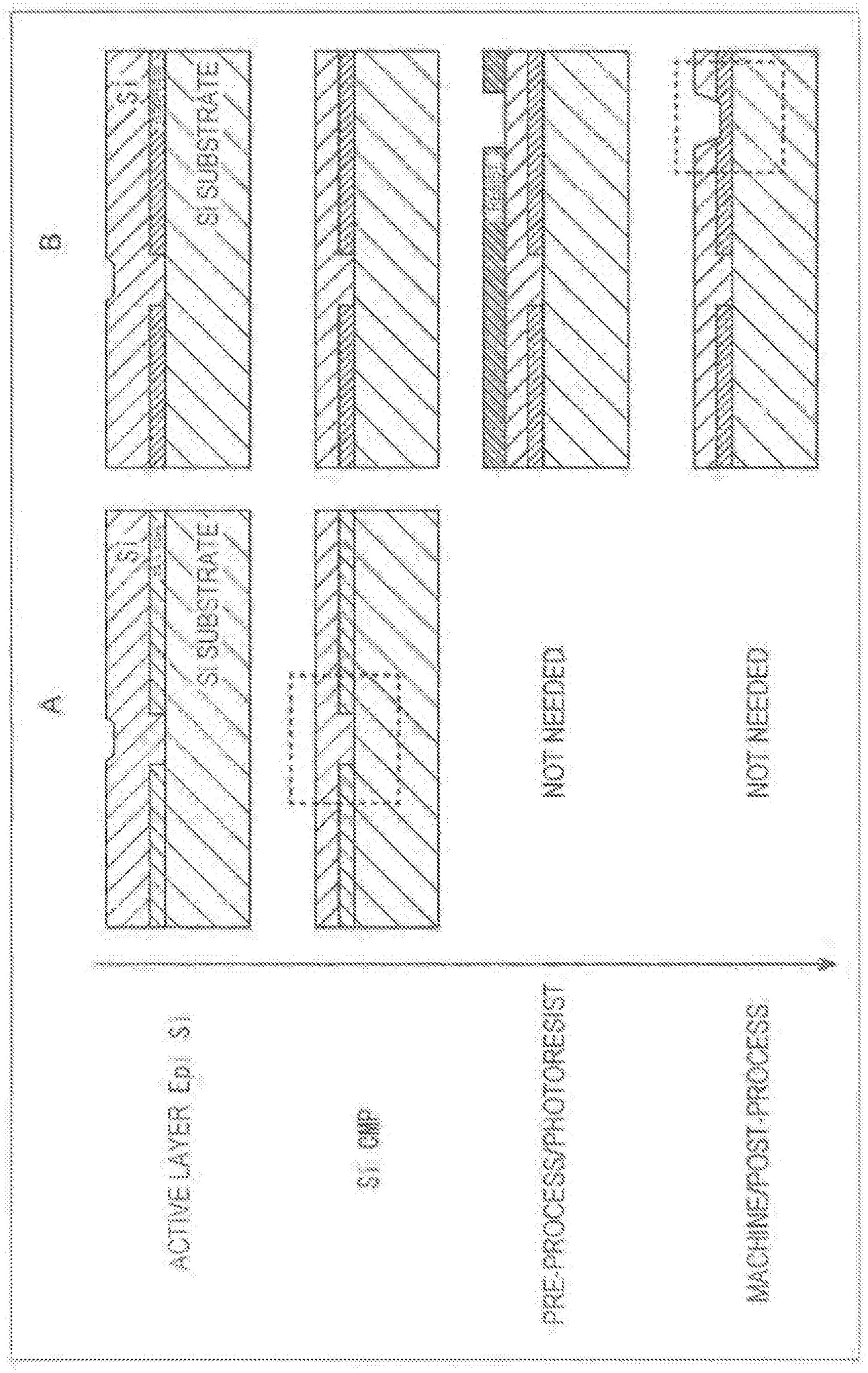
FIG. 99 is a diagram for comparing the steps of manufacturing an alignment mark.

FIG. 99 is a diagram in which the step of manufacturing an alignment mark of the solid-state image sensing device 101k in the first manufacture method is compared with the step of manufacturing an alignment mark of the solid-state image sensing device 101j in FIG. 73 described above. Additionally, the manufacture step A indicates a step of manufacturing an alignment mark of the solid-state image sensing device 101k, and the manufacture step B indicates a step of manufacturing an alignment mark of the solid-state image sensing device 101j.

In the solid-state image sensing device 101k, as described above, the silicon film 1104 is epitaxially grown on the upper surface of the SiGe-made sacrifice film 1103 in the step in FIG. 90 and the silicon film 1104 is only polished in the step in FIG. 91, thereby forming an alignment mark in a square in a dotted line in the Figure.

On the other hand, the steps up to the step of epitaxially growing the silicon film on the upper surface of the sacrifice film (the P+ type semiconductor region 851 in FIG. 76 and FIG. 77) made of boron-implanted silicon and polishing the silicon film in the solid-state image sensing device 101j are almost similar to those in the solid-state image sensing device 101k.

Here, the boron-implanted silicon is poor in visual property, and is difficult to use for alignment mark. Further, when the concentration of boron is increased for higher visual property, many defects occur, and many defects occur in the silicon film to be epitaxially grown, and the quality is deteriorated.

Thus, after being pre-processed, the surface of the silicon film is masked by photoresist. Then, the alignment mark is machined, and then post-processed. Thereby, the alignment mark is formed in the square in a dotted line in the Figure.

In this way, the steps of manufacturing an alignment mark can be further reduced in the solid-state image sensing device 101k than in the solid-state image sensing device 101j.

Additionally, there will be herein discussed whether an alignment mark can be formed by removing the sacrifice film 1103 in a region where the alignment mark is to be formed similarly as in the pixel region with reference to FIG. 100 to FIG. 103.

Figure 100:
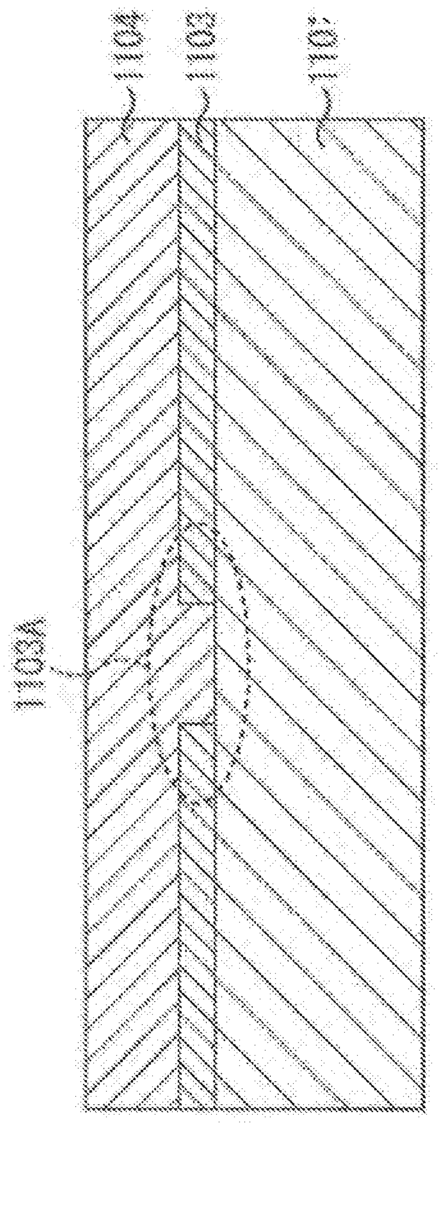
FIG. 100 is a diagram for considering other method for manufacturing an alignment mark.
Figure 101:
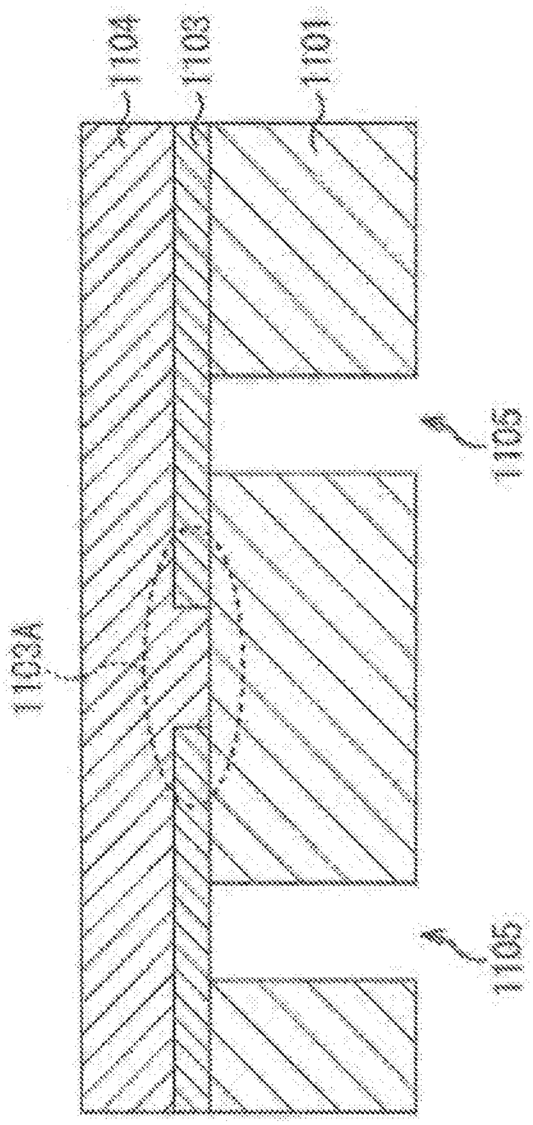
FIG. 101 is a diagram for considering other method for manufacturing an alignment mark.

For example, the trench 1105 is formed around the opening 1103A of the sacrifice film 1103 in a circle in a dotted line in FIG. 100 as illustrated in FIG. 101.

Figure 102:
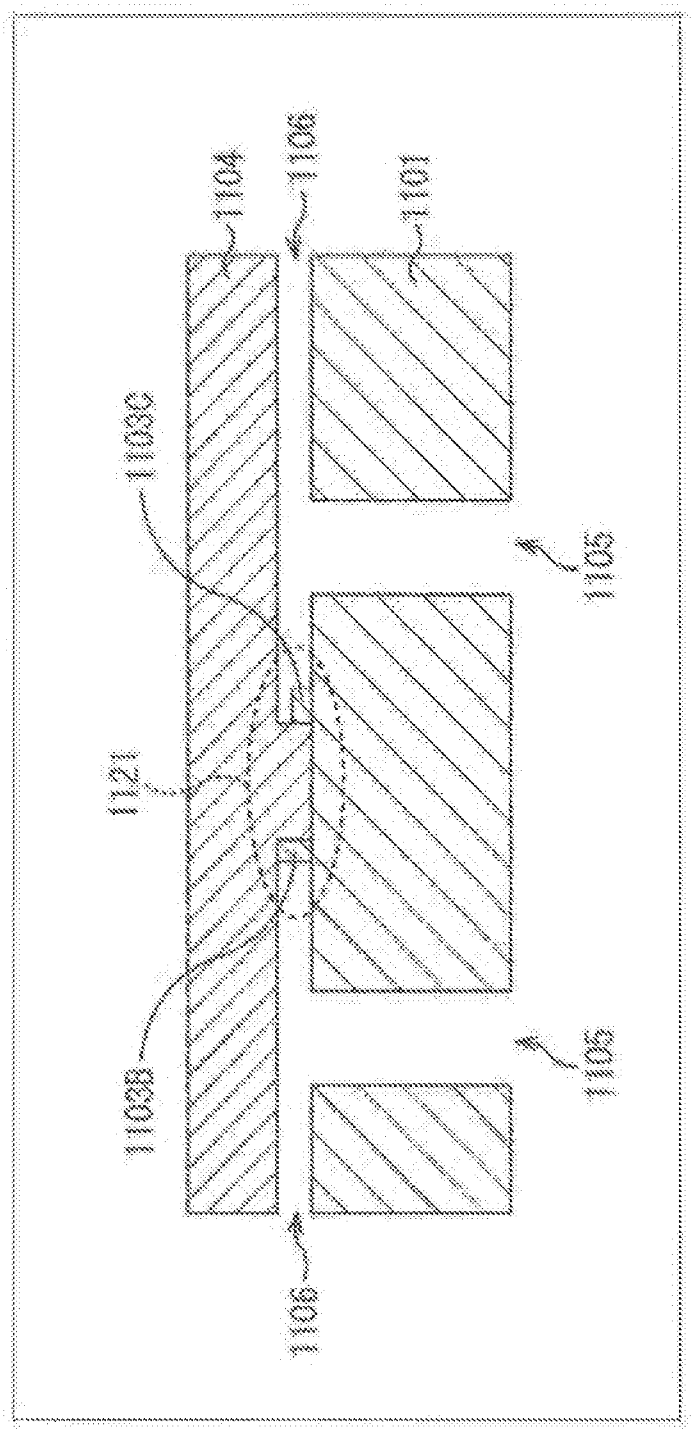
FIG. 102 is a diagram for considering other method for manufacturing an alignment mark.

Then, as illustrated in FIG. 102, the sacrifice film 1103 is removed by wet etching and the cavity 1106 is formed. At this time, the remains 1103B and 1103C of the sacrifice film may be left in the region surrounded in a dotted line 1121 in the Figure, or at an end of the sacrifice film 1103.

Figure 103:
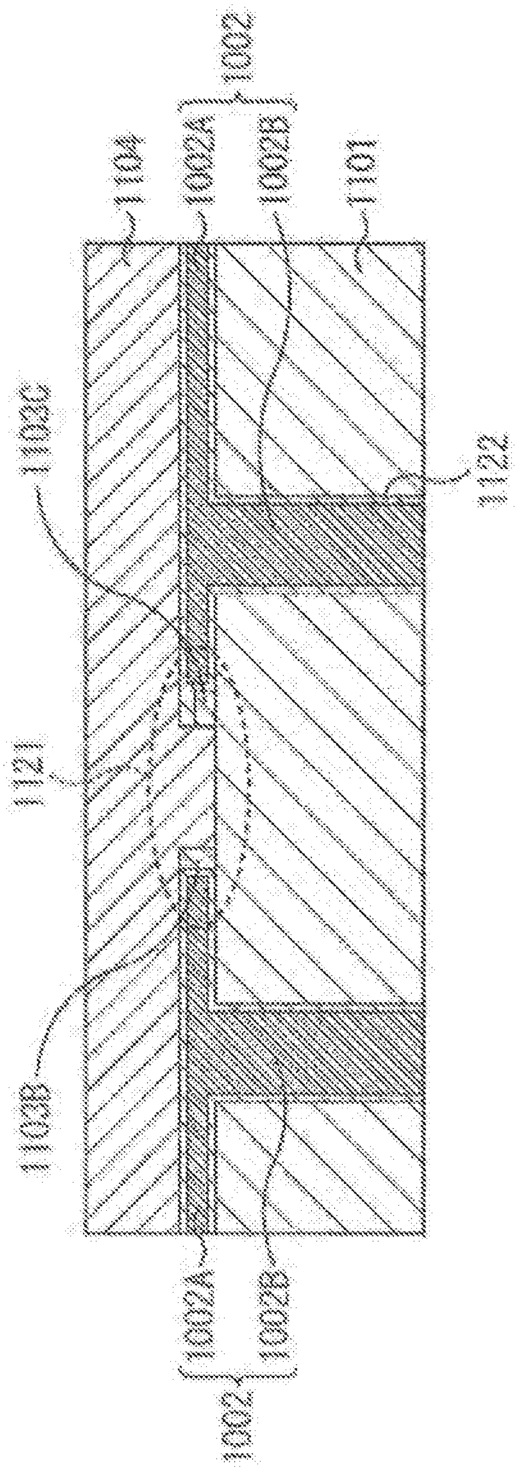
FIG. 103 is a diagram for considering other method for manufacturing an alignment mark.

Then, as illustrated in FIG. 103, a film 1122 made of a fixed charge film and an insulative film is formed on the surfaces of the trench 1105 and the cavity 1106, and then the light blocking film 1002 is embedded therein.

Here, the remains 1103B and 1103C are not removed and remain in the region surrounded in the dotted line 1121. Thus, in a case where the region is used for an alignment mark, the shape of the mark varies and is not symmetric. Therefore, a deterioration in alignment mark recognition accuracy is assumed, and the region surrounded in the dotted line 1121 is considered not suitable for an alignment mark.

(Second manufacture method) A second method for manufacturing the solid-state image sensing device 101*k* will be described below with reference to FIG. 104 to FIG. 120. Additionally, the parts corresponding to those in FIG. 85 to FIG. 98 are denoted with the same reference numerals in FIG. 104 to FIG. 120.

Figure 104:
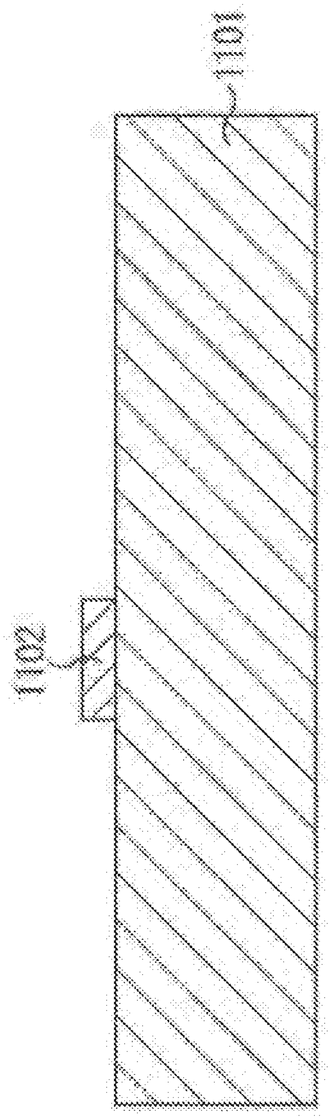
FIG. 104 is a diagram for explaining a second method for manufacturing the solid-state image sensing device according to the eleventh embodiment.

At first, as illustrated in FIG. 104, the hard mask 1102 is formed on the surface of the semiconductor substrate 1101 similarly as in the step in FIG. 85 described above.

Figure 105:
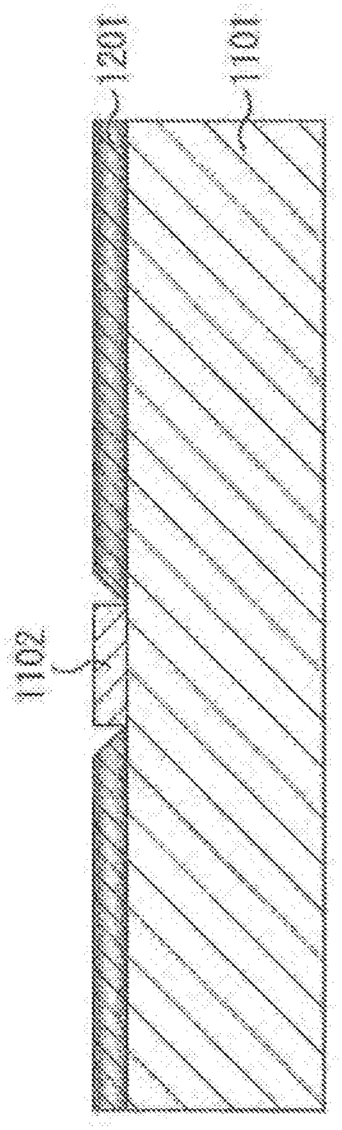
FIG. 105 is a diagram for explaining the second method for manufacturing the solid-state image sensing device according to the eleventh embodiment.

Then, as illustrated in FIG. 105, a sacrifice film 1201 is formed on the surface of the semiconductor substrate 1101 except the hard mask 1102.

The sacrifice film 1201 employs SiGe like the sacrifice film 1103 in the first manufacture method. Incidentally, the sacrifice film 1201 is adjusted such that the concentration of Ge is higher toward the center and lower toward the upper end and the lower end unlike the sacrifice film 1103. Thereby, the wet etching rate (WER) of the sacrifice film 1201 is higher toward the center and lower toward the upper end and the lower end.

Figure 106:
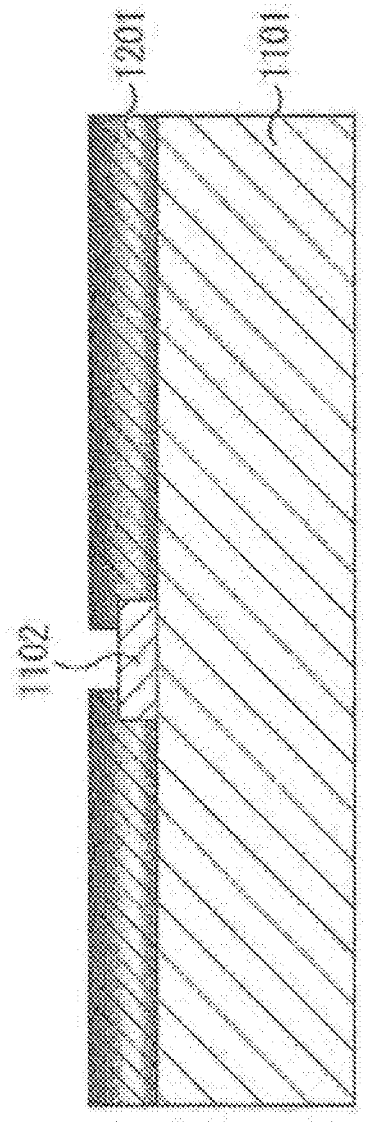
FIG. 106 is a diagram for explaining the second method for manufacturing the solid-state image sensing device according to the eleventh embodiment.
Figure 107:
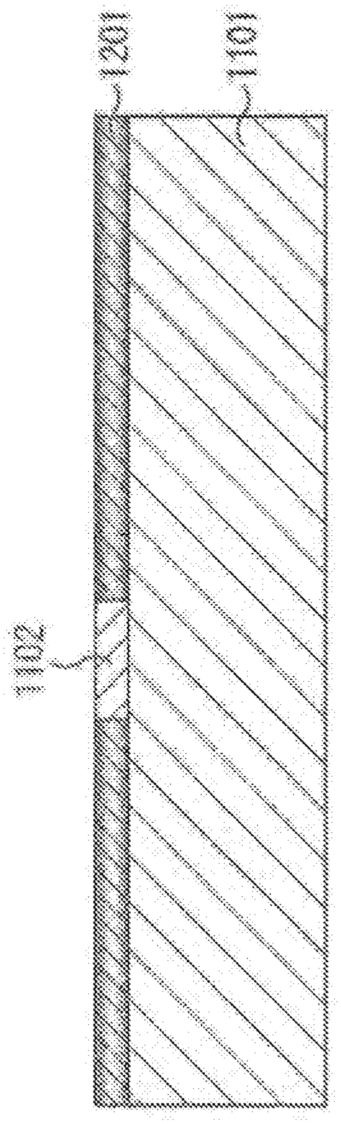
FIG. 107 is a diagram for explaining the second method for manufacturing the solid-state image sensing device according to the eleventh embodiment.

Additionally, as illustrated in FIG. 106, the sacrifice film 1201 may be formed beyond the upper end of the hard mask 1102. In this case, as illustrated in FIG. 107, the sacrifice film 1201 is polished to a predetermined thickness by CMP. Further, the concentration of Ge in the sacrifice film 1201 during its formation is adjusted such that the concentration of Ge in the polished sacrifice film 1201 is higher toward the center and lower toward the upper end and the lower end.

Figure 108:
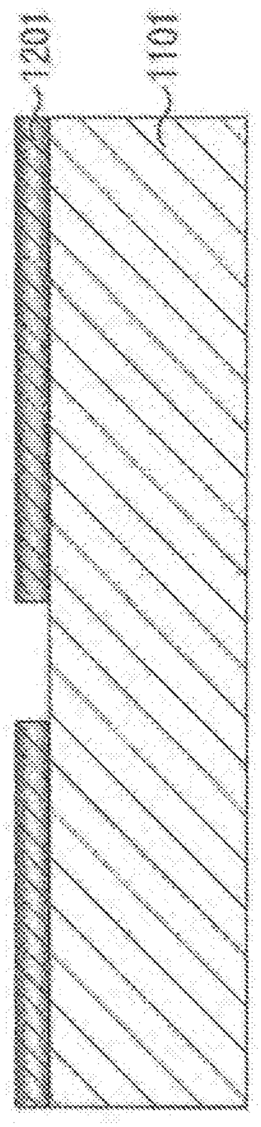
FIG. 108 is a diagram for explaining the second method for manufacturing the solid-state image sensing device according to the eleventh embodiment.

Then, as illustrated in FIG. 108, the hard mask 1102 is removed by wet etching similarly as in the step in FIG. 89 described above.

Figure 109:
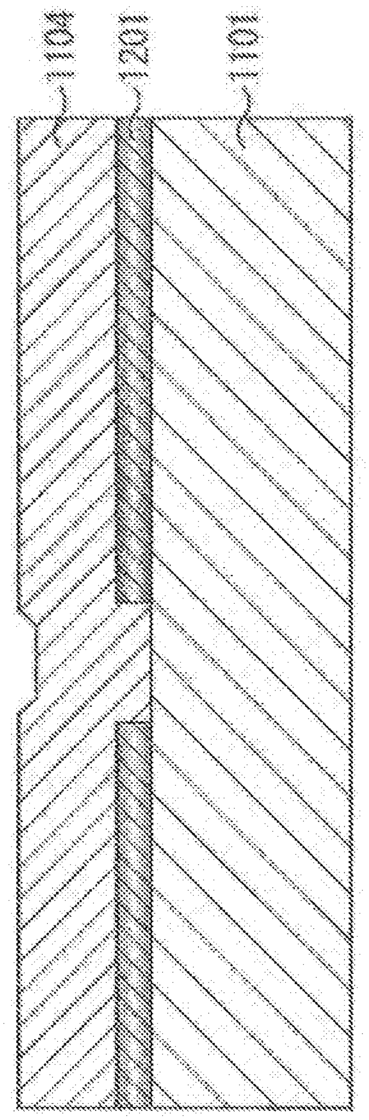
FIG. 109 is a diagram for explaining the second method for manufacturing the solid-state image sensing device according to the eleventh embodiment.

Then, as illustrated in FIG. 109, the silicon film 1104 is formed on the upper surfaces of the semiconductor substrate 1101 and the sacrifice film 1201 by epitaxial growth similarly as in the step in FIG. 90 described above.

Figure 110:
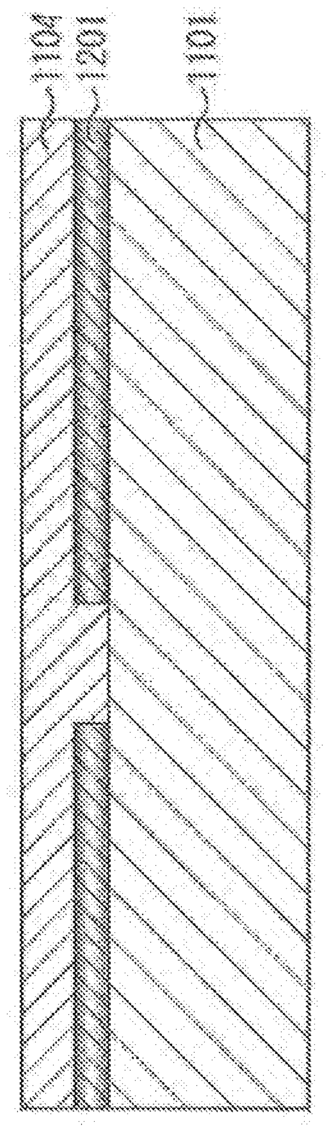
FIG. 110 is a diagram for explaining the second method for manufacturing the solid-state image sensing device according to the eleventh embodiment.

Then, as illustrated in FIG. 110, the silicon film 1104 is polished to a predetermined thickness by CMP similarly as in the step in FIG. 91 described above.

Figure 111:
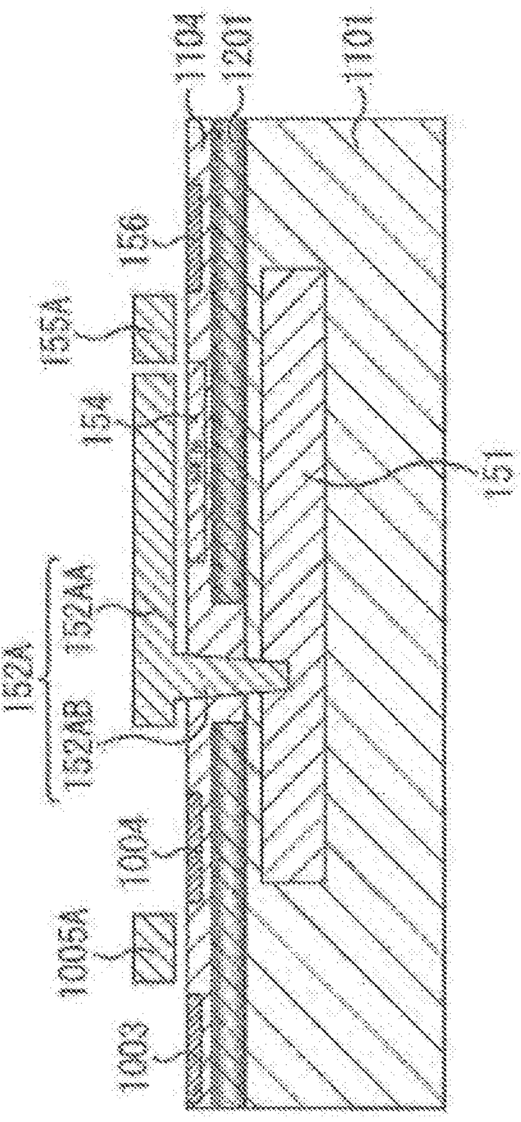
FIG. 111 is a diagram for explaining the second method for manufacturing the solid-state image sensing device according to the eleventh embodiment.

Then, as illustrated in FIG. 111, a pixel circuit is formed similarly as in the step in FIG. 92 described above.

Figure 112:
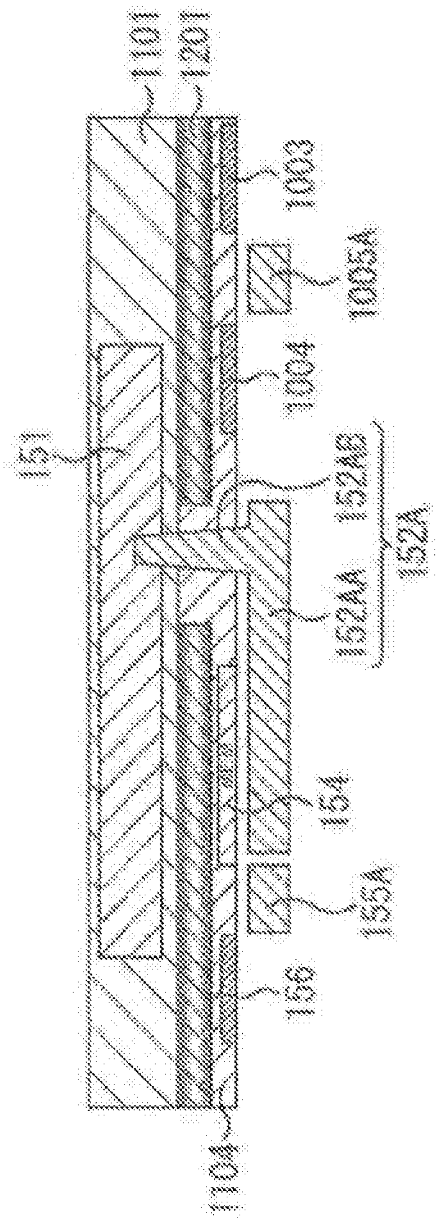
FIG. 112 is a diagram for explaining the second method for manufacturing the solid-state image sensing device according to the eleventh embodiment.

Then, as illustrated in FIG. 112, a support substrate (not illustrated) is applied and the backside of the semiconductor substrate 1101 is thinned similarly as in the step in FIG. 93 described above.

FIG. 112 and its subsequent Figures are vertically reverse to the previous Figures.

Figure 113:
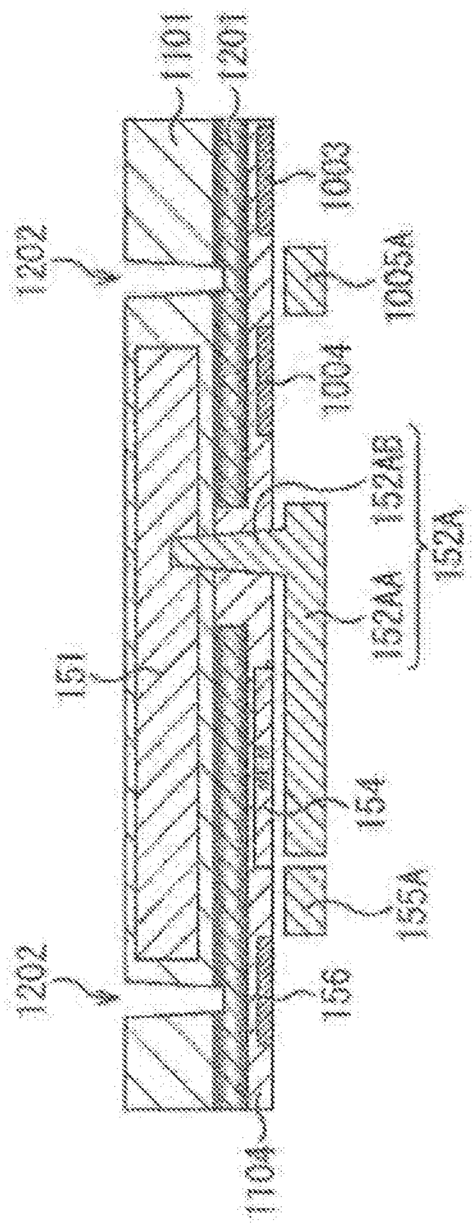
FIG. 113 is a diagram for explaining the second method for manufacturing the solid-state image sensing device according to the eleventh embodiment.

Then, as illustrated in FIG. 113, a trench 1202 is formed on the backside of the semiconductor substrate 1101 similarly as in the step in FIG. 94 described above. The tip of the trench 1202 reaches the sacrifice film 1201.

Figure 114:
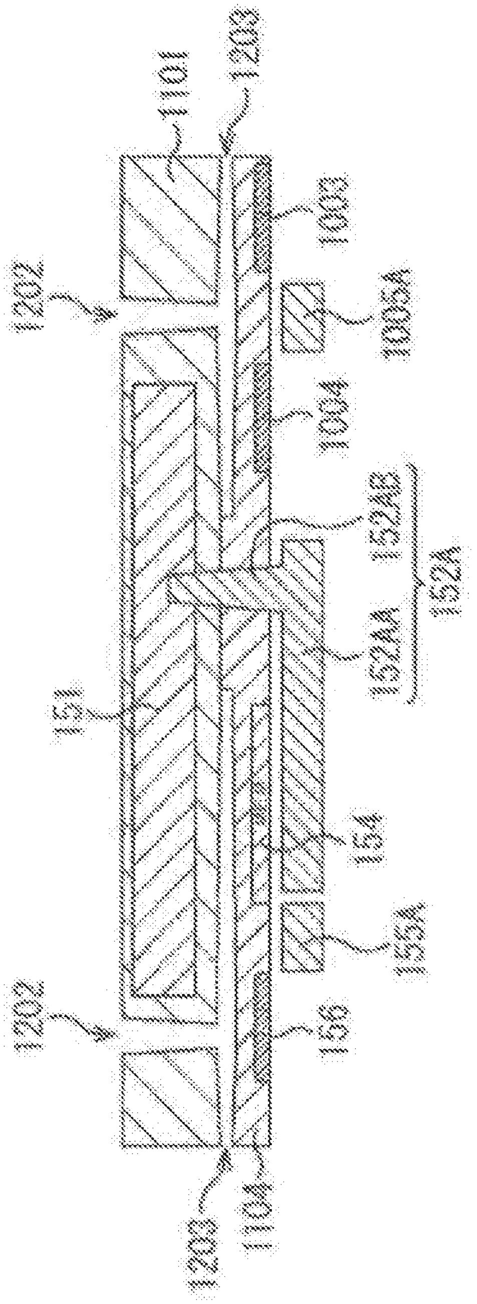
FIG. 114 is a diagram for explaining the second method for manufacturing the solid-state image sensing device according to the eleventh embodiment.

Then, as illustrated in FIG. 114, the sacrifice film 1201 is removed by wet etching similarly as in the step in FIG. 95 described above. Thereby, a cavity 1203, which leads to the trench 1202, is vertical to the trench 1202, and horizontally extends, is formed.

Here, as described above, the sacrifice film 1201 is higher in WER toward the center, and lower in WER toward the upper end and the lower end. Thus, the cavity 1203 is thicker closer to the trench 1202, and thinner farther away from the trench 1202 after the sacrifice film 1201 is removed. That is, a cross section of the cavity 1203 is the thickest at the connection part with the trench 1202, and is tapered toward the ends.

Figure 115:
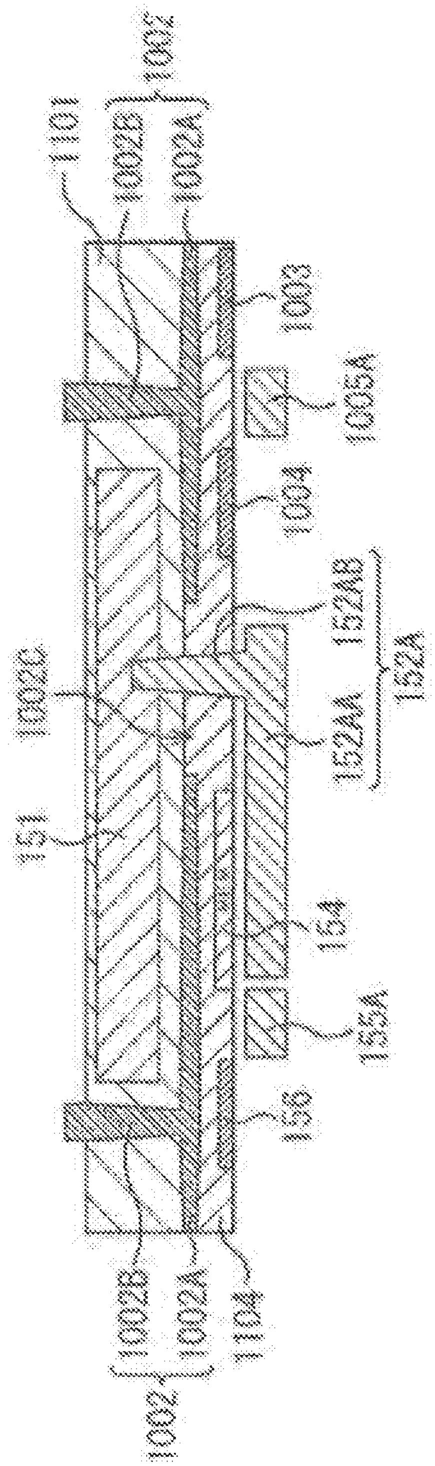
FIG. 115 is a diagram for explaining the second method for manufacturing the solid-state image sensing device according to the eleventh embodiment.

The light blocking film 1002 is then generated as illustrated in FIG. 115. For example, an insulative film (not illustrated) is first formed on the surfaces of the trench 1202 and the cavity 1203. The insulative film is made of a $SiO_2$ film, for example. The light blocking film 1002 is then embedded in the trench 1202 and the cavity 1203.

Figure 116:
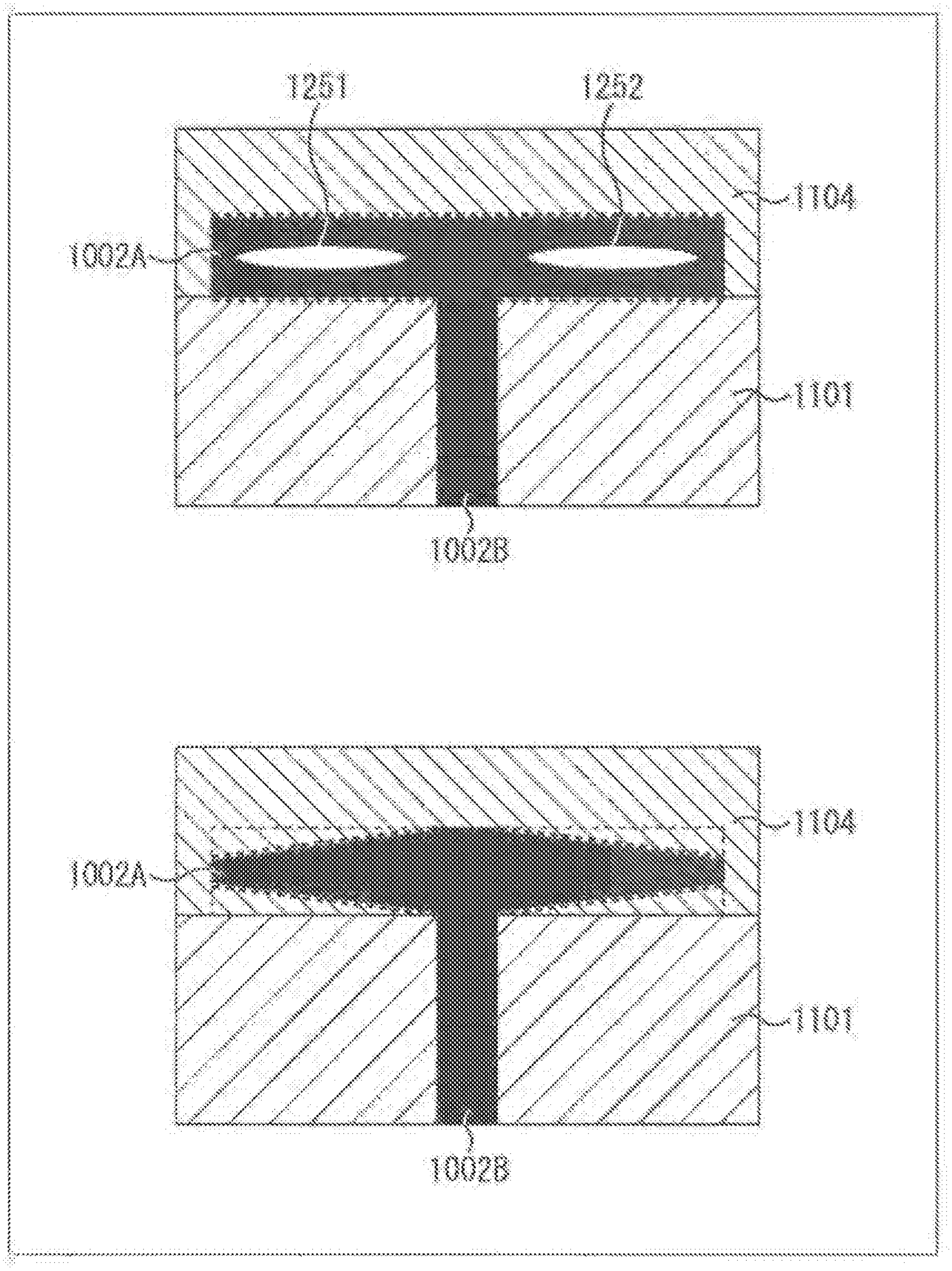
FIG. 116 is a diagram for explaining the second method for manufacturing the solid-state image sensing device according to the eleventh embodiment.

Here, a difference in the shape of the light blocking film 1002 between the first manufacture method and the second manufacture method will be described herein with reference to FIG. 116. The upper part of FIG. 116 schematically illustrates a cross section of the light blocking film 1002 generated in the first manufacture method, and the lower part thereof schematically illustrates a cross section of the light blocking film 1002 generated in the second manufacture method.

In the first manufacture method, the thickness of the cross section of the cavity 1106 in which the horizontal light blocking part 1002A is formed is almost uniform as described above with reference to FIG. 96. Thus, the thickness of the cross section of the horizontal light blocking part 1002A is almost uniform as illustrated in the upper part of FIG. 116.

Here, in a case where the light blocking film 1002 is embedded in the trench 1105 and the cavity 1106 in a method such as CVD, material gas or carrier gas is introduced from the inlet port of the trench 1105 into the trench 1105. At this time, the material gas or carrier gas may accumulate and may not sufficiently reach the inside of the cavity 1106. In particular, the material gas or carrier gas is less likely to reach closer to the ends of the cavity 1106 and farther away from the inlet port of the trench 1105. Consequently, for example, voids 1251 and 1252 are caused in the horizontal light blocking part 1002A as illustrated in the upper part of FIG. 116, and the light blocking performance can be deteriorated.

On the other hand, in the second manufacture method, the cross section of the cavity 1203 in which the horizontal light blocking part 1002A is formed is tapered as described above with reference to FIG. 114, and the cavity 1203 is the thickest at the connection part with the trench 1202, and is thinner toward the ends.

Here, in a case where the light blocking film 1002 is embedded in the trench 1202 and the cavity 1203 from the inlet port of the trench 1202 in a method such as CVD, material gas or carrier gas may accumulate and may not sufficiently reach the inside of the cavity 1203 as described above. In particular, the material gas or carrier gas is less likely to reach closer to the ends of the cavity 1203. However, since the cavity 1203 is tapered and the connection part with the trench 1202 is wider, the material gas or carrier gas is less accumulated. Further, the ends of the cavity 1203 are tapered, and thus even if the amount of gas to reach the ends of the cavity 1203 is reduced, the cavity 1203 can be embedded without any gap. Consequently, the horizontal light blocking part 1002A, which is tapered from the connection part with the vertical light blocking part 10028 toward the ends (the opening 1002C) and has no void, can be formed as illustrated in the lower part of FIG. 116, and the light blocking performance can be kept preferable.

Figure 118:
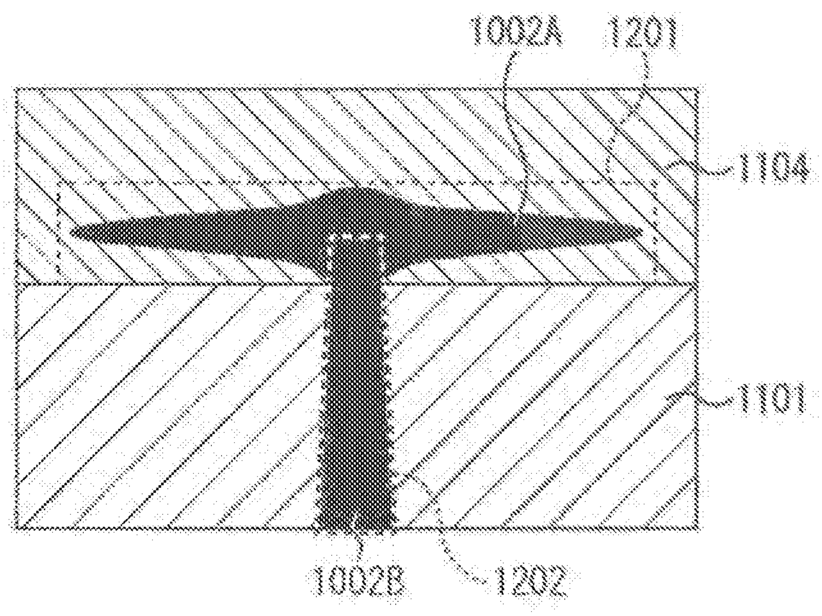
FIG. 118 is a diagram for explaining the second method for manufacturing the solid-state image sensing device according to the eleventh embodiment.
Figure 119:
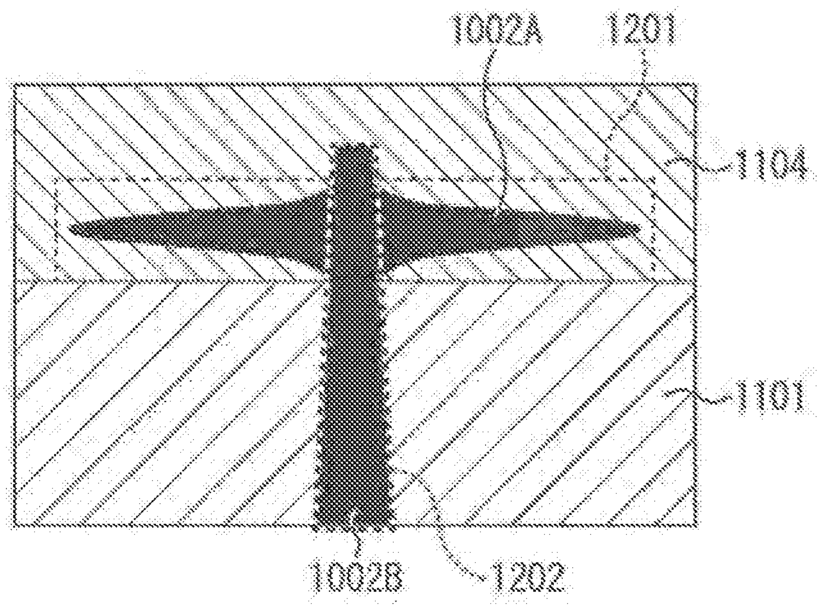
FIG. 119 is a diagram for explaining the second method for manufacturing the solid-state image sensing device according to the eleventh embodiment.

A relationship between the depth of the trench 1202 and the shape of the horizontal light blocking part 1002A will be described below with reference to FIG. 117 to FIG. 119.

Figure 117:
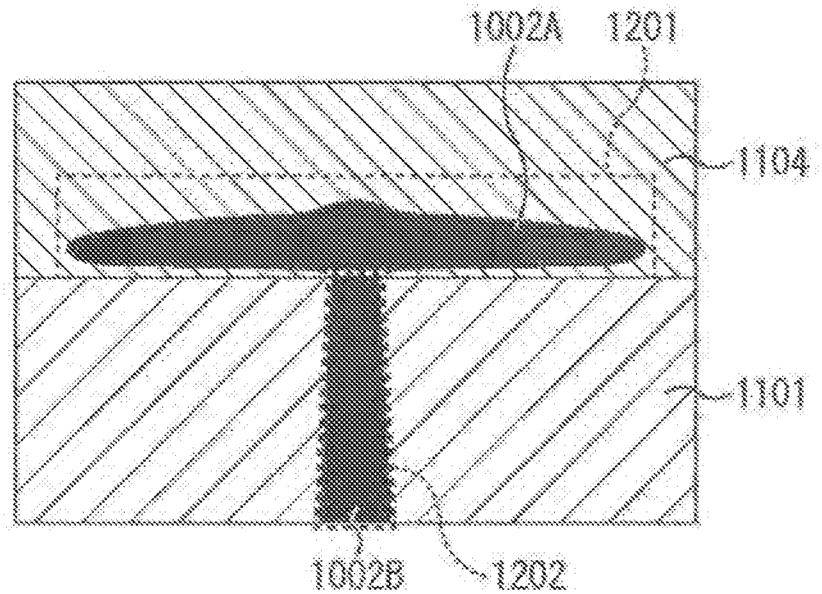
FIG. 117 is a diagram for explaining the second method for manufacturing the solid-state image sensing device according to the eleventh embodiment.

FIG. 117 schematically illustrates an exemplary shape of the horizontal light blocking part 1002A in a case where the trench 1202 is formed at a shallow position from the surface of the sacrifice film 1201. FIG. 118 schematically illustrates an exemplary shape of the horizontal light blocking part 1002A in a case where the trench 1202 is formed up to around the center of the sacrifice film 1201. FIG. 119 schematically illustrates an exemplary shape of the horizontal light blocking part 1002A in a case where the trench 1202 is formed deeper than the sacrifice film 1201.

In a case where the trench 1202 is formed at a shallow position from the surface of the sacrifice film 1201, the shape of the cross section of the horizontal light blocking part 1002A is not tapered to be vertically symmetric, and is tapered toward the trench 1202 (the vertical light blocking part 1002B).

On the other hand, there is not a large difference in the shape of the horizontal light blocking part 1002A between in a case where the trench 1202 is formed up to the center of the sacrifice film 1201 and in a case where it is formed deeper than the sacrifice film 1201. That is, the shape of the cross section of the horizontal light blocking part 1002A is tapered to be almost vertically symmetric.

Figure 120:
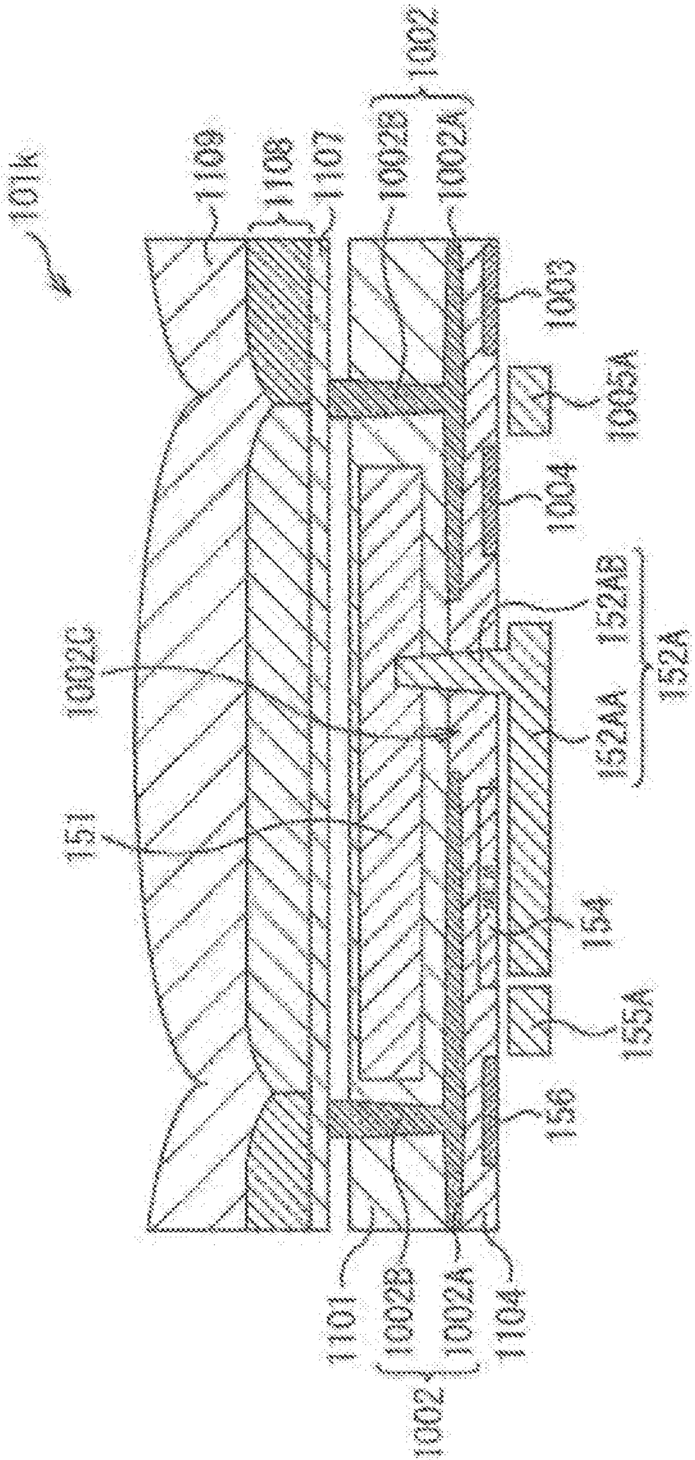

Returning to the description of the manufacture method, the planarizing film 1107, the on-chip color filter 1108, and the on-chip micro lens 1109, and the like are then formed on the backside of the semiconductor substrate 1101 similarly as in the step in FIG. 98 described above, and the solid-state image sensing device 101*k* is completed as illustrated in FIG. 120.

As described above, in the second manufacture method, the cross section of the horizontal light blocking part 1002A of the light blocking film 1002 is tapered, thereby forming the light blocking film 1002 without any void and with the excellent light blocking property.

The conditions for the thickness of the tapered horizontal light blocking part 1002A will be discussed herein.

Figure 121:
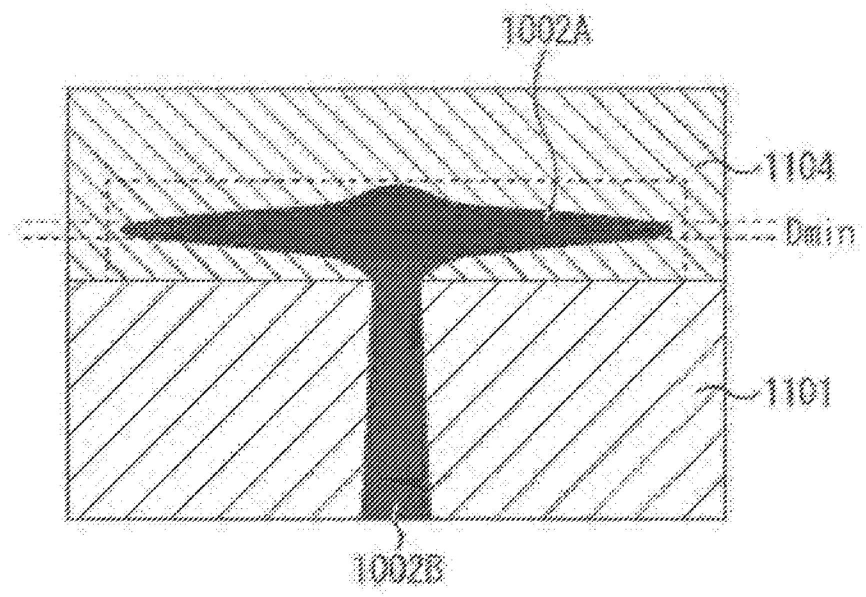

The upper table in FIG. 121 illustrates a relationship between the material and thickness of the horizontal light blocking part 1002A, and the light transmissivity.

For example, in a case where the horizontal light blocking part 1002A is made of W, the transmissivity is −50 dB or less for a thickness of 80 nm or more, and the transmissivity is −100 dB or less for a thickness of 180 nm or more. In a case where the horizontal light blocking part 1002A is made of Ti, the transmissivity is −50 dB or less for a thickness of 70 nm or more, and the transmissivity is −100 dB or less for a thickness of 140 nm or more. In a case where the horizontal light blocking part 1002A is made of Ta, the transmissivity is −50 dB or less for a thickness of 70 nm or more, and the transmissivity is −100 dB or less for a thickness of 150 nm or more. In a case where the horizontal light blocking part 1002A is made of Al, the transmissivity is −50 dB or less for a thickness of 40 nm or more, and the transmissivity is −100 dB or less for a thickness of 70 nm or more.

A minimum value Dmin of the horizontal light blocking part 1002A is then determined by the material of the horizontal light blocking part 1002A and the required light blocking performance. Additionally, the minimum value Dmin is assumed as a thickness not at the tip of the horizontal light blocking part 1002A but at a position slightly away from the tip.

For example, the minimum value Dmin is assumed as a thickness at a position away from the tip (the end of the opening 1002C) of the horizontal light blocking part 1002A by a predetermined distance.

Alternatively, for example, assuming a length from the connection part between the horizontal light blocking part 1002A and the vertical light blocking part 1002B to the tip of the horizontal light blocking part 1002A as L, the minimum value Dmin is assumed as a thickness at a position away from the tip of the horizontal light blocking part 1002A by a distance of LXx (%). x is set to be 10% or less, for example. More specifically, x is set at 0.5%, 1%, 3%, 5%, 7%, or 10%, for example.

For example, in a case where the horizontal light blocking part 1002A is made of W and the transmissivity is set at −50 dB or less, the minimum value Dmin of the horizontal light blocking part 1002A is set at 80 nm or more.

{Third Method for Manufacturing Solid-State Image Sensing Device 101*k*}

A third method for manufacturing the solid-state image sensing device 101*k* will be described below with reference to FIG. 122 to FIG. 128. The third manufacture method employs the silicon on nothing (SON) technique.

Figure 122:
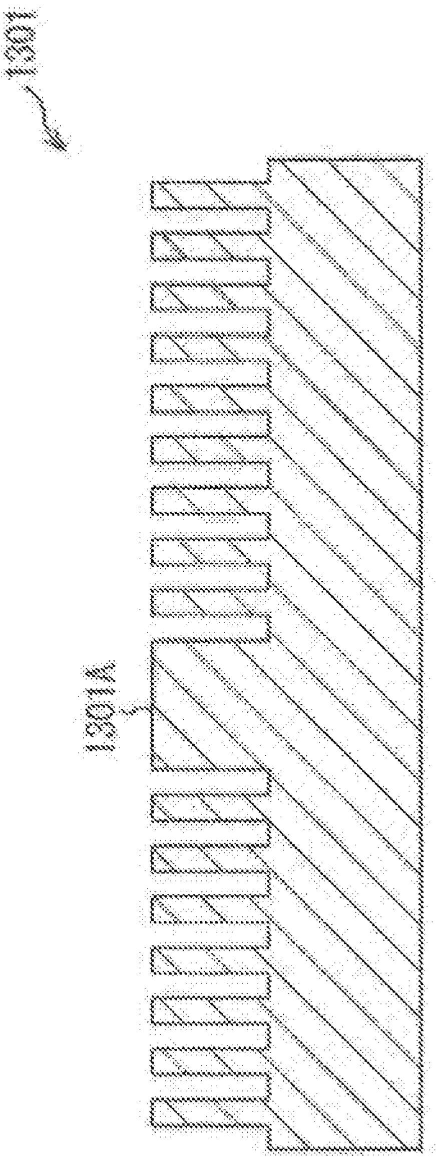

A plurality of trenches, which are vertical to the surface of a silicon-made semiconductor substrate 1301, are first formed at predetermined intervals as illustrated in FIG. 122. Additionally, a trench is not formed in a region 1301A in which the vertical terminal (electrode) part 152AB of the TRX 152 is formed.

Figure 123:
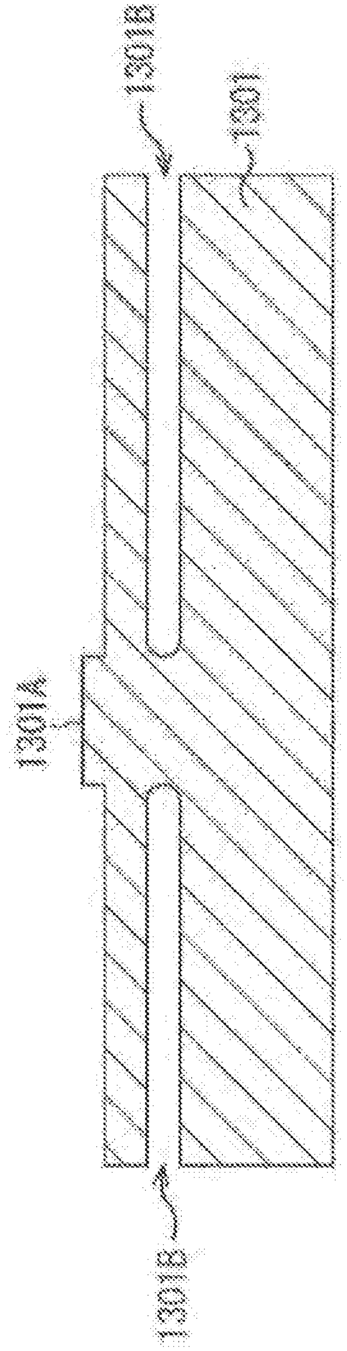

An annealing processing using H2 gas is performed on the semiconductor substrate 1301 in FIG. 122 at about 1100 degrees for about 10 minutes. Thereby, a horizontal cavity 1301B is formed in the semiconductor substrate 1301 as illustrated in FIG. 123. Additionally, the tip of the cavity 1301B is slightly rounded.

Figure 124:
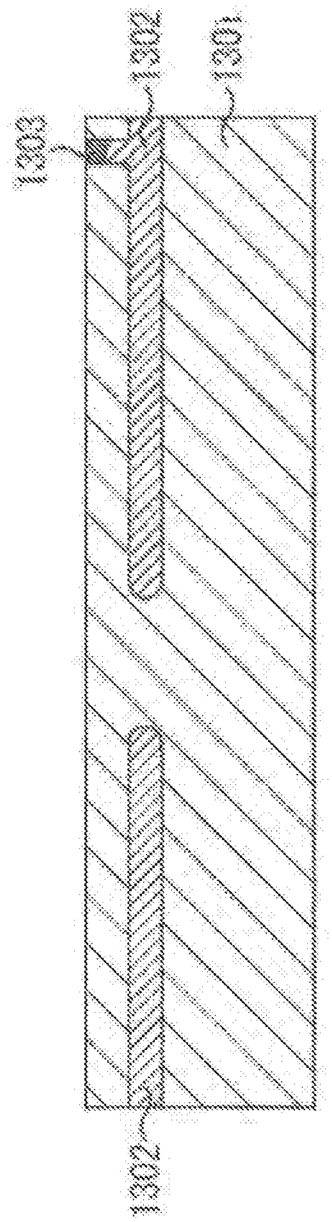
Figure 125:
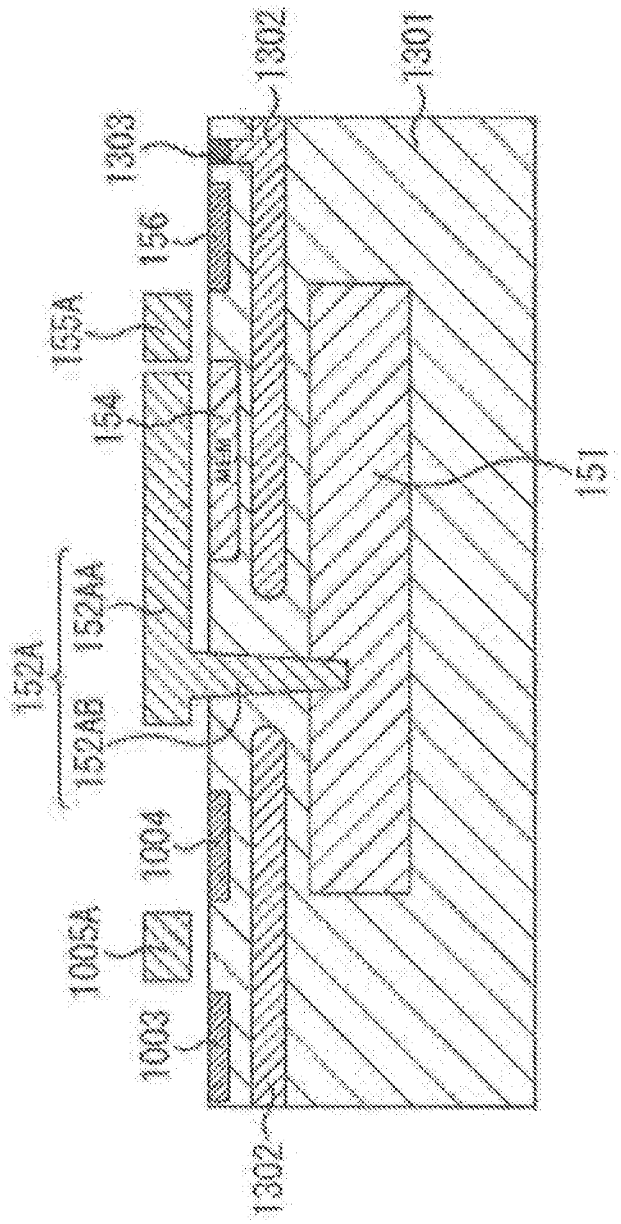

The surface of the semiconductor substrate 1301 is then drilled leading to the cavity 1301B as illustrated in FIG. 124. Then, a reinforcing film 1302 with a predetermined mechanical intensity is embedded in the cavity 1301B through the hole, and is epitaxially grown. Further, polysilicon 1303 is formed around the hole in the surface of the semiconductor substrate 1301.

Additionally, the reinforcing film 1302 may be an oxide film such as SiO2, a High-k film, or a laminated film of High-k film and oxide film, for example.

For example, in a case where the semiconductor substrate 1301 in FIG. 123 is used as it is, the horizontal cavity 1301B is formed, and thus the semiconductor substrate 1301 can be deformed or damaged when machined. To the contrary, the cavity 1301B is embedded with the reinforcing film 1302 so that the mechanical intensity of the semiconductor substrate 1301 is enhanced, thereby preventing the semiconductor substrate 1301 from being deformed or damaged.

A pixel circuit is then formed similarly as in the step in FIG. 92 described above as illustrated in FIG. 125.

Figure 126:
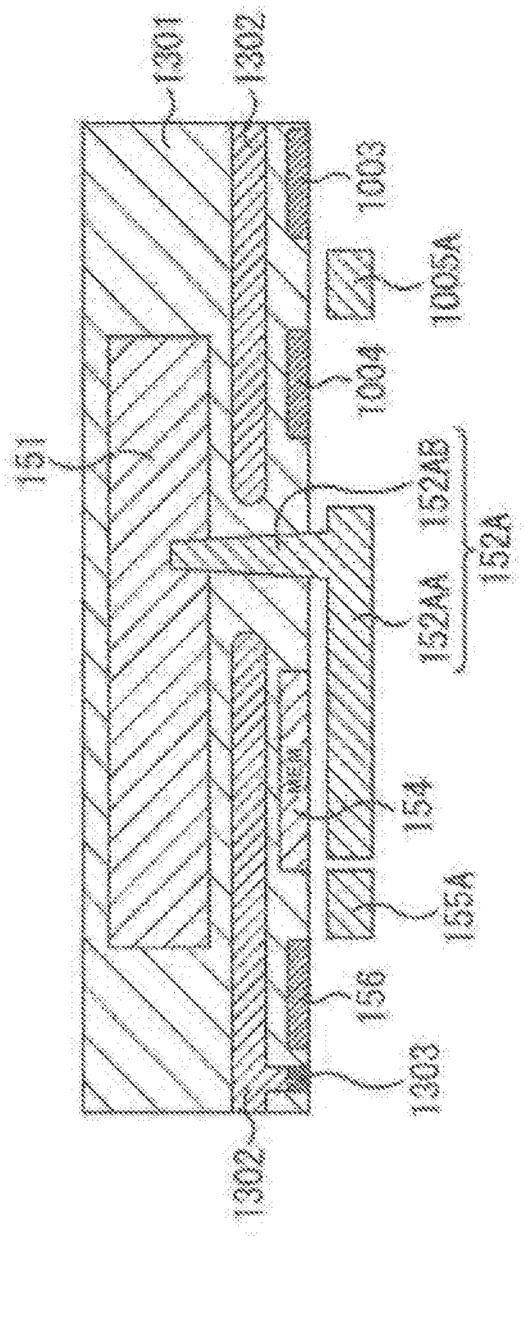
Figure 127:
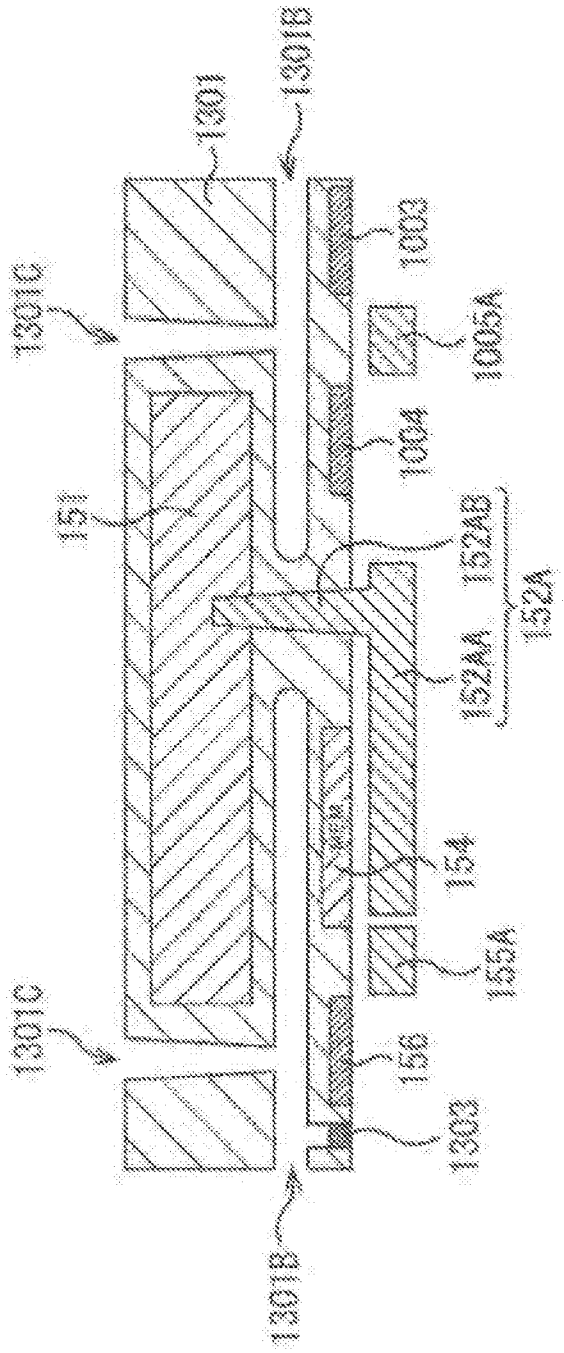

Then, a support substrate (not illustrated) is applied similarly as in the step in FIG. 93 described above, and the backside of the semiconductor substrate 1301 is thinned as illustrated in FIG. 126.

Additionally, FIG. 126 and its subsequent Figures are vertically reverse to the previous Figures.

A trench 1301C is then formed on the backside of the semiconductor substrate 1301 similarly as in the step in FIG. 94 described above as illustrated in FIG. 127. At this time, if the reinforcing film 1302 is not provided, the trench 1301C penetrates through the cavity 1301B and the semiconductor substrate 1301 can be deeper excavated than assumed. However, the trench 1301C is clogged by the reinforcing film 1302, thereby preventing the semiconductor substrate 1301 from being deeper excavated than assumed.

Further, the reinforcing film 1302 is removed by wet etching using a solution such as ammonium, and the cavity 1301B is formed again. At this time, the polysilicon 1303 formed after the formation of the reinforcing film 1302 is not removed and remains in the hole for forming the reinforcing film 1302 in the step in FIG. 124 described above.

Figure 128:
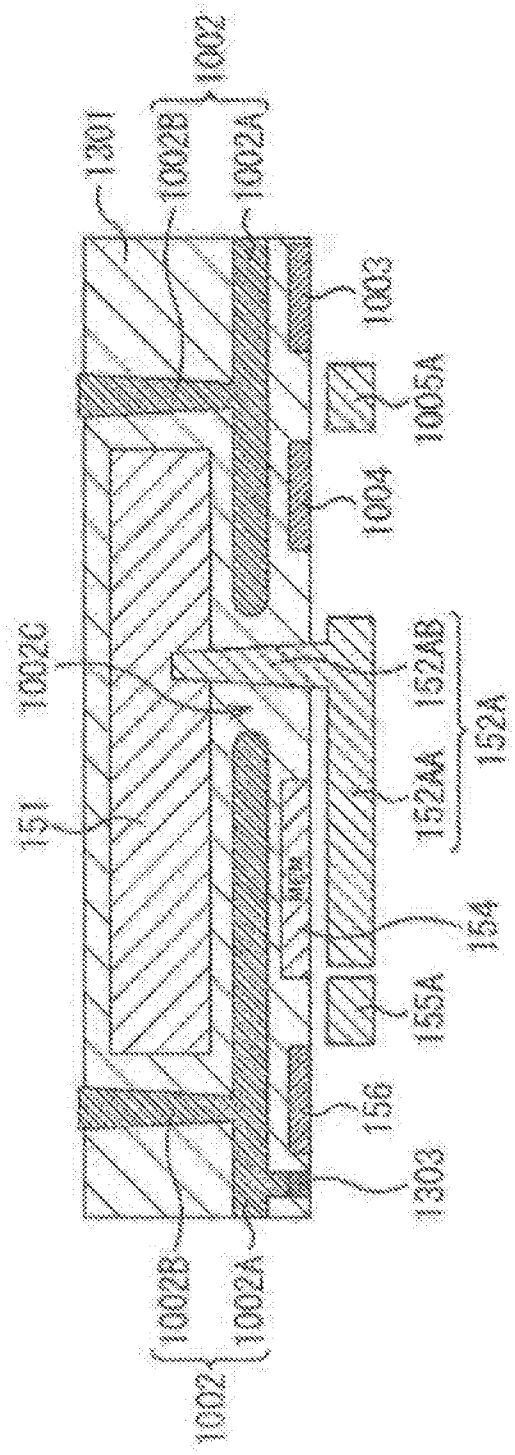

The light blocking film 1002 is then generated as illustrated in FIG. 128. For example, an insulative film (not illustrated) is first formed on the surfaces of the trench 1301C and the cavity 1301B. The insulative film is made of a SiO2 film, for example. The light blocking film 1002 is then embedded in the trench 1301C and the cavity 1301B.

As described above with reference to FIG. 98 or FIG. 113, the on-chip color filter and the on-chip micro lens are then formed so that the solid-state image sensing device 101*k* is completed.

Figure 129:
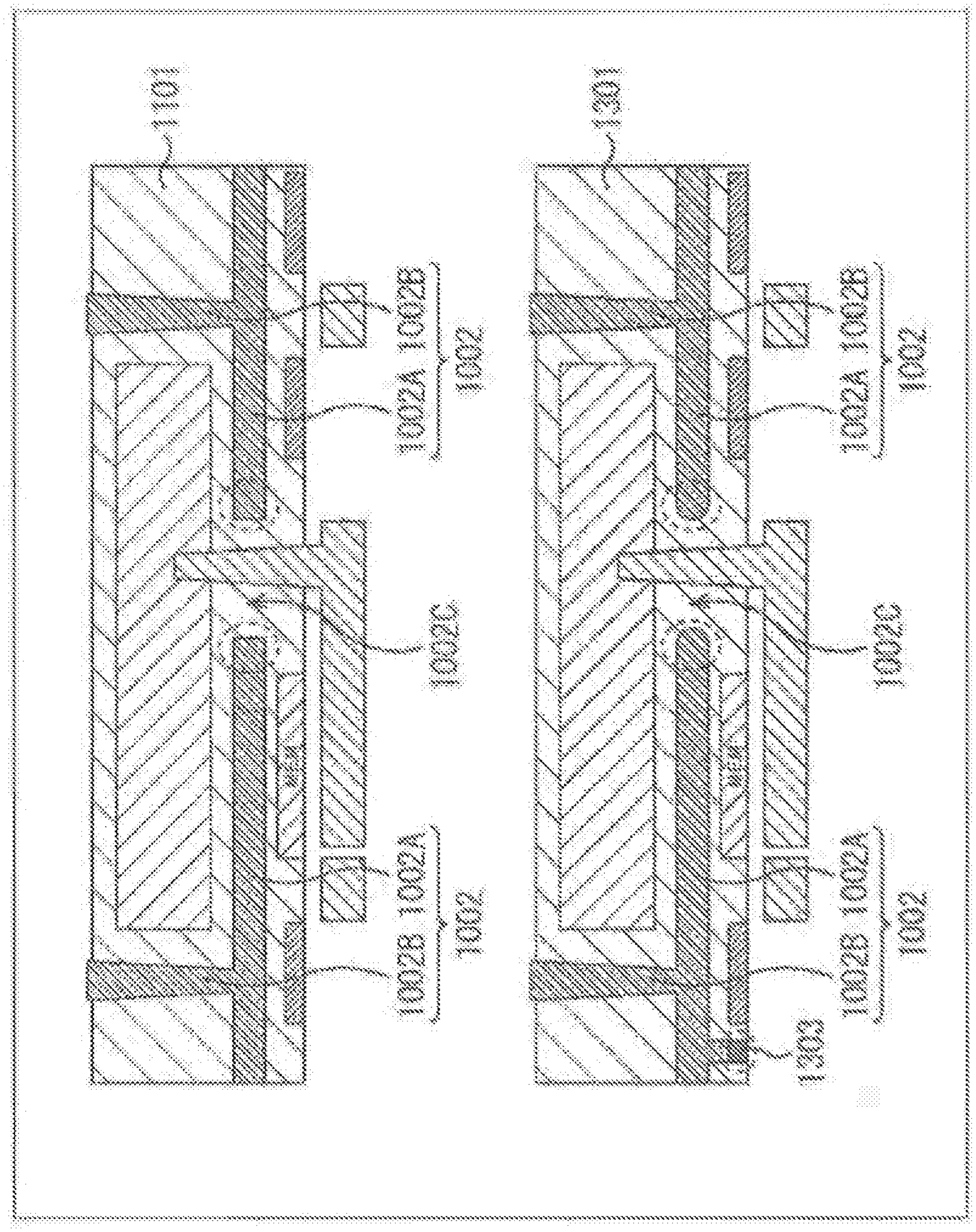

There will be described herein a difference in the structure between in a case where a cavity is formed on a semiconductor substrate by wet etching using a sacrifice film thereby to form the horizontal light blocking part 1002A as in the first manufacture method and in a case where a cavity is formed on a semiconductor substrate by use of the SON thereby to form the horizontal light blocking part 1002A as in the third manufacture method, for example, with reference to FIG. 129. The upper part in FIG. 129 schematically illustrates an exemplary shape of the light blocking film 1002 formed in the first manufacture method, and the lower part schematically illustrates an exemplary shape of the light blocking film 1002 formed in the third manufacture method.

In the former case, the shape of the cross section at the tip of the horizontal light blocking part 1002A (the end of the opening 1002C) is almost rectangular. On the other hand, in the latter case, the shape of the cross section at the tip of the horizontal light blocking part 1002A (the end of the opening 1002C) is not rectangular but rounded.

Further, in the latter case, the polysilicon 1303, which clogs the hole used for embedding the reinforcing film 1302, is formed on the surface of the semiconductor substrate 1301. On the other hand, in the former case, nothing corresponding to the polysilicon 1303 is formed on the surface of the semiconductor substrate 1101.

12. TWELFTH EMBODIMENT

A twelfth embodiment of the present technology will be described below with reference to FIG. 130 to FIG. 139.

{Exemplary Configuration of Solid-State Image Sensing Device 101*l*}

Figure 130:
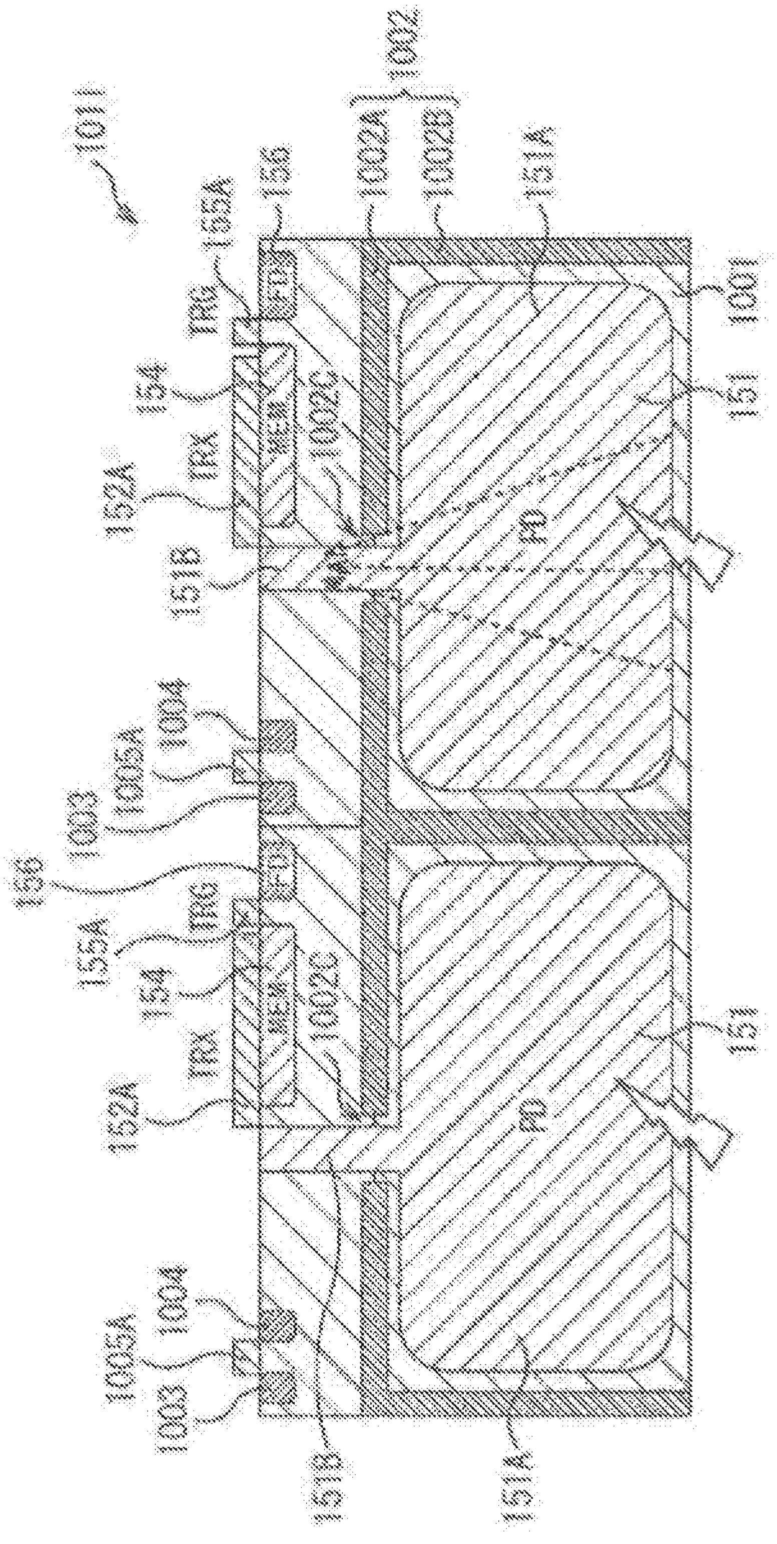

FIG. 130 schematically illustrates a cross section of a solid-state image sensing device 101*l* according to the twelfth embodiment of the present technology. FIG. 130 illustrates a cross section of a part including two pixels in the solid-state image sensing device 101*l*, but other pixels basically have the same configuration.

Additionally, the parts corresponding to those in FIG. 84 are denoted with the same reference numerals in the Figure, and the description thereof will be omitted as needed.

The solid-state image sensing device 101*l* in FIG. 130 is different from the solid-state image sensing device 101*k* in FIG. 84 in the shapes of the PD 151 and the gate terminal (electrode) 152A of the TRX 152.

The PD 151 in the solid-state image sensing device 101*l* is configured of a main body 151A and a protruded plug 151B.

The main body 151A has substantially the same shape as the PD 151 in the solid-state image sensing device 101*k*. The side surface of the main body 151A is surrounded by the vertical light blocking part 1002B of the light blocking film 1002. The upper surface of the main body 151A is covered with the horizontal light blocking part 1002A of the light blocking film 1002 except the opening 1002C.

The plug 151B extends vertically upward from the upper surface of the main body 151A, and extends from the horizontal light blocking part 1002A toward the MEM 154 via the opening 1002C of the light blocking film 1002. The tip of the plug 151B then reaches around the surface of the semiconductor substrate 1001.

On the other hand, the gate terminal (electrode) 152A of the TRX 152 is different from the gate terminal (electrode) 152A in the solid-state image sensing device 101*k* in that the vertical terminal (electrode) part 152AB is not provide and only the part corresponding to the horizontal terminal (electrode) part 152AA is provided.

Thus, even when an incident light is not absorbed in the main body 151A of the PD 151 and passes through the opening 1002C of the light blocking film 1002, it is absorbed in the plug 151B of the PD 151 in the solid-state image sensing device 101*k*. Thereby, the charges generated by the light passing through the opening 1002C of the light blocking film 1002 are prevented from invading in the MEM 154 or the FD 156, and a noise is prevented from occurring.

{Method for Manufacturing Solid-State Image Sensing Device 101*l*}

A method for manufacturing the solid-state image sensing device 101*l* will be described below with reference to FIG. 131 to FIG. 139.

Figure 131:
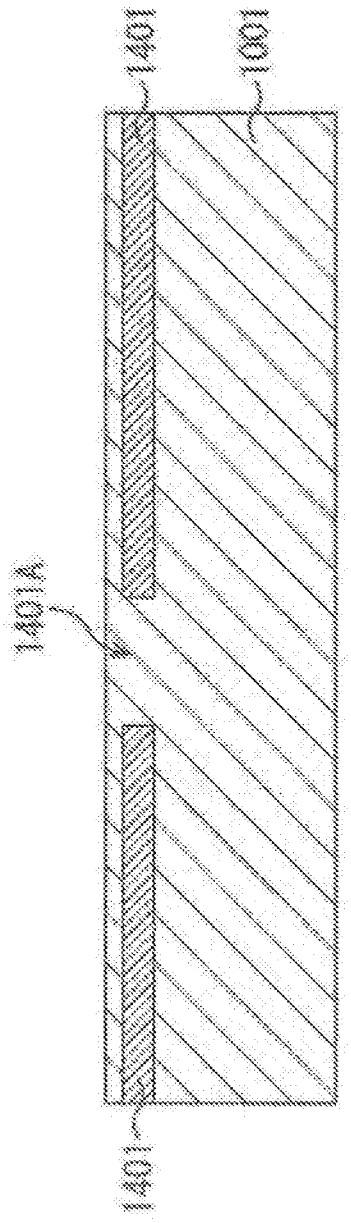

A high-concentration boron (B) layer 1401, which extends in the horizontal direction, is first formed in the semiconductor substrate 1001 as illustrated in FIG. 131. Further, an opening 1401A is formed at the position in the B layer 1401 where the opening 1002C of the light blocking film 1002 is formed. Additionally, a layer lower than the B layer 1401 in the semiconductor substrate 1001 is assumed as silicon support layer, and an upper layer than the B layer 1401 is assumed as silicon active layer.

The active layer in the semiconductor substrate 1001 is then epitaxially grown as illustrated in FIG. 132.

Impurity ions are then implanted in the semiconductor substrate 1001 and the main body 151A of the PD 151 is formed in the layer lower than the B layer 1401 as illustrated in FIG. 133

Impurity ions are then implanted in the semiconductor substrate 1001 and the plug 151B of the PD 151 is formed as illustrated in FIG. 134. The plug 151B protrudes vertically upward from the upper surface of the main body 151A, passes through the opening 1401A of the B layer 1401, and reaches around the surface of the semiconductor substrate 1001.

A pixel circuit is then formed as illustrated in FIG. 135. That is, the gate terminal (electrode) 152A, the MEM 154, the gate terminal (electrode) 155A, the SDs 1003, 1004, the gate terminal (electrode) 1005A, and the like are formed. Further, a wiring layer (not illustrated) is formed on the semiconductor substrate 1001, for example.

Then, as illustrated in FIG. 136, a support substrate (not illustrated) is applied and the backside of the semiconductor substrate 1001 is thinned similarly as in the step in FIG. 93 described above.

Additionally, FIG. 136 and its subsequent Figures are vertically reverse to the previous Figures.

Then, as illustrated in FIG. 137, a trench 1001A is formed on the backside of the semiconductor substrate 1001 similarly as in the step in FIG. 94 described above. The tip of the trench 1001A reaches the B layer 1401.

Then, as illustrated in FIG. 138, the B layer 1401 is removed by wet etching similarly as in the step in FIG. 95 described above. Thereby, a cavity 1001B, which leads to the trench 1001A, is vertical to the trench 1001A, and extends in the horizontal direction, is formed.

The light blocking film 1002 is then generated as illustrated in FIG. 139. For example, an insulative film (not illustrated) is first formed on the surfaces of the trench 1001A and the cavity 1001B. The insulative film is made of a SiO2 film, for example. The light blocking film 1002 is then embedded in the trench 1001A and the cavity 1001B.

The on-chip color filter and the on-chip micro lens are then formed as described above with reference to FIG. 98 or FIG. 113, and the solid-state image sensing device 101*l* is completed.

13. THIRTEENTH EMBODIMENT

A thirteenth embodiment of the present technology will be described below with reference to FIG. 140.

{Exemplary Configuration of Solid-State Image Sensing Device 101*m*}

FIG. 140 schematically illustrates a cross section of a solid-state image sensing device 101*m* according to the thirteenth embodiment of the present technology. Additionally, the parts corresponding to those in FIG. 130 are denoted with the same reference numerals in the Figure, and the description thereof will be omitted as needed.

The solid-state image sensing device 101*m* in FIG. 140 is different from the solid-state image sensing device 101*l* in FIG. 130 in the shape of the PD 151. That is, a lid 151C is formed at the tip of the plug 151B in the PD 151 in the solid-state image sensing device 101*m*.

The lid 151C spreads from the tip of the plug 151B along the upper surface of the semiconductor substrate 1001 in parallel with the upper surface of the main body 151A and reverse to the MEM 154.

A light with a small incident angle in a dotted line among the lights which are not absorbed in the main body 151A of the PD 151 and pass through the opening 1002C of the light blocking film 1002 is incident in the plug 151B and is easily absorbed. On the other hand, an oblique light with a large incident angle in a solid line is likely to pass through the plug 151B. This is applicable to a diffraction light passing through the opening 1002C.

Thus, the lid 151C is provided at the tip of the plug 151B so that a light, which is not absorbed in the plug 151B and passes therethrough, can be absorbed in the lid 151C. Consequently, the charges generated by the light passing through the opening 1002C of the light blocking film 1002 can be prevented from invading in the MEM 154 or the FD 156, and a noise can be more effectively prevented from occurring.

14. FOURTEENTH EMBODIMENT

A fourteenth embodiment of the present technology will be described below with reference to FIG. 141.

{Exemplary Configuration of Solid-State Image Sensing Device 101*n*}

FIG. 141 schematically illustrates a cross section of a solid-state image sensing device 101*n* according to the fourteenth embodiment of the present technology. Additionally, the parts corresponding to those in FIG. 130 are denoted with the same reference numerals in the Figure, and the description thereof will be omitted as needed.

The solid-state image sensing device 101*n* in FIG. 141 is different from the solid-state image sensing device 101*l* in FIG. 130 in the positions of the opening 1002C of the light blocking film 1002, the plug 151B of the PD 151, the SD 1003, the SD 1004, and the gate terminal (electrode) 1005A. Specifically, the solid-state image sensing device 101*n* is different from the solid-state image sensing device 101*l* in that the opening 1002C and the plug 151B are arranged closer to the vertical light blocking part 1002B (the end of the pixel). Further, the SD 1003, the SD 1004, and the gate terminal (electrode) 1005A are moved toward the right of the FD 156.

In this way, the opening 1002C of the light blocking film 1002 is made closer to the vertical light blocking part 1002B, and thus an oblique light with a large incident angle hardly passes through the opening 1002C as indicated in a solid arrow in the Figure, for example. Therefore, most of the lights passing through the opening 1002C are lights with a small incident angle, and the lights passing through the opening 1002C are more easily absorbed in the plug 151B. Consequently, the charges generated by the lights passing through the opening 1002C of the light blocking film 1002 can be prevented from invading in the MEM 154 or the FD 156, and a noise can be more effectively prevented from occurring.

15. FIFTEENTH EMBODIMENT

A fifteenth embodiment of the present technology will be described below with reference to FIG. 142 and FIG. 143.

{Exemplary Configuration of Solid-State Image Sensing Device 101*o*}

FIG. 142 schematically illustrates a cross section of a solid-state image sensing device 101*o* according to the fifteenth embodiment of the present technology. FIG. 143 is a plan view schematically illustrating an exemplary configuration of a device forming surface of the semiconductor substrate 1001 in the solid-state image sensing device 101*o*. Additionally, the parts corresponding to those in FIG. 141 are denoted with the same reference numerals in the Figure, and the description thereof will be omitted as needed.

The solid-state image sensing device 1010 in FIG. 142 is different from the solid-state image sensing device 101*n* in FIG. 141 in that the gate terminal (electrode) 157A of the OFG 157 and a charge discharging unit (OFD) 1501 are formed.

The gate terminal (electrode) 157A of the OFG 157 is formed on the left of the plug 151B of the PD 151 on the device forming surface of the semiconductor substrate 1001.

The OFD 1501 is formed on the left of the gate terminal (electrode) 157A of the OFG 157 and at an end of the pixel around the surface of the semiconductor substrate 1001.

When the drive signal OFG applied to the gate terminal (electrode) 157A of the OFG 157 is turned on and the OFG 157 is turned on, the charges accumulated in the PD 151 are transferred to the OFD 1501 via the OFG 157 to be discharged to the outside. Thereby, the PD 151 is reset.

Further, an oblique light passing through the opening 1002C of the light blocking film 1002 is incident in the OFD 1501 as indicated by a solid arrow in the Figure. The charges generated by the light incident in the OFD 1501 are then discharged from the OFD 1501 to the outside. Consequently, the charges generated by the light passing through the opening 1002C of the light blocking film 1002 can be prevented from invading in the MEM 154 or the FD 156, and a noise can be more effectively prevented from occurring.

Additionally, the OFD 1501 does not necessarily need to be arranged between adjacent pixels. For example, the OFD 1501 is arranged at a position where an oblique light with a predetermined incident angle is incident in a case where the light passes through the opening 1002C of the light blocking film 1002.

16. SIXTEENTH EMBODIMENT

A sixteenth embodiment of the present technology will be described below with reference to FIG. 144.

{Exemplary Configuration of Solid-State Image Sensing Device 101*p*}

FIG. 144 schematically illustrates a cross section of a solid-state image sensing device 101*p* according to the sixteenth embodiment of the present technology. Additionally, the parts corresponding to those in FIG. 142 are denoted with the same reference numerals in the Figure, and the description thereof will be omitted as needed.

The solid-state image sensing device 101*p* in FIG. 144 is different from the solid-state image sensing device 1010 in FIG. 142 in that the gate terminal (electrode) 158A of the RST 158 is added, the position of the OFD 1501 is different, and the SD 1003, the SD 1004, and the gate terminal (electrode) 1005A are deleted. Additionally, the SD 1003, the SD 1004, and the gate terminal (electrode) 1005A are not actually deleted, and they are arranged at different positions in the solid-state image sensing device 101*p*.

The gate terminal (electrode) 158A of the RST 158 is formed on the right of the FD 156 on the device forming surface of the semiconductor substrate 1001.

The OFD 1501 is arranged between the pixel P1 and the pixel P2 which are adjacent to each other. More specifically, the OFD 1501 is arranged between the gate terminal (electrode) 158A of the RST 158 in the pixel P1 and the gate terminal (electrode) 157A of the OFG 157 in the pixel P2 around the surface of the semiconductor substrate 1001.

For example, when the drive signal RST applied to the gate terminal (electrode) 158A of the RST 158 in the pixel P1 is turned on and the RST 158 is turned on, the charges accumulated in the FD 156 are transferred to the OFD 1501 via the RST 158 to be discharged to the outside. Thereby, the FD 156 is reset.

Further, when the drive signal OFG applied to the gate terminal (electrode) 157A of the OFG 157 in the pixel P2 is turned on and the OFG 157 is turned on, the charges accumulated in the PD 151 are transferred to the OFD 1501 via the OFG 157 to be discharged to the outside. Thereby, the PD 151 is reset.

Therefore, the OFD 1501 is shared between the pixel P1 and the pixel P2 which are adjacent to each other in the solid-state image sensing device 101*p*.

Further, an oblique light passing through the opening 1002C of the light blocking film 1002 is incident in the OFD 1501 in the solid-state image sensing device 101*p* as in the solid-state image sensing device 1010. The charges generated by the light incident in the OFD 1501 are then discharged from the OFD 1501 to the outside. Consequently, the charges generated by the light passing through the opening 1002C of the light blocking film 1002 can be prevented from invading in the MEM 154 or the FD 156, and a noise can be more effectively prevented from occurring.

17. SEVENTEENTH EMBODIMENT

A seventeenth embodiment of the present technology will be described below with reference to FIG. 145.

{Exemplary Configuration of Solid-State Image Sensing Device 101*q*}

FIG. 145 is a plan view schematically illustrating an exemplary configuration of a device forming surface of a solid-state image sensing device 101*q* according to the seventeenth embodiment of the present technology. Additionally, the parts corresponding to those in FIG. 144 are denoted with the same reference numerals in the Figure, and the description thereof will be omitted as needed.

FIG. 145 schematically illustrates an exemplary configuration of the device forming surfaces of the pixel P1 and the pixel P2 in the solid-state image sensing device 101*q*. In the example, the pixel P1 and the pixel P2 are arranged side by side in the Figure, and the layouts thereof are symmetric to each other.

Further, the solid-state image sensing device 101*q* is different from the solid-state image sensing device 101*p* in FIG. 144 in that not only the OFD 1501 but also the FD 156 is shared by the pixel P1 and the pixel P2 which are adjacent to each other.

18. EIGHTEENTH EMBODIMENT

An eighteenth embodiment of the present technology will be described below with reference to FIG. 146.

{Exemplary Configuration of Solid-State Image Sensing Device 101*r*}

FIG. 146 is a plan view schematically illustrating an exemplary configuration of a device forming surface of a solid-state image sensing device 101*r* according to the eighteenth embodiment of the present technology. Additionally, the parts corresponding to those in FIG. 145 are denoted with the same reference numerals in the Figure, and the description thereof will be omitted as needed.

The solid-state image sensing device 101*r* is different from the solid-state image sensing device 101*q* in FIG. 145 in that a dummy opening 1551L is formed in the pixel P1 and a dummy opening 1551R is formed in the pixel P2.

The dummy opening 1551L is formed at a position corresponding to the position in which the plug 151B of the PD 151 in the pixel P2 is formed (or the position in which the opening 1002C (not illustrated) of the light blocking film 1002 in the pixel P2 is formed) in the pixel P1. The dummy opening 1551L has substantially the same size as the opening 1002C of the light blocking film 1002.

The dummy opening 1551R is formed at a position corresponding to the position in which the plug 151B of the PD 151 in the pixel P1 is formed (or the position in which the opening 1002C (not illustrated) of the light blocking film 1002 in the pixel P1 is formed) in the pixel P2. The dummy opening 1551R has substantially the same size as the opening 1002C of the light blocking film 1002.

Therefore, the openings are provided almost at the same positions in the pixel P1 and the pixel P2, respectively, to be symmetric to each other. Thereby, an optical property for the oblique lights indicated by the arrows in the Figure can be adjusted in the pixel P1 and pixel P2, for example. Consequently, a variation in color or brightness between the pixels can be restricted.

19. VARIANTS

The description has been made assuming that the cross section of the light blocking film is tapered in the second manufacture method according to the eleventh embodiment of the present technology, but the films other than the light blocking film can be tapered in the manufacture method.

Further, part of the side surface of the PD may not be surrounded by the light blocking film as needed, for example.

Further, the present technology can be applied to solid-state image sensing devices in systems other than the global shutter system, or solid-state image sensing devices of surface irradiation type, for example, within the applicable range.

Further, each of the above embodiments has been described assuming that electrons are basically charges, but the present technology can be applied in a case where holes are assumed as charges. Furthermore, in each circuit configuration described above, the polarities of the transistors (N type MOS transistor and P type MOS transistor) can be exchanged.

20. EXEMPLARY USE OF SOLID-STATE IMAGE SENSING DEVICES

FIG. 147 is a diagram illustrating exemplary use of the solid-state image sensing devices.

The above-described solid-state image sensing devices can be used for various cases for sensing lights such as visible light, infrared ray, ultraviolet ray, and X-ray as described below.

- Devices such as digital camera or camera-equipped portable device for shooting images to be viewed
- Traffic devices such as vehicle-mounted sensors for shooting images in front of, behind, and round an automobile, and the interior thereof for safe driving such as automatic stop or for recognition of driver's state, monitoring cameras for monitoring traveling vehicles or roads, and distance measurement sensors for measuring an inter-vehicle distance
- Devices for household electric appliances such as TV, refrigerator, and air conditioner in order to shoot user's gestures and to operate a device according to the gestures
- Medical or healthcare devices such as endoscopes or angiographic devices using received infrared ray
- Security devices such as monitoring cameras for crime prevention or person authentication cameras
- Beauty care devices such as skin measurement devices for shooing the skin or microscopes for shooting the skin of the head
- Sports devices such as action cameras or wearable cameras for sports
- Agricultural devices such as cameras for monitoring the states of the fields or crops {Shooting Device}

FIG. 148 is a block diagram illustrating an exemplary configuration of a shooting device (camera device) 1701 as an exemplary electronic device to which the present technology is applied.

As illustrated in FIG. 148, the shooting device 1701 has an optical system including a group of lenses 1711, an imaging device 1712, a DSP circuit 1713 as camera signal processing unit, a frame memory 1714, a display device 1715, a recording device 1716, an operation system 1717, a power supply system 1718, and the like. Then, the DSP circuit 1713, the frame memory 1714, the display device 1715, the recording device 1716, the operation system 1717, and the power supply system 1718 are mutually connected via a bus line 1719.

The group of lenses 1711 takes an incident light (image light) from a subject, and forms an image on the imaging surface of the imaging device 1712. The imaging device 1712 converts the amount of incident light formed as an image on the imaging surface by the group of lenses 1711 into an electric signal in units of pixel, and outputs the electric signal as a pixel signal.

The display device 1715 is configured of a panel type display device such as liquid crystal display device or organic electro luminescence (EL) display device, and displays animations or still images shot by the imaging device 1712. The recording device 1716 records the animations or still images shot by the imaging device 1712 in a recording medium such as memory card, video tape, or digital versatile disk (DVD).

The operation system 1717 issues operation commands for various functions of the shooting device 1701 in response to user's operations. The power supply system 1718 supplies the DSP circuit 1713, the frame memory 1714, the display device 1715, the recording device 1716, and the operation system 1717 with power as needed.

The shooting device 1701 is applicable to video cameras or digital still cameras, and additionally camera modules for mobile devices such as Smartphones or cell phones. Further, the solid-state image sensing device according to each of the above embodiments can be used as the imaging device 1712 in the shooting device 1701. Thereby, the image quality of the shooting device 1701 can be enhanced.

Additionally, embodiments of the present technology are not limited to the above-described embodiments, and can be variously changed without departing from the spirit of the present technology.

For example, each of the above-described embodiments can be combined within the possible range. For example, the fourth embodiment, the ninth embodiment, or the eighteenth embodiment can be combined with other embodiment.

Further, the present technology can employ the following configurations, for example.

(1)

A solid-state image sensing device including:

a photoelectric conversion unit;

a charge holding unit for holding charges transferred from the photoelectric conversion unit;

a first transfer transistor for transferring charges from the photoelectric conversion unit to the charge holding unit; and a light blocking part including a first light blocking part and a second light blocking part, in which the first light blocking part is arranged between a second surface opposite to a first surface as a light receiving surface of the photoelectric conversion unit and the charge holding unit, and covers the second surface, and is formed with a first opening, and the second light blocking part surrounds the side surface of the photoelectric conversion unit.

(2)

The solid-state image sensing device according to (1), in which a cross section of the first light blocking part is tapered from a connection part with the second light blocking part toward the first opening.

(3)

The solid-state image sensing device according to (1) or (2), further including:

a third light blocking part for covering at least a surface of the charge holding unit opposite to a surface opposing the first light blocking part at a position away from the first light blocking part from a device forming surface on which the first transfer transistor is formed.

(4)

The solid-state image sensing device according to any of (1) to (3), in which a gate electrode of the first transfer transistor includes a first electrode part parallel to the first light blocking part, and a second electrode part vertical to the first light blocking part and extending from the first light blocking part closer to the charge holding unit toward the photoelectric conversion unit via the first opening.

(5)

The solid-state image sensing device according to (4), further including:

a fourth light blocking part which is connected to the first light blocking part and is at least partially arranged closer to the charge holding unit than to the first light blocking part and at a different position from the second light blocking part in parallel with the second surface.

(6)

The solid-state image sensing device according to (4), in which the photoelectric conversion unit is formed on a first semiconductor substrate, the charge holding unit is formed on a second semiconductor substrate, the first transfer transistor is formed over the first semiconductor substrate and the second semiconductor substrate, and a joining interface between the first semiconductor substrate and the second semiconductor substrate is formed in a channel of the first transfer transistor.

(7)

The solid-state image sensing device according to (6), in which the joining interface is formed closer to a drain end of the transfer transistor than to a source end.

(8)

The solid-state image sensing device according to (6) or (7), in which the second light blocking part is formed from the second surface of the photoelectric conversion unit, the device further including:

a fifth light blocking part formed from the first surface of the photoelectric conversion unit and connected to the second light blocking part.

(9)

The solid-state image sensing device according to any of (1) to (5), in which the photoelectric conversion unit, the charge holding unit, and the first transfer transistor are made of monocrystal silicon.

(10)

The solid-state image sensing device according to any of (1) to (3), in which the photoelectric conversion unit includes a protruded part from the second surface extending from the first light blocking part toward the charge holding unit via the first opening.

(11)

The solid-state image sensing device according to (10), in which the protruded part spreads in parallel with the second surface from the first light blocking part toward the charge holding unit.

(12)

The solid-state image sensing device according to (10), further including:

a charge discharging unit for discharging charges accumulated in the photoelectric conversion unit, in which the charge discharging unit is arranged at a position in which a light with a predetermined incident angle is incident in a case where the light passes through the first opening.

(13)

The solid-state image sensing device according to (12), in which the charge discharging unit is arranged between a first pixel and a second pixel which are adjacent to each other, and is shared by the first pixel and the second pixel.

(14)

The solid-state image sensing device according to (13), in which the first openings are arranged near the charge discharging unit in the first pixel and the second pixel, respectively, a second opening with substantially the same size as the first opening is formed in the first pixel at a position corresponding to the first opening in the second pixel, and a third opening with substantially the same size as the first opening is formed in the second pixel at a position corresponding to the first opening in the first pixel.

(15)

The solid-state image sensing device according to (1), in which a sacrifice film making the first light blocking part is made of SiGe, and the device further including:

an alignment mark made of the sacrifice film which is not removed and remains.

(16)

The solid-state image sensing device according to (1), in which a cross section of the first light blocking part is rounded at the first opening.

(17)

The solid-state image sensing device according to any of (1) to (16), further including:

a charge voltage conversion unit; and a second transfer transistor for transferring charges held in the charge holding unit to the charge voltage conversion unit, in which the first light blocking part is arranged between the second surface of the photoelectric conversion unit, and the charge holding unit and the charge voltage conversion unit.

(18)

An electronic device including a solid-state image sensing device, the device including:

a photoelectric conversion unit;

a charge holding unit for holding charges transferred from the photoelectric conversion unit;

a first transfer transistor for transferring charges from the photoelectric conversion unit to the charge holding unit; and a light blocking part including a first light blocking part and a second light blocking part, in which the first light blocking part is arranged between a second surface opposite to a first surface as a light receiving surface of the photoelectric conversion unit and the charge holding unit, covers the second surface, and is formed with a first opening, and the second light blocking part surrounds the side surface of the photoelectric conversion unit.

(19)

A solid-state image sensing device including:

a photoelectric conversion unit;

a charge holding unit for holding charges transferred from the photoelectric conversion unit;

a transfer transistor for transferring charges from the photoelectric conversion unit to the charge holding unit; and a light blocking part including a first light blocking part formed with an opening, and a second light blocking part, in which the first light blocking part is arranged in parallel with a light receiving surface of the photoelectric conversion unit and between the photoelectric conversion unit and the charge holding unit, and covers the photoelectric conversion unit except the opening, and the second light blocking part surrounds the side surface of the photoelectric conversion unit.

REFERENCE SIGNS LIST

101*a* to 101*r* Solid-state image sensing device
111 Pixel array part
112 Vertical drive unit
113 Ramp wave module
116 Horizontal drive unit
117 System control unit
118 Signal processing unit
151 PD
151A Main body
151B Plug
151C Lid
152 TRX
152A Gate terminal (electrode)
152AA Horizontal terminal (electrode) part
152AB Vertical terminal (electrode) part
153 TRM
153A Gate terminal (electrode)
154 MEM
155 TRG
155A Gate terminal (electrode)
156 FD
157 OFG
157A Gate terminal (electrode)
157AA Florizontal terminal (electrode) part
157AB Vertical terminal (electrode) part
158 RST
158A Gate terminal (electrode)
159 AMP
159A Gate terminal (electrode)
160 SEL
160A Gate terminal (electrode)
201 First semiconductor substrate
201A Trench
202 Second semiconductor substrate
203 Logic layer
216 N− type semiconductor region
217 P+ type semiconductor region
219 Light blocking part
219A Horizontal light blocking part
219B Vertical light blocking part
219C Opening
226 N++ type semiconductor region
228 P type semiconductor region
231 N+ type semiconductor region
310 Silicon film
312 Trench
401 Light blocking film
411 Light blocking film
451 N− type semiconductor region
452 P+ type semiconductor region
453 Light blocking film
453A Horizontal light blocking part
453B Vertical light blocking part
453C Opening
462 N++ type semiconductor region
468 N+ type semiconductor region
501 Light blocking film
501A Horizontal light blocking part
601 N− type semiconductor region
602 P+ type semiconductor region
603 Light blocking film
603A, 603B Opening
701A First layer
701B Second layer
702 Pixel array part
703 Latch circuit
751 ADC circuit
801 Semiconductor substrate
802 N− type semiconductor region
804 Light blocking film
804A Horizontal light blocking part
804B Vertical light blocking part
804C Vertical light blocking part
804D Horizontal light blocking part
804E Opening
806 P type semiconductor region
808 N type semiconductor region
809 N− type semiconductor region
853 Trench
1001 Semiconductor substrate
1001A Trench
1001B Cavity
1002 Light blocking film
1002A Horizontal light blocking part
1002B Vertical light blocking part
1002C Opening
1101 Semiconductor substrate
1103 Sacrifice film
1103A Opening
1103B, 1103C Remains
1104 Silicon film
1105 Trench
1106 Cavity
1201 Sacrifice film
1202 Trench
1203 Cavity
1301 Semiconductor substrate
1301B Cavity
1301C Trench
1302 Reinforcing film
1303 Polysilicon
1401 Boron layer
1501 OFD
1551L, 1551R Dummy opening
1701 Shooting device
1712 Imaging device

What is claimed is:

1. A solid-state image sensing device, comprising:

a photoelectric conversion unit, wherein the photoelectric conversion unit comprises a first surface and a second surface, the first surface is a light receiving surface of the photoelectric conversion unit, and the second surface is opposite to the first surface;

an insulating film on the first surface of the photoelectric conversion unit;

a first light blocking film on a lower surface of the insulating film;

a charge holding unit configured to hold charges transferred from the photoelectric conversion unit;

a first transfer transistor configured to transfer the charges from the photoelectric conversion unit to the charge holding unit;

a light blocking part comprising a first light blocking part and a second light blocking part, wherein the first light blocking part is arranged between the second surface of the photoelectric conversion unit opposite to the first surface of the photoelectric conversion unit and the charge holding unit, the first light blocking part covers the second surface, and the photoelectric conversion unit comprises a first opening, the second light blocking part is from a side of the first surface, and surrounds a side surface of the photoelectric conversion unit;

a second light blocking film connecting the second light blocking part and the first light blocking film; and a cross section of the first light blocking part is tapered from a connection part with the second light blocking part towards the first opening.

2. The solid-state image sensing device according to claim 1, further comprising a third light blocking part that covers at least a surface opposite to a surface of the charge holding unit opposing the first light blocking part at a position farther away from the first light blocking part than a device forming surface that has the first transfer transistor.

3. The solid-state image sensing device according to claim 1, wherein a gate electrode of the first transfer transistor comprises a first electrode part parallel to the first light blocking part and a second electrode part that is perpendicular to the first light blocking part, and the gate extends from a side closer to the charge holding unit, than to the first light blocking part, towards the photoelectric conversion unit through the first opening.

4. The solid-state image sensing device according to claim 3, further comprising a fourth light blocking part connected to the first light blocking part, wherein at least a part of the fourth blocking part is arranged on the side closer to the charge holding unit than to the first light blocking part and at a different position from the second light blocking part in a direction parallel to the second surface.

5. The solid-state image sensing device according to claim 3, wherein the photoelectric conversion unit is on a first semiconductor substrate, the charge holding unit is on a second semiconductor substrate, the first transfer transistor is over the first semiconductor substrate and the second semiconductor substrate, and a joining interface of the first semiconductor substrate and the second semiconductor substrate is in a channel of the first transfer transistor.

6. The solid-state image sensing device according to claim 5, wherein the joining interface is at a position closer to a drain end of the first transfer transistor than to a source end of the first transfer transistor.

7. The solid-state image sensing device according to claim 1, wherein the photoelectric conversion unit, the charge holding unit, and the first transfer transistor comprise monocrystal silicon.

8. The solid-state image sensing device according to claim 1, wherein the photoelectric conversion unit comprises a protruded part that extends from the second surface towards a side closer to the charge holding unit, than to the first light blocking part, through the first opening.

9. The solid-state image sensing device according to claim 8, wherein the protruded part extends in a direction parallel to the second surface on the side closer to the charge holding unit than to the first light blocking part.

10. The solid-state image sensing device according to claim 8, further comprising a charge discharging unit configured to discharge charges accumulated in the photoelectric conversion unit, wherein the charge discharging unit is arranged at a position at which light with a predetermined incident angle is incident in a case where the light passes through the first opening.

11. The solid-state image sensing device according to claim 10, wherein the charge discharging unit is arranged between a first pixel and a second pixel adjacent to each other, and the charge discharging unit is shared by the first pixel and the second pixel.

12. The solid-state image sensing device according to claim 11, wherein the first opening is arranged near the charge discharging unit in each of the first pixel and the second pixel, a second opening with substantially a same size as the first opening is in the first pixel at a position corresponding to the first opening in the second pixel, and a third opening with substantially a same size as the first opening is in the second pixel at a position corresponding to the first opening in the first pixel.

13. The solid-state image sensing device according to claim 1, further comprising an alignment mark that forms a cavity that embeds the first light blocking part in a region of a fourth surface opposite to a third surface that is a surface on a side of the first surface of the photoelectric conversion unit of a semiconductor substrate, excluding the first opening, wherein the alignment mark includes a sacrifice film comprising SiGe and the first opening, the sacrifice film is not removed and remains around a silicon film that clogs the first opening when the sacrifice film is removed by wet etching through a trench that reaches the sacrifice film from a side of the third surface of the semiconductor substrate, and the second light blocking part is embedded in the trench.

14. The solid-state image sensing device according to claim 1, wherein the cross section of the first light blocking part is rounded at the first opening.

15. The solid-state image sensing device according to claim 1, further comprising:

a charge voltage conversion unit; and a second transfer transistor configured to transfer charges held in the charge holding unit to the charge voltage conversion unit, wherein the first light blocking part is arranged between the second surface of the photoelectric conversion unit and the charge holding unit, and the first light blocking part is arranged between the second surface of the photoelectric conversion unit and the charge voltage conversion unit.

16. An electronic device, comprising
a solid-state image sensing device that comprises:
a photoelectric conversion unit, wherein
the photoelectric conversion unit comprises a first surface and a second surface,
the first surface is a light receiving surface of the photoelectric conversion unit, and
the second surface is opposite to the first surface;
an insulating film on the first surface of the photoelectric conversion unit;
a first light blocking film on a lower surface of the insulating film;
a charge holding unit configured to hold charges transferred from the photoelectric conversion unit;
a first transfer transistor configured to transfer the charges from the photoelectric conversion unit to the charge holding unit;
a light blocking part comprising a first light blocking part and a second light blocking part, wherein
the first light blocking part is arranged between the second surface of the photoelectric conversion unit opposite to the first surface of the photoelectric conversion unit and the charge holding unit,
the first light blocking part covers the second surface, and
the photoelectric conversion unit comprises a first opening,
the second light blocking part is from a side of the first surface, and surrounds a side surface of the photoelectric conversion unit;
a second light blocking film connecting the second light blocking part and the first light blocking film; and
a cross section of the first light blocking part is tapered from a connection part with the second light blocking part towards the opening.

17. A solid-state image sensing device, comprising:
a photoelectric conversion unit, wherein
the photoelectric conversion unit comprises a first surface and a second surface,
the first surface is a light receiving surface of the photoelectric conversion unit, and
the second surface is opposite to the first surface;
an insulating film on the first surface of the photoelectric conversion unit;
a first light blocking film on a lower surface of the insulating film;
a charge holding unit configured to hold charges transferred from the photoelectric conversion unit;
a first transfer transistor configured to transfer the charges from the photoelectric conversion unit to the charge holding unit;
a light blocking part comprising a first light blocking part with an opening and a second light blocking part, wherein
the first light blocking part is parallel to the first surface of the photoelectric conversion unit,
the first light blocking part is arranged between the photoelectric conversion unit and the charge holding unit,
the first light blocking part covers the photoelectric conversion unit except for the opening,
the second light blocking part is from a side of the first surface, and surrounds a side surface of the photoelectric conversion unit;
a second light blocking film connecting the second light blocking part and the first light blocking film; and
a cross section of the first light blocking part is tapered from a connection part with the second light blocking part towards the opening.

* * * * *